US011696492B2

(12) United States Patent
Chen et al.

(10) Patent No.: US 11,696,492 B2
(45) Date of Patent: *Jul. 4, 2023

(54) ORGANIC ELECTROLUMINESCENT MATERIALS AND DEVICES

(71) Applicant: Universal Display Corporation, Ewing, NJ (US)

(72) Inventors: Hsiao-Fan Chen, Lawrence Township, NJ (US); Daniel W. Silverstein, Ewing, NJ (US); Peter Wolohan, Princeton Junction, NJ (US); Tyler Fleetham, Newtown, PA (US); Jason Brooks, Philadelphia, PA (US); Charles J. Stanton, III, Wilmington, DE (US); Olexandr Tretyak, Newark, DE (US); Raghupathi Neelarapu, Newark, DE (US); Katarina Rohlfing, Wilmington, DE (US); Douglas Williams, Mullica Hill, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 554 days.

This patent is subject to a terminal disclaimer.

(21) Appl. No.: 16/807,898

(22) Filed: Mar. 3, 2020

(65) Prior Publication Data

US 2020/0220090 A1 Jul. 9, 2020

Related U.S. Application Data

(63) Continuation-in-part of application No. 16/116,439, filed on Aug. 29, 2018, now Pat. No. 11,424,420.

(Continued)

(51) Int. Cl.

*H01L 51/54* (2006.01)
*H01L 51/00* (2006.01)

(Continued)

(52) U.S. Cl.

CPC ...... *H01L 51/0087* (2013.01); *C07F 15/0086* (2013.01); *C09K 11/06* (2013.01);

(Continued)

(58) Field of Classification Search

None

See application file for complete search history.

(56) References Cited

U.S. PATENT DOCUMENTS 4,769,292 A 9/1988 Tang et al.
5,061,569 A 10/1991 VanSlyke et al.

(Continued)

FOREIGN PATENT DOCUMENTS

CN 106117269 11/2016
CN 108299505 7/2018

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Andrew K Bohaty
(74) *Attorney, Agent, or Firm* — Duane Morris LLP

(57) ABSTRACT

A novel compound having a benzimidazole based structure is disclosed that is selected from one of the following structures:

Formula I

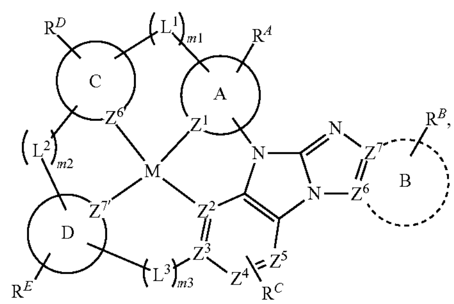

Formula II

Formula III (Continued)

The compound is useful in improving photophysical performance of OLEDs.

20 Claims, 2 Drawing Sheets

Related U.S. Application Data

(60) Provisional application No. 62/898,219, filed on Sep. 10, 2019, provisional application No. 62/859,919, filed on Jun. 11, 2019, provisional application No. 62/842,230, filed on May 2, 2019, provisional application No. 62/823,922, filed on Mar. 26, 2019, provisional application No. 62/555,115, filed on Sep. 7, 2017.

(51) Int. Cl.
*C07F 15/00* (2006.01)
*C09K 11/06* (2006.01)
*H01L 51/50* (2006.01)

(52) U.S. Cl.
CPC *C09K 2211/1074* (2013.01); *C09K 2211/185* (2013.01); *H01L 51/5012* (2013.01); *H01L 51/5016* (2013.01)

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2012/0302753 | A1 | 11/2012 | Li |
| 2015/0295189 | A1 | 10/2015 | Brooks |
| 2016/0072082 | A1 | 3/2016 | Brooks |
| 2017/0040554 | A1 | 2/2017 | Brooks |
| 2017/0183368 | A1 | 6/2017 | Hara |
| 2018/0090691 | A1 | 3/2018 | Brooks |
| 2018/0305384 | A1 | 10/2018 | Chen |
| 2018/0370978 | A1 | 12/2018 | Wolohan |

FOREIGN PATENT DOCUMENTS

| | | |
|---|---|---|
| EP | 0650955 | 5/1995 |
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |

(56) References Cited

FOREIGN PATENT DOCUMENTS

| | | |
|---|---|---|
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1:15-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1)162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).

(56) References Cited

OTHER PUBLICATIONS

Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

ORGANIC ELECTROLUMINESCENT MATERIALS AND DEVICES

CROSS-REFERENCE TO RELATED APPLICATIONS

This application claims priority under 35 U.S.C. § 119(e), to U.S. Provisional Applications No. 62/842,230, filed on May 2, 2019, No. 62/823,922, filed on Mar. 26, 2019, No. 62/859,919, filed on Jun. 11, 2019, and No. 62/898,219, filed on Sep. 10, 2019, the entire contents of which are incorporated herein by reference. This application is also a continuation-in-part of the co-pending U.S. patent application Ser. No. 16/116,439, filed on Aug. 29, 2018, which claims priority under 35 U.S.C. § 119(e) to U.S. Provisional Application No. 62/555,115, filed Sep. 7, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

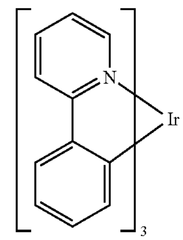

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

A novel compound useful in improving photophysical performance of OLEDs is disclosed. The compound is selected from the group consisting of:

Formula I

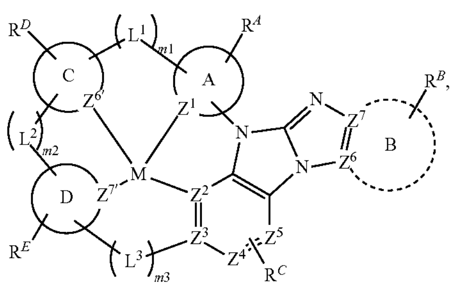

Formula II

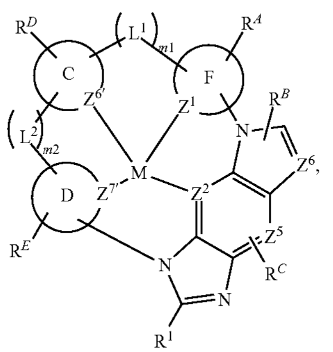

and

Formula III

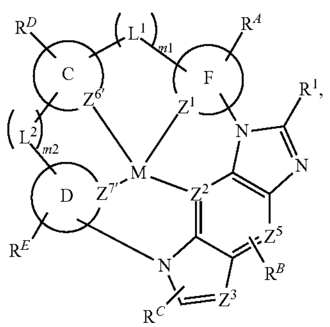

where; A, B, C, D, and F are each independently a 5-membered or 6-membered aromatic ring; ring B may or may not be present; M is selected from the group consisting of Pt, Pd, Cu, and Au; $Z^1$, $Z^2$, $Z^3$, $Z^4$, $Z^5$, $Z^6$, $Z^{6'}$, $Z^7$, and $Z^{7'}$ are each independently selected from the group consisting of C and N; m1, m2 and m3 are each independently an integer of 0 or 1; when m2 is 0, each m1 and m3 is 1; when m2 is 1, each m1 and m3 can be 0 or 1; when m1 is 0, $L^1$ is not present; when m2 is 0, $L^2$ is not present; when m3 is 0, $L^3$ is not present; $L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof; each $R^A$, $R^B$, $R^C$, $R^D$, and $R^E$ represents mono- to maximum possible number of substitutions, or no substitution; each $R^A$, $R^B$, $R^C$, $R^D$, $R^E$, R and R' is a hydrogen or a substituent independently selected from the group consisting of the general substituents defined herein; and any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

An OLED comprising an anode, a cathode, and an organic layer disposed between the anode and the cathode is disclosed, in which, the organic layer comprises the novel compound of the present disclosure.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
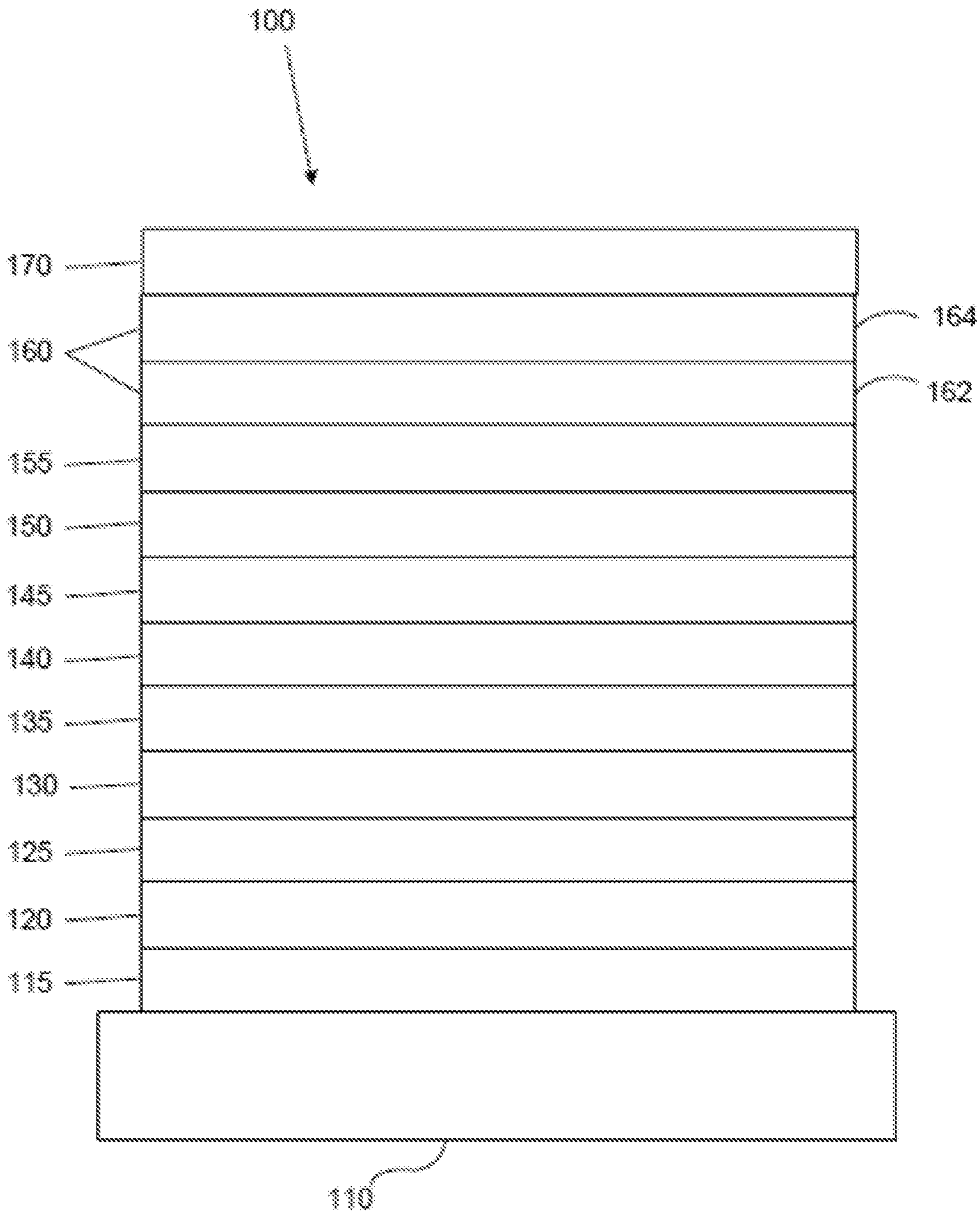
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
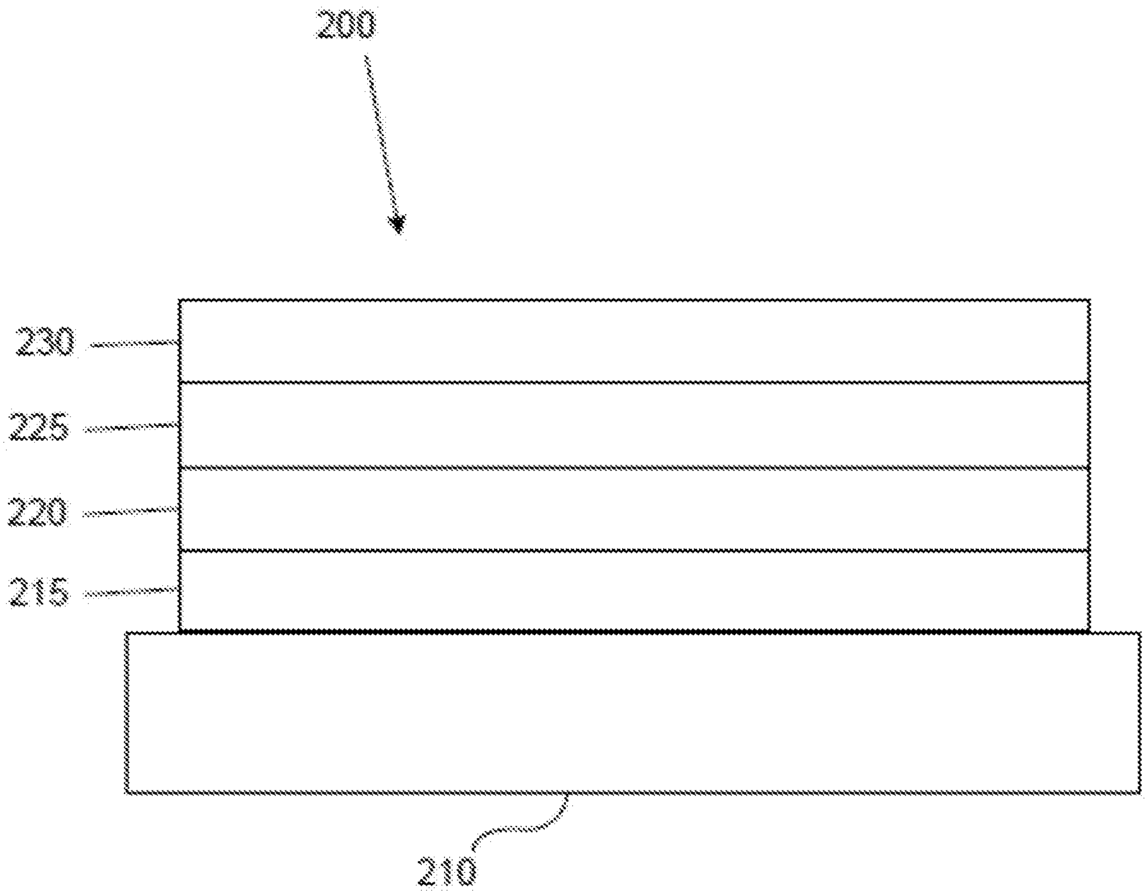
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

The term "boryl" refers to a —$B(R_s)_2$ radical or its Lewis adduct —$B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof.

In some instances, the more preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

According to some embodiments of the present disclosure, a novel compound is disclosed that is selected from the group consisting of:

Formula I

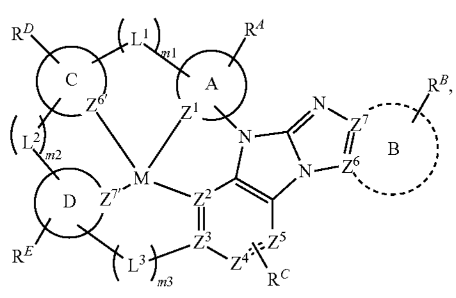

Formula II

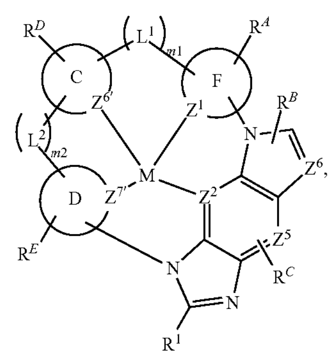

and

-continued

Formula III

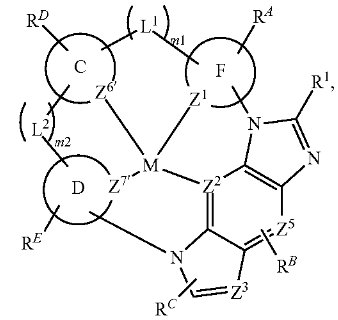

where; A, B, C, D, and F are each independently a 5-membered or 6-membered aromatic ring; ring B may or may not be present; M is selected from the group consisting of Pt, Pd, Cu, and Au; $Z^1$, $Z^2$, $Z^3$, $Z^4$, $Z^5$, $Z^6$, $Z^{6'}$, $Z^7$, and $Z^{7'}$ are each independently selected from the group consisting of C and N; m1, m2 and m3 are each independently an integer of 0 or 1; when m2 is 0, each m1 and m3 is 1; when m2 is 1, each m1 and m3 can be 0 or 1; when m1 is 0, $L^1$ is not present; when m2 is 0, $L^2$ is not present; when m3 is 0, $L^3$ is not present; $L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof; each $R^A$, $R^B$, $R^C$, $R^D$, and $R^E$ represents mono- to maximum possible number of substitutions, or no substitution; each $R^A$, $R^B$, $R^C$, $R^D$, $R^E$, R and R' is independently a hydrogen or a substituent selected from the group consisting of the general substituents defined herein; and any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

In some embodiments of the compound, each $R^A$, $R^B$, $R^C$, $R^D$, $R^E$, R and R' is independently a hydrogen or a substituent selected from the group consisting of the preferred general substituents defined herein.

In some embodiments of the compound, M is Pt.

In some embodiments of the compound, one of $Z^6$ and $Z^7$ is nitrogen, and the other one of $Z^6$ and $Z^7$ is carbon. In some embodiments, one of $Z^{6'}$ and $Z^{7'}$ is a neutral carbene carbon, and the other one of $Z^{6'}$ and $Z^{7'}$ is an anionic carbon.

In some embodiments of the compound, at least one of $L^1$, $L^2$, and $L^3$ is present and is not a direct bond. In some embodiments, $L^2$ is present and is a direct bond. In some embodiments, $L^3$ and $Z^4$ are fused to form a 5-membered or 6-membered carbocyclic or heterocyclic ring. In some embodiments, $L^3$ is present and is selected from the group consisting of O, S, and CRR'.

In some embodiments of the compound, m1 is 0, m2 is 1, and m3 is 1.

In some embodiments of the compound, rings A, B, C, D, and F are each independently selected from the group consisting of phenyl, pyridine, pyrimidine, triazine, pyrazole, triazole, imidazole, and imidazole derived carbene. In some embodiments, ring D is a 6-membered aromatic ring. In some embodiments, ring B is present and is a 6-membered aromatic ring. In some embodiments, ring C is a 5-membered aromatic ring.

In some embodiments of the compound, the compound is Formula I and ring A is pyridine with N coordinating to M.

In some embodiments of the compound, the compound is selected from the group consisting of:

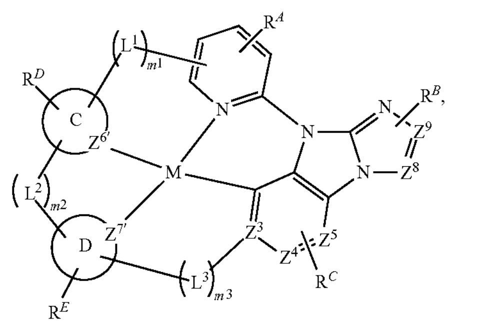

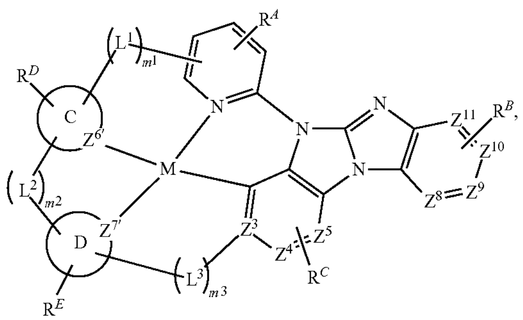

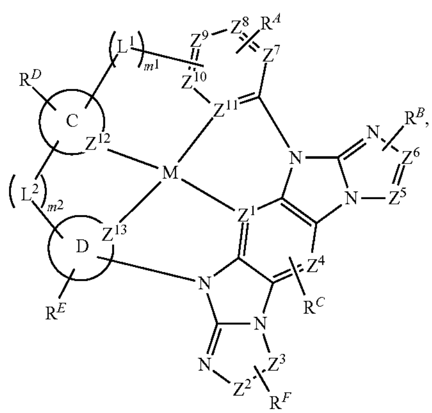

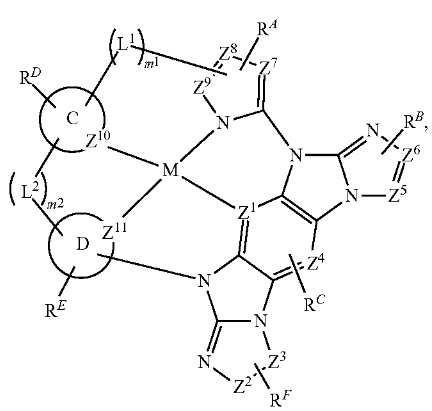

-continued

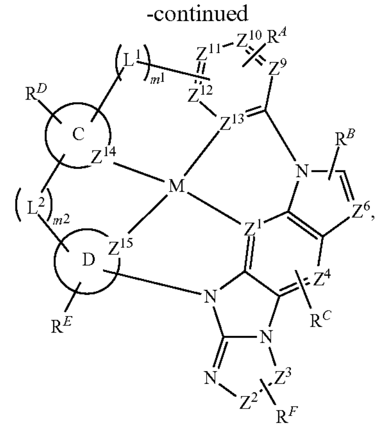

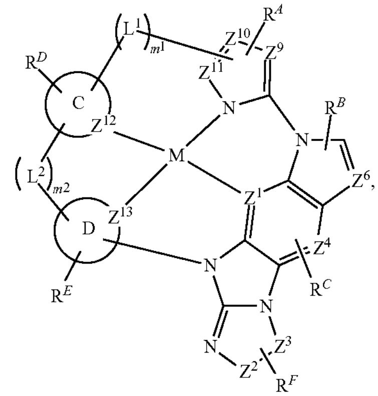

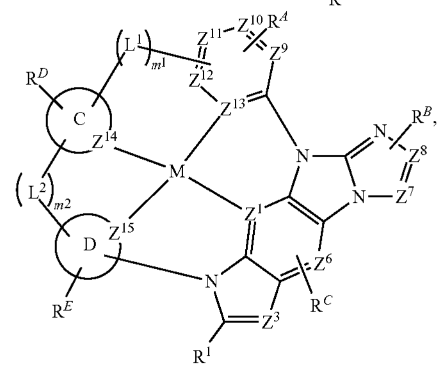

and

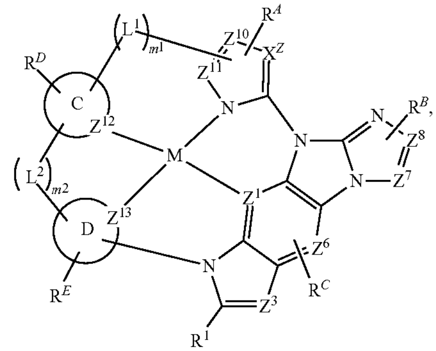

where;

$Z^1$, $Z^2$, $Z^3$, $Z^4$, $Z^5$, $Z^6$, $Z^{6'}$, $Z^7$, $Z^{7'}$, $Z^8$, $Z^9$, $Z^{10}$, $Z^{11}$, $Z^{12}$, $Z^{13}$, $Z^{14}$, and $Z^{15}$ are each independently C or N; $R^A$, $R^B$, $R^C$, $R^D$, $R^E$, $L^1$, $L^2$, $L^3$, m1, m2, and m3 are as defined above in connection with Formulas I, II, and III; $R^F$ represents mono- to maximum possible number of substitutions, or no substitution; each $R^F$ is independently a hydrogen or a substituent selected from the group consisting of the general substituents defined herein; and any two substituents can be joined or fused into a ring. In some embodiments of the compound each $R^A$, $R^B$, $R^C$, $R^D$, $R^E$, and $R^F$ is independently a hydrogen or a substituent selected from the group consisting of the preferred general substituents defined herein.

In some embodiments of the compound, wherein the compound has the structure according to Formula X

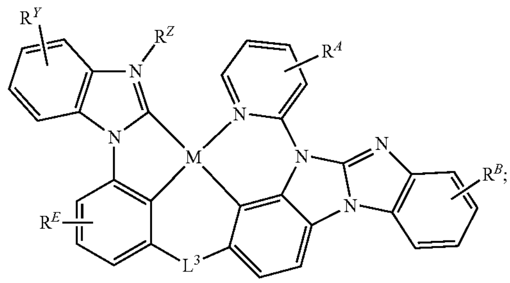

where; $R^Y$ represents mono- to tetra-substitutions, or no substitution; any two substituents can be joined or fused into a ring; $R^Y$ is a hydrogen or a substituent selected from the group consisting of the general substituents defined herein; and where $R^Z$ is selected from the group consisting of alkyl, cycloalkyl, heteroalkyl, heterocycloalkyl, arylalkyl, silyl, aryl, heteroaryl, boryl, partially or fully deuterated variants thereof, partially or fully fluorinated variants thereof, and combinations thereof.

In some embodiments of the compound, at least one of $R^A$, $R^B$, $R^C$, $R^D$, $R^E$, $R^F$, R and R' comprises a chemical group containing at least three 6-membered aromatic rings that are not fused next to each other. In some embodiments of the compound, at least one of $R^A$, $R^B$, $R^C$, $R^D$, $R^E$, $R^F$, R and R' comprises a chemical group containing at least four 6-membered aromatic rings that are not fused next to each other. In some embodiments of the compound, at least one of $R^A$, $R^B$, $R^C$, $R^D$, $R^E$. $R^F$, R and R' comprises a chemical group containing at least five 6-membered aromatic rings that are not fused next to each other. In some embodiments of the compound, at least one of $R^A$, $R^B$, $R^C$, $R^D$, $R^E$, $R^F$, R and R' comprises a chemical group containing at least six 6-membered aromatic rings that are not fused next to each other.

In some embodiments of the compound having the structure according to Formula X, at least one of $R^Y$ and $R^Z$ comprises a chemical group containing at least three 6-membered aromatic rings that are not fused next to each other. In some embodiments, at least one of $R^Y$ and $R^Z$ comprises a chemical group containing at least four 6-membered aromatic rings that are not fused next to each other. In some embodiments, at least one of $R^Y$ and $R^Z$ comprises a chemical group containing at least three 6-membered aromatic rings that are not fused next to each other. In some embodiments, at least one of $R^Y$ and $R^Z$ comprises a chemical group containing at least four 6-membered aromatic rings that are not fused next to each other. In some embodiments, at least one of $R^Y$ and $R^Z$ comprises at least five 6-membered aromatic rings that are not fused next to each other. In some embodiments, at least one of $R^Y$ and $R^Z$ comprises at least six 6-membered aromatic rings that are not fused next to each other.

In some embodiments of the compound, the compound is the compound x having the formula $(L_{Xi})Pt(L_{Yj})(L_{Zk})$;

where, $L_{Xi}$ is a bidentate ligand;

$L_{Yj}$ is a monodentate ligand;

$L_{Zk}$ is a monodentate ligand;

$L_{Xi}$ is linked to $L_{Zk}$ by a linking group $L^3$.

$L_{Zk}$ is linked to $L_{Yj}$ by a direct bond;

$x=30(k-1)+j+1200(i-1)$, i is an integer from 1 to 212258, j is an integer from 1 to 30, and k is an integer from 1 to 40; when k=41, 42, or 43, $x=25(k-41)+j+75(i-1)+254709600$, i is an integer from 1 to 212258, j is an integer from 1 to 25;

$L_{Xi}$ is selected from the group consisting of $L_{X1}$ to $L_{X212258}$ whose structures are defined as follows:

| $L_{Xi}$ | Structure of $L_{Xi}$ | $Ar^1$, $R^1$ | *i* |
|---|---|---|---|
| wherein $L_{X1}$ to $L_{X9900}$ have the structure | 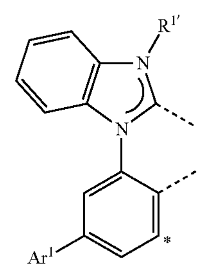 | wherein $Ar^1$ = A*m* and $R^{1'}$ = R*n*, wherein *m* is an integer from 1 to 30 and *n* is an integer from 1 to 330, and | $y = 330(m - 1) + n$ |
| wherein $L_{X9901}$-$L_{X19800}$ have the structure | 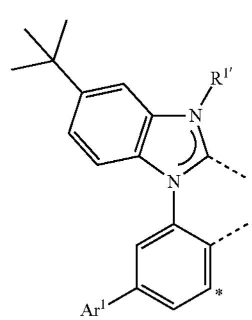 | wherein $Ar^1$ = A*m* and $R^{1'}$ = R*n*, wherein *m* is an integer from 1 to 30 and *n* is an integer from 1 to 330, and | $y = 330(m - 1) + n + 9900$ |

-continued

| $L_{Xi}$ | Structure of $L_{Xi}$ | $Ar^1$, $R^1$ | *i* |
|---|---|---|---|
| wherein $L_{X19801}$-$L_{X29700}$ have the structure | 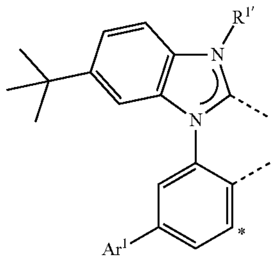 | wherein $Ar^1 = Am$ and $R^{1'} = Rn$, wherein *m* is an integer from 1 to 30 and *n* is an integer from 1 to 330, and | $y = 330(m - 1) + n + 19800$ |
| wherein $L_{X29701}$-$L_{X39600}$ have the structure | 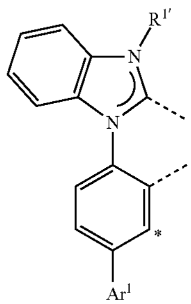 | wherein $Ar^1 = Am$ and $R^{1'} = Rn$, wherein *m* is an integer from 1 to 30 and *n* is an integer from 1 to 330, and | $y = 330(m - 1) + n + 29700$ |
| wherein $L_{X39601}$-$L_{X49500}$ have the structure | 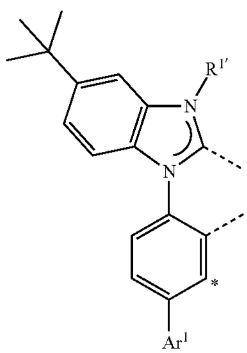 | wherein $Ar^1 = Am$ and $R^{1'} = Rn$, wherein *m* is an integer from 1 to 30 and *n* is an integer from 1 to 330, and | $y = 330(m - 1) + n + 39600$ |
| wherein $L_{X49501}$-$L_{X59400}$ have the structure | 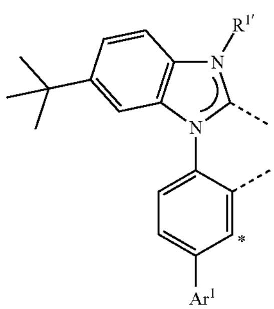 | wherein $Ar^1 = Am$ and $R^{1'} = Rn$, wherein *m* is an integer from 1 to 30 and *n* is an integer from 1 to 330, and | $y = 330(m - 1) + n + 49500$ |
| wherein $L_{X59401}$-$L_{X69300}$ have the structure | 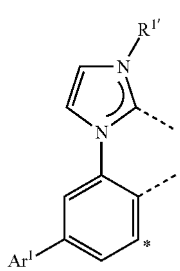 | wherein $Ar^1 = Am$ and $R^{1'} = Rn$, wherein *m* is an integer from 1 to 30 and *n* is an integer from 1 to 330, and | $y = 330(m - 1) + n + 59400$ |

-continued

| $L_{Xi}$ | Structure of $L_{Xi}$ | $Ar^1$, $R^1$ | $i$ |
|---|---|---|---|
| wherein $L_{X69301}$-$L_{X79200}$ have the structure | 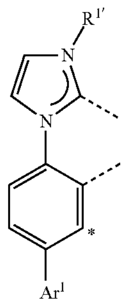 | wherein $Ar^1$ = A$m$ and $R^{1'}$ = R$n$, wherein $m$ is an integer from 1 to 30 and $n$ is an integer from 1 to 330, and | $y = 330(m-1) + n + 69300$ |
| wherein $L_{X79201}$ to $L_{X79530}$ have the structure | 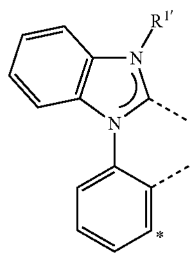 | wherein $R^{1'}$ = R$n$, wherein $n$ is an integer from 1 to 330, and | $y = n + 79200$ |
| wherein $L_{X79531}$-$L_{X79860}$ have the structure | 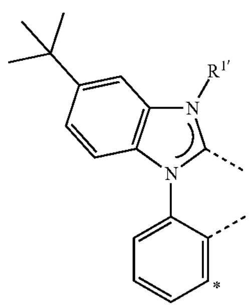 | wherein $R^{1'}$ = R$n$, wherein $n$ is an integer from 1 to 330, and | $y = n + 79530$ |
| wherein $L_{X79861}$-$L_{X80190}$ have the structure | 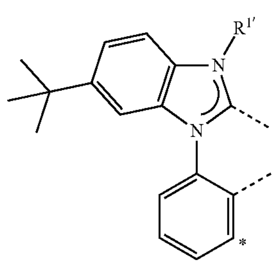 | wherein $R^{1'}$ = R$n$, wherein $n$ is an integer from 1 to 330, and | $y = n + 79860$ |
| wherein $L_{X80191}$-$L_{X80520}$ have the structure | 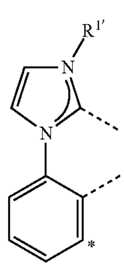 | wherein $R^{1'}$ = R$n$, wherein $n$ is an integer from 1 to 330, and | $y = n + 80190$ |

-continued

| $L_{Xi}$ | Structure of $L_{Xi}$ | $Ar^1$, $R^1$ | i |
|---|---|---|---|
| wherein $L_{X80521}$ to $L_{X90420}$ have the structure | 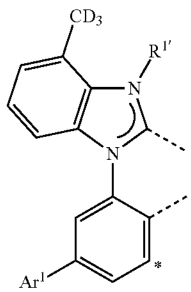 | wherein $Ar^1$ = Am and $R^{1'}$ = Rn, wherein m is an integer from 1 to 30 and n is an integer from 1 to 330, and | $y = 330(m - 1) + n + 80520$ |
| wherein $L_{X90421}$ to $L_{X100320}$ have the structure | 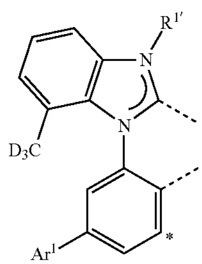 | wherein $Ar^1$ = Am and $R^{1'}$ = Rn, wherein m is an integer from 1 to 30 and n is an integer from 1 to 330, and | $y = 330(m - 1) + n + 90420$ |
| wherein $L_{X100321}$ to $L_{X110220}$ have the structure | 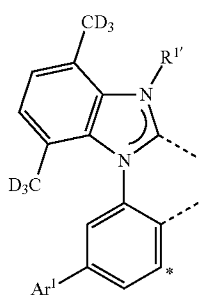 | wherein $Ar^1$ = Am and $R^{1'}$ = Rn, wherein m is an integer from 1 to 30 and n is an integer from 1 to 330, and | $y = 330(m - 1) + n + 100320$ |
| wherein $L_{X110221}$ to $L_{X120120}$ have the structure | 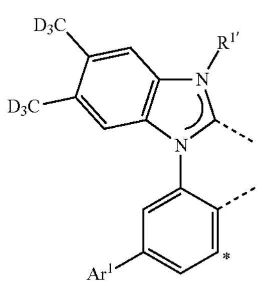 | wherein $Ar^1$ = Am and $R^{1'}$ = Rn, wherein m is an integer from 1 to 30 and n is an integer from 1 to 330, and | $y = 330(m - 1) + n + 110220$ |
| wherein $L_{X120121}$ to $L_{X130020}$ have the structure | 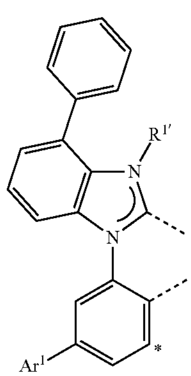 | wherein $Ar^1$ = Am and $R^{1'}$ = Rn, wherein m is an integer from 1 to 30 and n is an integer from 1 to 330, and | $y = 330(m - 1) + n + 120120$ |

-continued

| $L_{Xi}$ | Structure of $L_{Xi}$ | $Ar^1$, $R^1$ | $i$ |
|---|---|---|---|
| wherein $L_{X130021}$ to $L_{X139920}$ have the structure | 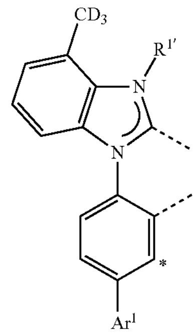 | wherein $Ar^1$ = A$m$ and $R^{1'}$ = R$n$, wherein $m$ is an integer from 1 to 30 and $n$ is an integer from 1 to 330, and | $y = 330(m - 1) + n + 130020$ |
| wherein $L_{X139921}$ to $L_{X149820}$ have the structure | 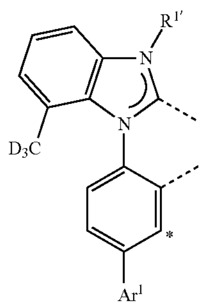 | wherein $Ar^1$ = A$m$ and $R^{1'}$ = R$n$, wherein $m$ is an integer from 1 to 30 and $n$ is an integer from 1 to 330, and | $y = 330(m - 1) + n + 139920$ |
| wherein $L_{X149821}$ to $L_{X159720}$ have the structure | 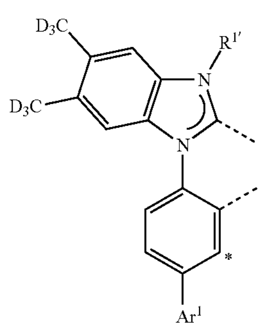 | wherein $Ar^1$ = A$m$ and $R^{1'}$ = R$n$, wherein $m$ is an integer from 1 to 30 and $n$ is an integer from 1 to 330, and | $y = 330(m - 1) + n + 149820$ |
| wherein $L_{X159721}$ to $L_{X169620}$ have the structure | 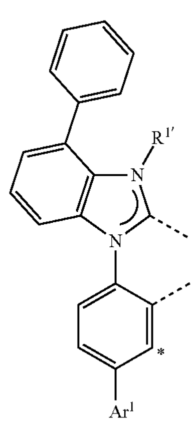 | wherein $Ar^1$ = A$m$ and $R^{1'}$ = R$n$, wherein $m$ is an integer from 1 to 30 and $n$ is an integer from 1 to 330, and | $y = 330(m - 1) + n + 159720$ |

-continued

| $L_{Xi}$ | Structure of $L_{Xi}$ | $Ar^1$, $R^1$ | $i$ |
|---|---|---|---|
| wherein $L_{X169621}$ to $L_{X169950}$ have the structure | 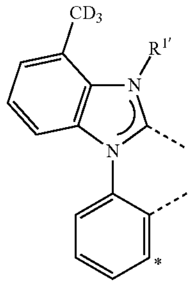 | wherein $R^{1'} = Rn$, wherein $n$ is an integer from 1 to 330, and | $y = n + 169620$ |
| wherein $L_{X169951}$ to $L_{X170280}$ have the structure | 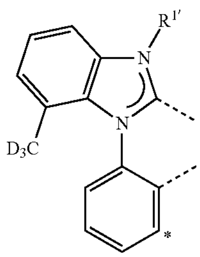 | wherein $R^{1'} = Rn$, wherein $n$ is an integer from 1 to 330, and | $y = n + 169950$ |
| wherein $L_{X170281}$ to $L_{X170610}$ have the structure | 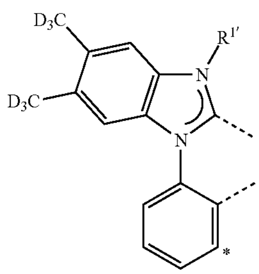 | wherein $R^{1'} = Rn$, wherein $n$ is an integer from 1 to 330, and | $y = n + 170280$ |
| wherein $L_{X170610}$ to $L_{X170940}$ have the structure | 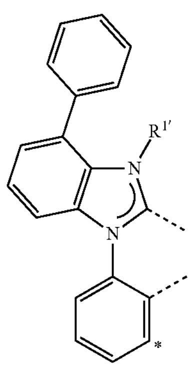 | wherein $R^{1'} = Rn$, wherein $n$ is an integer from 1 to 330, and | $y = n + 170610$ |
| wherein $L_{X170941}$ to $L_{X171270}$ have the structure | 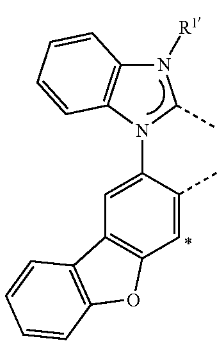 | wherein $R^{1'} = Rn$, wherein $n$ is an integer from 1 to 330, and | $y = n + 170940$ |

-continued

| $L_{Xi}$ | Structure of $L_{Xi}$ | $Ar^1$, $R^1$ | $i$ |
|---|---|---|---|
| wherein $L_{X171271}$ to $L_{X171600}$ have the structure | 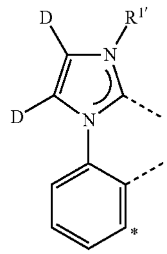 | wherein $R^{1'} = Rn$, wherein $n$ is an integer from 1 to 330, and | $y = n + 171270$ |
| wherein $L_{X171601}$ to $L_{X181500}$ have the structure | 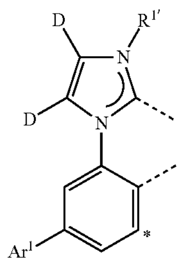 | wherein $Ar^1 = Am$ and $R^{1'} = Rn$, wherein $m$ is an integer from 1 to 30 and $n$ is an integer from 1 to 330, and | $y = 330(m - 1) + n + 171600$ |
| wherein $L_{X181501}$ to $L_{X191400}$ have the structure | 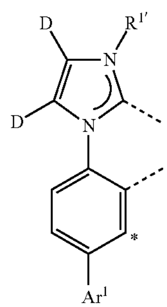 | wherein $Ar^1 = Am$ and $R^{1'} = Rn$, wherein $m$ is an integer from 1 to 30 and $n$ is an integer from 1 to 330, and | $y = 330(m - 1) + n + 181500$ |
| wherein $L_{X191401}$ to $L_{X191730}$ have the structure | 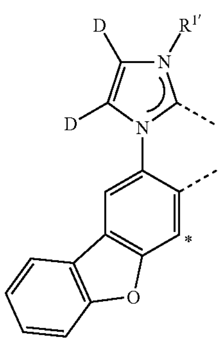 | wherein $R^{1'} = Rn$, wherein $n$ is an integer from 1 to 330, and | $y = n + 191400$ |
| wherein $L_{X191731}$ to $L_{X192060}$ have the structure | 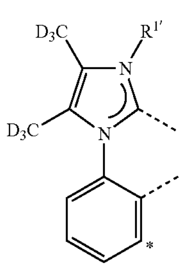 | wherein $R^{1'} = Rn$, wherein $n$ is an integer from 1 to 330, and | $y = n + 191730$ |

-continued

| $L_{Xi}$ | Structure of $L_{Xi}$ | $Ar^1$, $R^1$ | $i$ |
|---|---|---|---|
| wherein $L_{X192061}$ to $L_{X201960}$ have the structure | 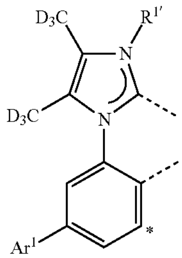 | wherein $Ar^1$ = A*m* and $R^{1'}$ = R*n*, wherein *m* is an integer from 1 to 30 and *n* is an integer from 1 to 330, and | $y = 330(m - 1) + n + 192060$ |
| wherein $L_{X201961}$ to $L_{X211860}$ have the structure | 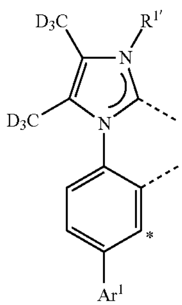 | wherein $Ar^1$ = A*m* and $R^{1'}$ = R*n*, wherein *m* is an integer from 1 to 30 and *n* is an integer from 1 to 330, and | $y = 330(m - 1) + n + 201960$ |
| wherein $L_{X211861}$ to $L_{X212190}$ have the structure | 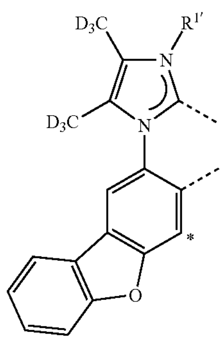 | wherein $R^{1'}$ = R*n*, wherein *n* is an integer from 1 to 330, and | $y = n + 211860$ |

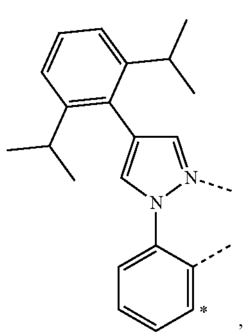

$L_{X212191}$

-continued

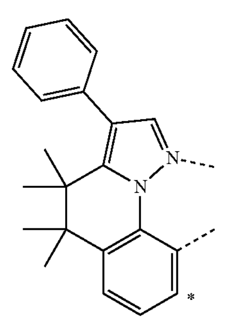

$L_{X212192}$

-continued
$L_{X212193}$
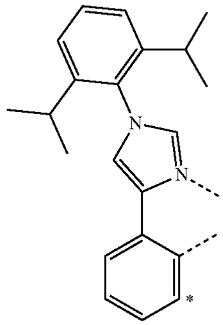
$L_{X212194}$
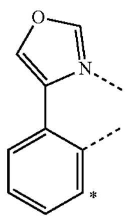
,
$L_{X212195}$
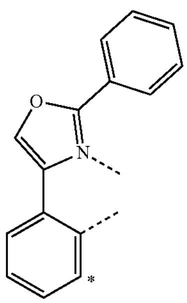
,
$L_{X212196}$
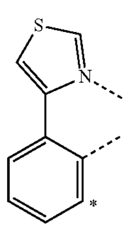
,
$L_{X212197}$
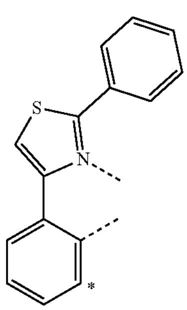
,
-continued
$L_{X212198}$
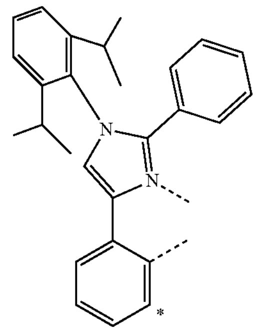
,
$L_{X212199}$
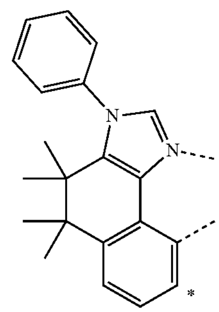
,
$L_{X212200}$
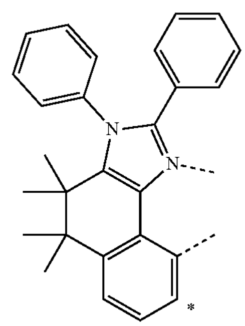
,
$L_{X212201}$
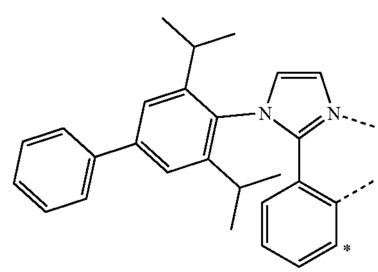
,
$L_{X212202}$
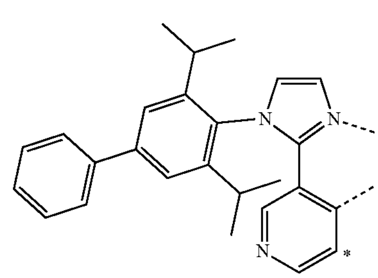
, -continued
$L_{X212203}$
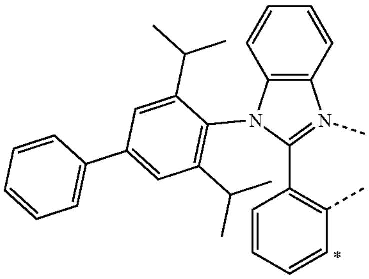
,
$L_{X212204}$
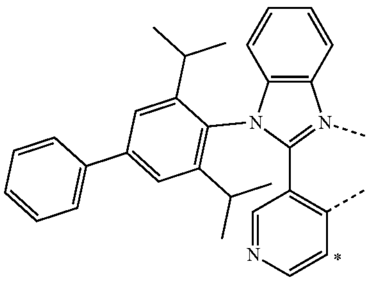
,
$L_{X212205}$
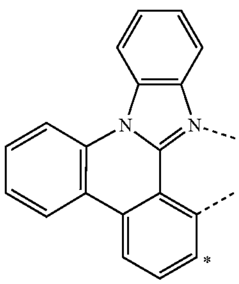
,
$L_{X212206}$
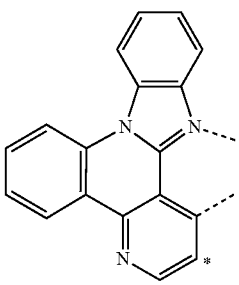
,
$L_{X212207}$
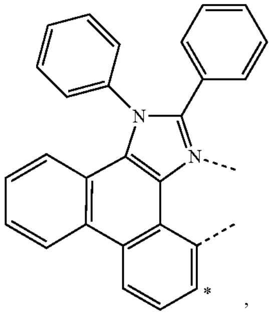
,
-continued
$L_{X212208}$
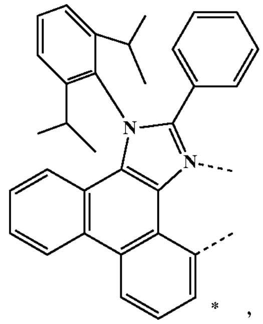
,
$L_{X212209}$
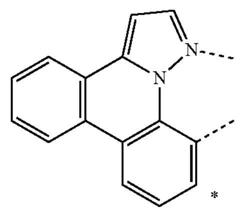
,
$L_{X212210}$
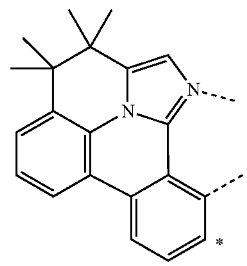
,
$L_{X212211}$
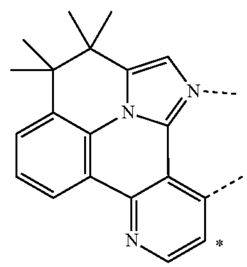
,
$L_{X212212}$
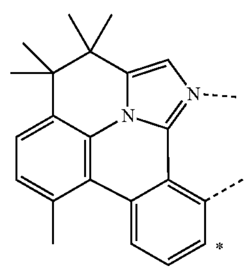
,
$L_{X212213}$
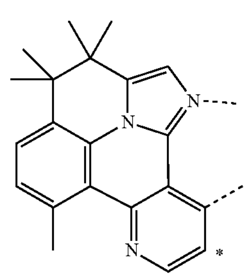
, -continued
$L_{X212214}$
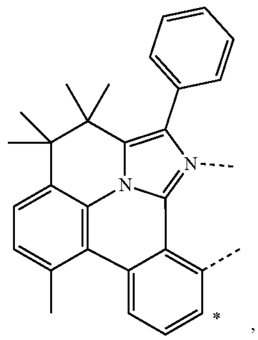
$L_{X212215}$
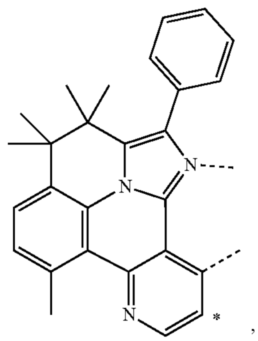
$L_{X212216}$
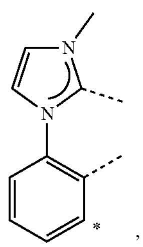
$L_{X212217}$
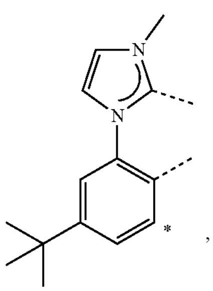
$L_{X212218}$
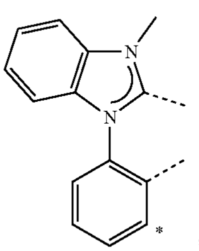
-continued
$L_{X212219}$
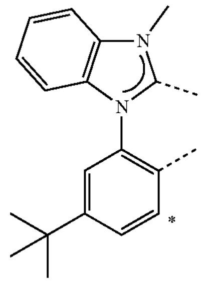
$L_{X212220}$
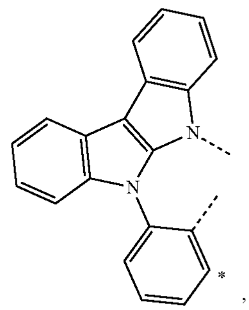
$L_{X212221}$
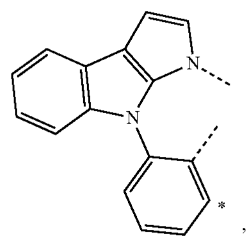
$L_{X212222}$
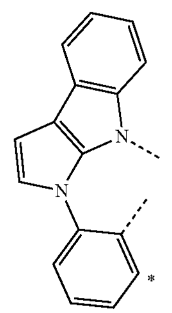
$L_{X212223}$
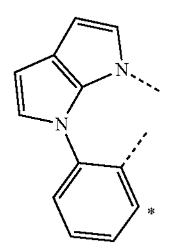
$L_{X212224}$
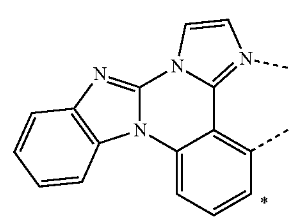

$L_{X212225}$
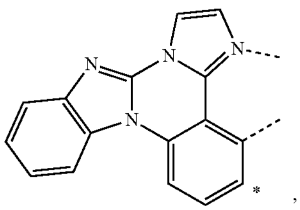
$L_{X212226}$
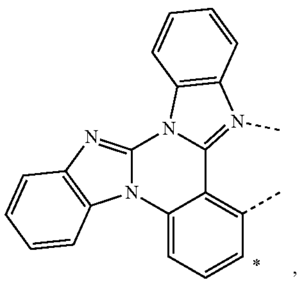
$L_{X212227}$
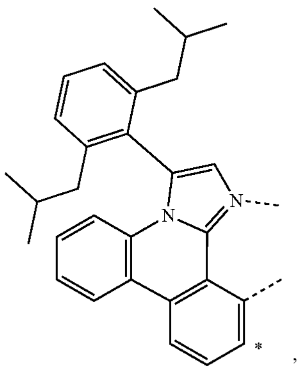
$L_{X212228}$
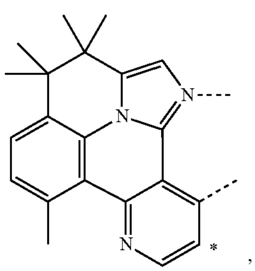
$L_{X212229}$
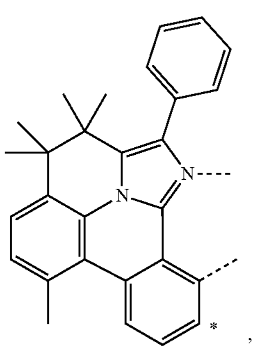
$L_{X212230}$
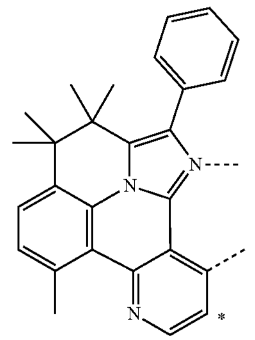
$L_{X212231}$
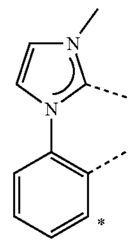
$L_{X212232}$
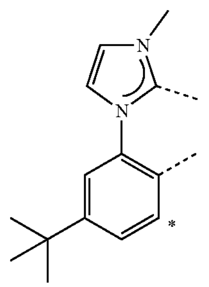
$L_{X212233}$
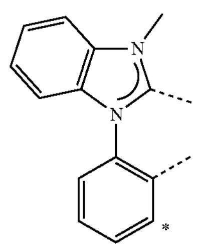
$L_{X212234}$
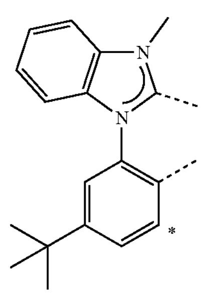

-continued
$L_{X212235}$
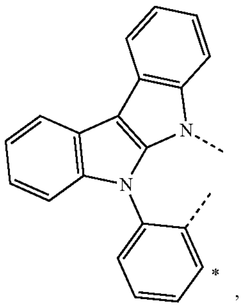
$L_{X212236}$
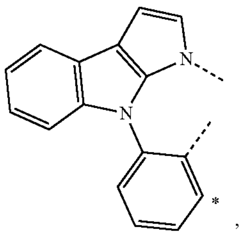
$L_{X212237}$
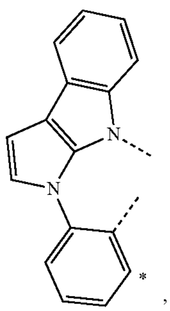
$L_{X212238}$
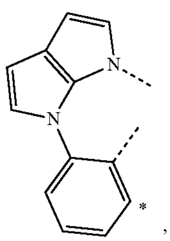
$L_{X212239}$
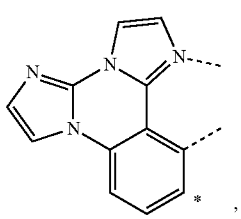
$L_{X212240}$
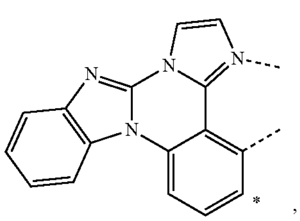
-continued
$L_{X212241}$
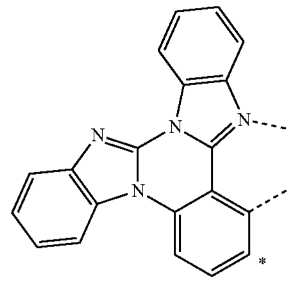
$L_{X212242}$
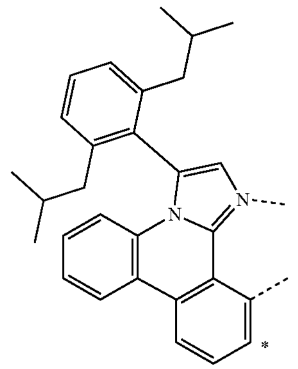
$L_{X212243}$
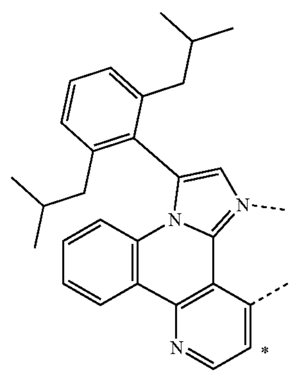
$L_{X212244}$
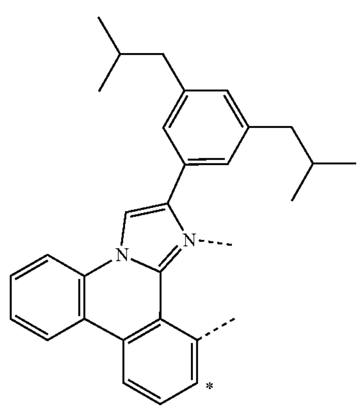

-continued
$L_{X212245}$
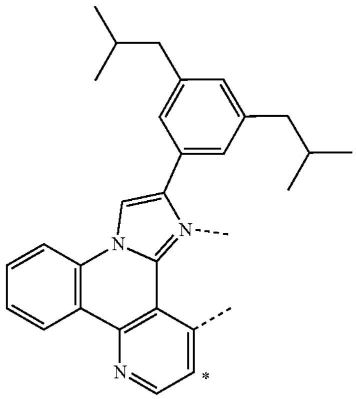
,
$L_{X212246}$
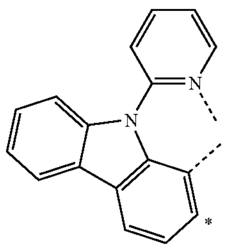
,
$L_{X212247}$
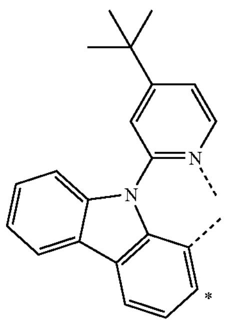
,
$L_{X212248}$
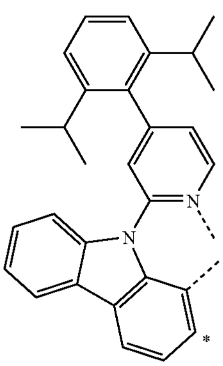
,
$L_{X212249}$
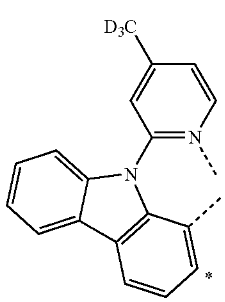
,
-continued
$L_{X212250}$
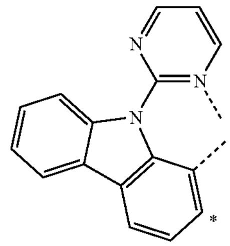
,
$L_{X212251}$
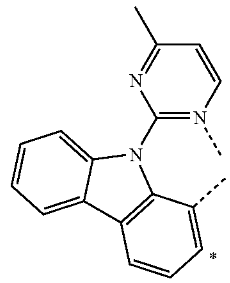
,
$L_{X212252}$
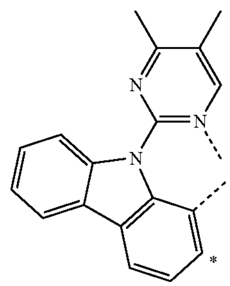
,
$L_{X212253}$
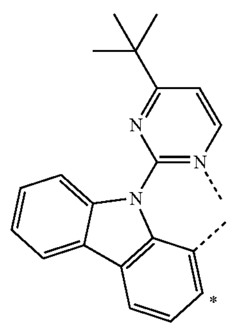
,
$L_{X212254}$
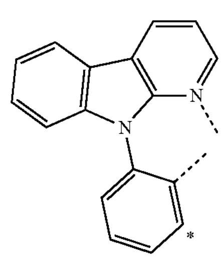
, -continued
$L_{X212255}$
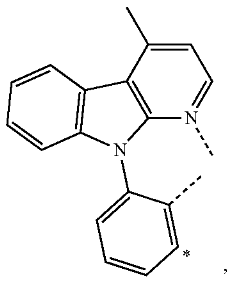
$L_{X212256}$
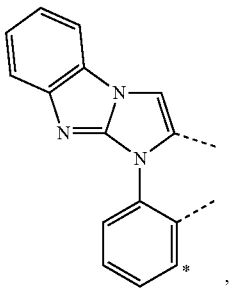
$L_{X212257}$
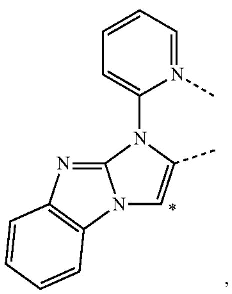
$L_{X212258}$
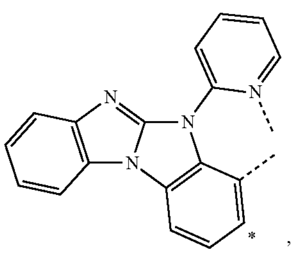
wherein A1 to A30 have the following structures:
A1
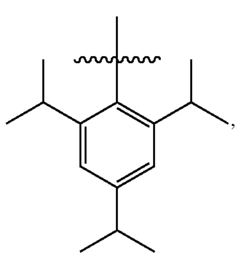
-continued
A2
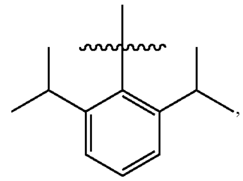
A3
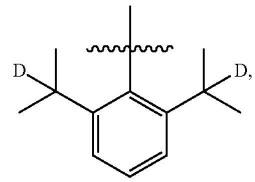
A4
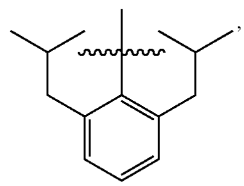
A5
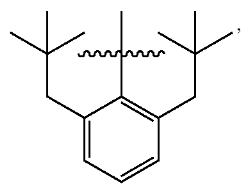
A6
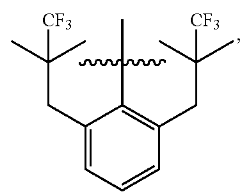
A7
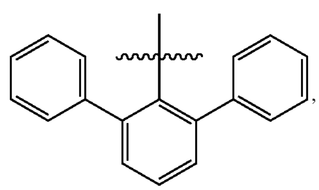
A8
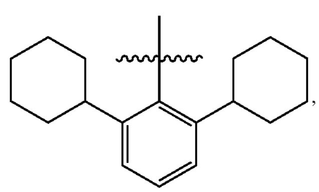
A9
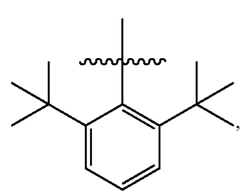

-continued
A10
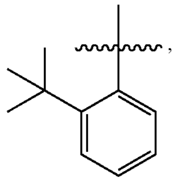
A11
Me,
A12
iPr,
A13
tBu,
A14
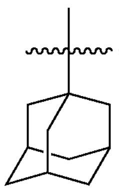
A15
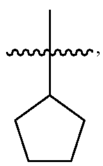
A16
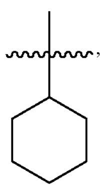
A17
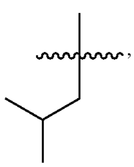
A18
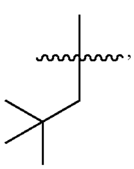
A19
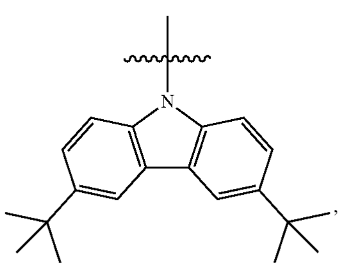
-continued
A20
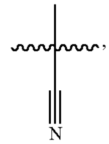
A21
$CD_3$,
A22
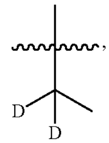
A23
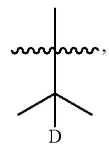
A24
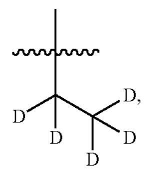
A25
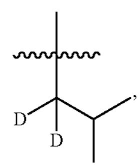
A26
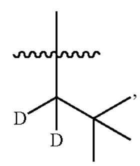
A27
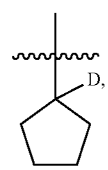
A28
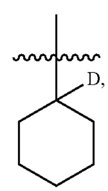
A29
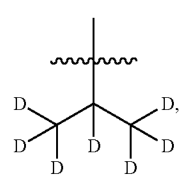

-continued
A30
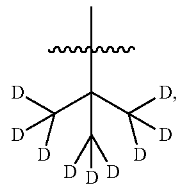
and R1 to R330 have the following structures:
R1
Et,
R2
iPr,
R3
tBu,
R4
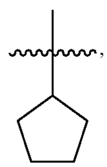
R5
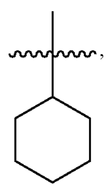
R6
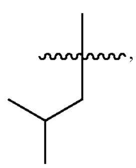
R7
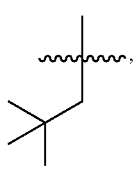
R8
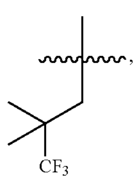
R9
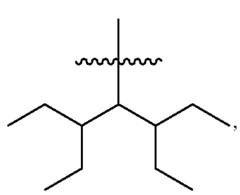
-continued
R10
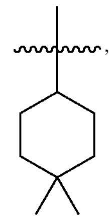
R11
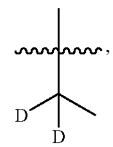
R12
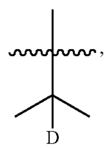
R13
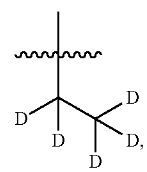
R14
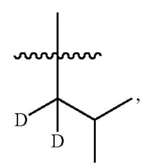
R15
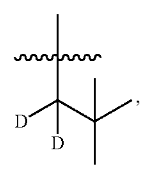
R16
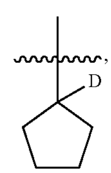
R17
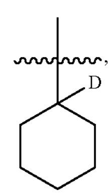
R18
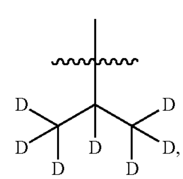

-continued
R19
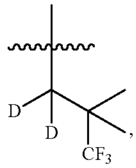
R20
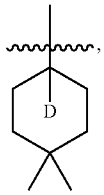
R21
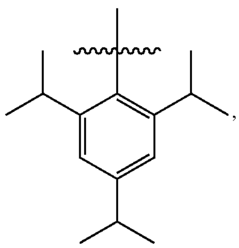
R22
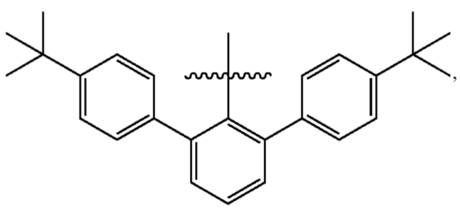
R23
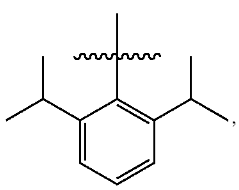
R24
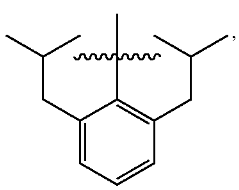
R25
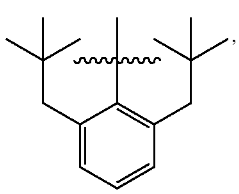
R26
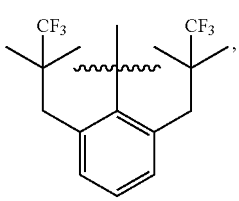
-continued
R27
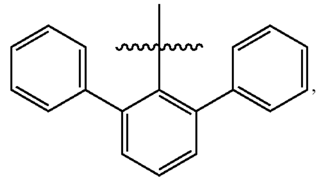
R28
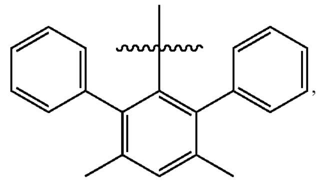
R29
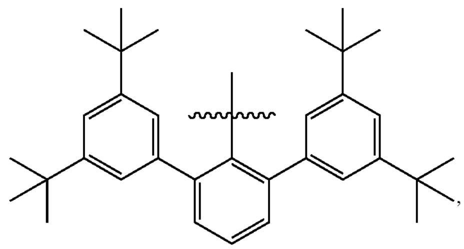
R30
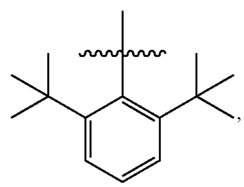
R31
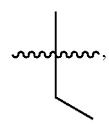
R32
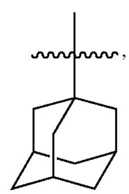
R33
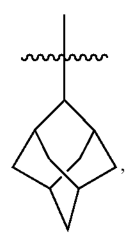
R34
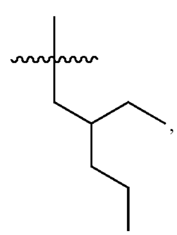

-continued
R35
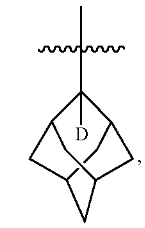
R36
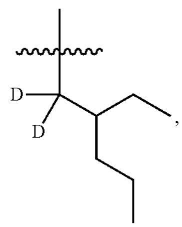
R37
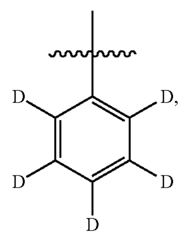
R38
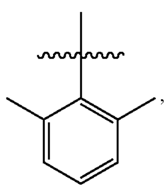
R39
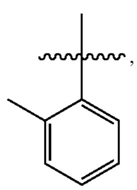
R40
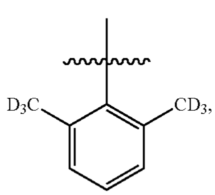
R41
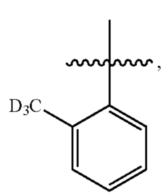
-continued
R42
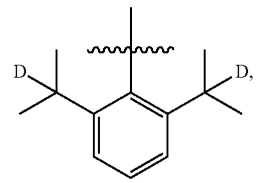
R43
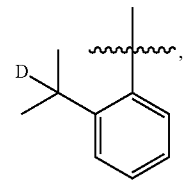
R44
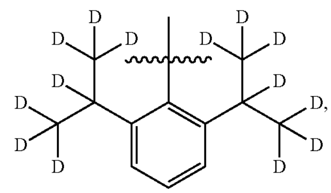
R45
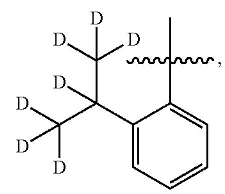
R46
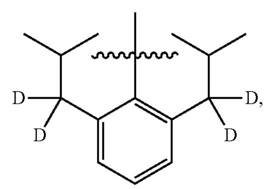
R47
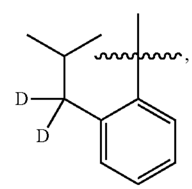
R48
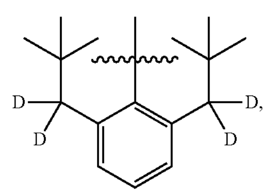
R49
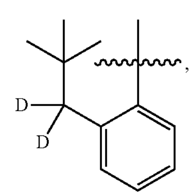

-continued
R50
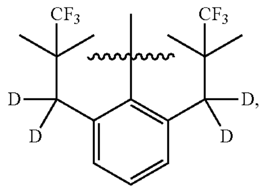
R51
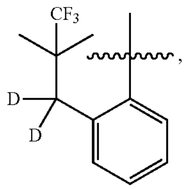
R52
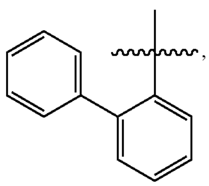
R53
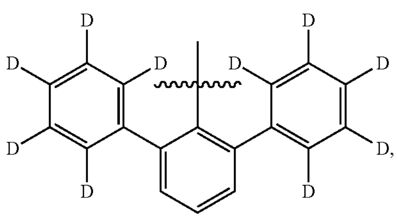
R54
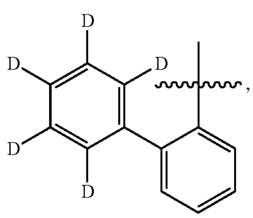
R55
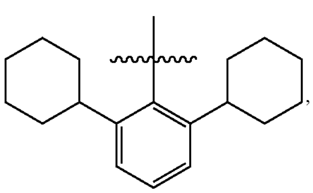
R56
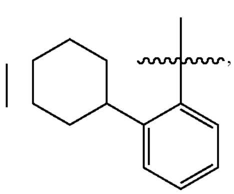
R57
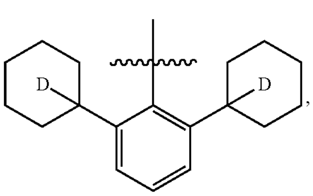
-continued
R58
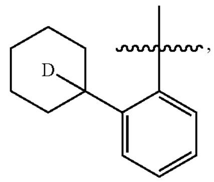
R59
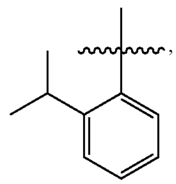
R60
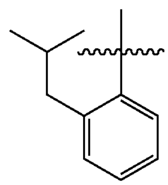
R61
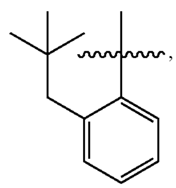
R62
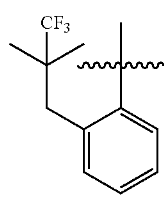
R63
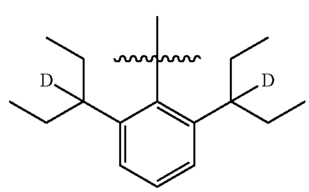
R64
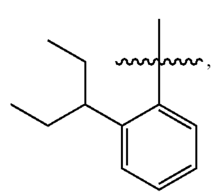
R65
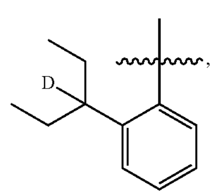

-continued
R66
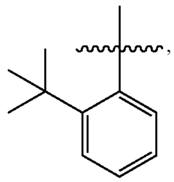
R67
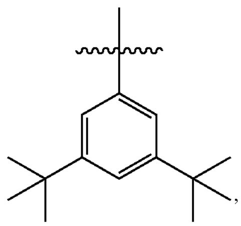
R68
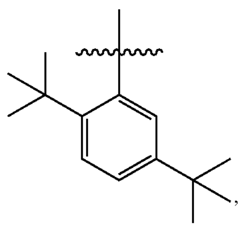
R69
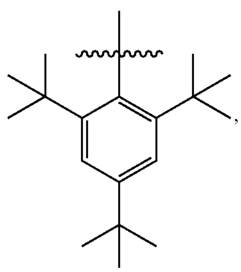
R70
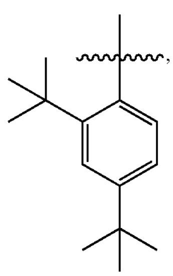
R71
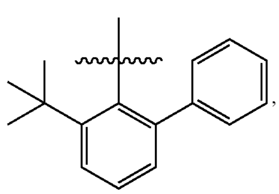
R72
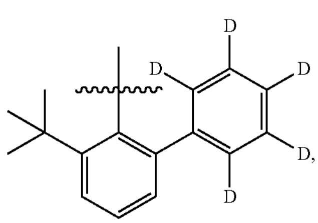
-continued
R73
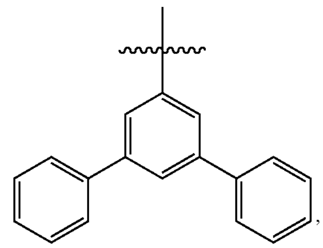
R74
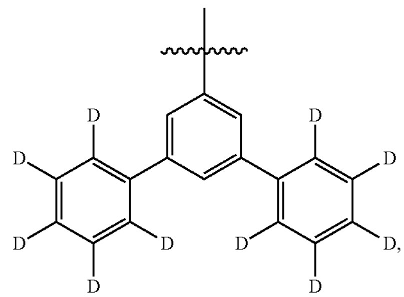
R75
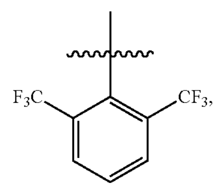
R76
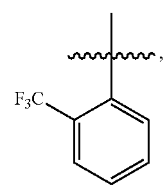
R77
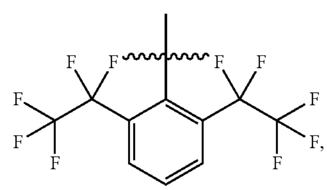
R78
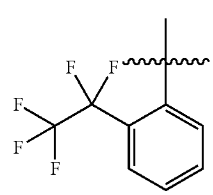
R79
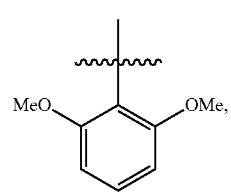

-continued
R80
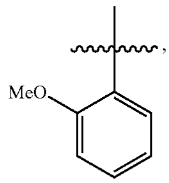
R81
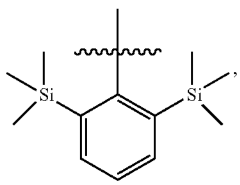
R82
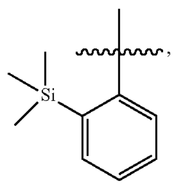
R83
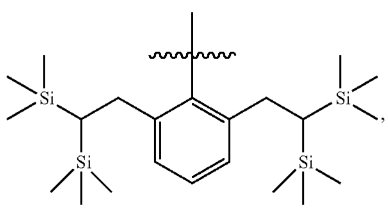
R84
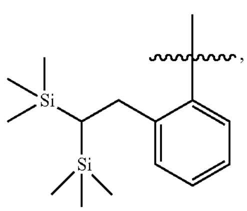
R85
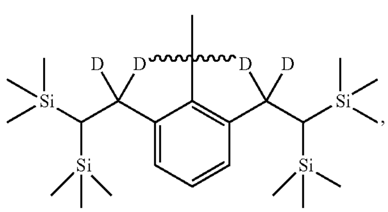
R86
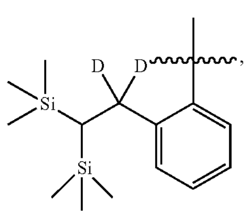
R87
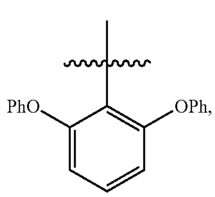
-continued
R88
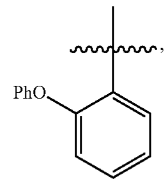
R89
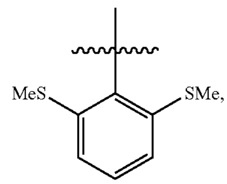
R90
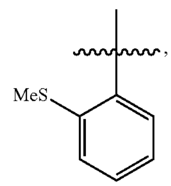
R91
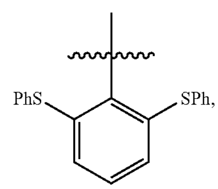
R92
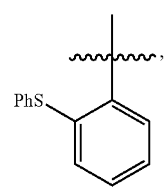
R93
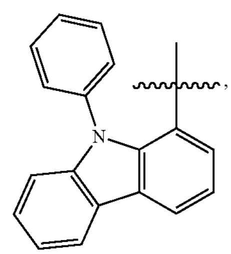
R94
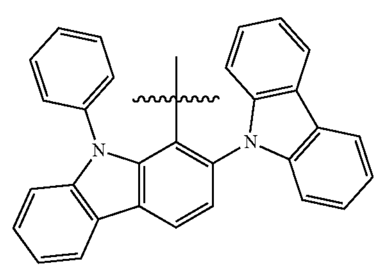

-continued
R95
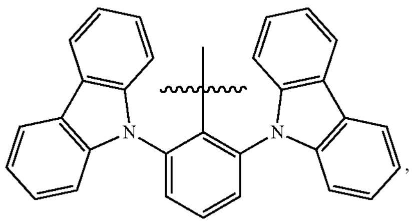
R96
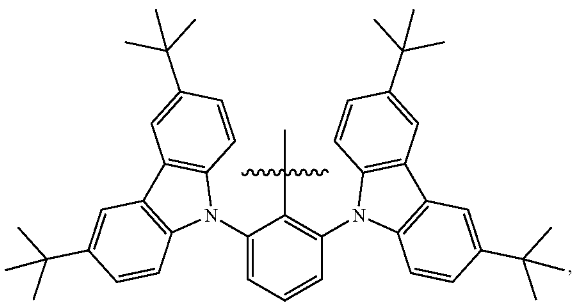
R97
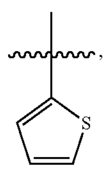
R98
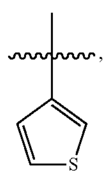
R99
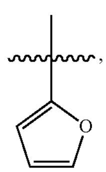
R100
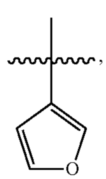
R101
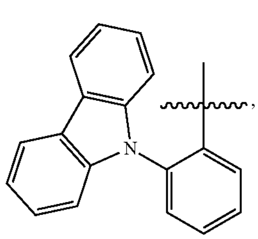
-continued
R102
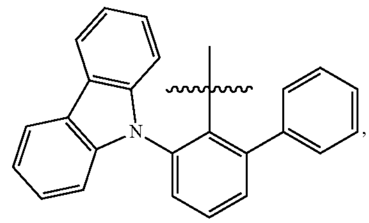
R103
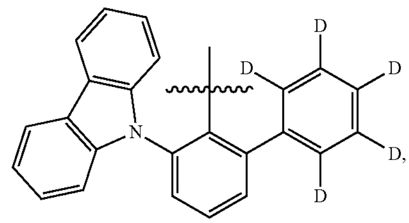
R104
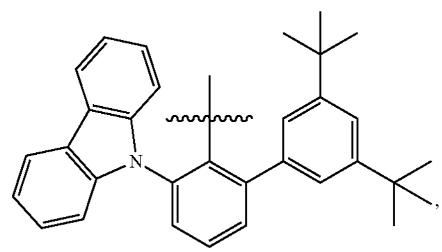
R105
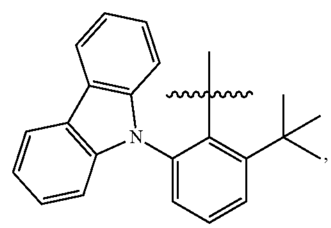
R106
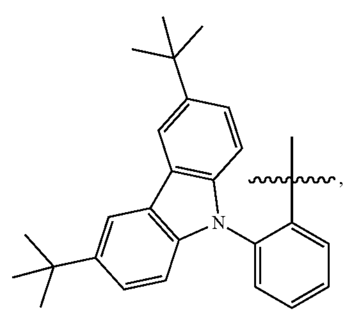
R107
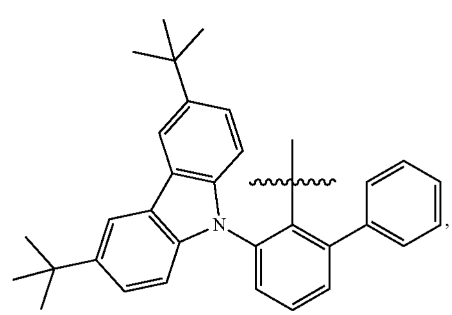

-continued
R108
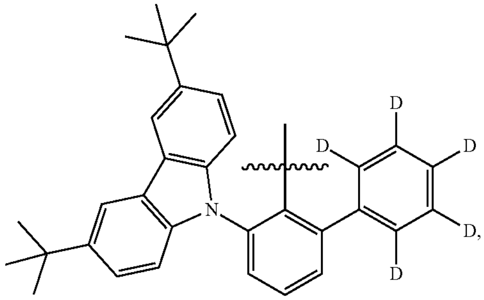
R109
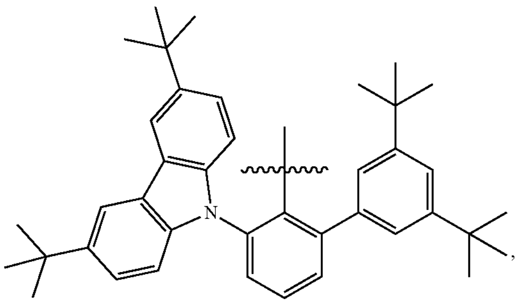
R110
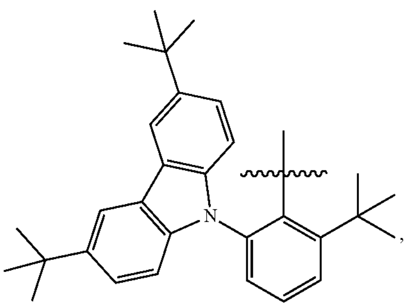
R111
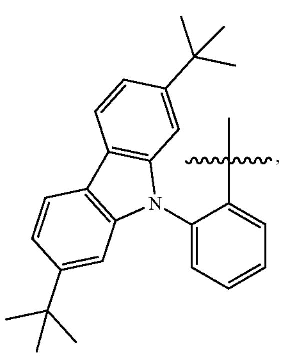
R112
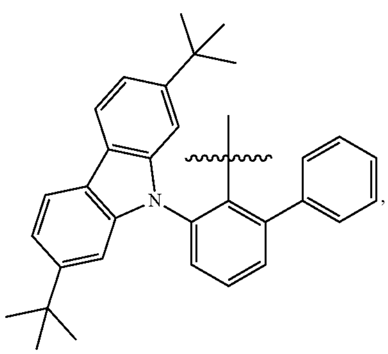
-continued
R113
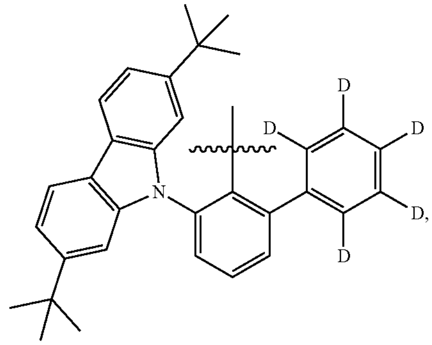
R114
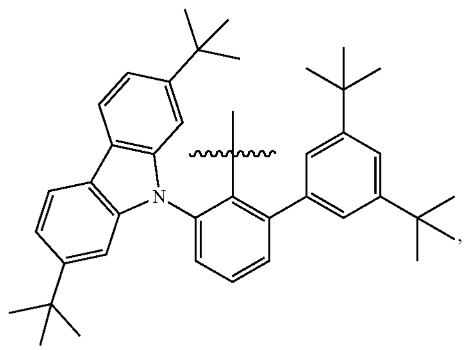
R115
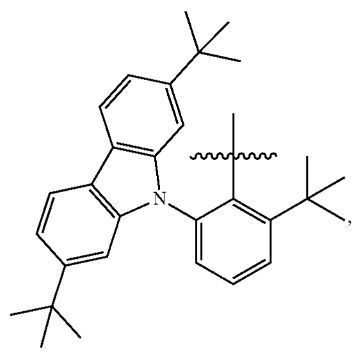
R116
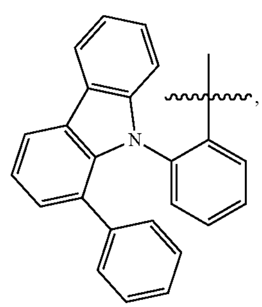

-continued
R117
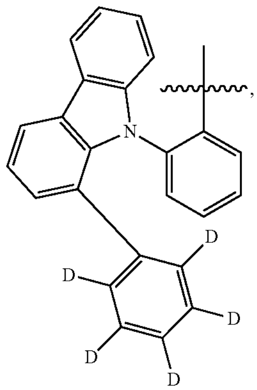
R118
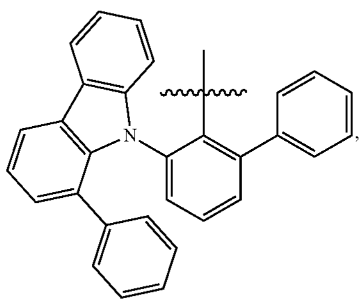
R119
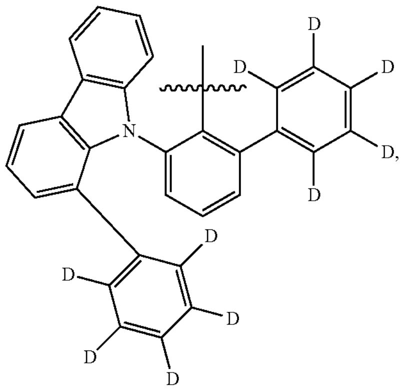
R120
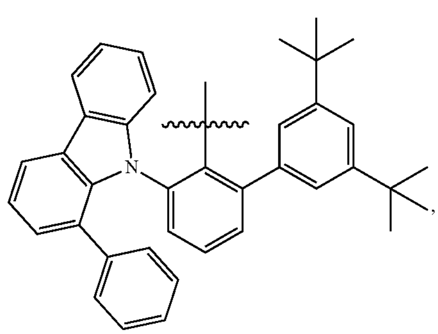
-continued
R121
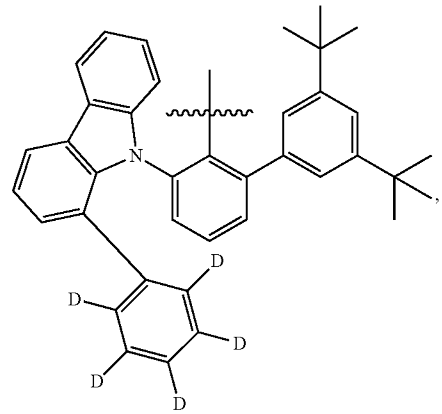
R122
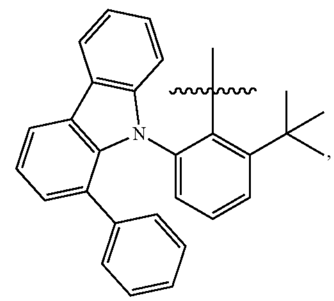
R123
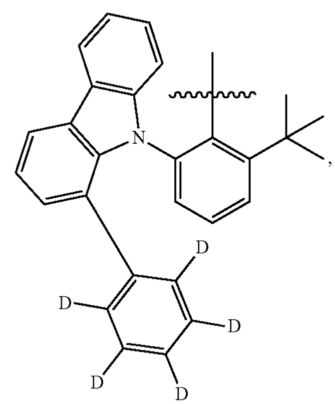
R124
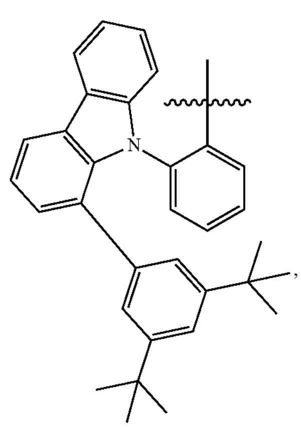

R125
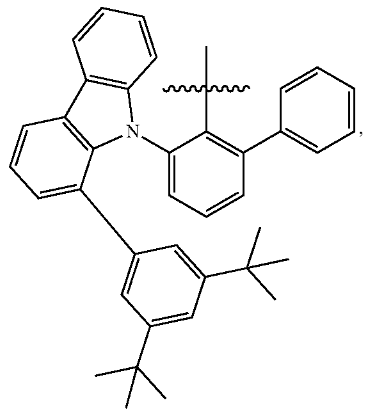
R126
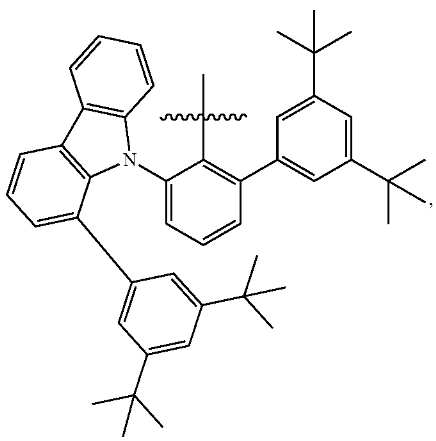
R127
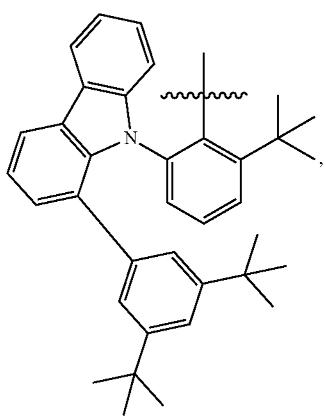
R128
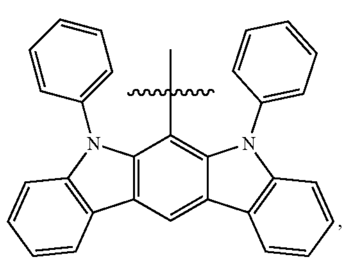
R129
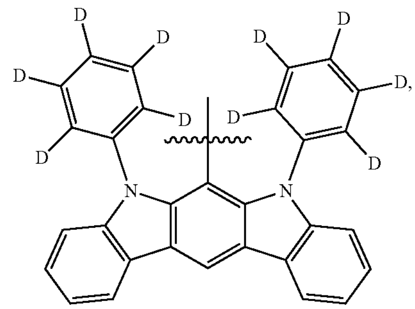
R130
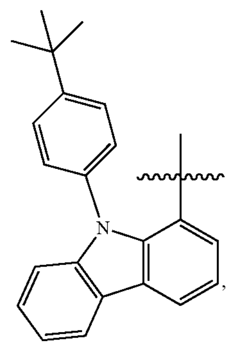
R131
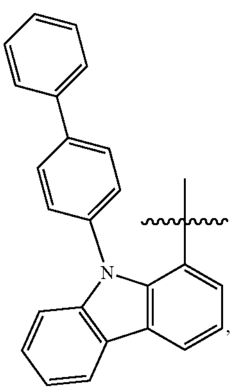
R132
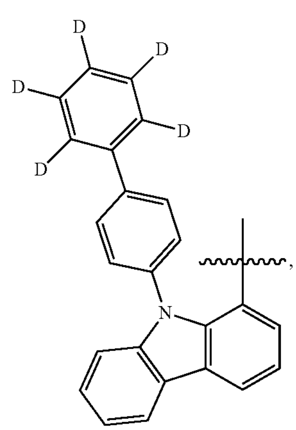

-continued
R133
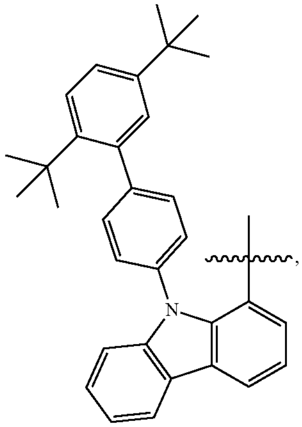
R134
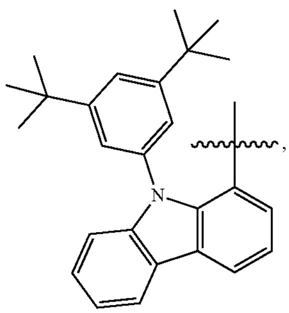
R135
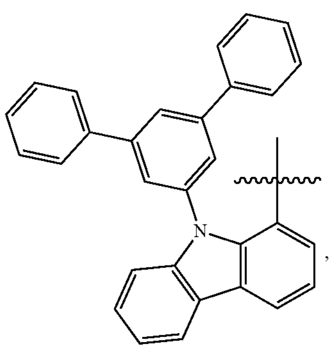
R136
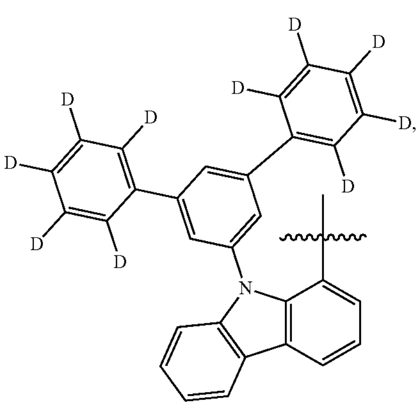
-continued
R137
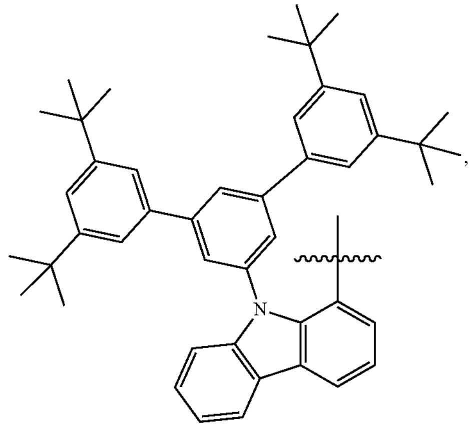
R138
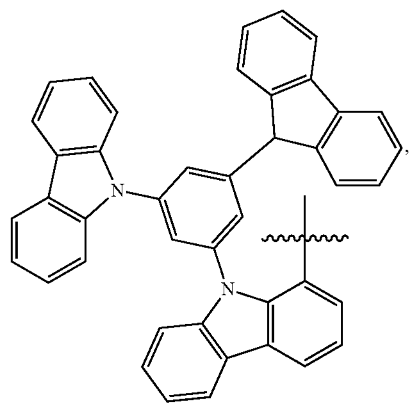
R139
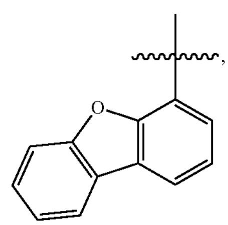
R140
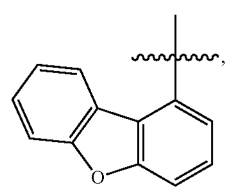
R141
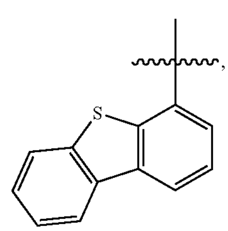

-continued
R142
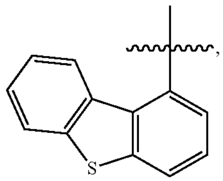
R143
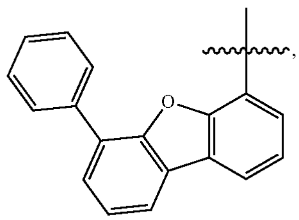
R144
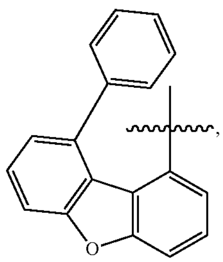
R145
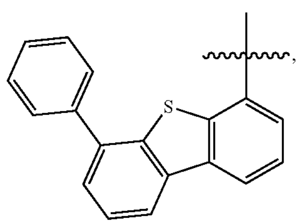
R146
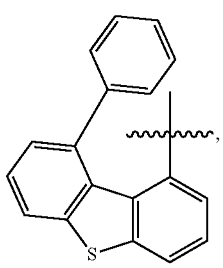
R147
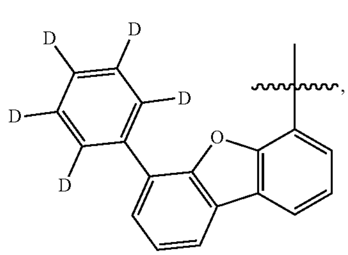
-continued
R148
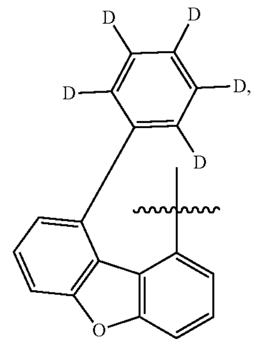
R149
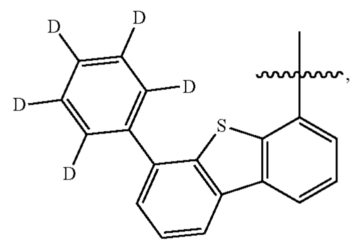
R150
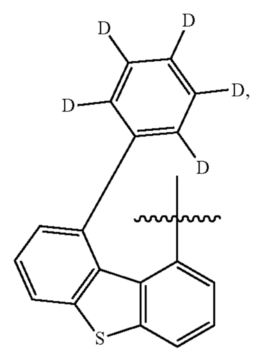
R151
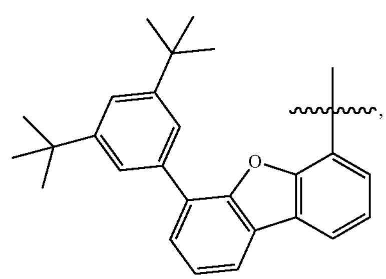
R152
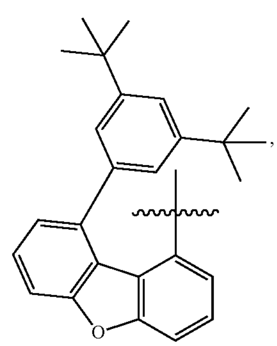

-continued
R153
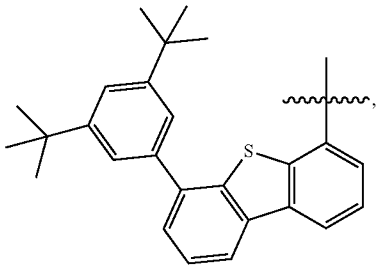
R154
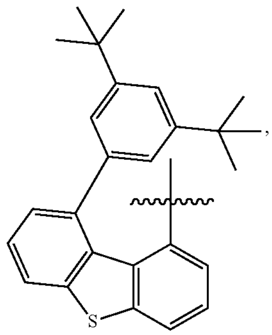
R155
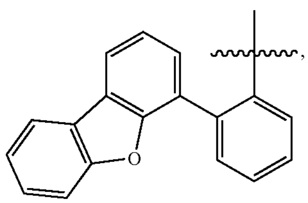
R156
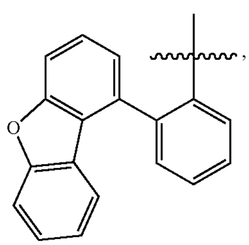
R157
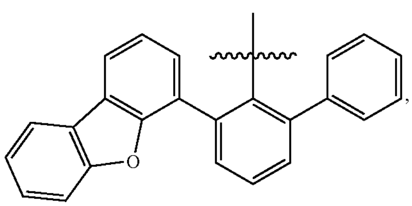
R158
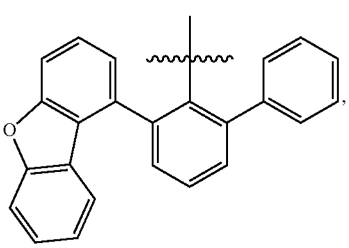
-continued
R159
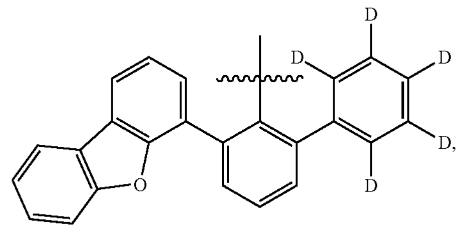
R160
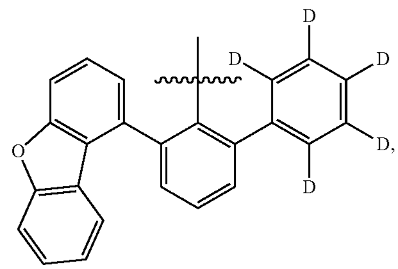
R161
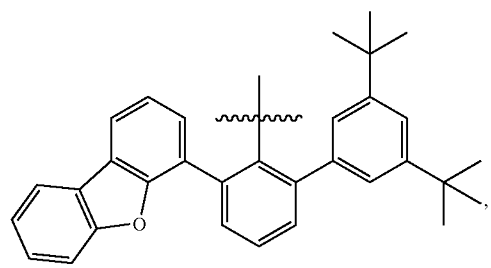
R162
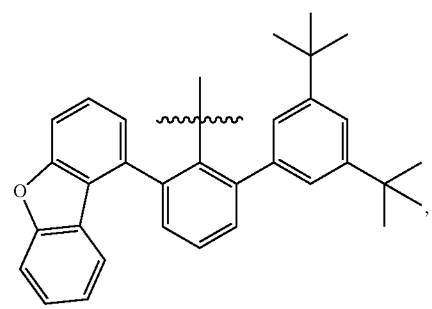
R163
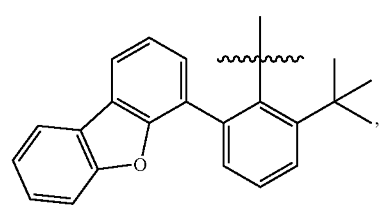
R164
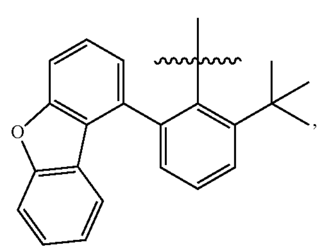

R165
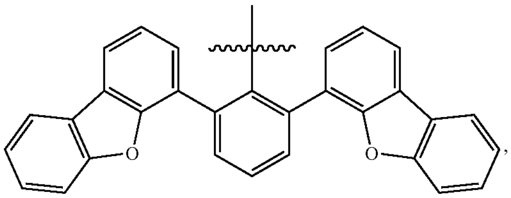
R166
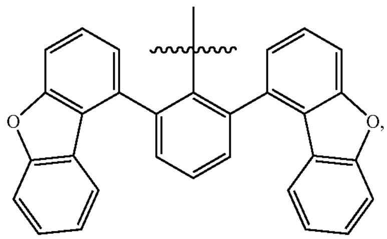
R167
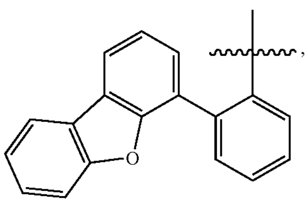
R168
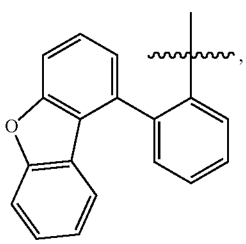
R169
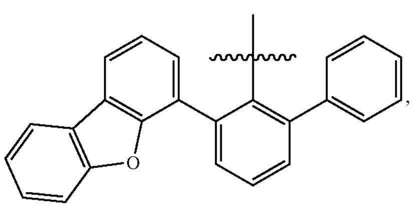
R170
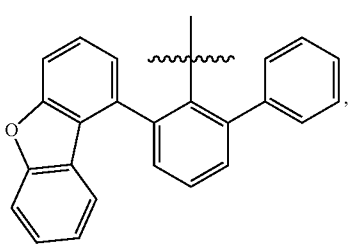
R171
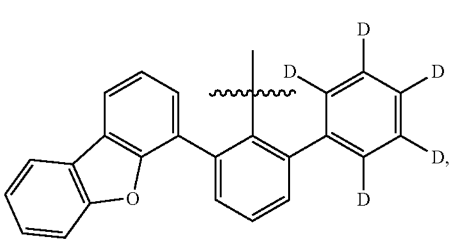
R172
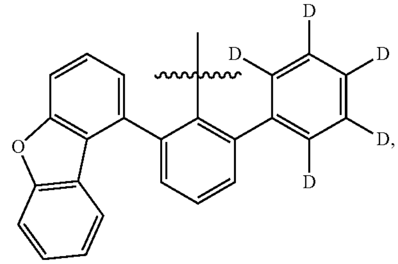
R173
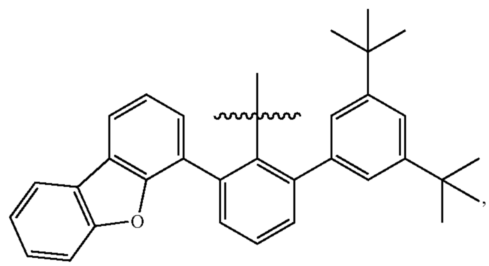
R174
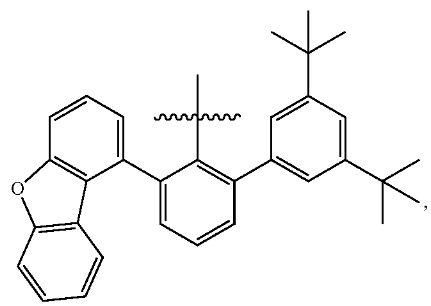
R175
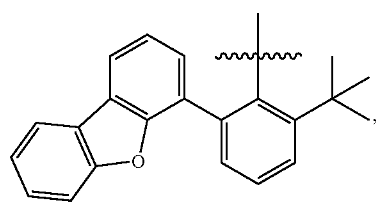
R176
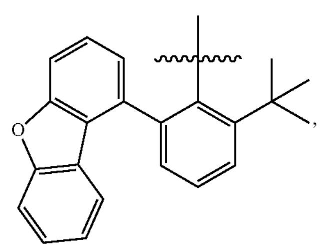
R177
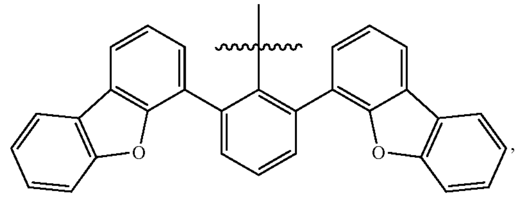

-continued
R178
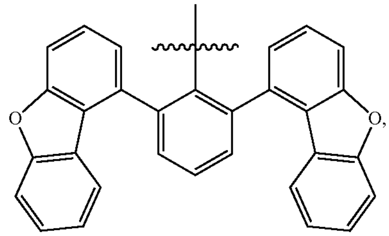
R179
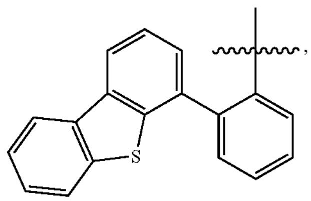
R180
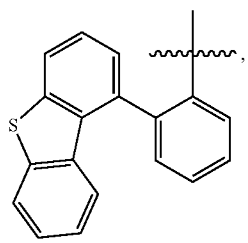
R181
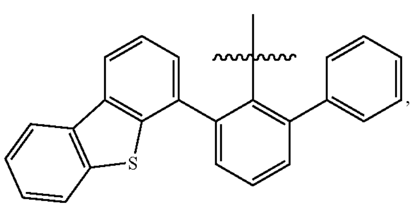
R182
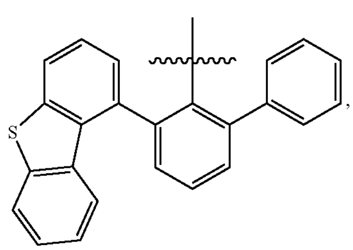
R183
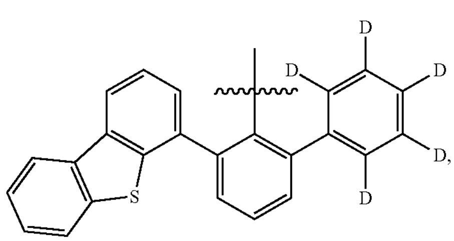
-continued
R184
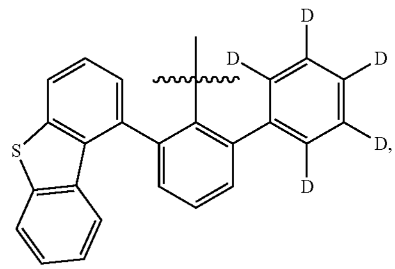
R185
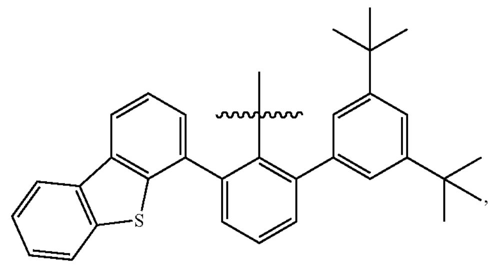
R186
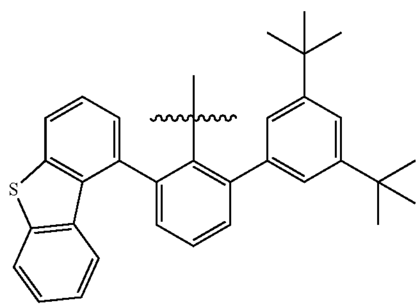
R187
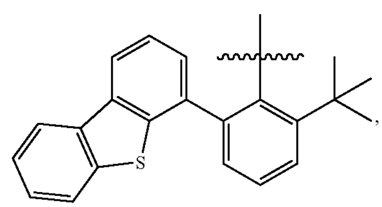
R188
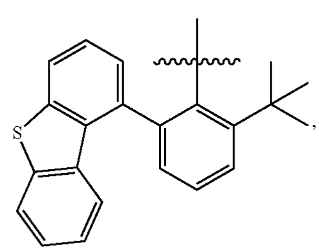
R189
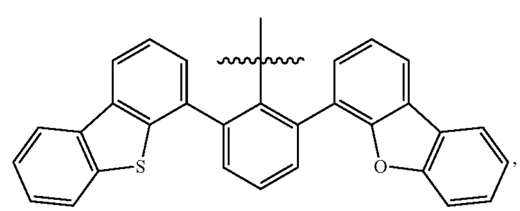

-continued
R190
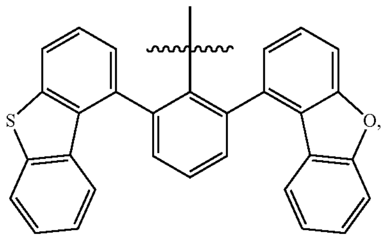
R191
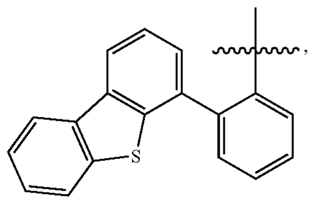
R192
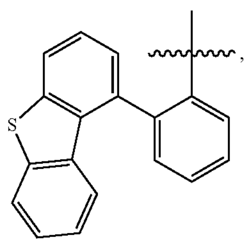
R193
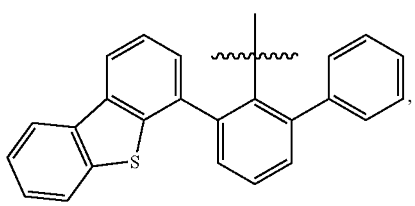
R194
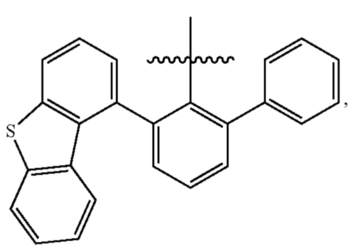
R195
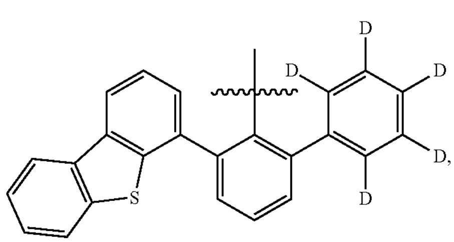
-continued
R196
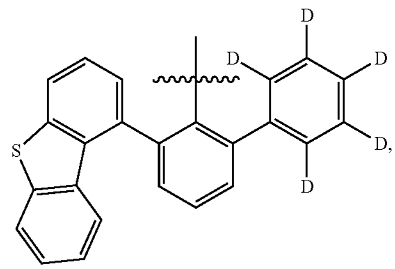
R197
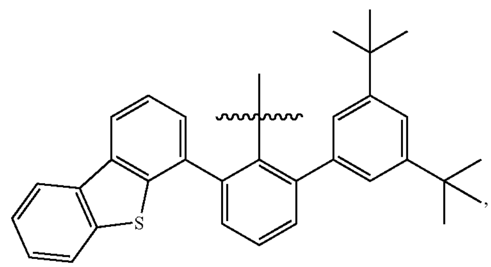
R198
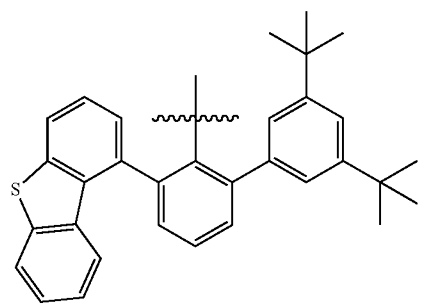
R199
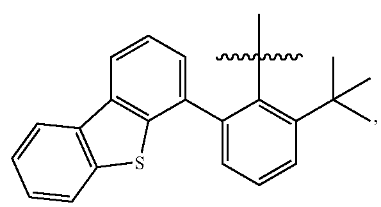
R200
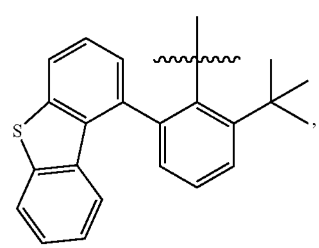
R201
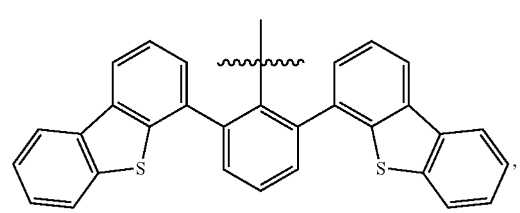

R202
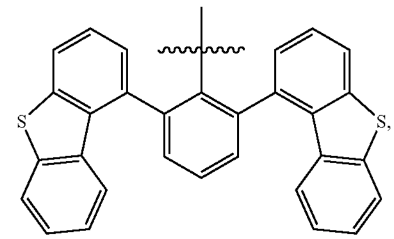
R203
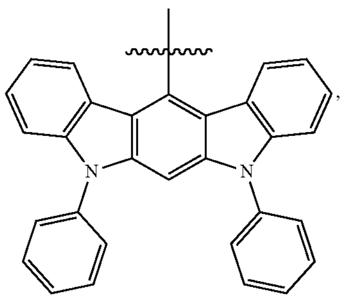
R204
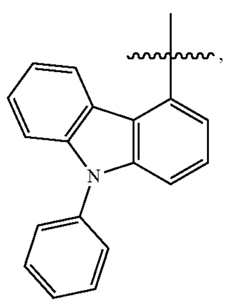
R205
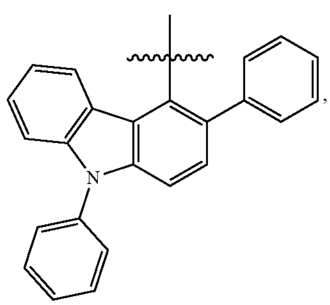
R206
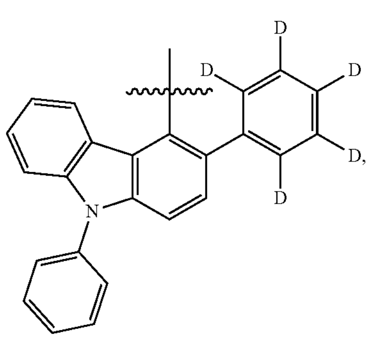
R207
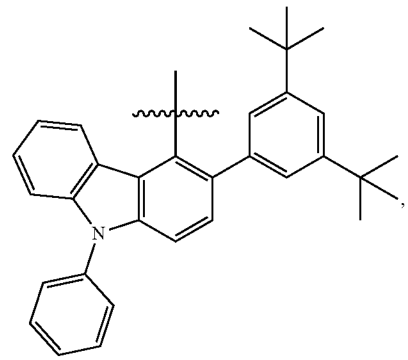
R208
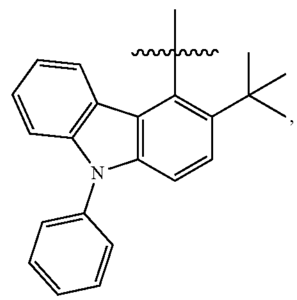
R209
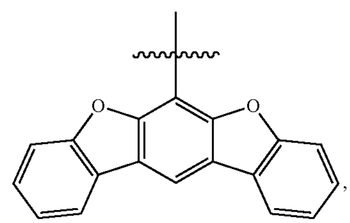
R210
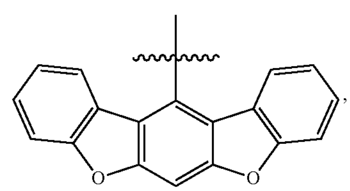
R211
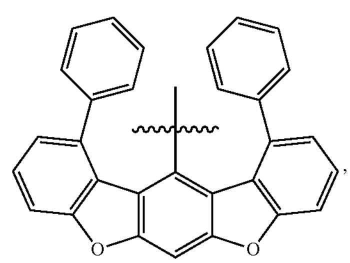
R212
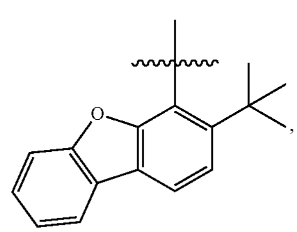

R213
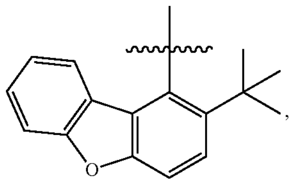
R214
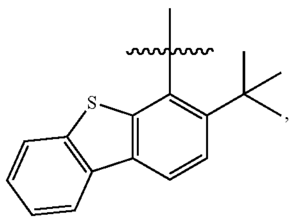
R215
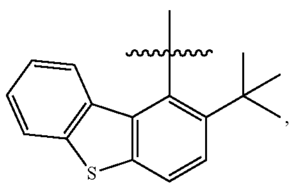
R216
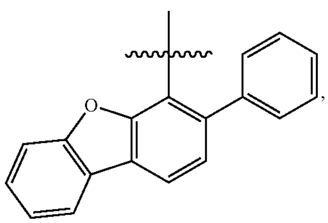
R217
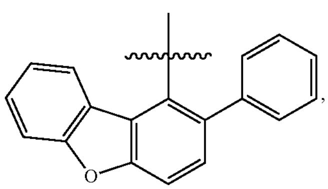
R218
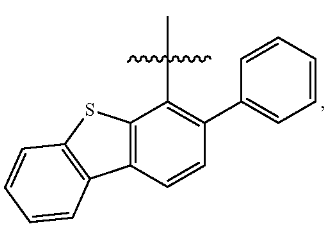
R219
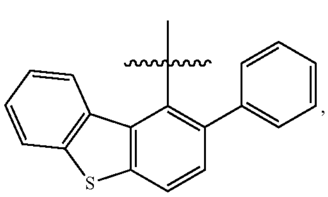
R220
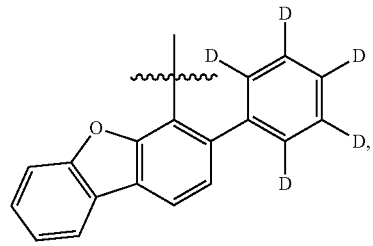
R221
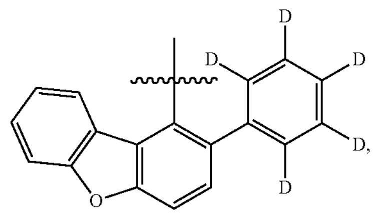
R222
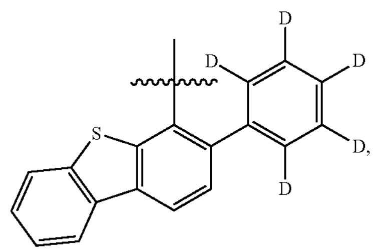
R223
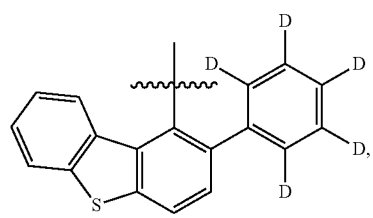
R224
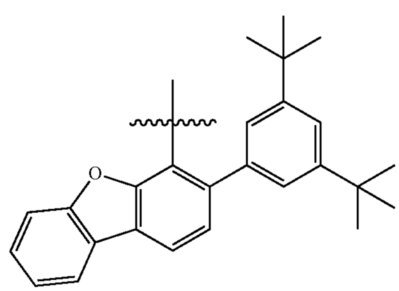
R225
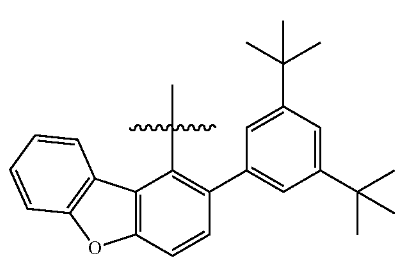

-continued
R226
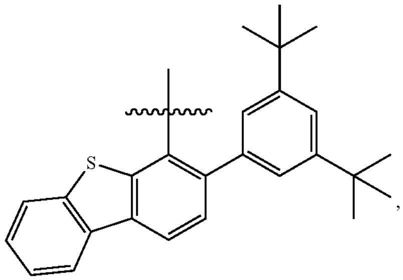
R227
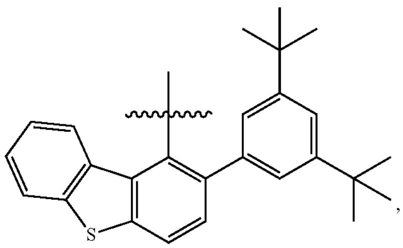
R228
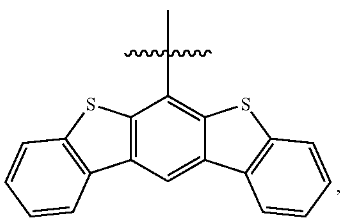
R229
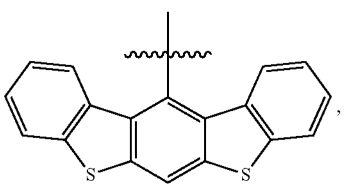
R230
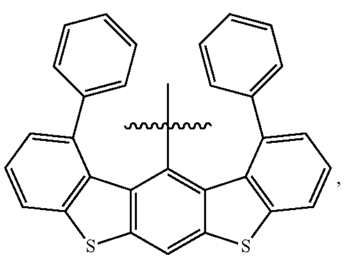
R231
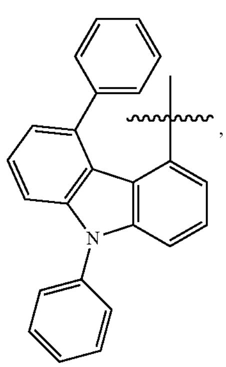
-continued
R232
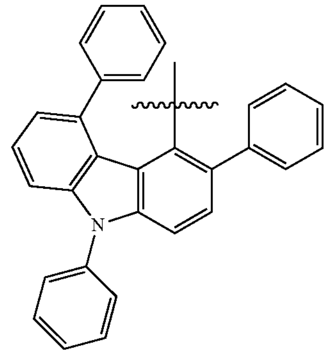
R233
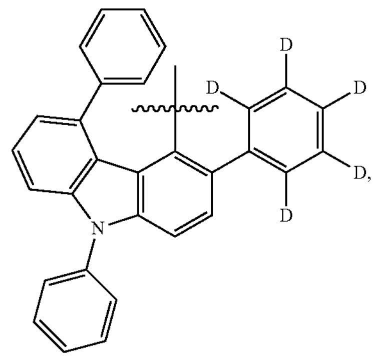
R234
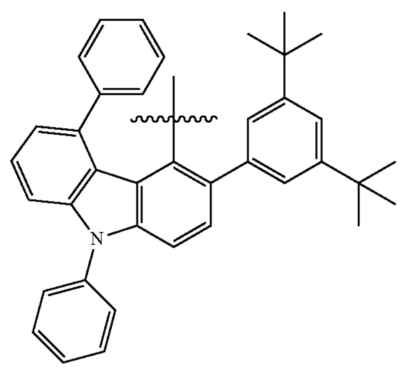
R235
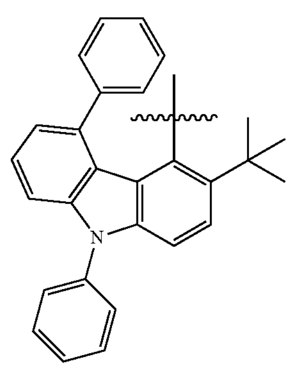

-continued
R236
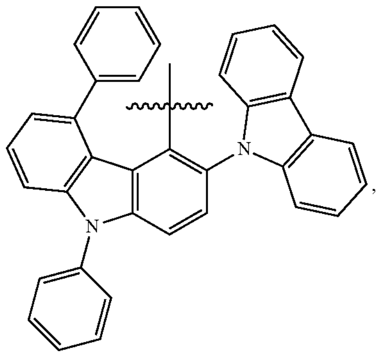
R237
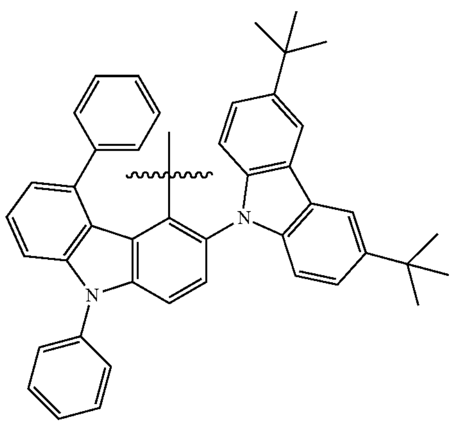
R238
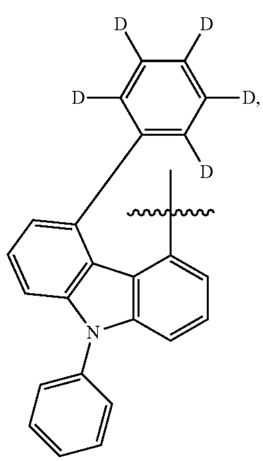
-continued
R239
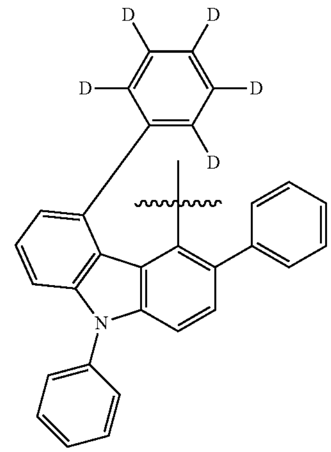
R240
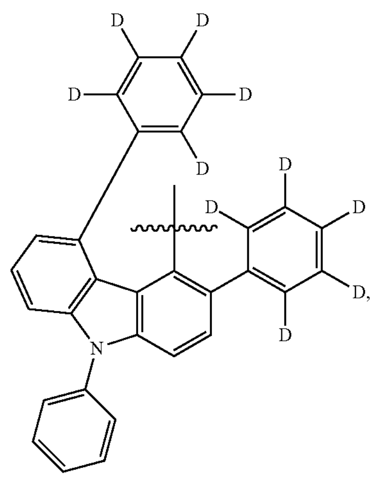
R241
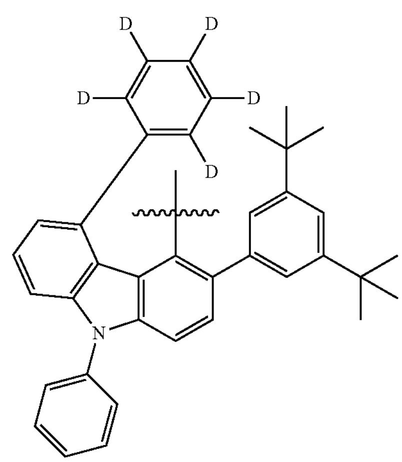

-continued
R242
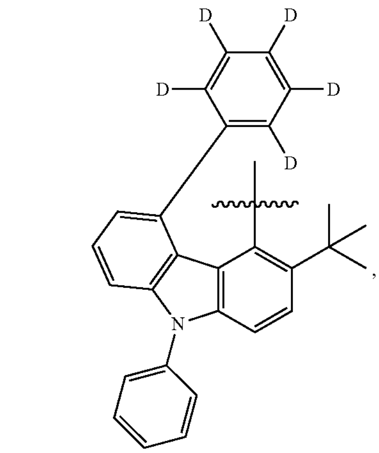
R243
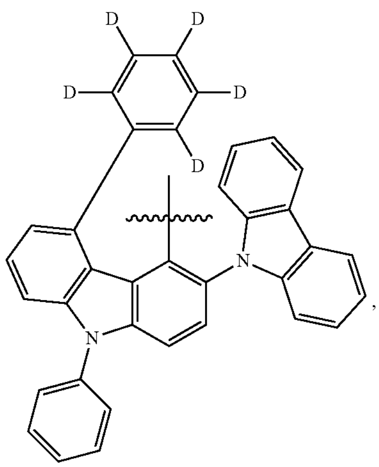
R244
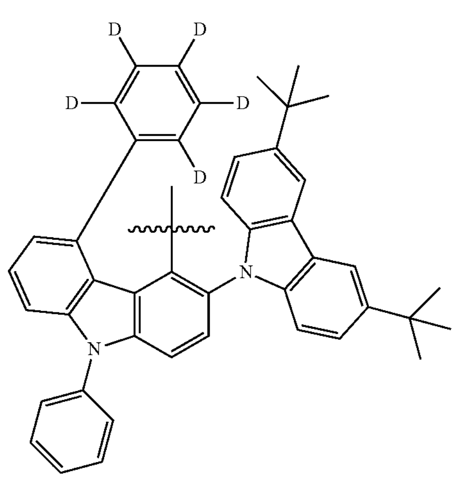
-continued
R245
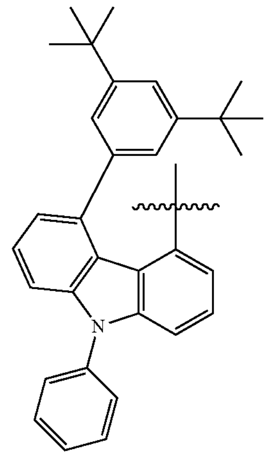
R246
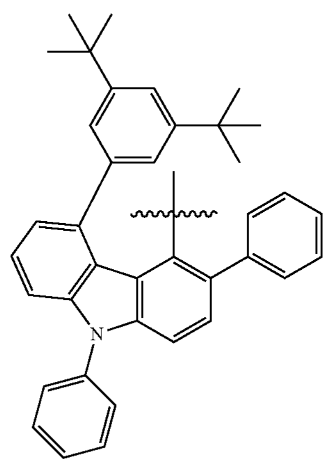
R247
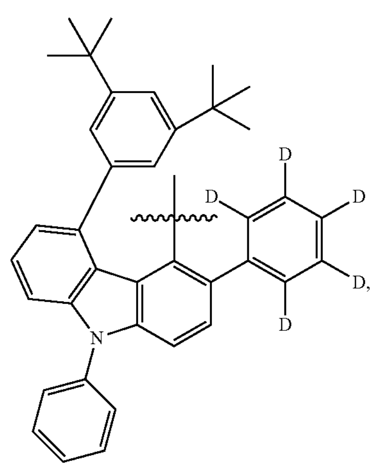

-continued
R248
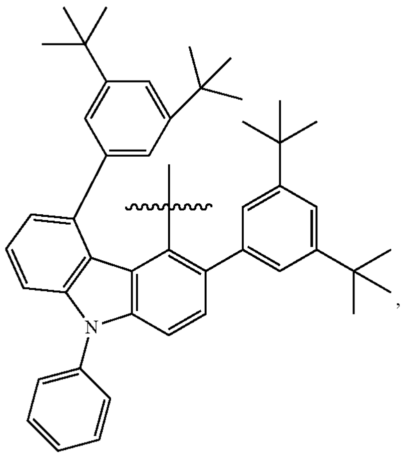
R249
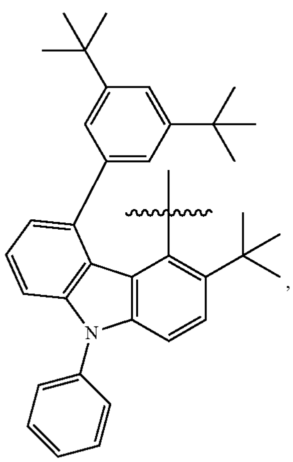
R250
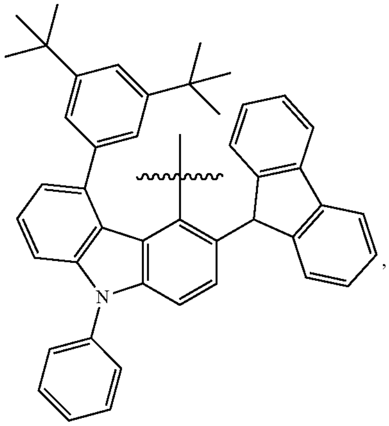
-continued
R251
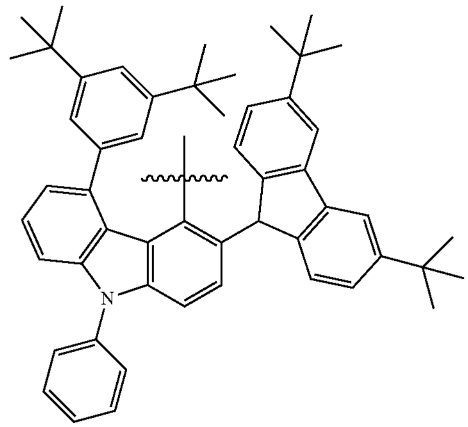
R252
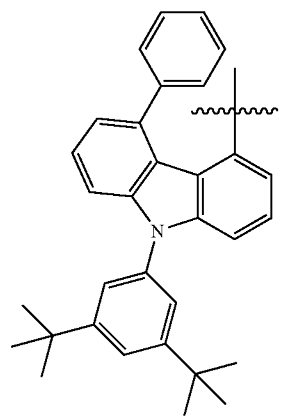
R253
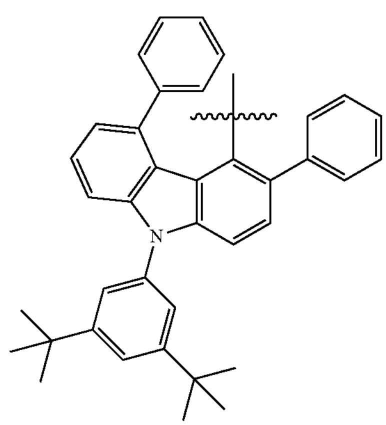

R254
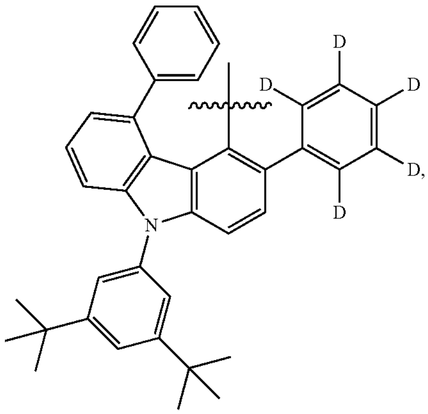
R255
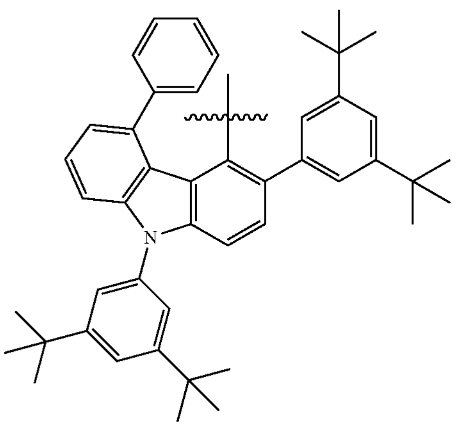
R256
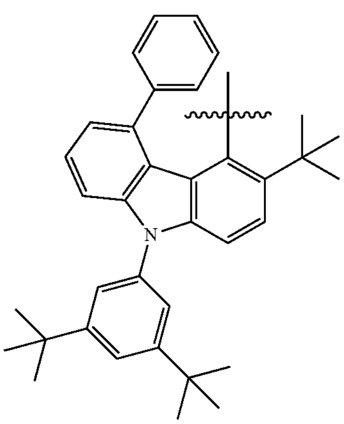
R257
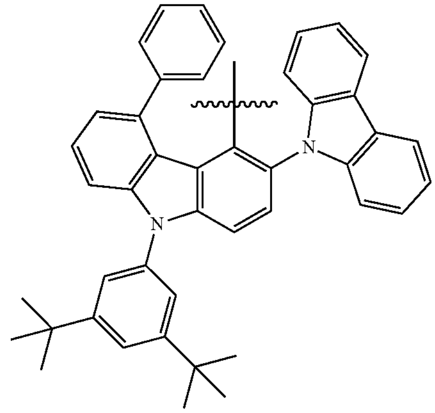
R258
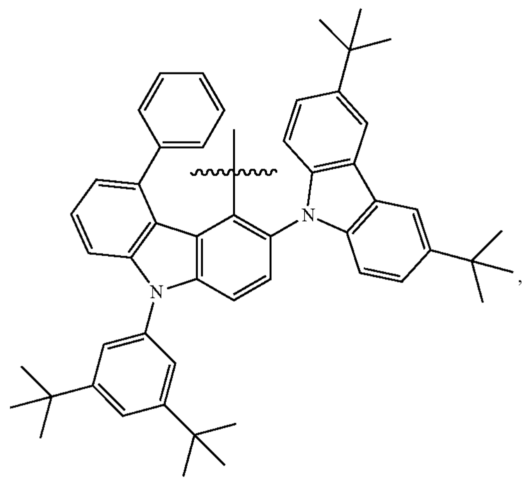
R259
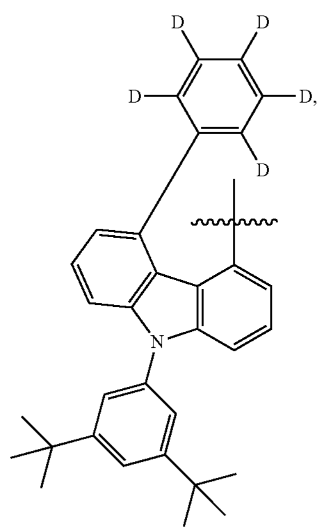

-continued
R260
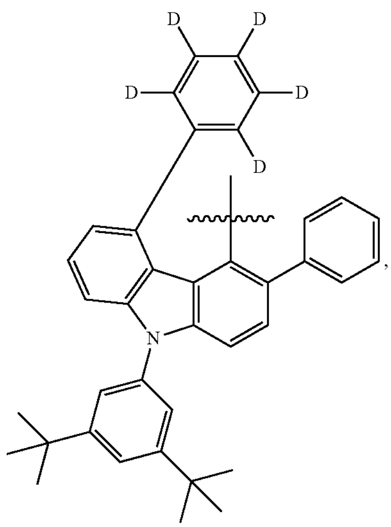
R261
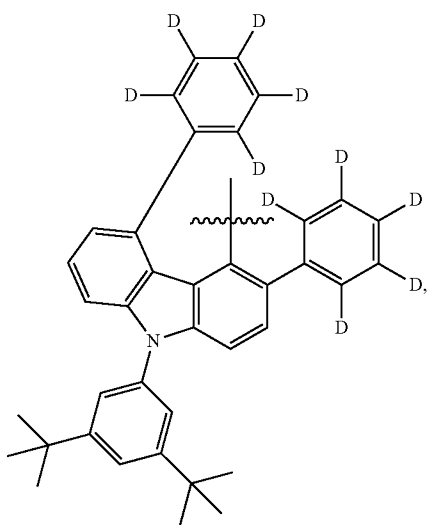
R262
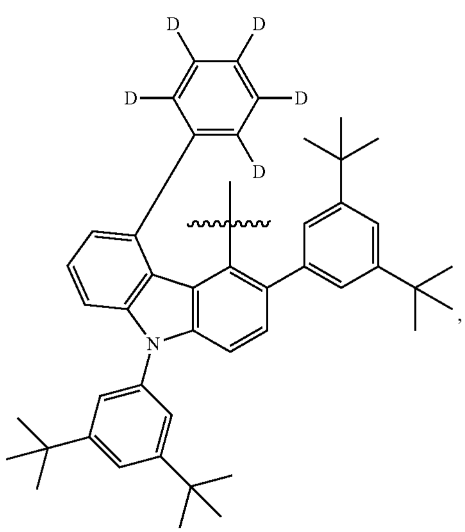
-continued
R263
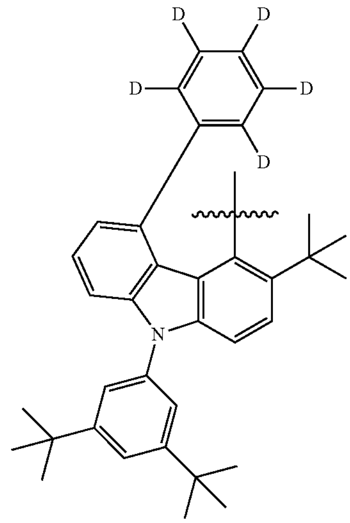
R264
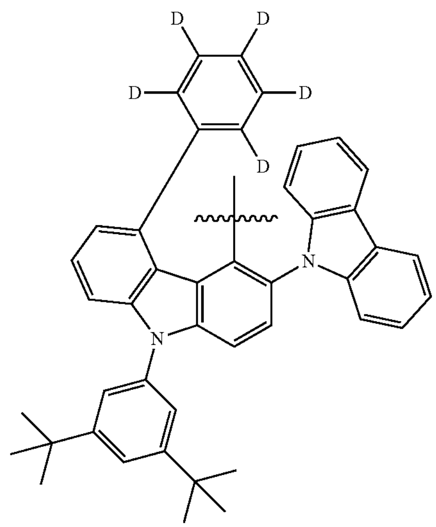
R265
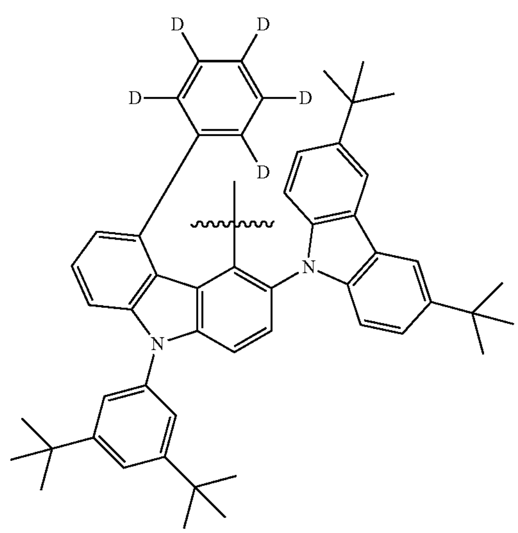

-continued
R266
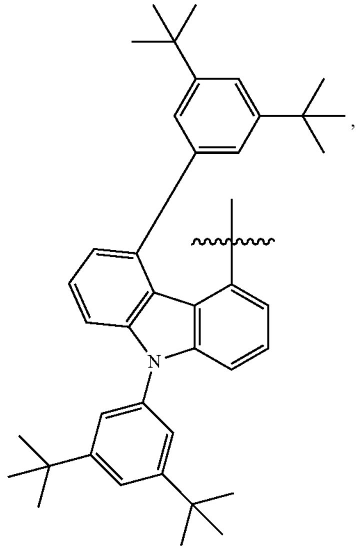
R267
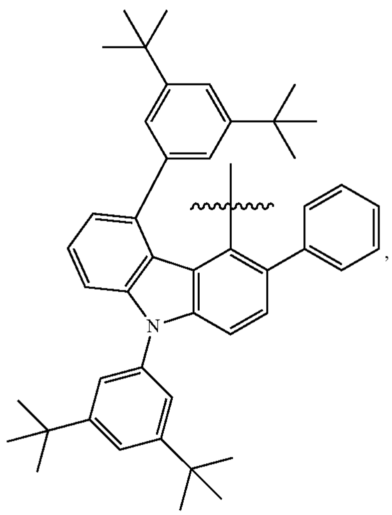
R268
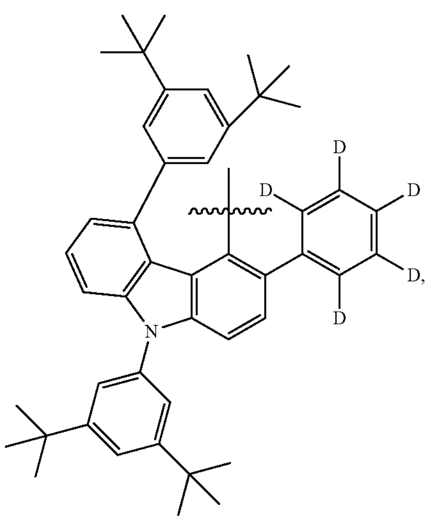
-continued
R269
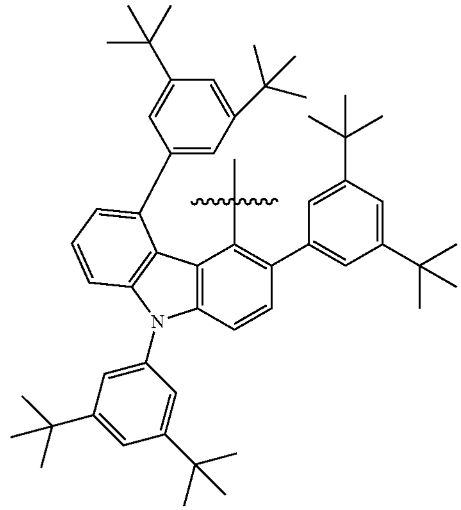
R270
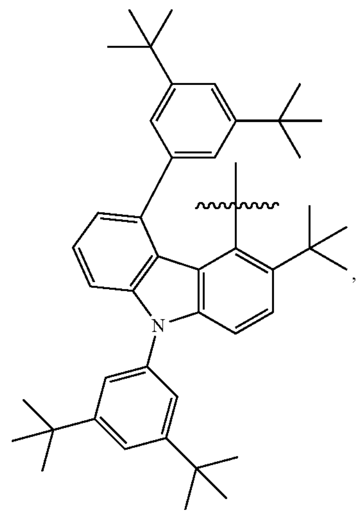
R271
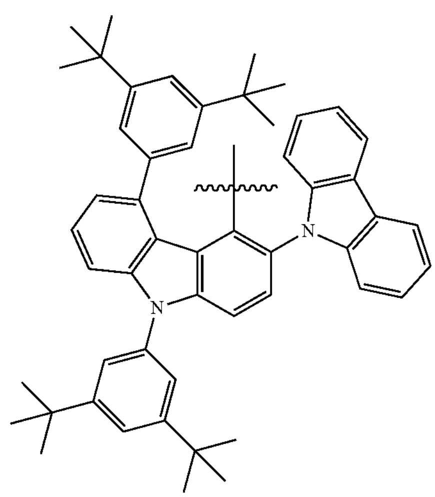

-continued
R272
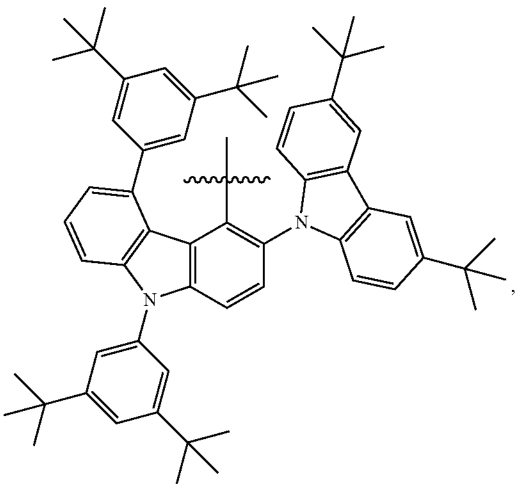
R273
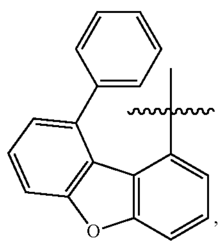
R274
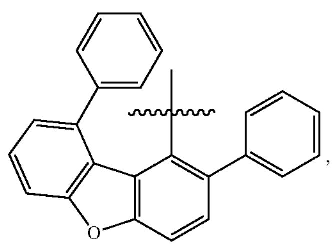
R275
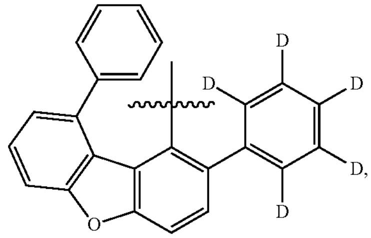
R276
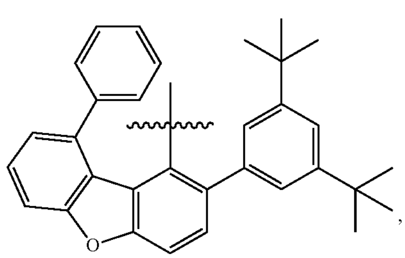
-continued
R277
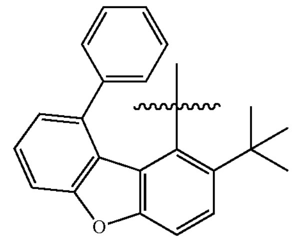
R278
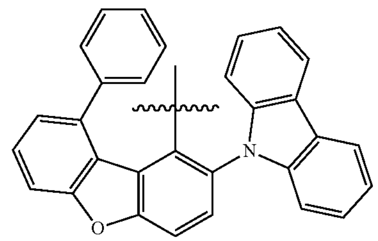
R279
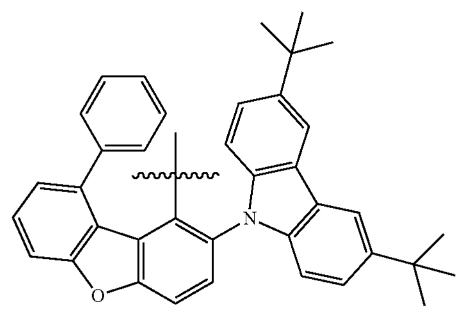
R280
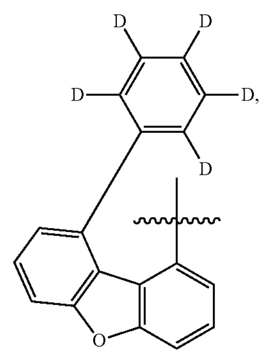
R281
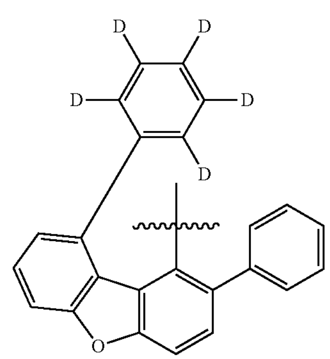

-continued
R282
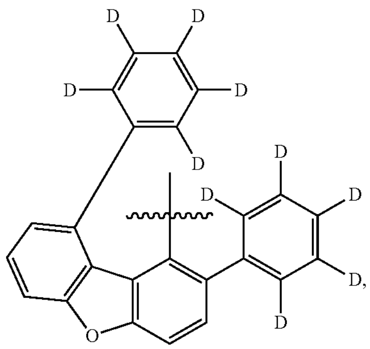
R283
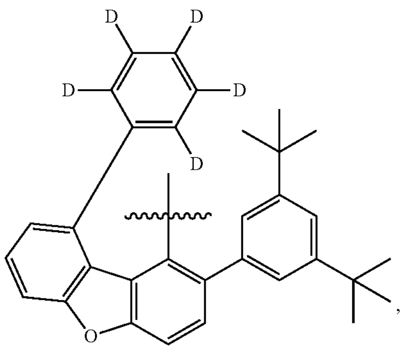
R284
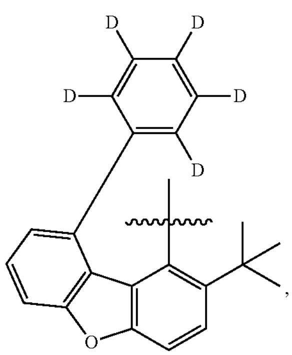
R285
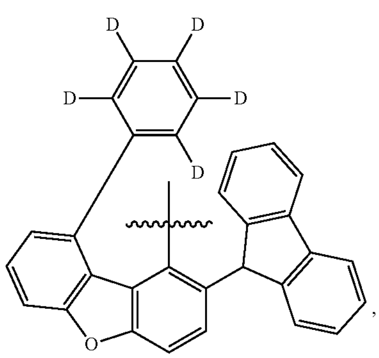
-continued
R286
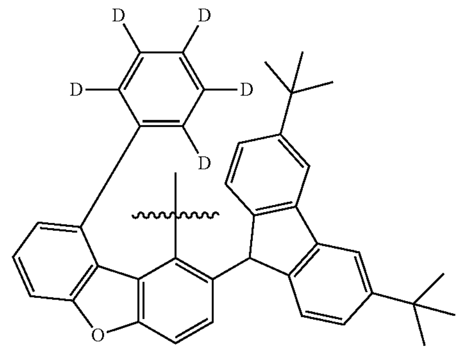
R287
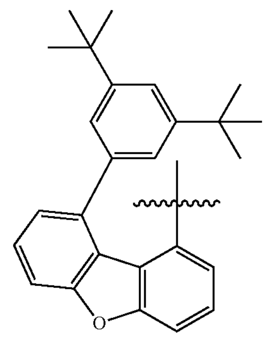
R288
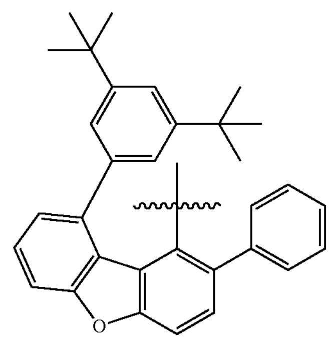
R289
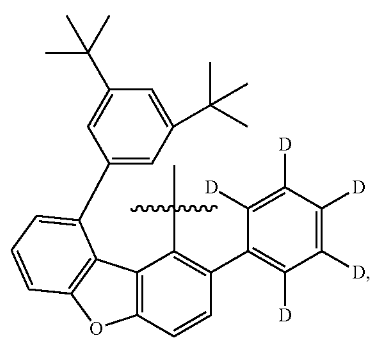

-continued
R290
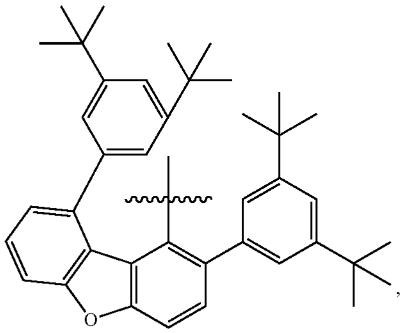
R291
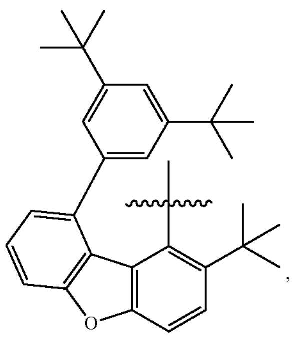
R292
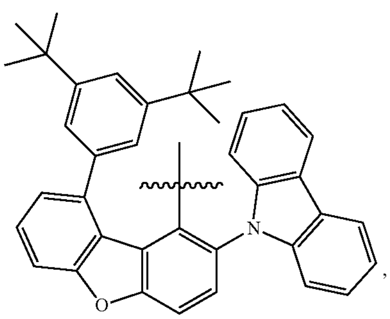
R293
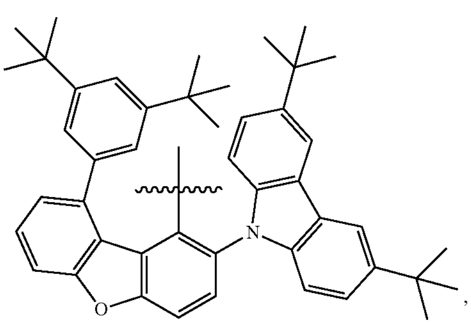
-continued
R294
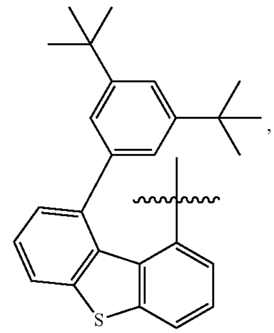
R295
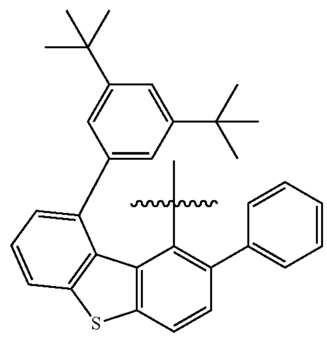
R296
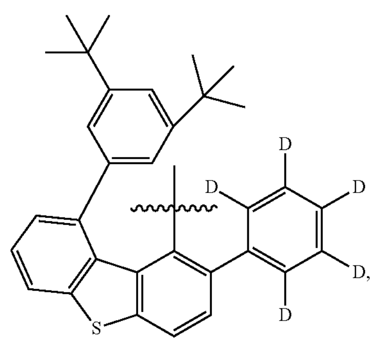
R297
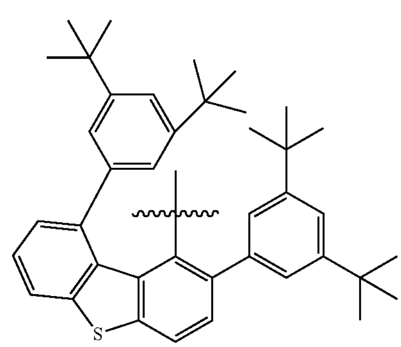

-continued
R298
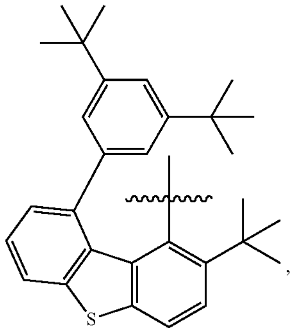
R299
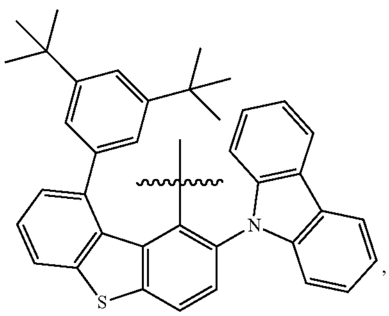
R300
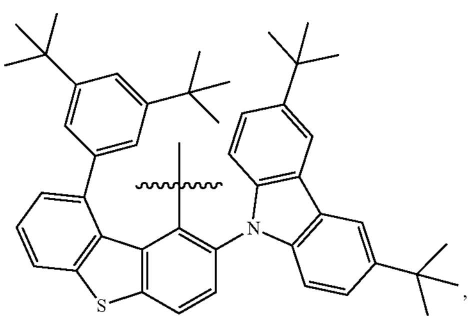
R301
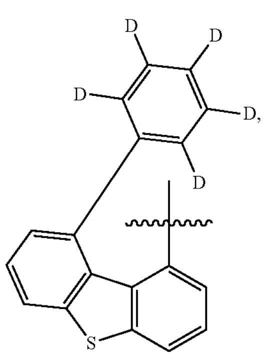
-continued
R302
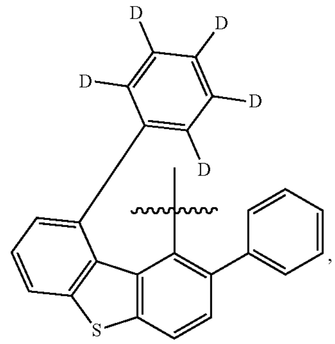
R303
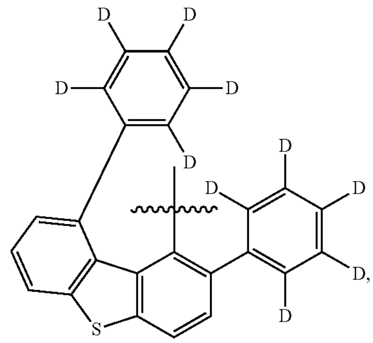
R304
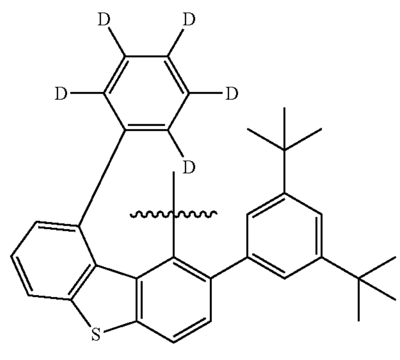
R305
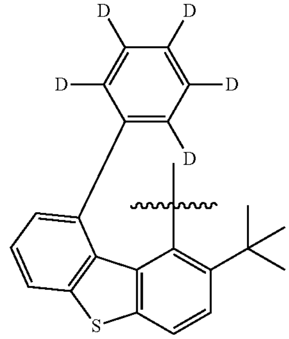

-continued
R306
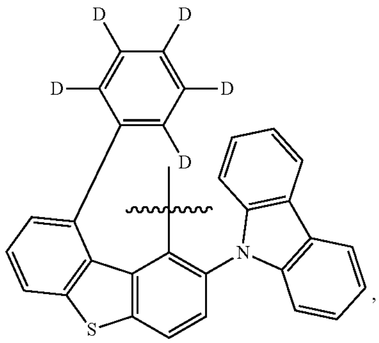
R307
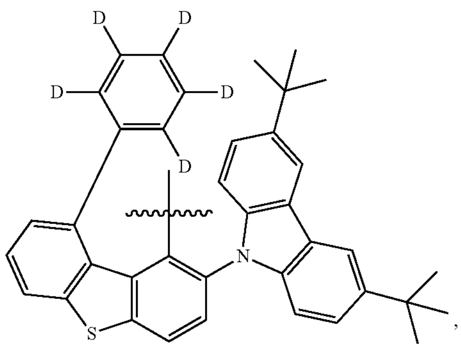
R308
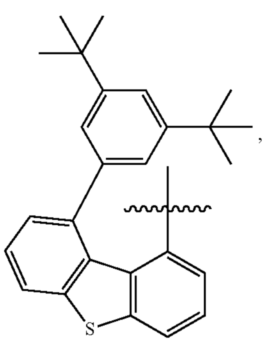
R309
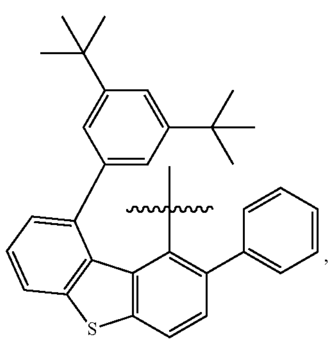
-continued
R310
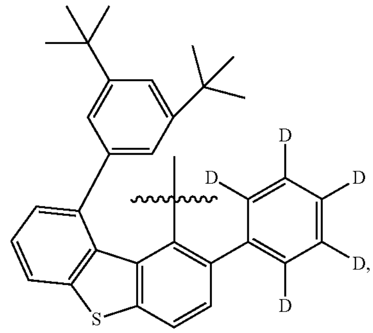
R311
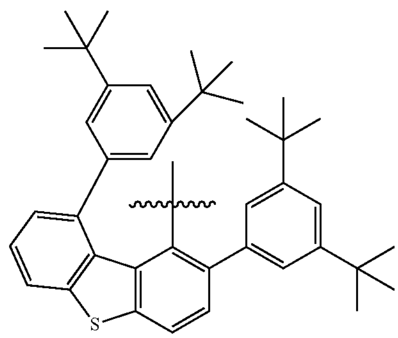
R312
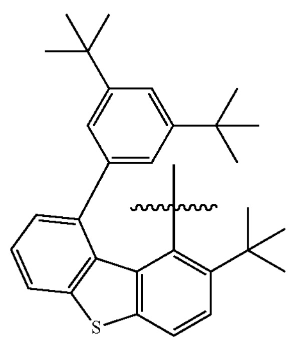
R313
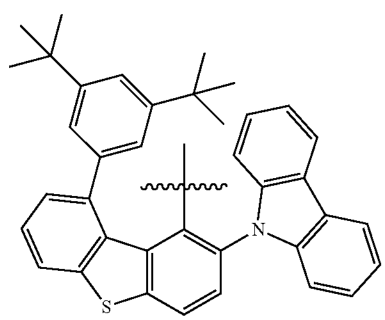

-continued
R314
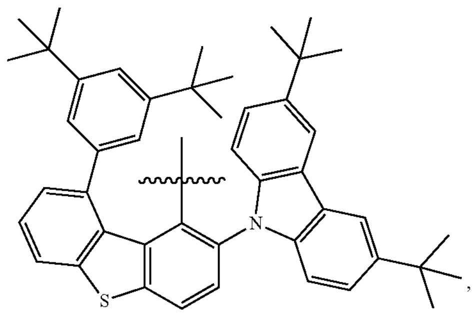
R315
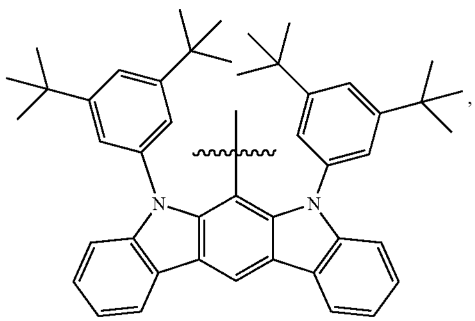
R316
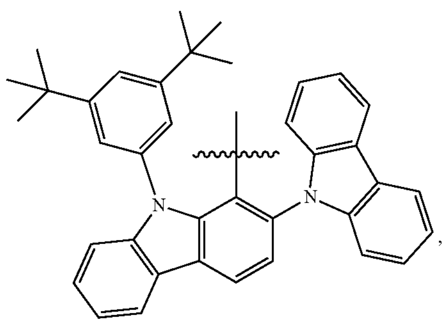
R317
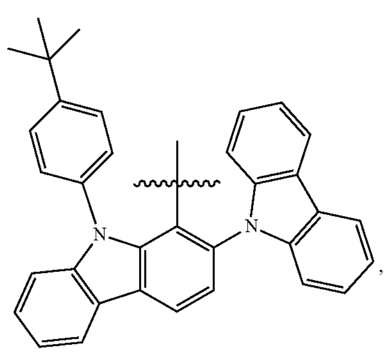
-continued
R318
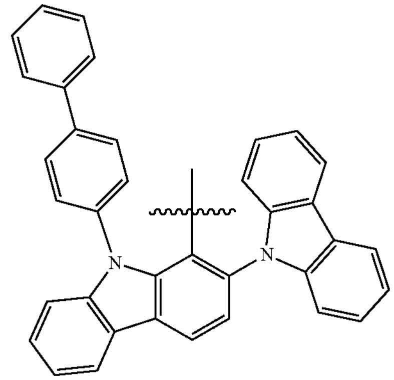
R319
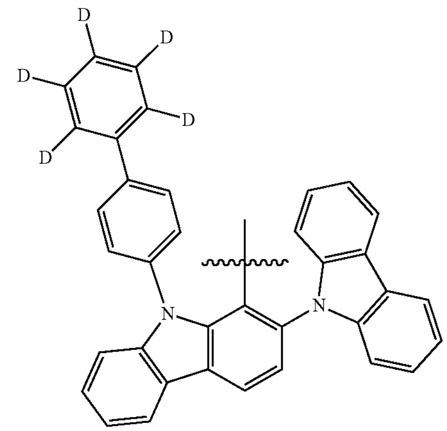
R320
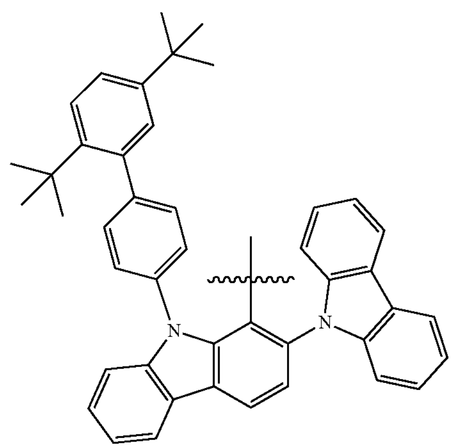
R321
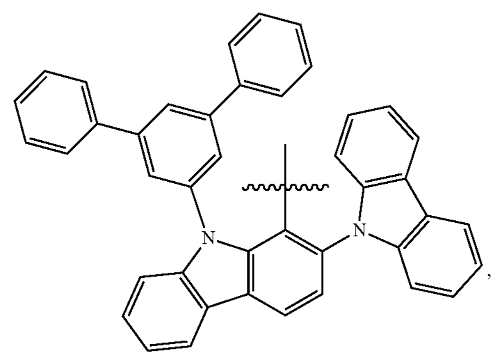

R322
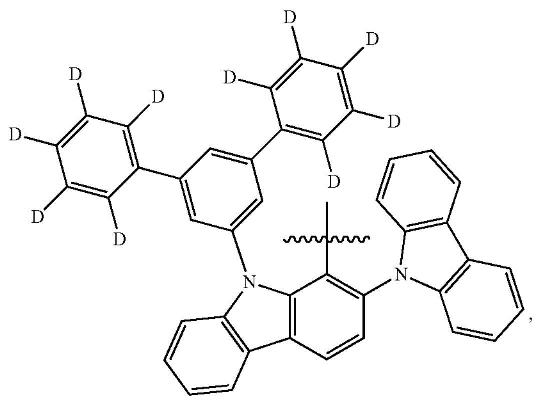
R323
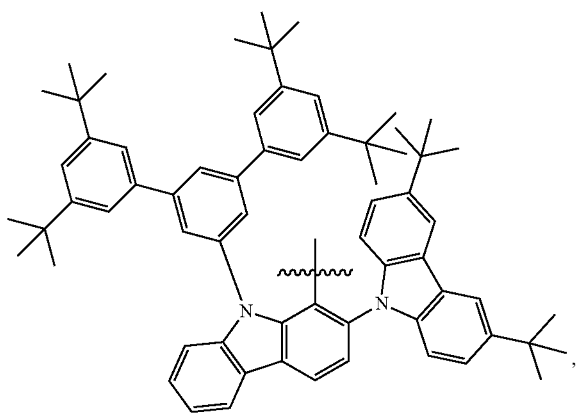
R324
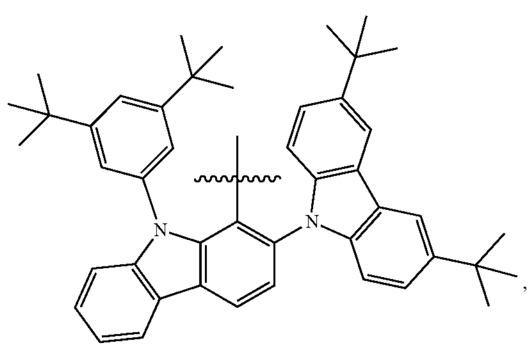
R325
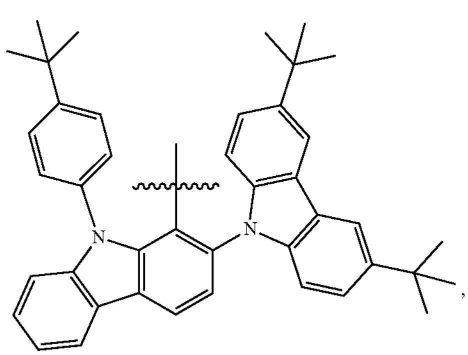
R326
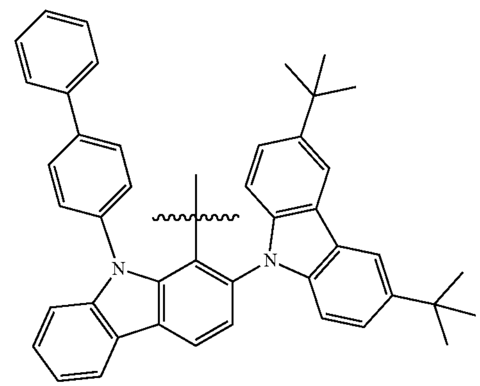
R327
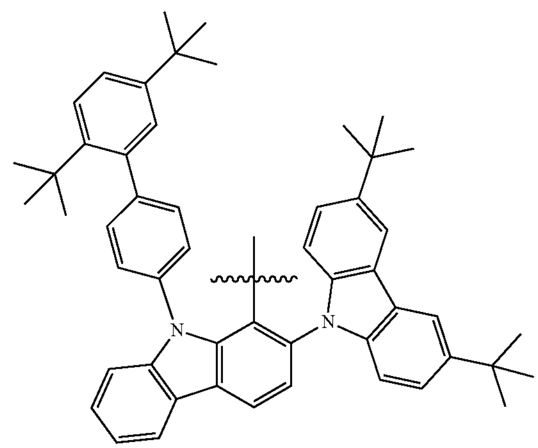
R328
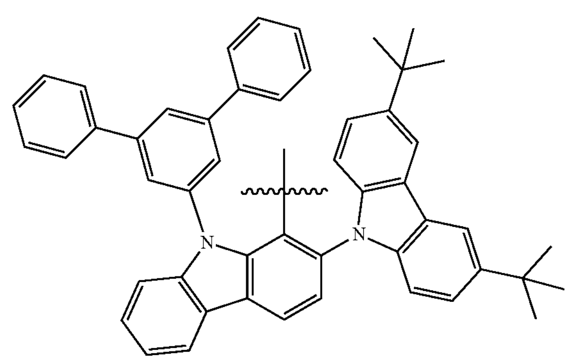
R329
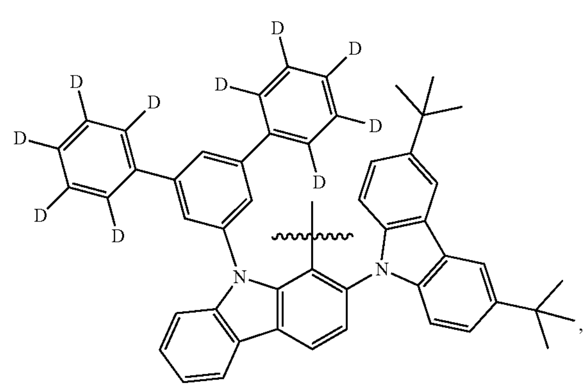

-continued
R330
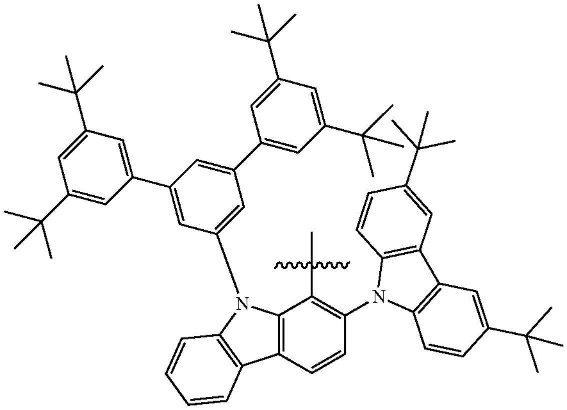
;
$L_{Yj}$ is selected from the group consisting of:
$L_{Y1}$
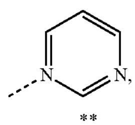
$L_{Y2}$
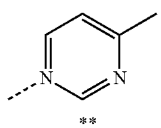
,
$L_{Y3}$
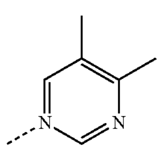
,
$L_{Y4}$
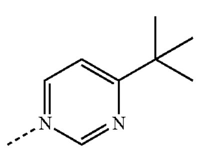
,
$L_{Y5}$
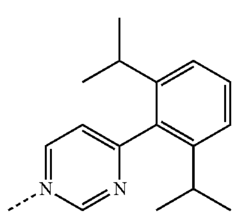
,
-continued
$L_{Y6}$
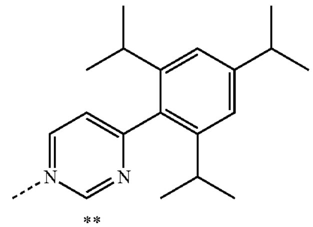
,
$L_{Y7}$
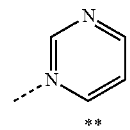
,
$L_{Y8}$
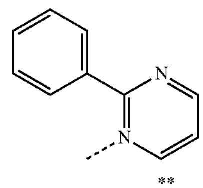
,
$L_{Y9}$
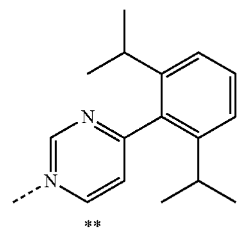
,
$L_{Y10}$
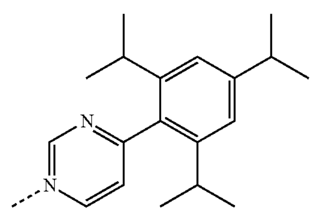
,
$L_{Y11}$
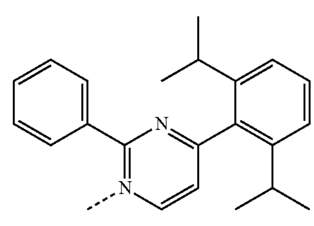
,
$L_{Y12}$
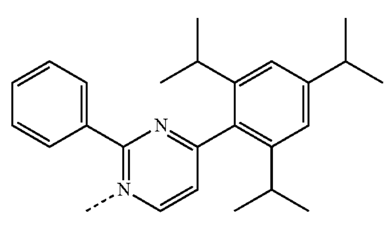
, $L_{Y13}$
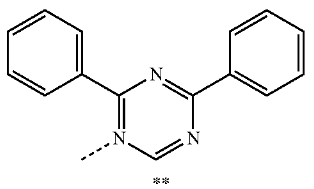
$L_{Y14}$
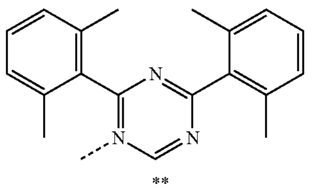
$L_{Y15}$
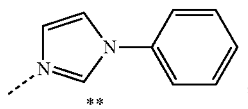
$L_{Y16}$
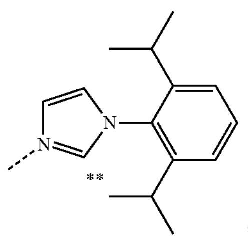
$L_{Y17}$
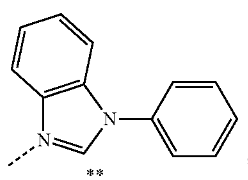
$L_{Y18}$
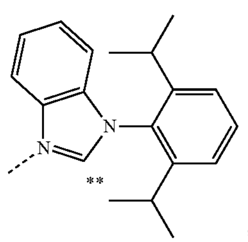
$L_{Y19}$
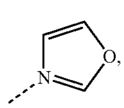
$L_{Y20}$
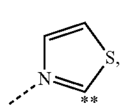
$L_{Y21}$
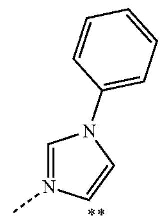
$L_{Y22}$
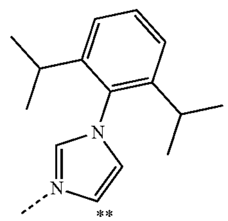
$L_{Y23}$
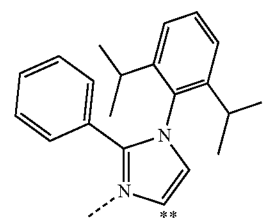
$L_{Y24}$
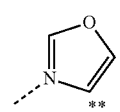
$L_{Y25}$
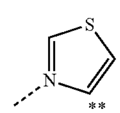
$L_{Y26}$
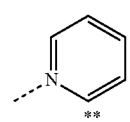
$L_{Y27}$
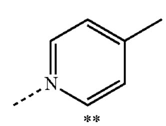
$L_{Y28}$
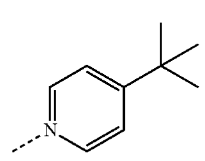

-continued
$L_{Y29}$
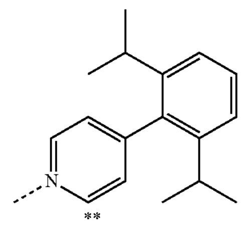
, and
$L_{Y30}$
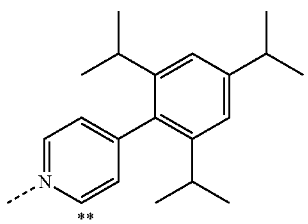
;
$L_{Zk}$ is selected from the group consisting of:
$L_{Z1}$
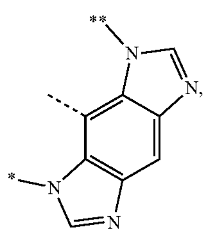
$L_{Z2}$
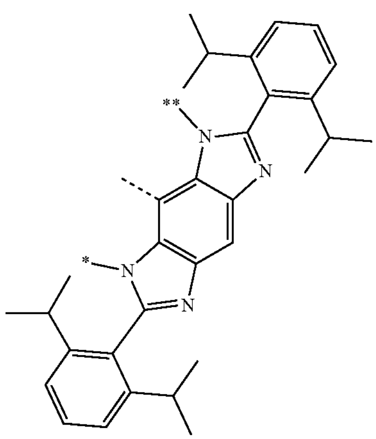
,
$L_{Z3}$
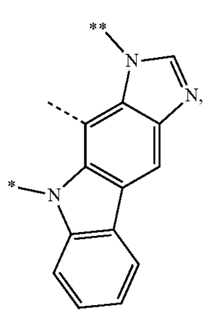
-continued
$L_{Z4}$
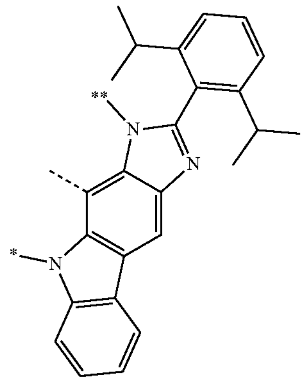
,
$L_{Z5}$
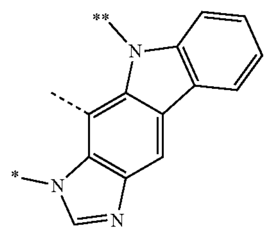
,
$L_{Z6}$
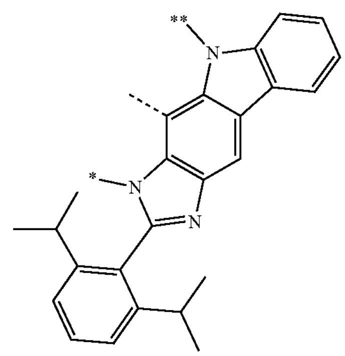
,
$L_{Z7}$
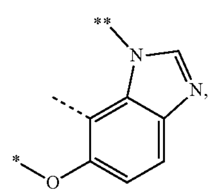
$L_{Z8}$
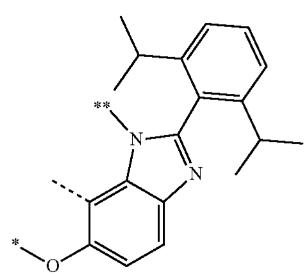
,
$L_{Z9}$
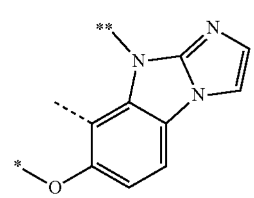
, -continued
$L_{Z10}$
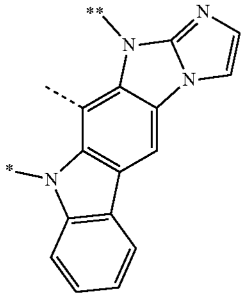
,
$L_{Z11}$
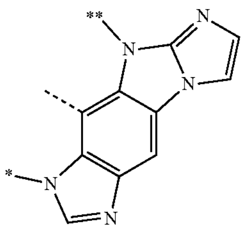
,
$L_{Z12}$
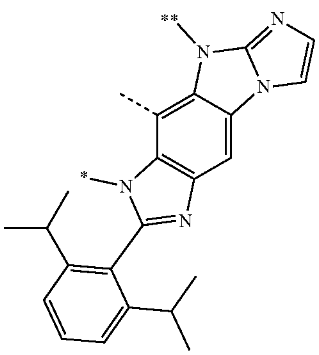
,
$L_{Z13}$
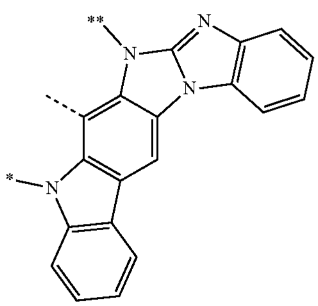
,
$L_{Z14}$
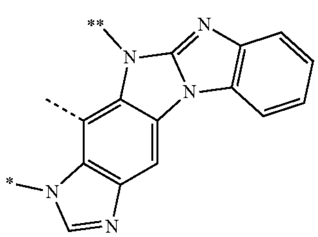
,
-continued
$L_{Z15}$
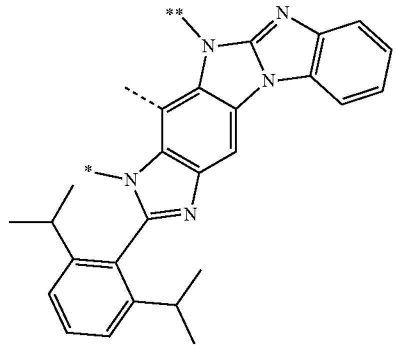
,
$L_{Z16}$
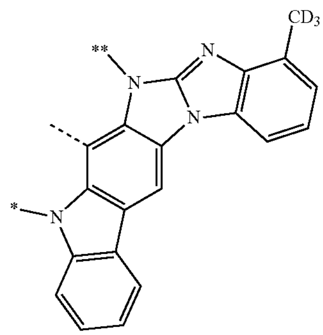
,
$L_{Z17}$
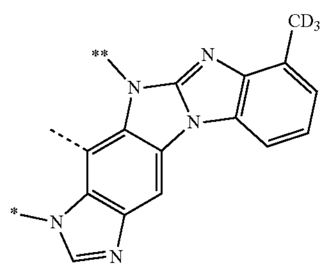
,
$L_{Z18}$
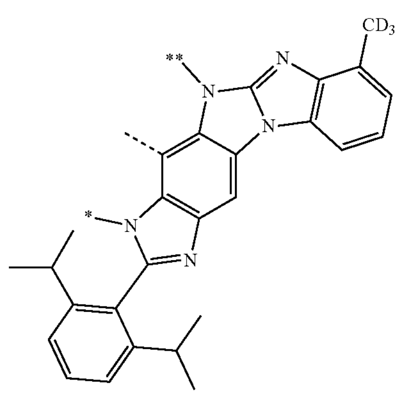
, -continued
L$_{Z19}$
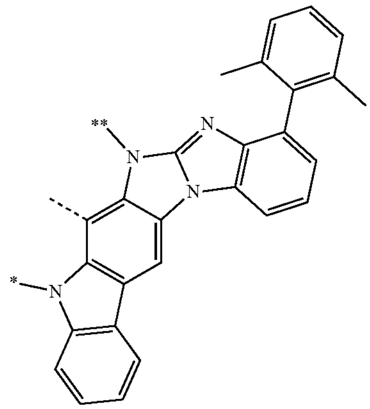
,
L$_{Z20}$
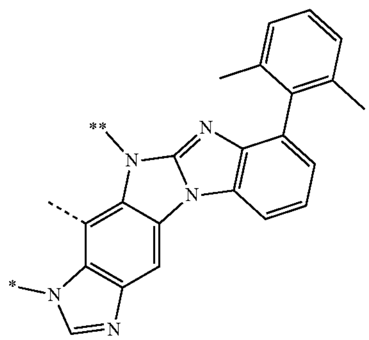
,
L$_{Z21}$
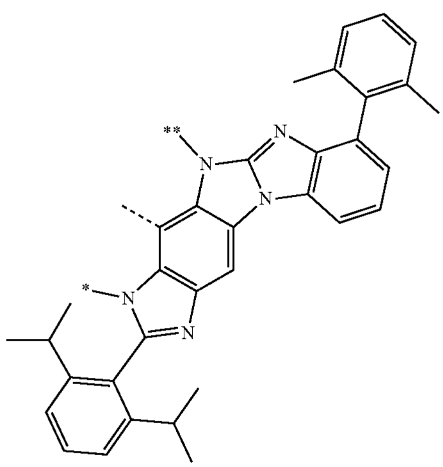
,
L$_{Z22}$
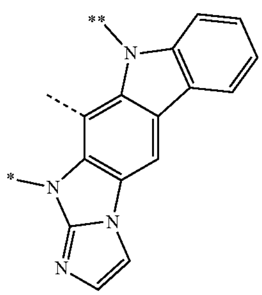
,
-continued
L$_{Z23}$
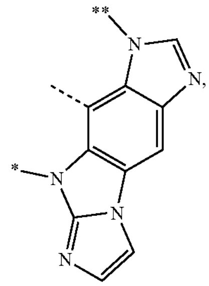
L$_{Z24}$
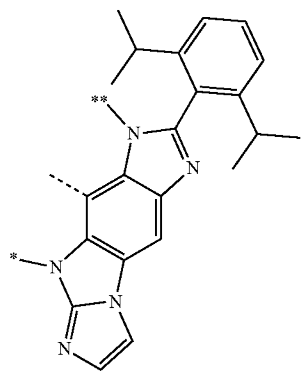
,
L$_{Z25}$
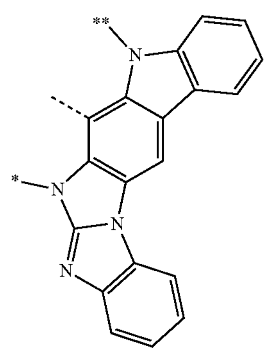
,
L$_{Z26}$
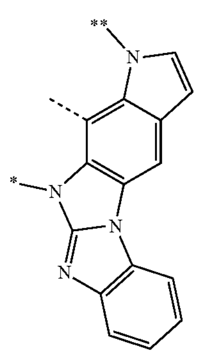
, -continued
$L_{Z27}$
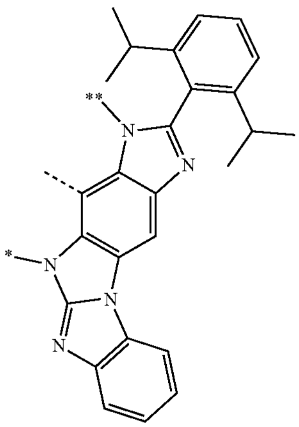
,
$L_{Z28}$
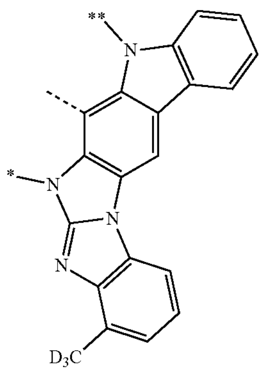
,
$L_{Z29}$
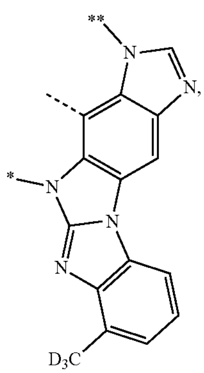
$L_{Z30}$
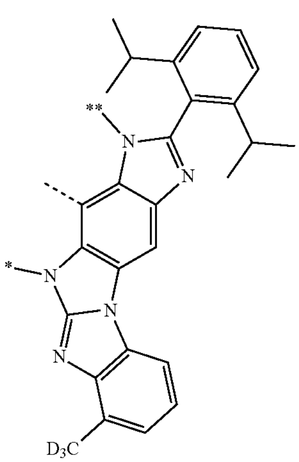
,
-continued
$L_{Z31}$
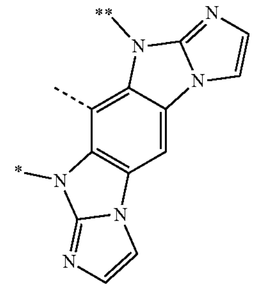
,
$L_{Z32}$
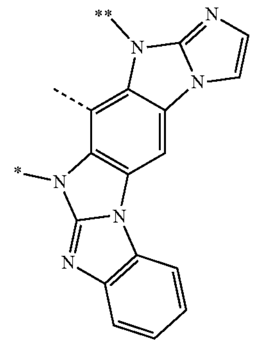
,
$L_{Z33}$
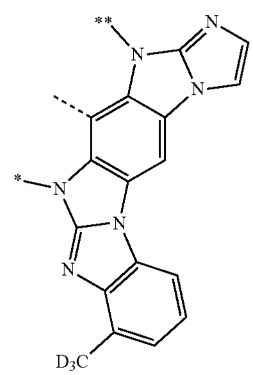
,
$L_{Z34}$
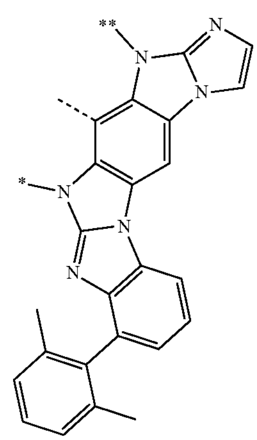
, -continued
$L_{Z35}$
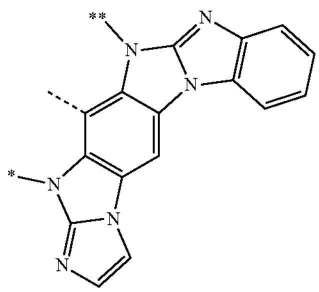
,
$L_{Z36}$
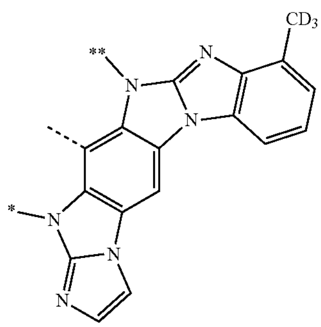
,
$L_{Z37}$
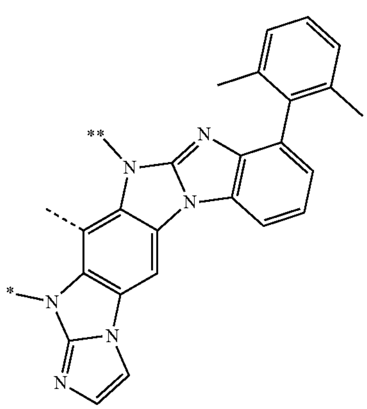
,
$L_{Z38}$
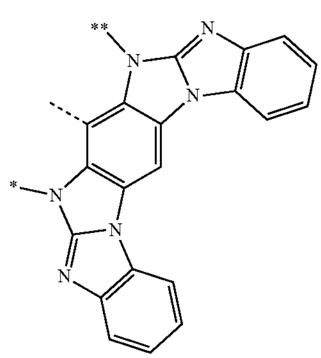
,
-continued
$L_{Z39}$
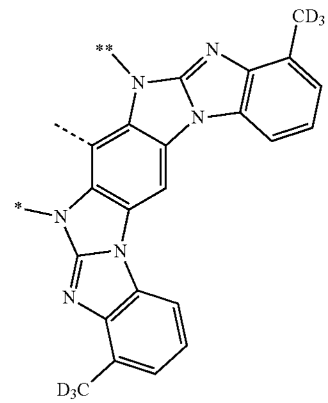
, and
$L_{Z40}$
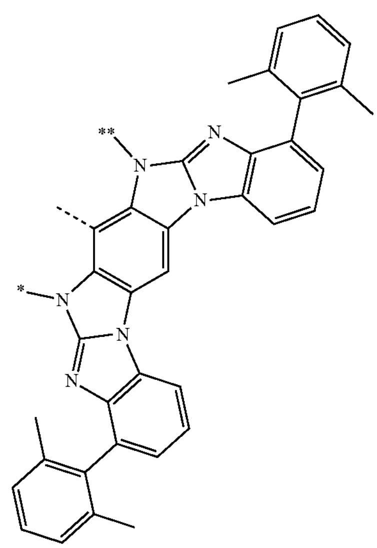
,
$L_{Z41}$
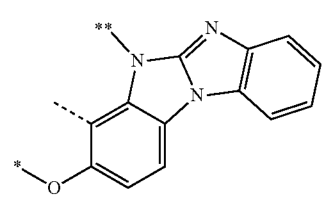
,
$L_{Z42}$
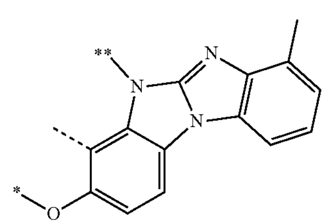
, $L_{Z43}$
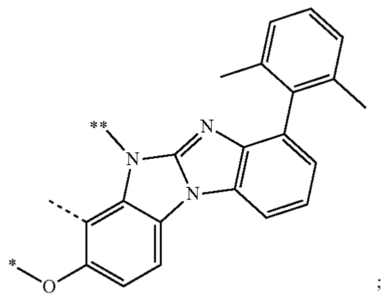
;
and the * of $L_{Zk}$ attaches to the * of $L_{Xi}$, and the  of $L_{Zk}$ attaches to the  of $L_{Yj}$.
In some embodiments, the compound is compound x having the formula $(L_{Xi})Pt(L_{Yj})(L_{Zk})$; where x=5(k−41)+(j−25)+15(i−1)+270628950, i is an integer from 1 to 212258, j is an integer from 26 to 30, and k is an integer from 41 to 43.
In some embodiments, the compound is selected from the group consisting of:
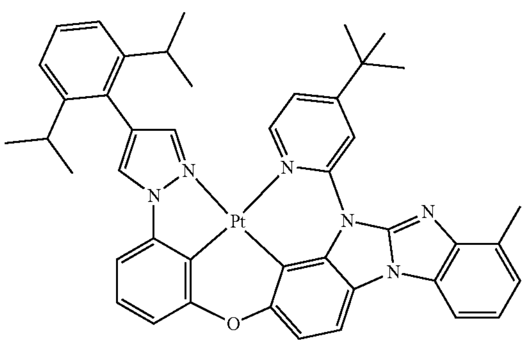
,
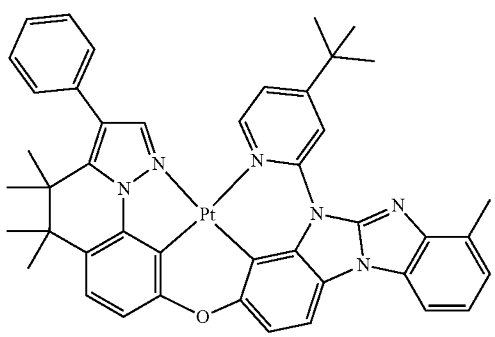
,
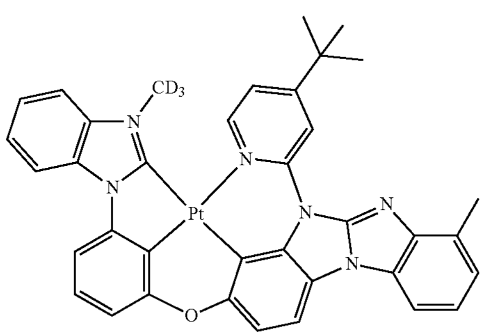
,
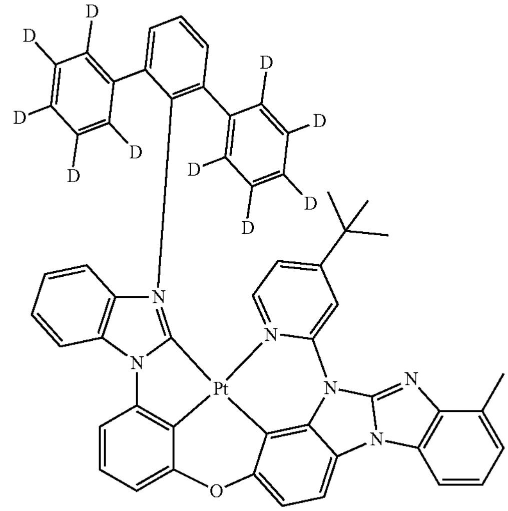
,
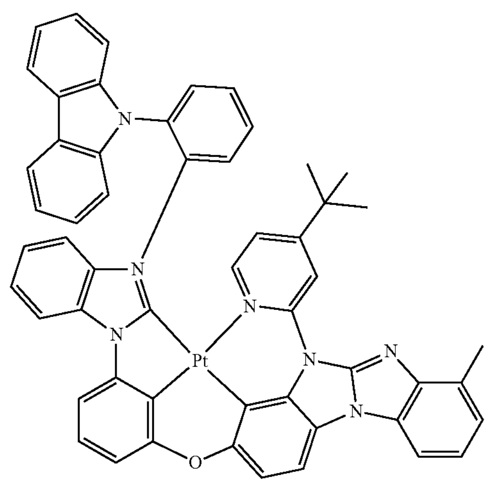
,
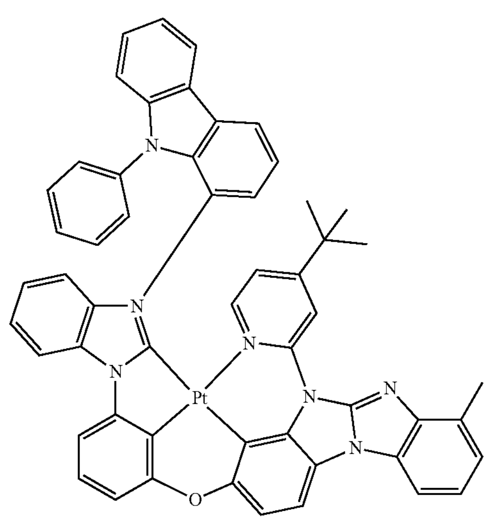
, -continued
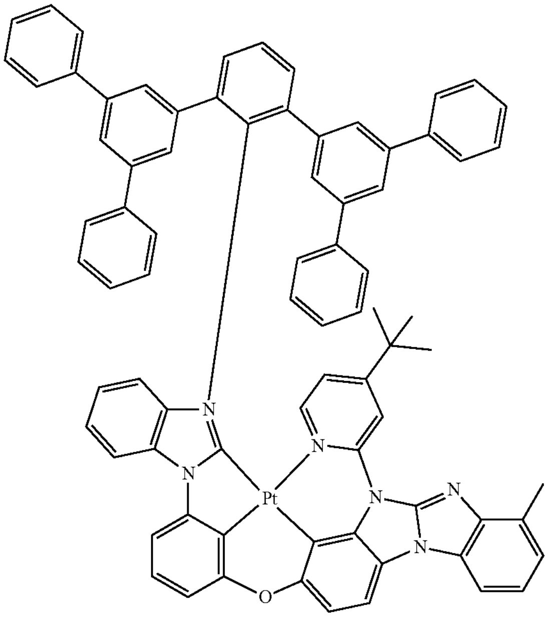
,
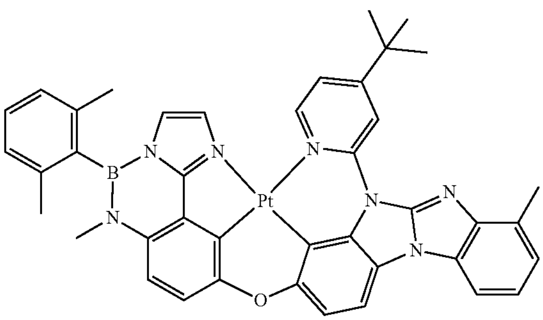
,
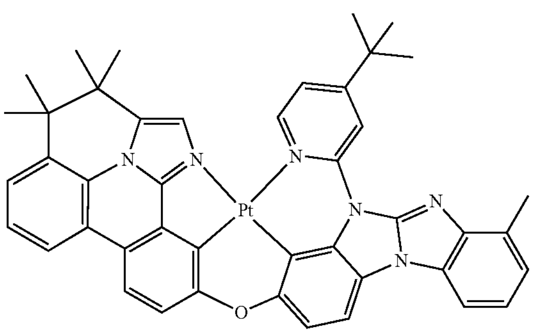
,
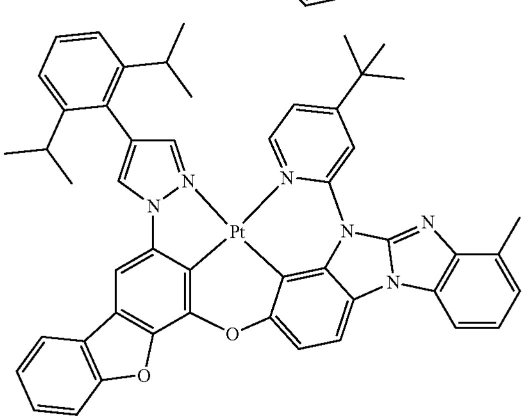
,
-continued
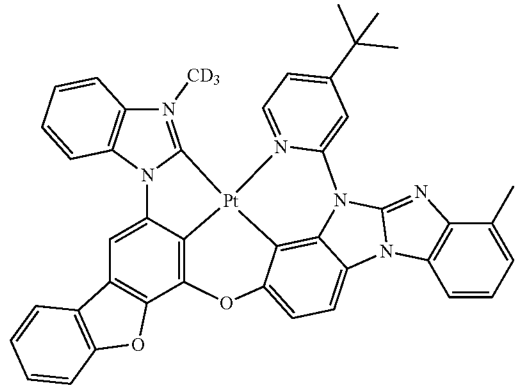
,
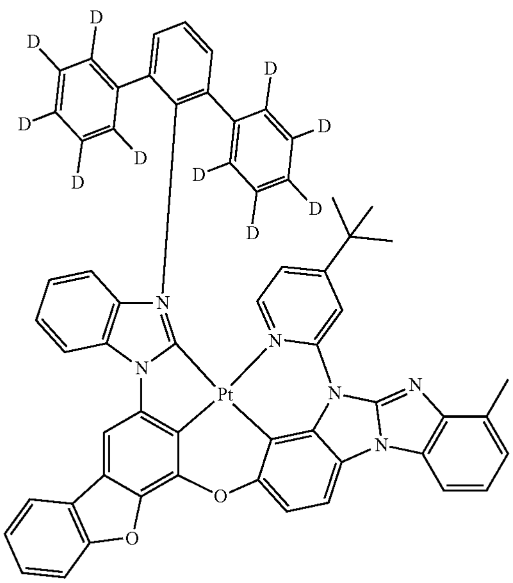
,
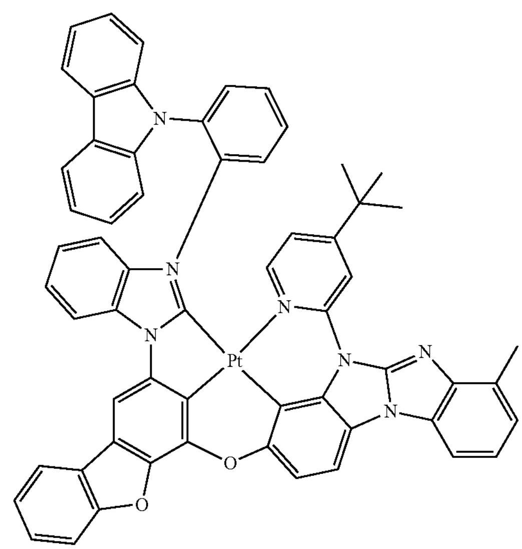
, -continued
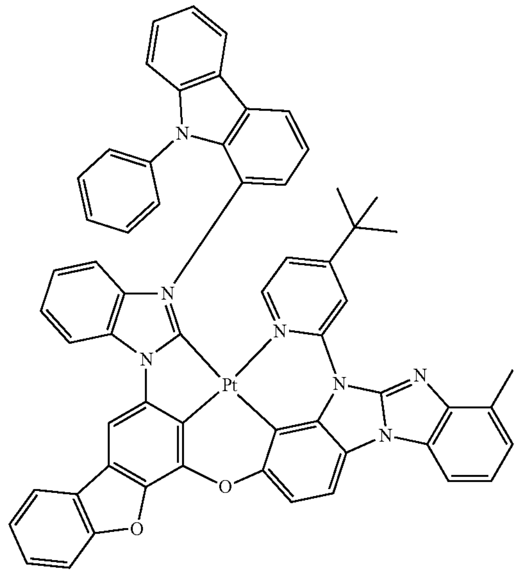
,
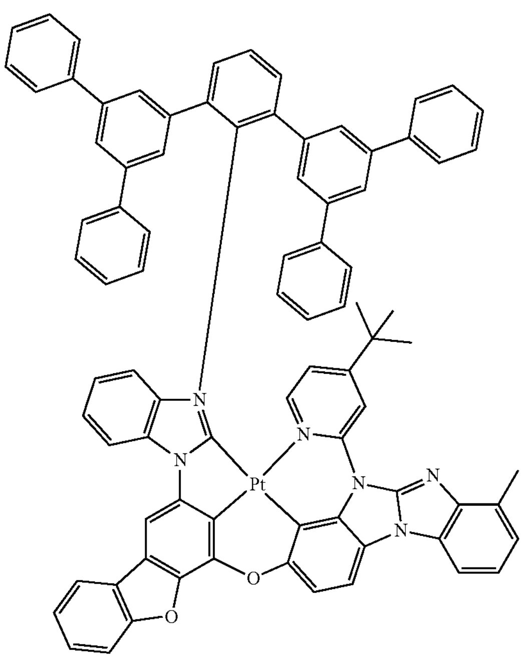
,
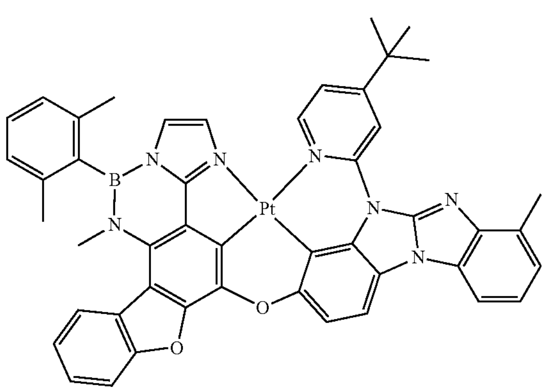
,
-continued
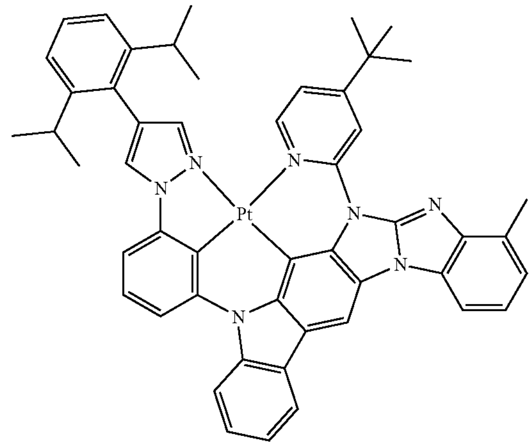
,
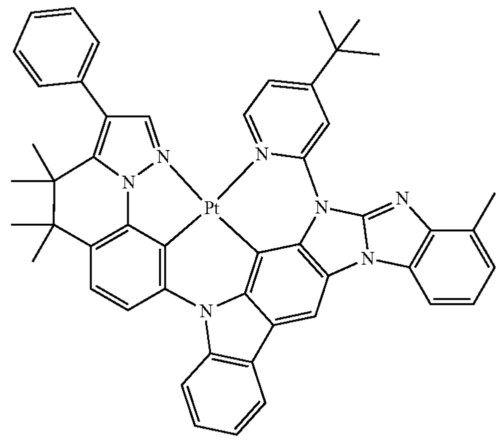
,
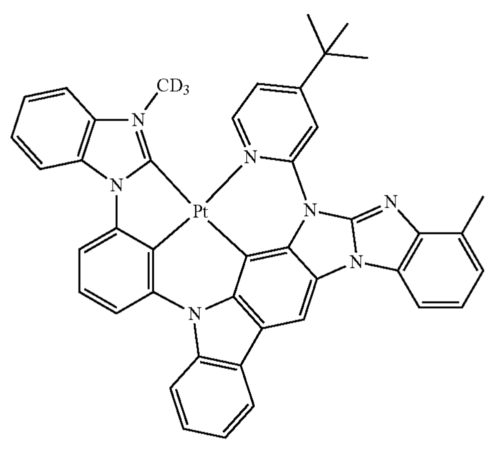
, -continued
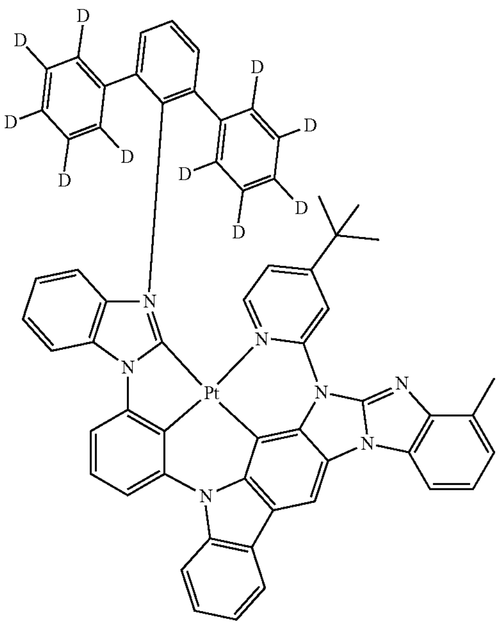
,
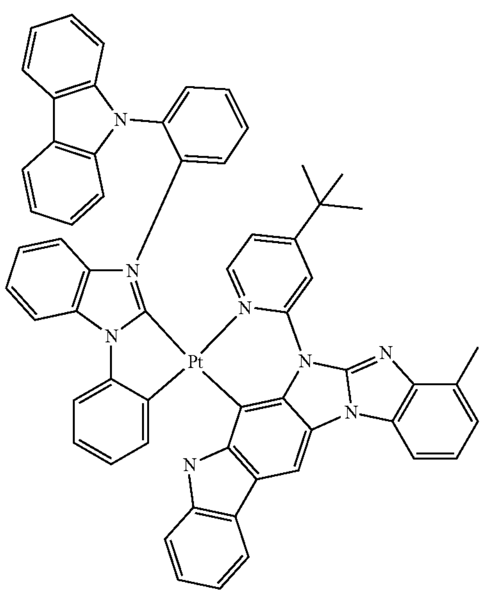
,
-continued
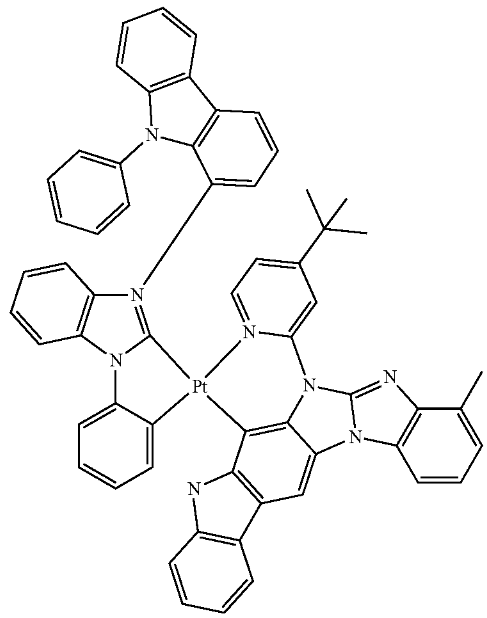
,
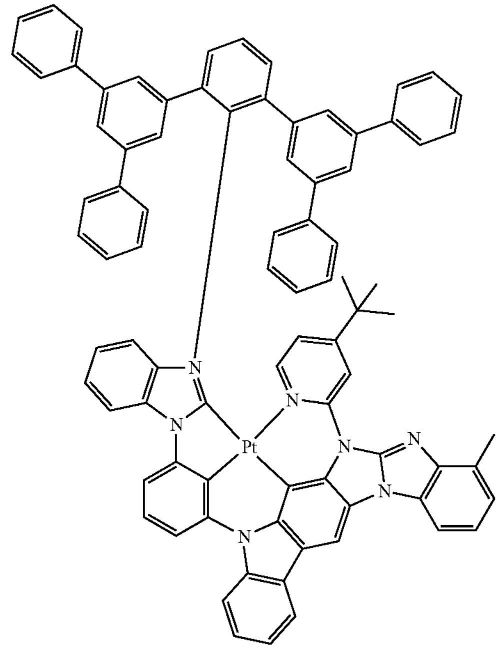
,
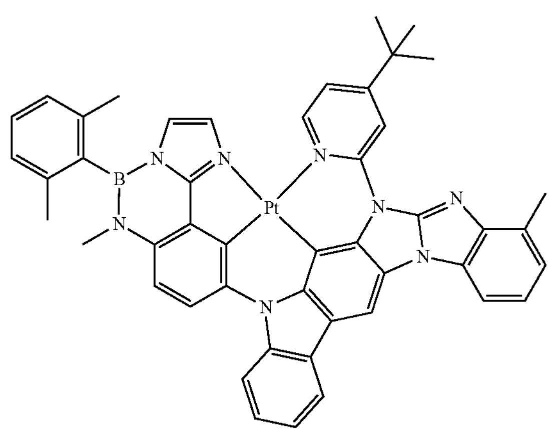
, -continued
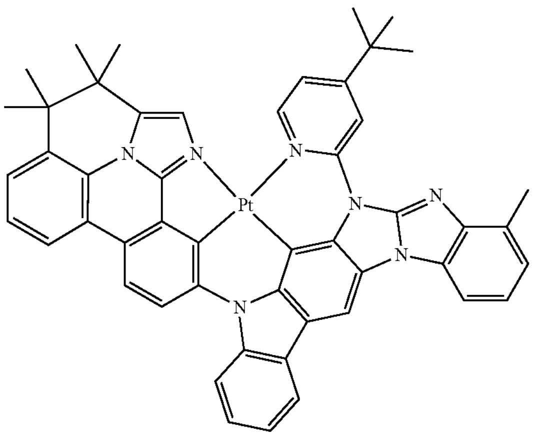
,
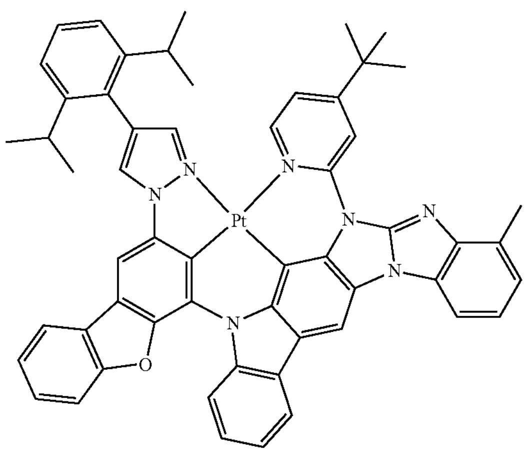
,
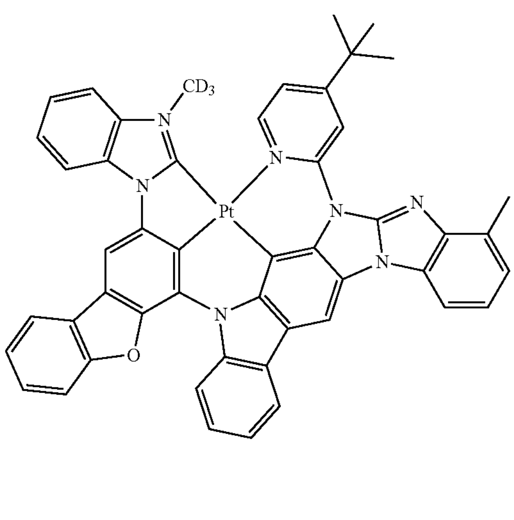
,
-continued
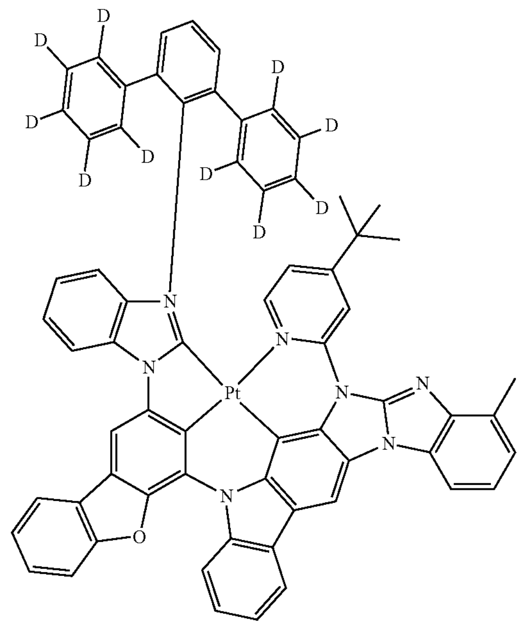
,
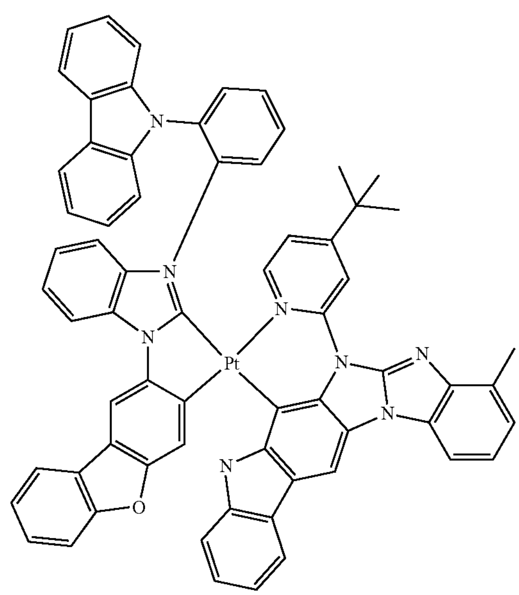
,

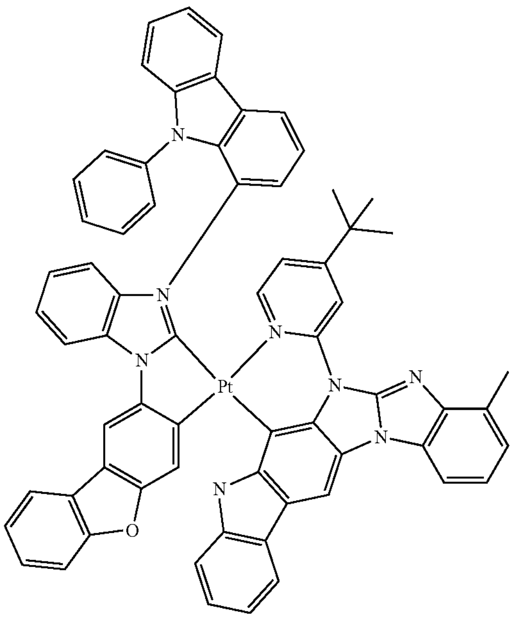
,
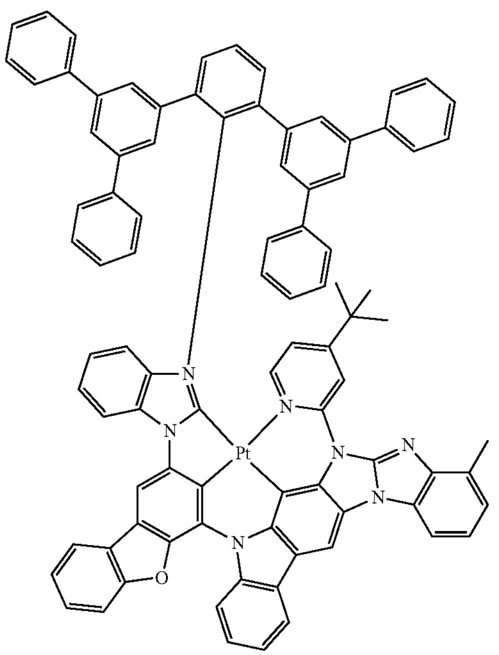
,
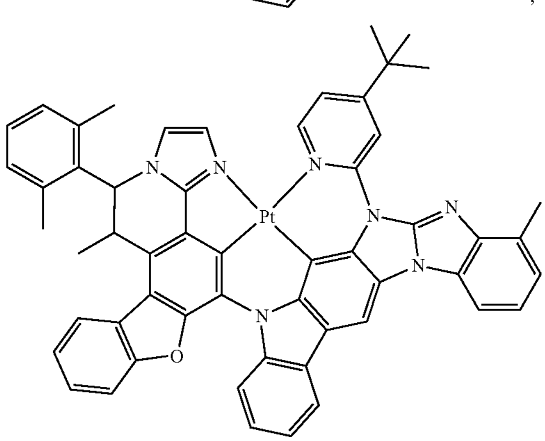
,
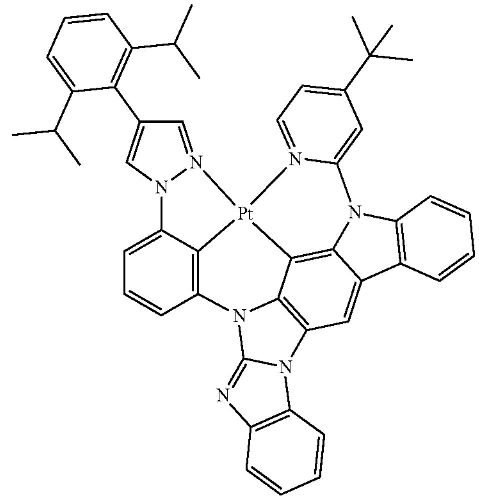
,
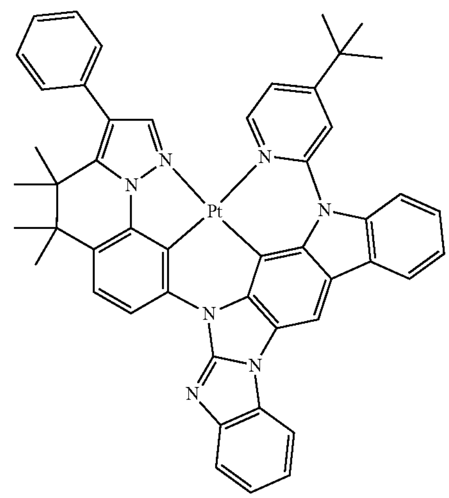
,
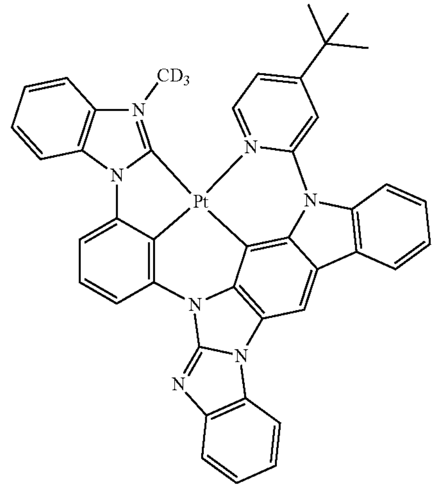
, -continued
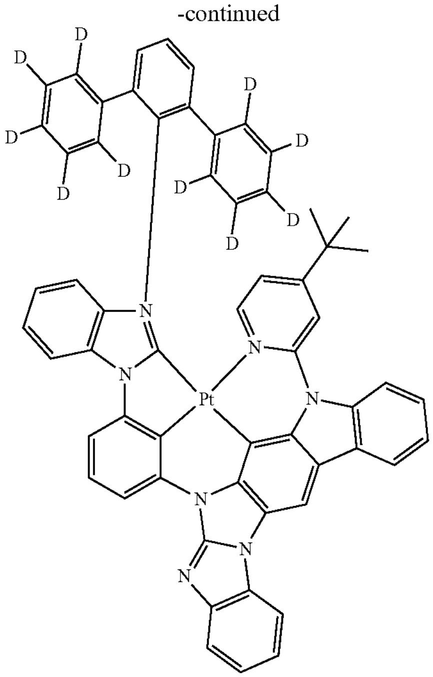
,
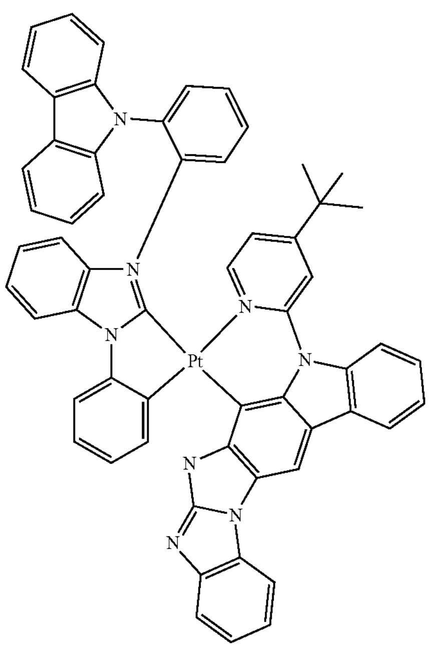
,
-continued
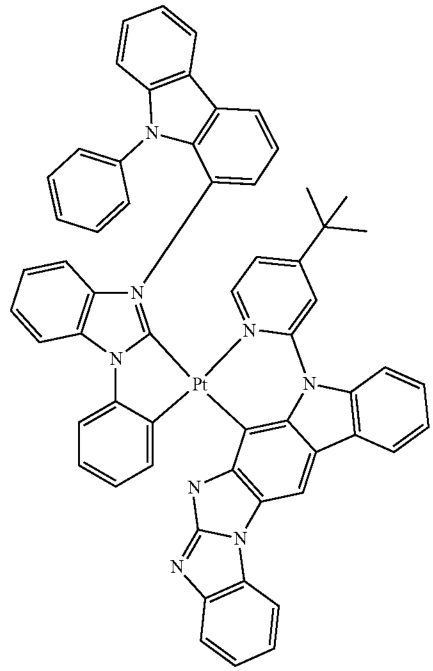
,
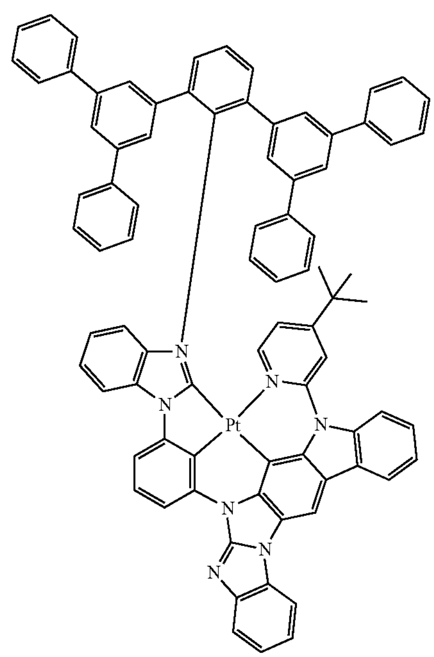
, -continued
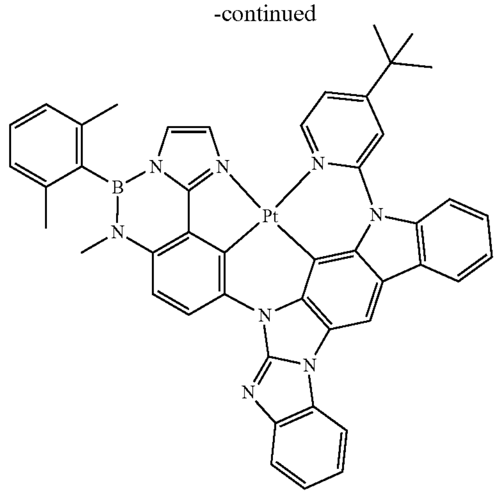
,
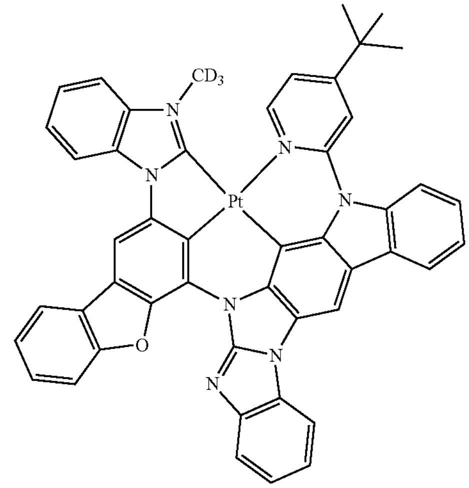
,
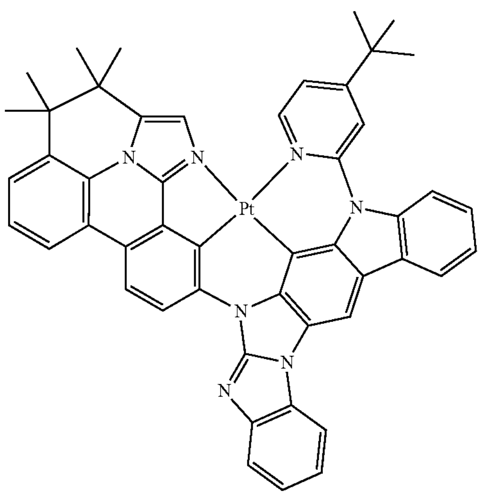
,
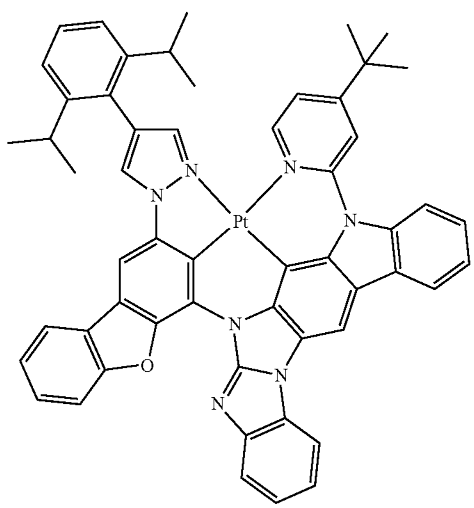
,
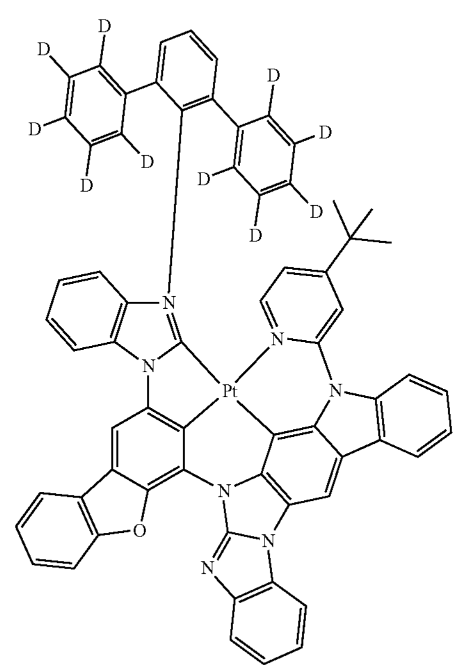
, -continued
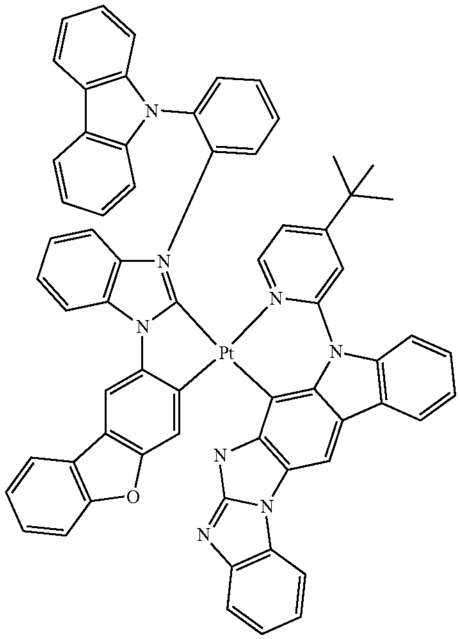
,
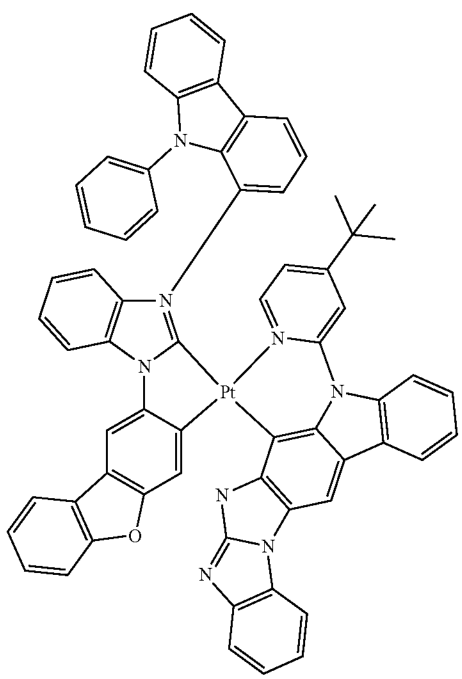
,
-continued
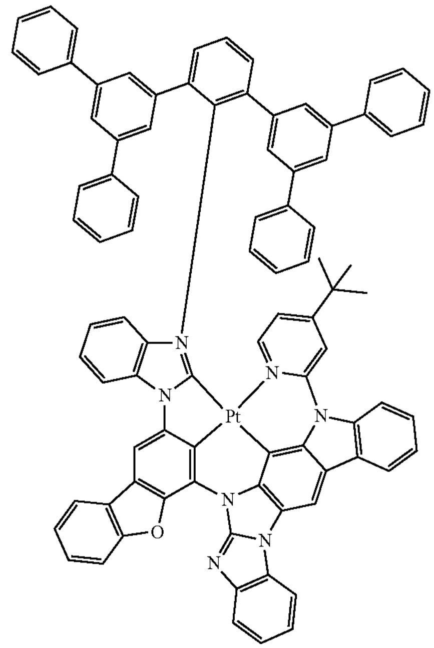
,
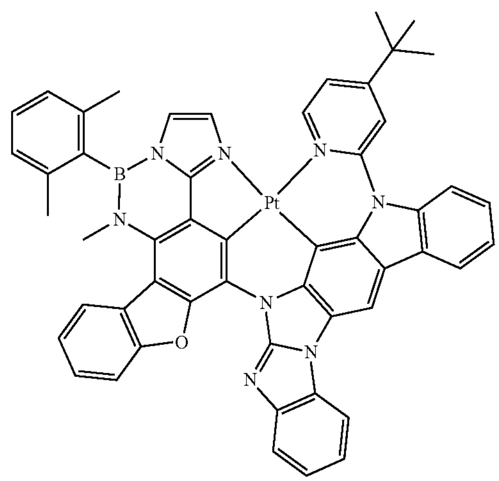
,
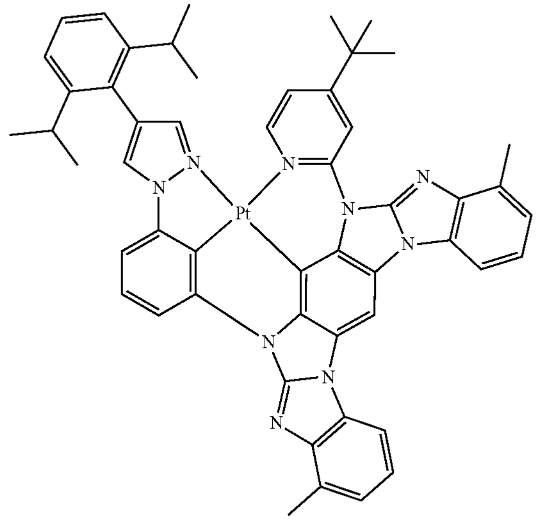
, -continued
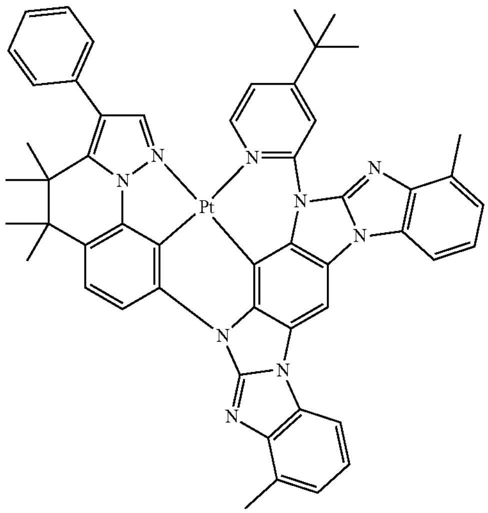
,
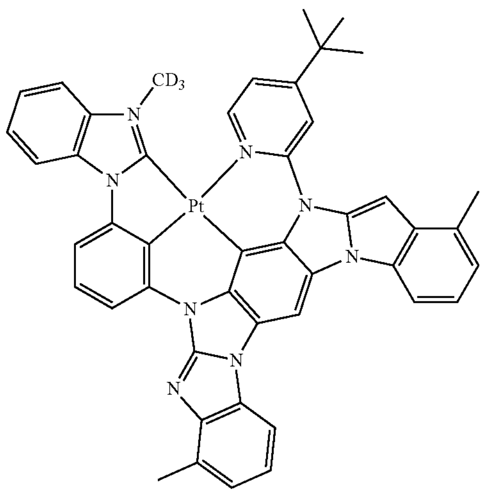
,
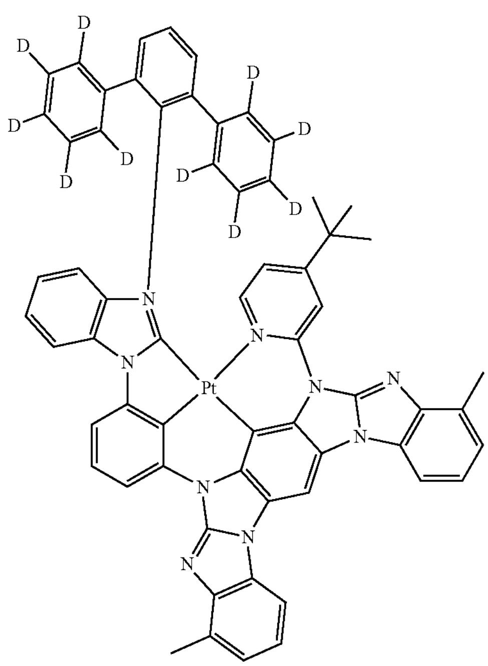
,
-continued
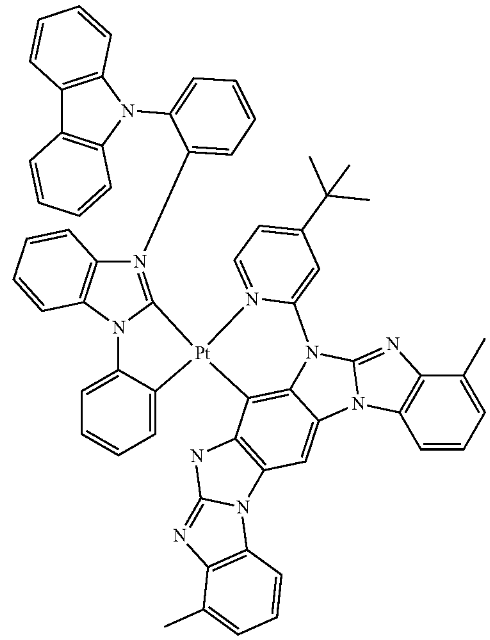
,
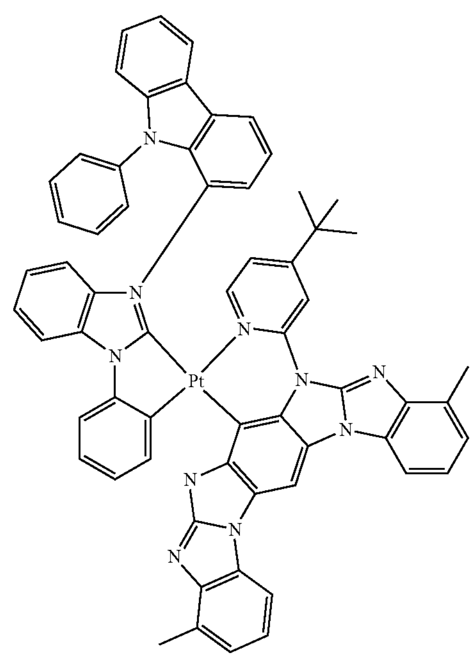
, -continued
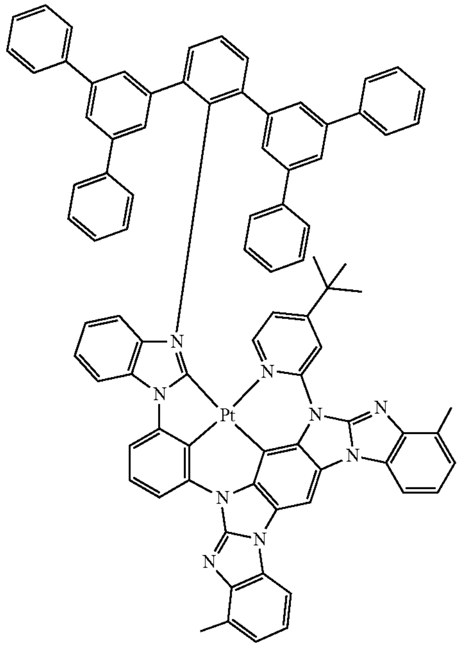
,
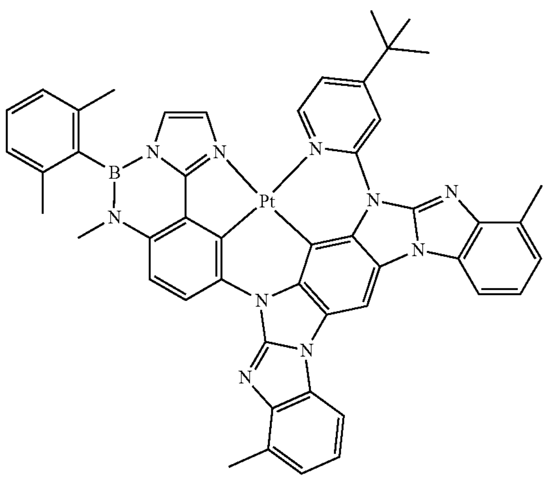
,
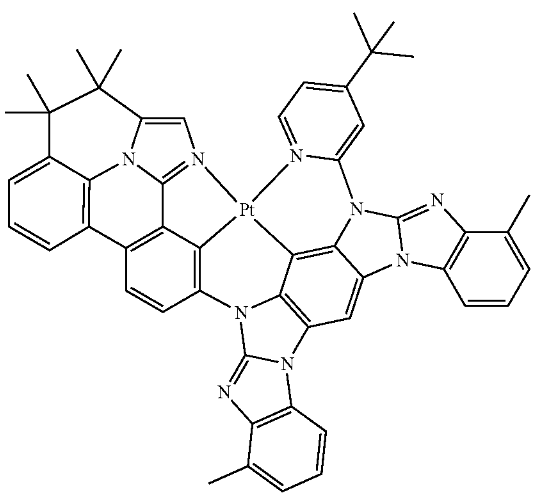
,
-continued
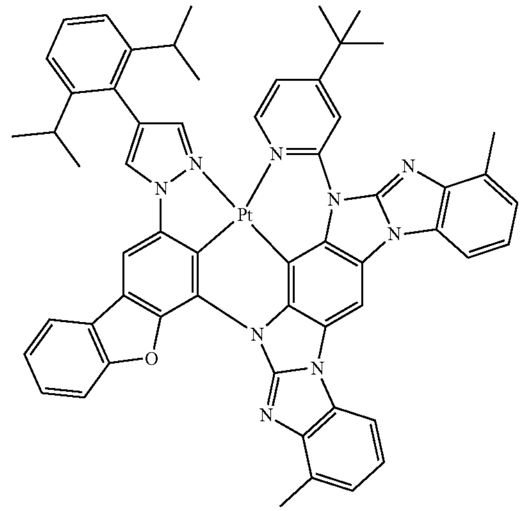
,
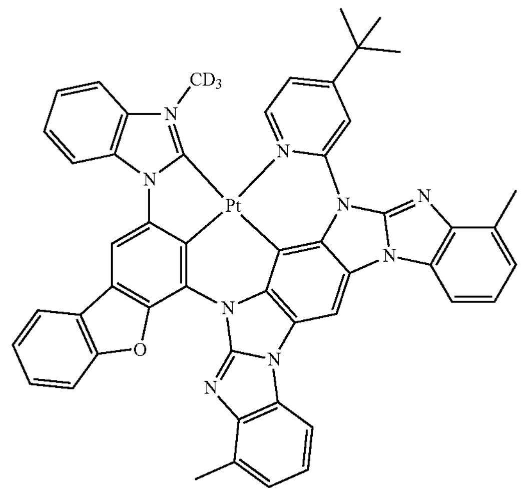
,
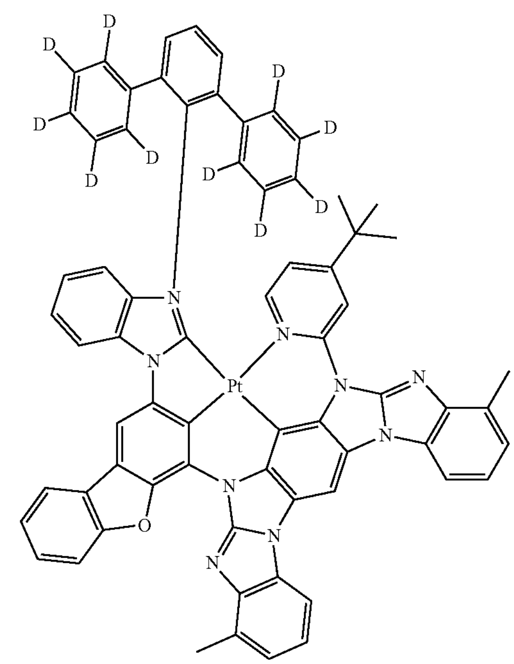
, -continued
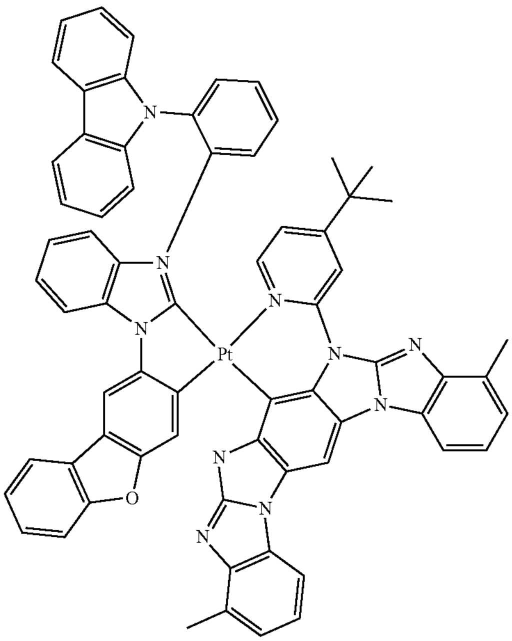
,
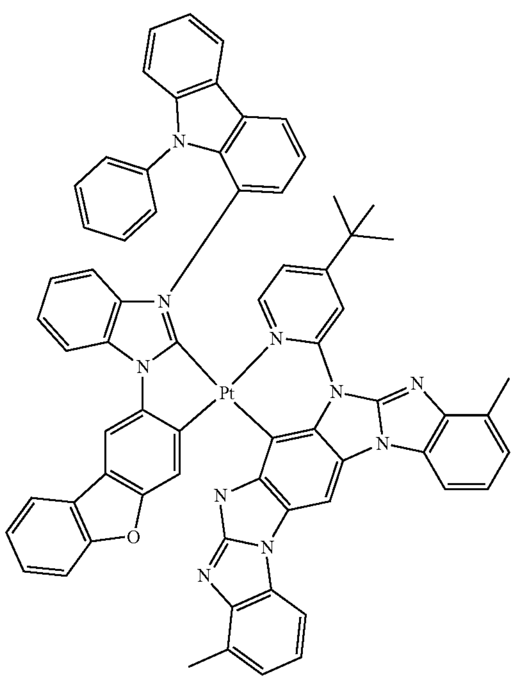
,
-continued
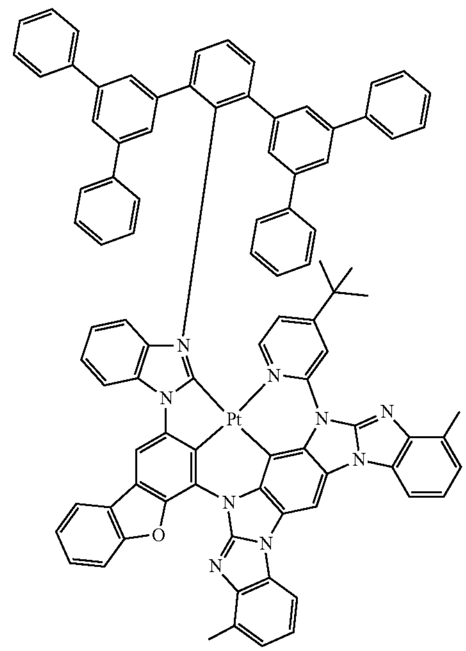
, and
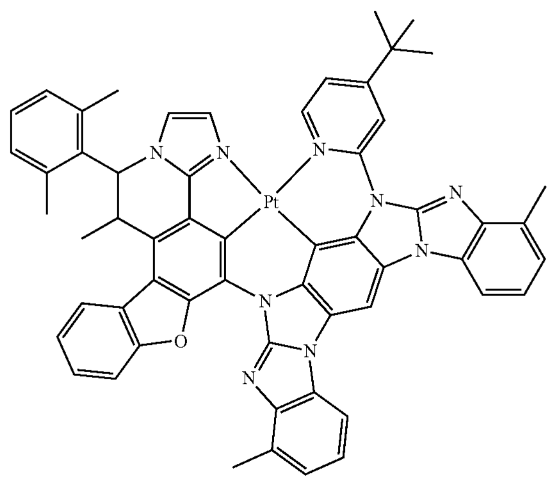
.
An organic light emitting device (OLED) is disclosed, where the OLED comprises: an anode; a cathode; and an organic layer, disposed between the anode and the cathode, comprising a compound selected from the group consisting of:
Formula I
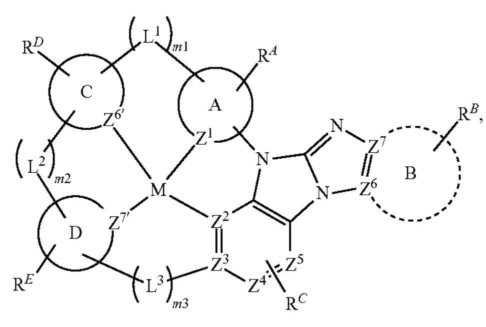

-continued

Formula II

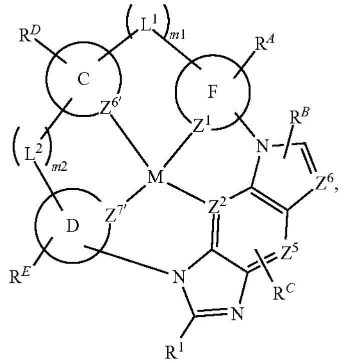

and

Formula III

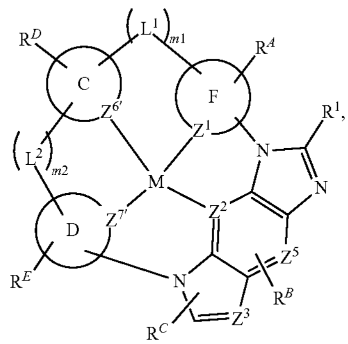

wherein; A, B, C, D, and F are each independently a 5-membered or 6-membered aromatic ring; ring B may or may not be present; M is selected from the group consisting of Pt, Pd, Cu, and Au; $Z^1$, $Z^2$, $Z^3$, $Z^4$, $Z^5$, $Z^6$, $Z^{6'}$, $Z^7$, and $Z^{7'}$ are each independently selected from the group consisting of C and N; m1, m2 and m3 are each independently an integer of 0 or 1; when m2 is 0, each m1 and m3 is 1; when m2 is 1, each m1 and m3 can be 0 or 1; when m1 is 0, $L^1$ is not present; when m2 is 0, $L^2$ is not present; when m3 is 0, $L^3$ is not present; $L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof; each $R^A$, $R^B$, $R^C$, $R^D$, and $R^E$ represents mono- to maximum possible number of substitutions, or no substitution; each $R^A$, $R^B$, $R^C$, $R^D$, $R^E$, R and R' is a hydrogen or a substituent independently selected from the group consisting of the general substituents as defined herein; any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

In some embodiments of the OLED, the compound is a sensitizer; wherein the device further comprises an acceptor; and wherein the acceptor is selected from the group consisting of fluorescent emitter, delayed fluorescence emitter, and combination thereof.

A consumer product comprising the OLED is also disclosed, where the OLED comprises: an anode; a cathode; and an organic layer, disposed between the anode and the cathode, comprising a compound selected from the group consisting of:

Formula I

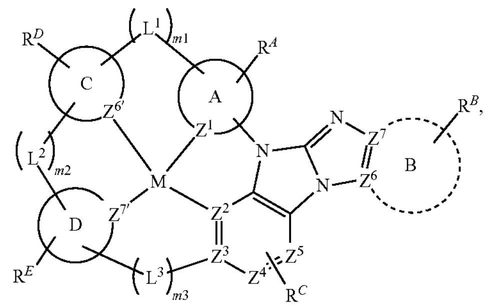

Formula II

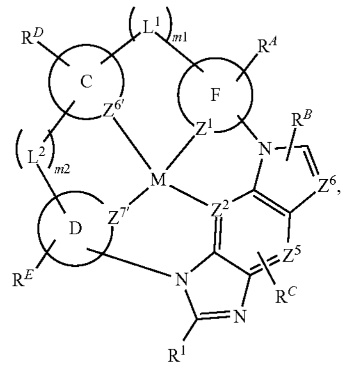

and

Formula III

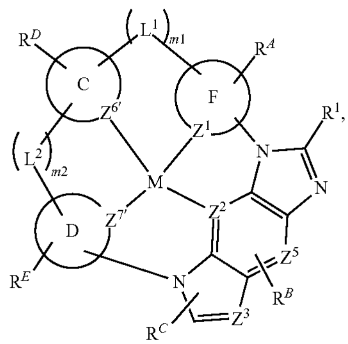

where; A, B, C, D, and F are each independently a 5-membered or 6-membered aromatic ring; ring B may or may not be present; M is selected from the group consisting of Pt, Pd, Cu, and Au; $Z^1$, $Z^2$, $Z^3$, $Z^4$, $Z^5$, $Z^6$, $Z^{6'}$, $Z^7$, and $Z^{7'}$ are each independently selected from the group consisting of C and N; m1, m2 and m3 are each independently an integer of 0 or 1; when m2 is 0, each m1 and m3 is 1; when m2 is 1, each m1 and m3 can be 0 or 1; when m1 is 0, $L^1$ is not present; when m2 is 0, $L^2$ is not present; when m3 is 0, $L^3$ is not present; $L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof; each $R^A$, $R^B$, $R^C$, $R^D$, and $R^E$ represents mono- to maximum possible number of substitutions, or no substitution; each $R^A$, $R^B$, $R^C$, $R^D$, $R^E$, R and R' is a hydrogen or a substituent independently selected from the group consisting of the general substituents defined herein; and any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others).

When there are more than one ligand coordinated to a metal, the ligands can all be the same in some embodiments. In some other embodiments, at least one ligand is different from the other ligand(s). In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

In some embodiments, the compound of the present disclosure is neutrally charged.

According to another aspect, a formulation comprising the compound described herein is also disclosed. The formulation can include one or more components selected from the group consisting of a solvent, a host, a hole injection material, hole transport material, electron blocking material, hole blocking material, and an electron transport material, disclosed herein.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nCH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the Host Group consisting of:

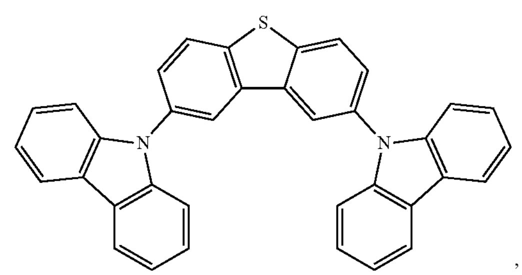

,

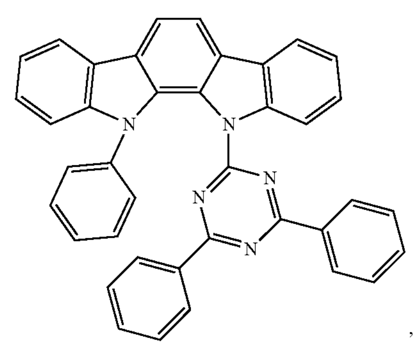

,

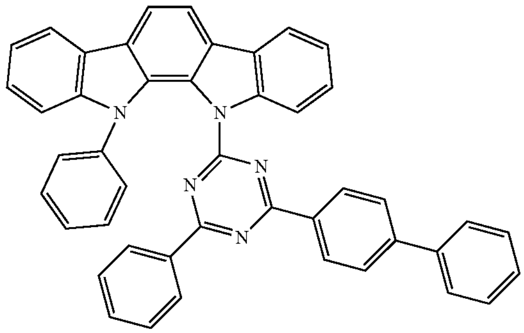
,
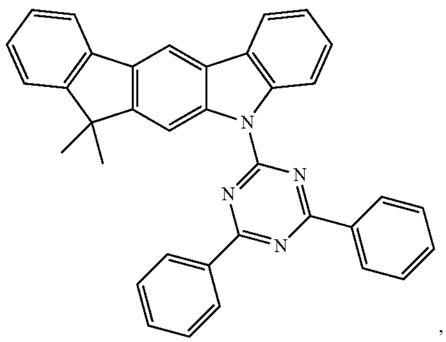
,
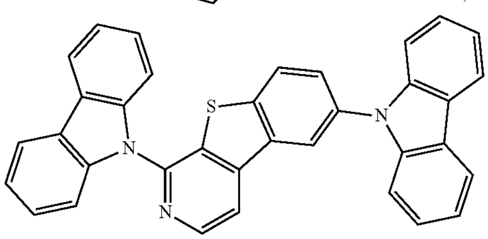
,
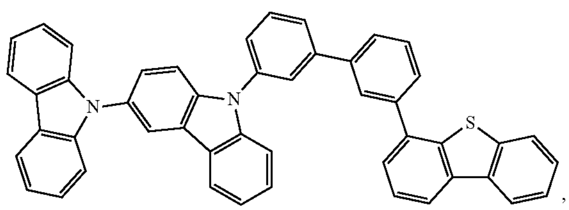
,
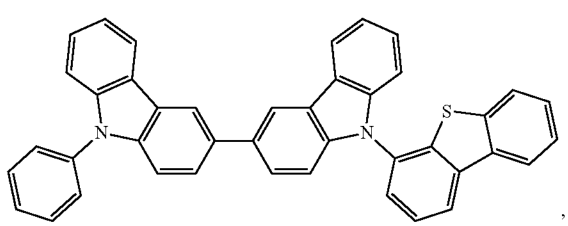
,
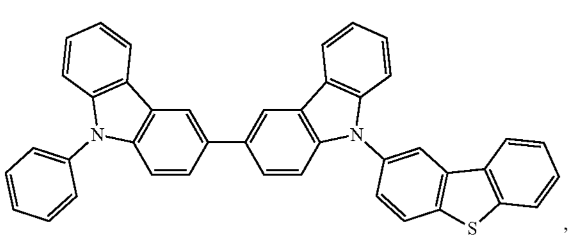
,
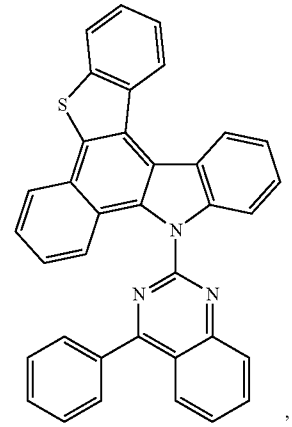
,
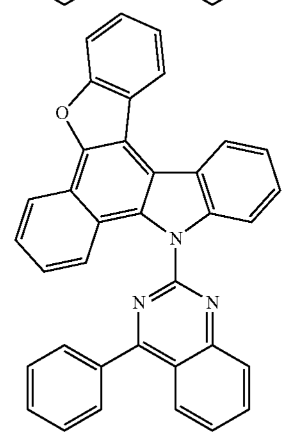
,
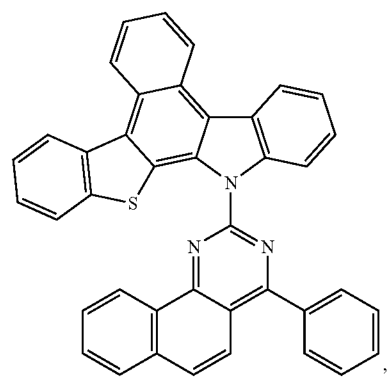 [SMILES: c1ccc(-c2nc(-n3c4ccccc4c4c5ccccc5c5c6ccccc6sc5c43)nc3c2ccc2ccccc23)cc1]
,
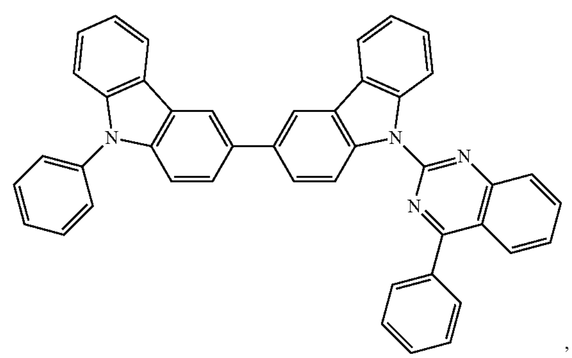
, -continued
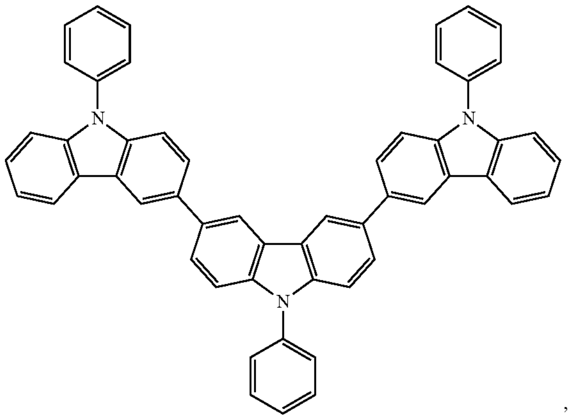
,
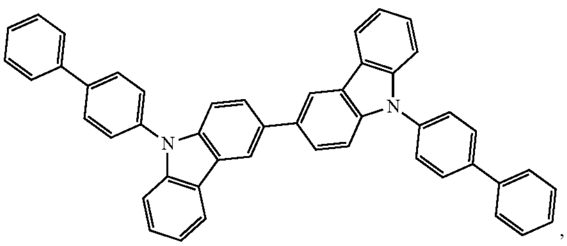
,
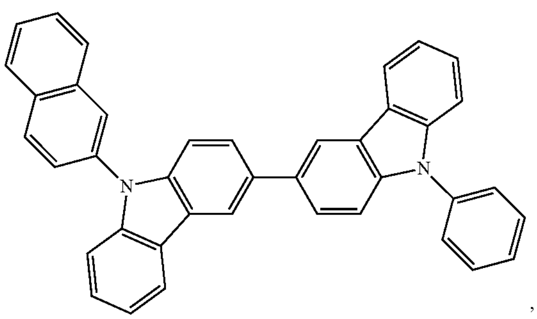
,
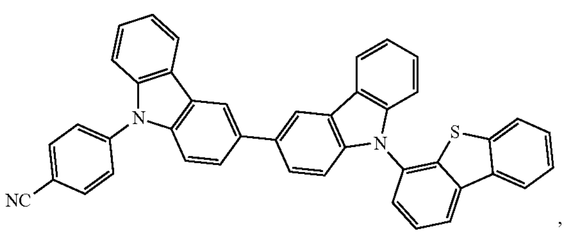
,
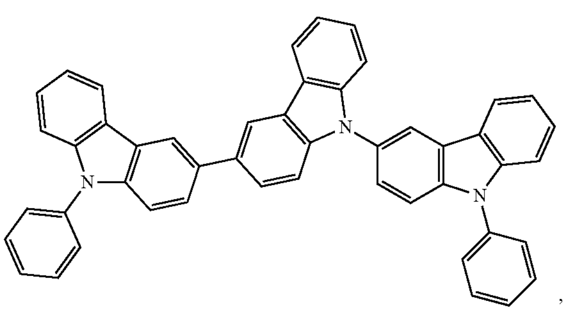
,
-continued
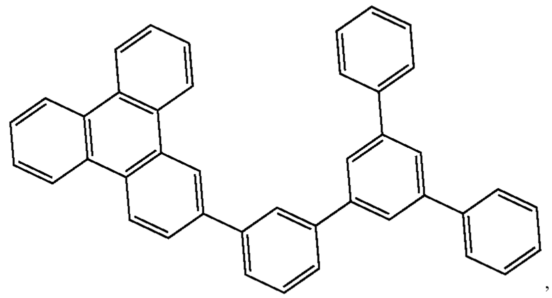
,
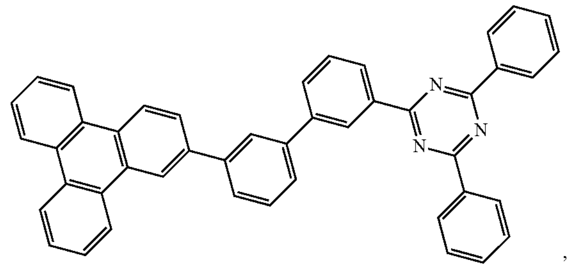
,
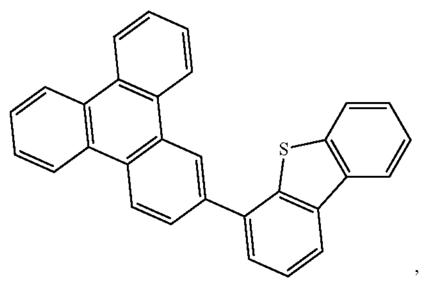
,
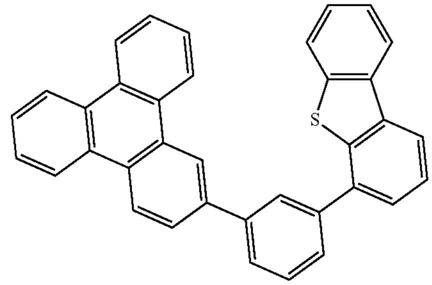
,
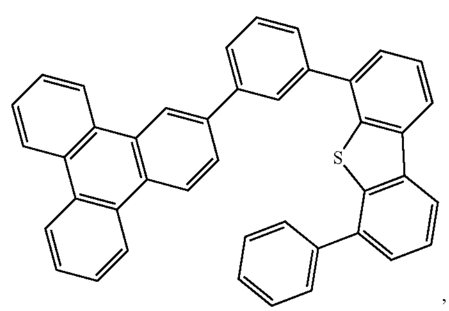
,
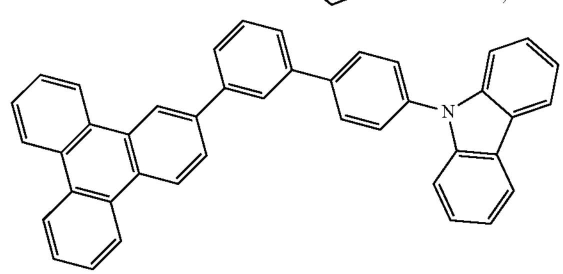
,

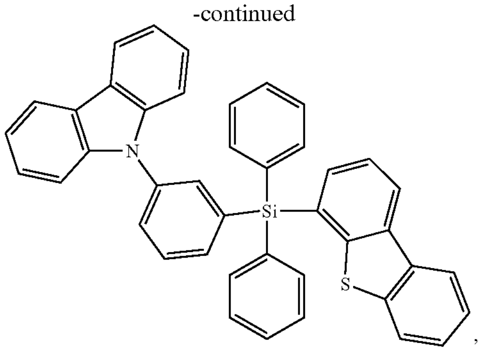

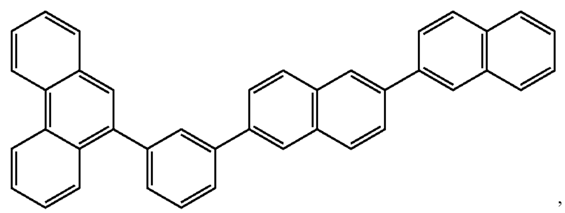

and combinations thereof.

Additional information on possible hosts is provided below.

An emissive region in an OLED is also disclosed, the emissive region comprises a compound selected from the group consisting of:

Formula I

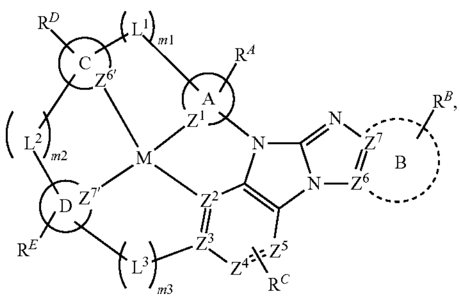

Formula II

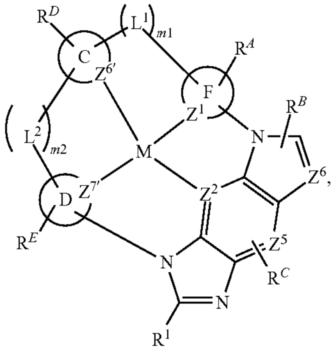

and

Formula III

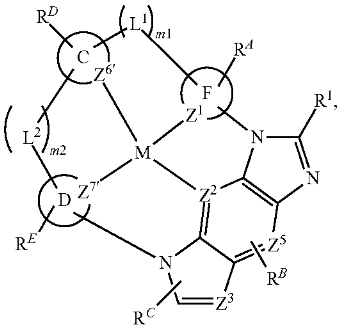

where; A, B, C, D, and F are each independently a 5-membered or 6-membered aromatic ring; ring B may or may not be present; M is selected from the group consisting of Pt, Pd, Cu, and Au; $Z^1$, $Z^2$, $Z^3$, $Z^4$, $Z^5$, $Z^6$, $Z^{6'}$, $Z^7$, and $Z^{7'}$ are each independently selected from the group consisting of C and N; m1, m2 and m3 are each independently an integer of 0 or 1; when m2 is 0, each m1 and m3 is 1; when m2 is 1, each m1 and m3 can be 0 or 1; when m1 is 0, $L^1$ is not present; when m2 is 0, $L^2$ is not present; when m3 is 0, $L^3$ is not present; $L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof; each $R^A$, $R^B$, $R^C$, $R^D$, and $R^E$ represents mono- to maximum possible number of substitutions, or no substitution; each $R^A$, $R^B$, $R^C$, $R^D$, $R^E$, R and R' is a hydrogen or a substituent independently selected from the group consisting of the general substituents defined herein; and any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

In some embodiments of the emissive region, the compound is an emissive dopant or a non-emissive dopant. In some embodiments, the emissive region further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiments, the emissive region further comprises a host, wherein the host is selected from the Host Group defined herein.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound is can also be incorporated into the supramolecule complex without covalent bonds.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

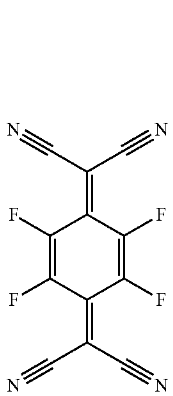

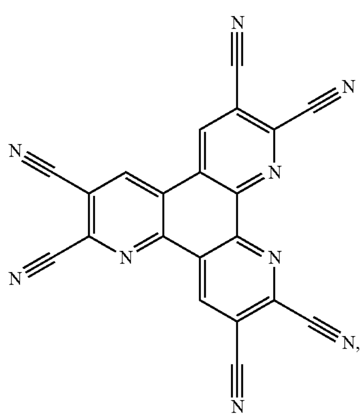

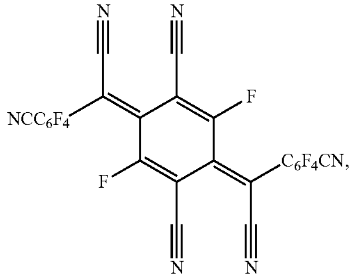

-continued

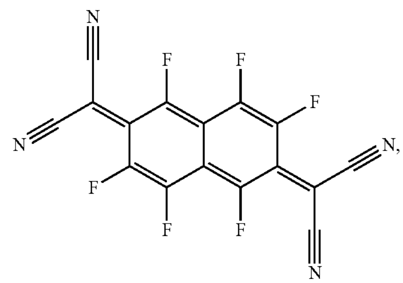

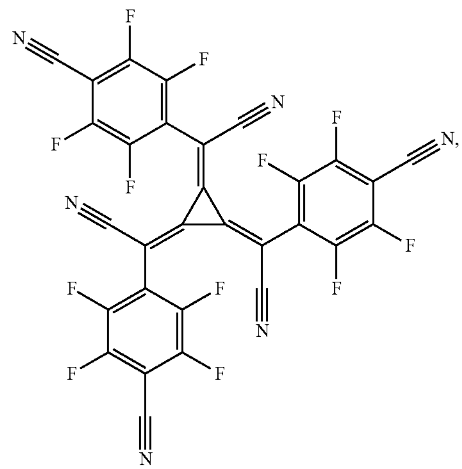

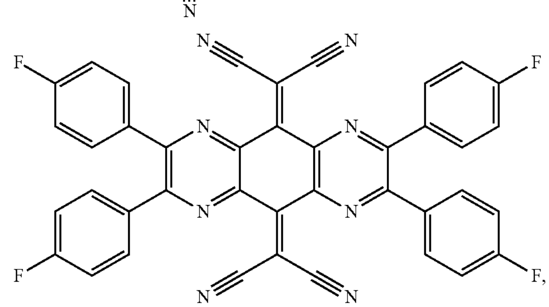

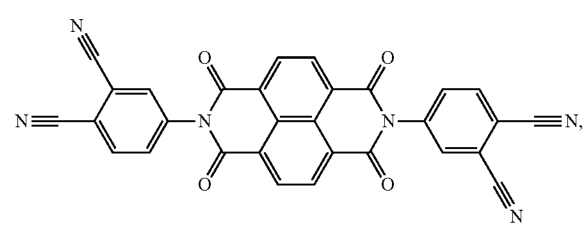

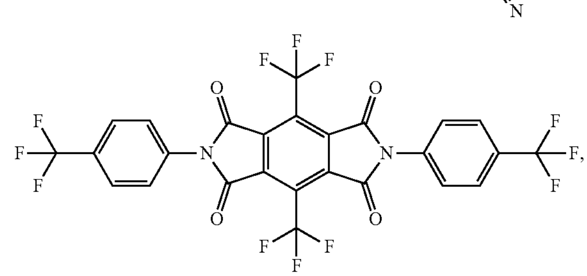

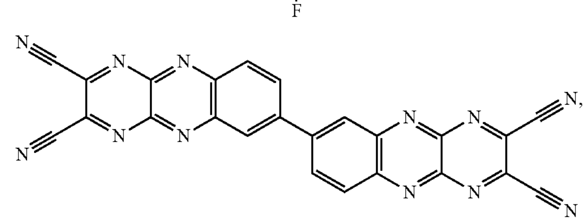

-continued

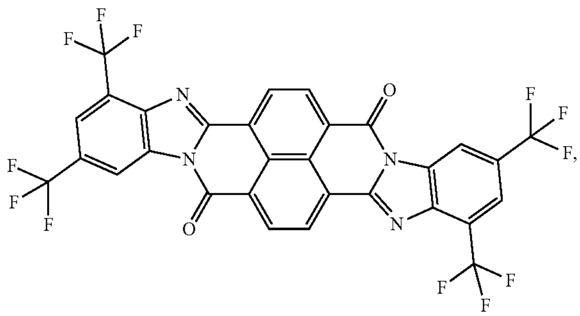

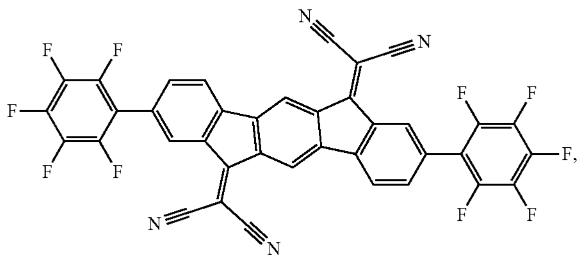

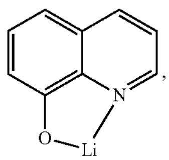

, and

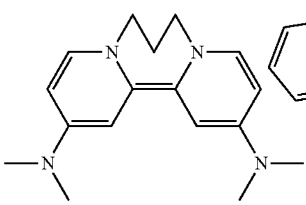

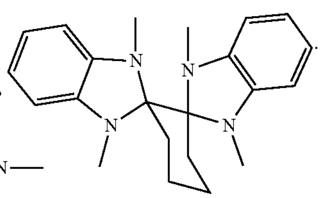

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

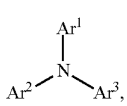

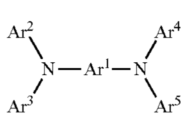

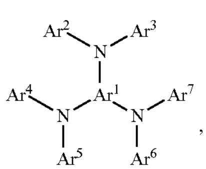

-continued

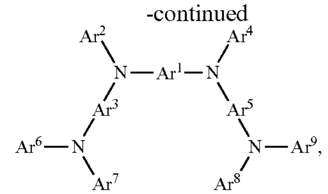

and

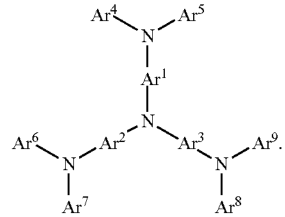

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

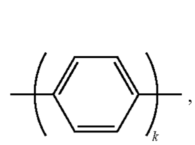

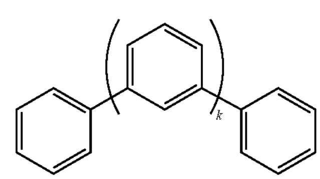

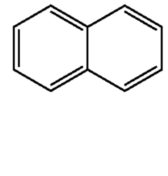

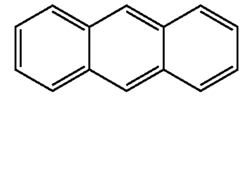

-continued

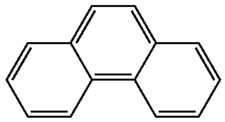

,

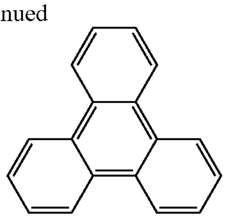

,

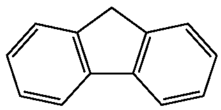

, and

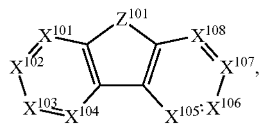

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

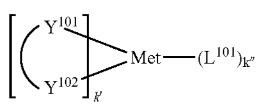

wherein Met is a metal, which can have an atomic weight greater than 40; $(Y^{101}-Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

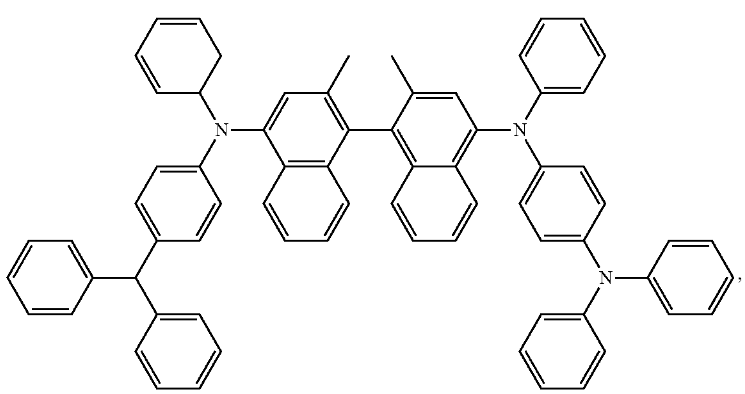

,

In one aspect, $(Y^{101}-Y^{102})$ is a 2-phenylpyridine derivative. In another aspect, $(Y^{101}-Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

-continued
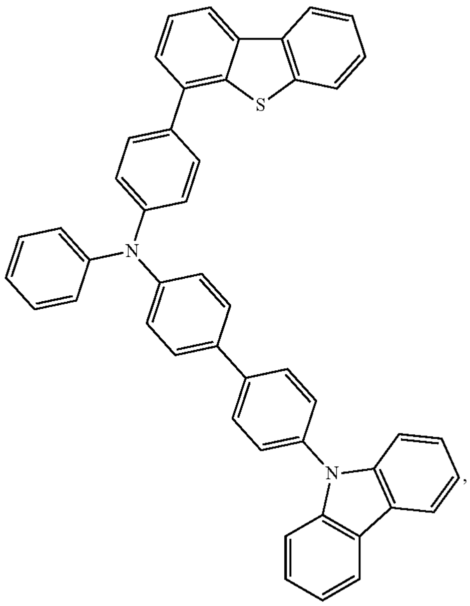
,
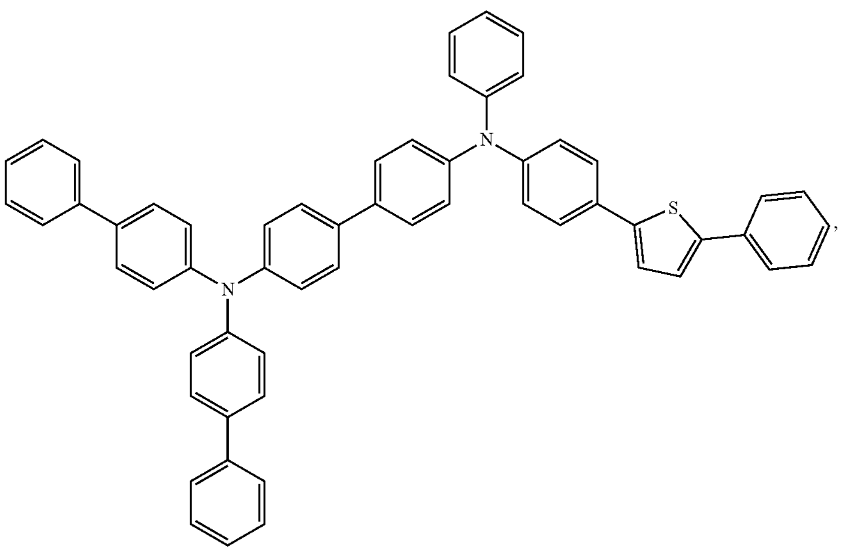
,
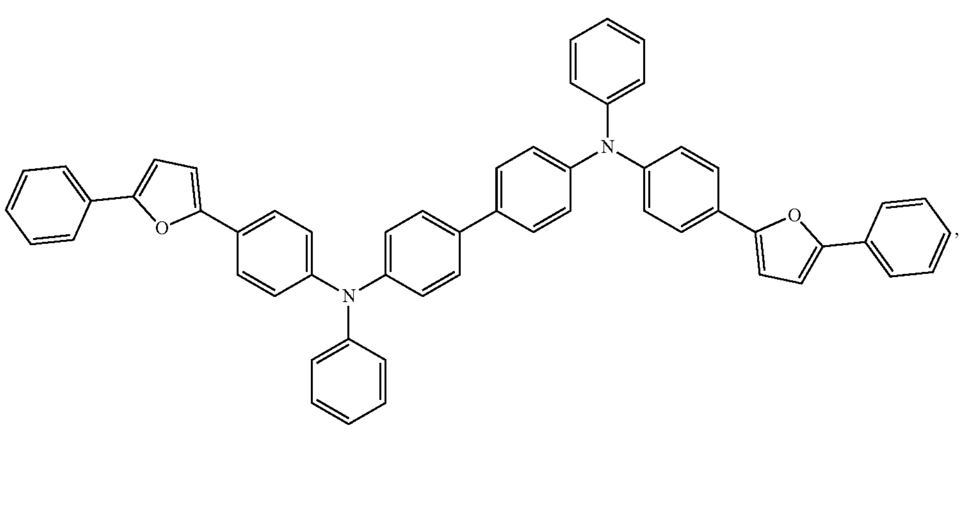
,

-continued
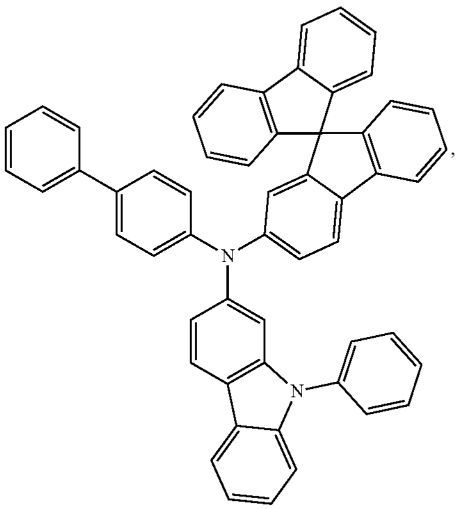
,
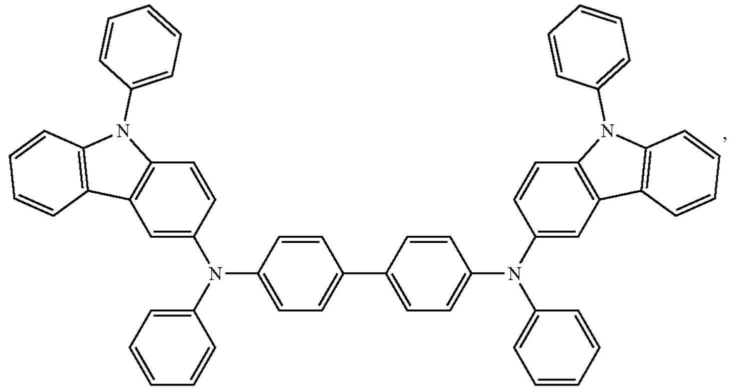
,
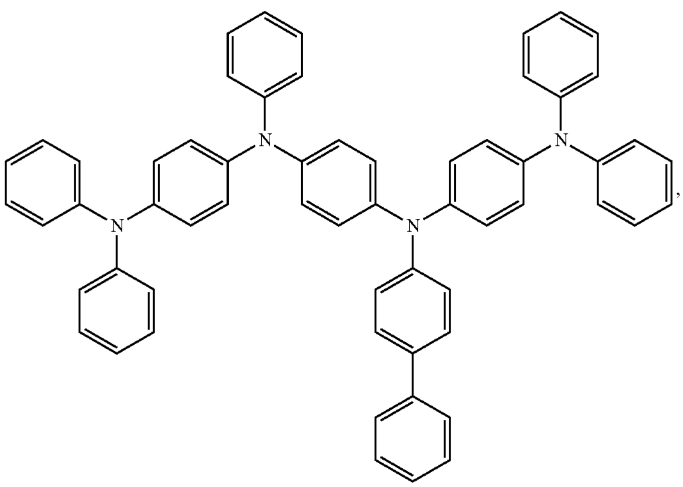
,
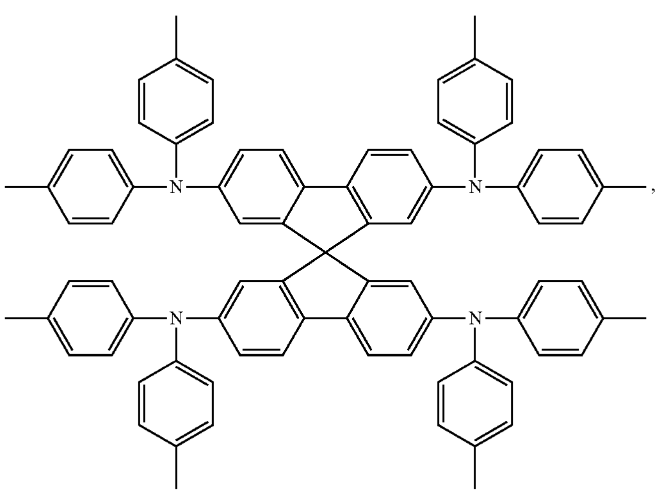
,

-continued
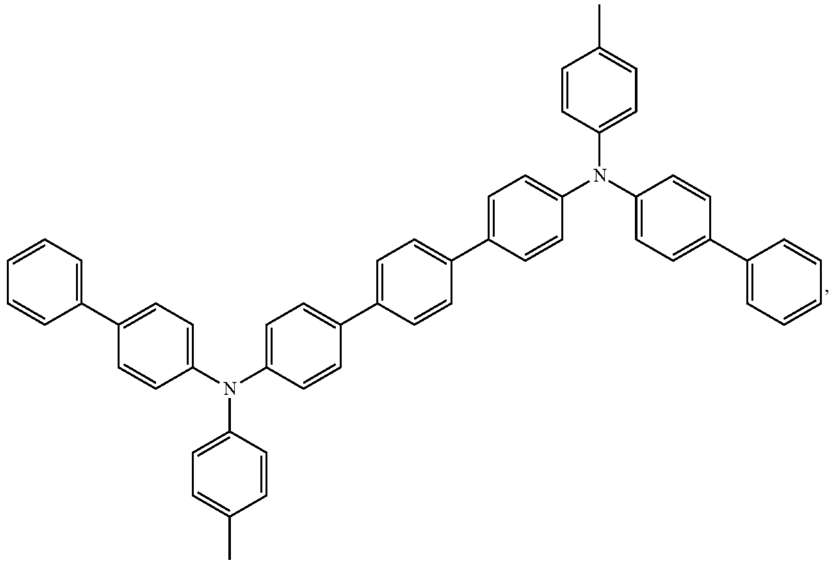
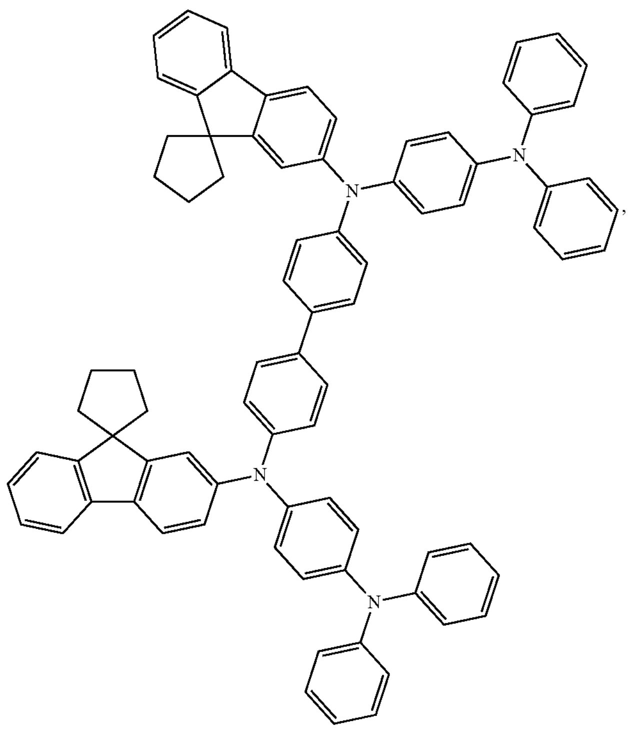
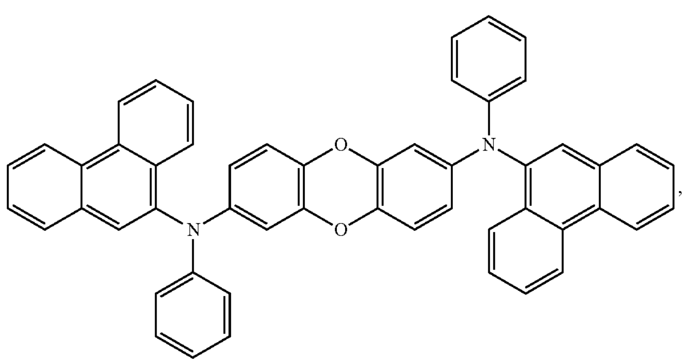

-continued
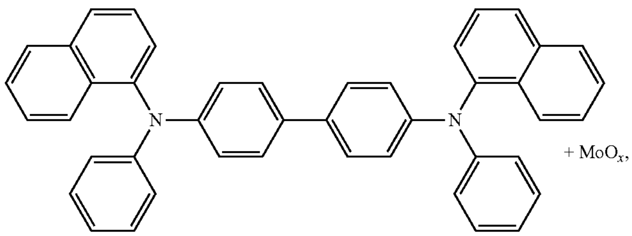
+ $MoO_x$,
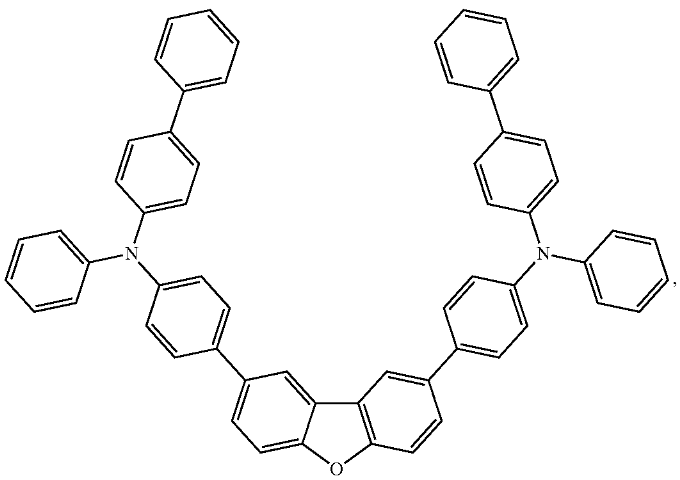
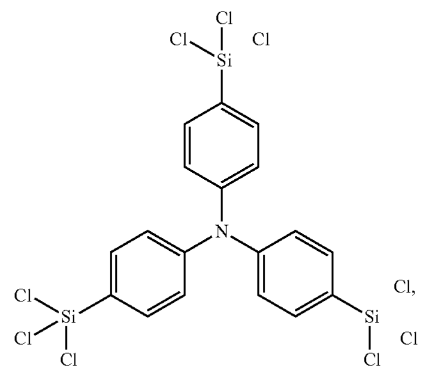
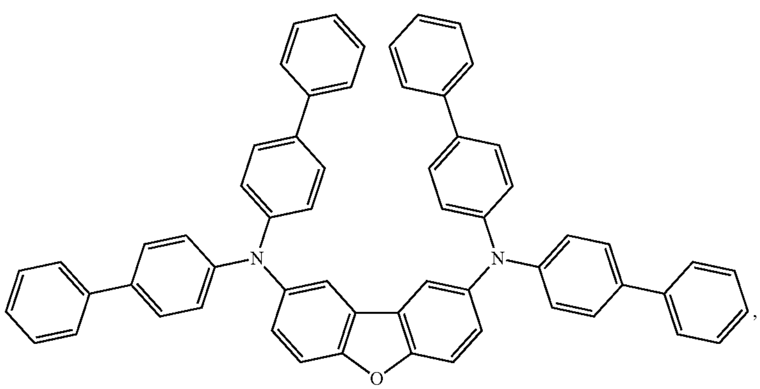
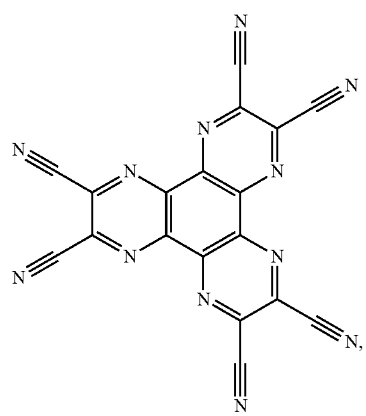
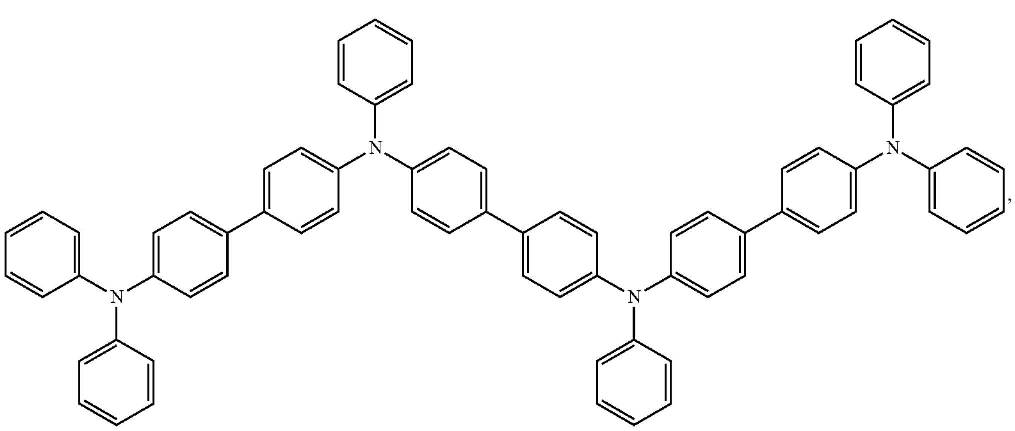

-continued
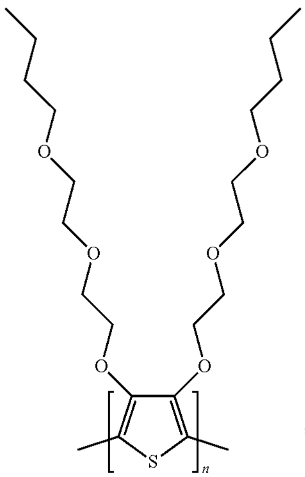
,
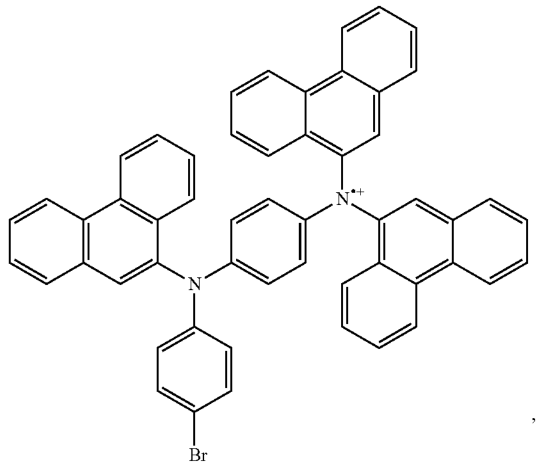
,
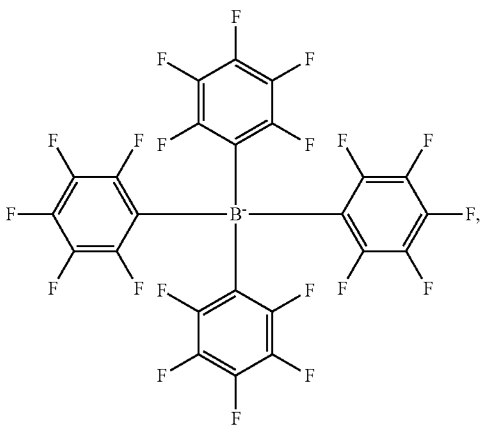
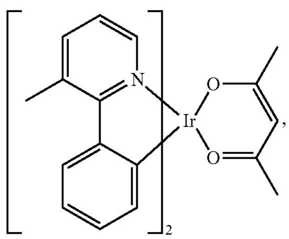
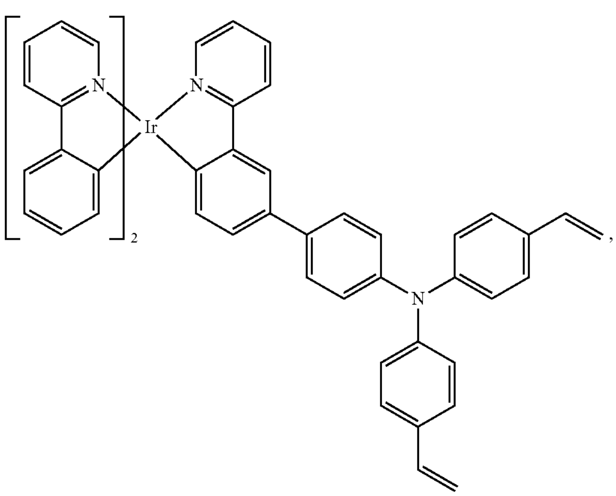

-continued
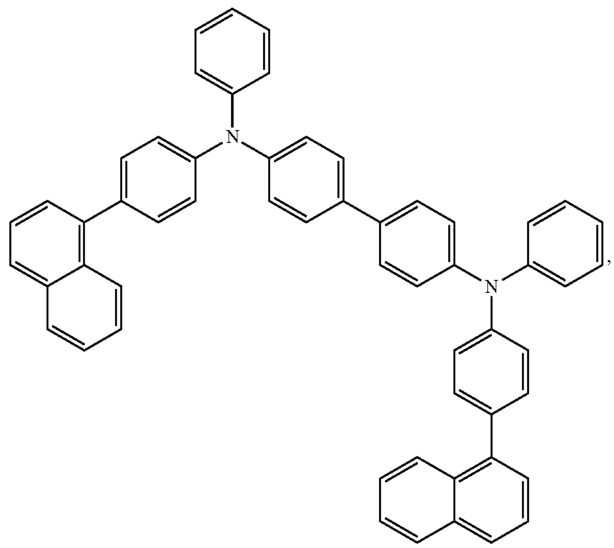
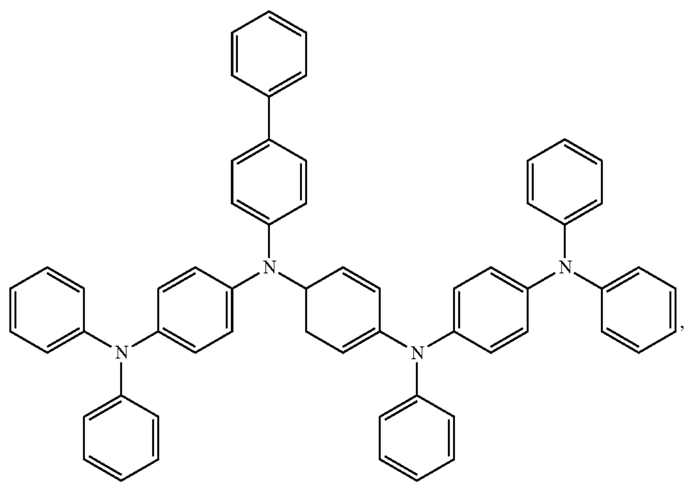
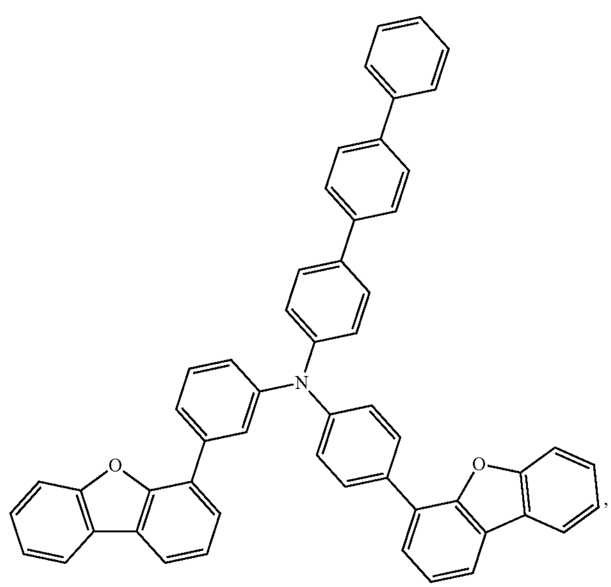

-continued
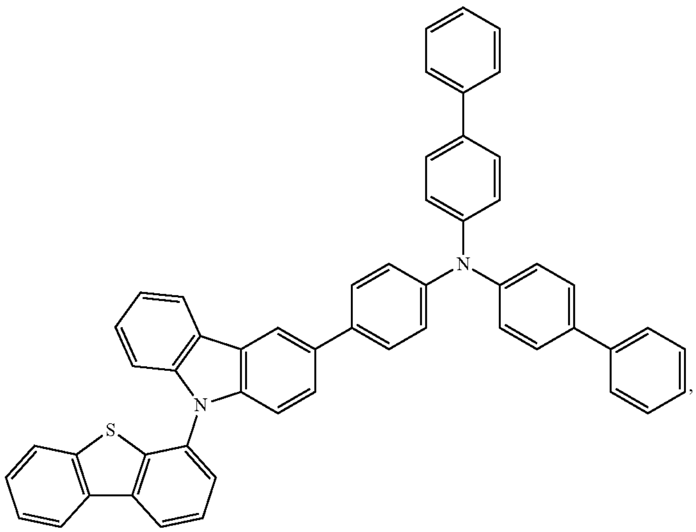
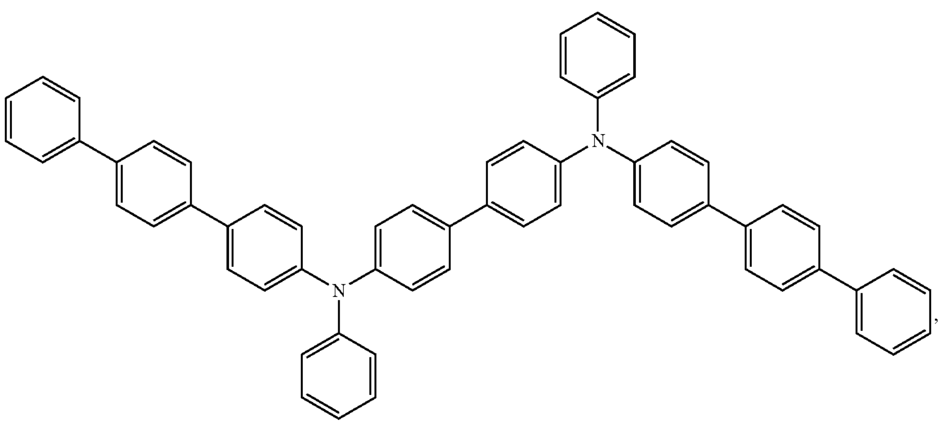
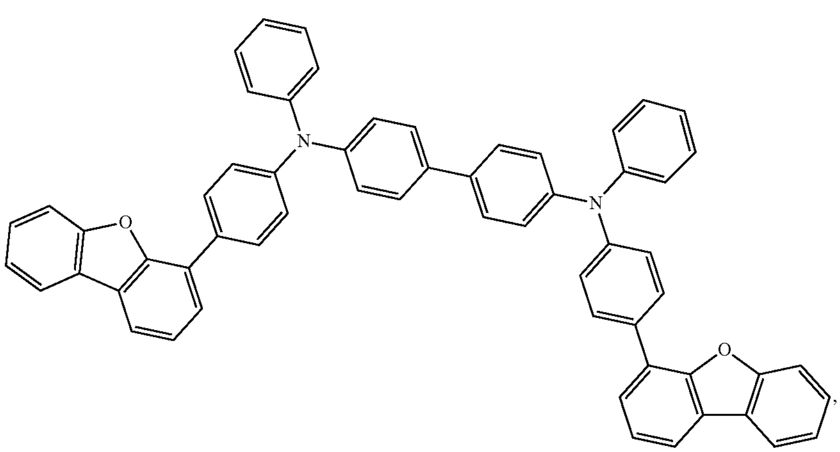

-continued
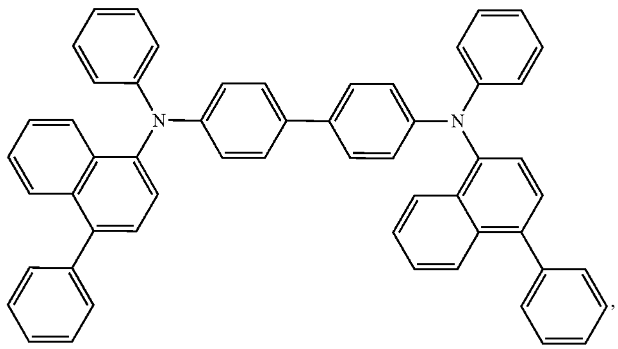
,
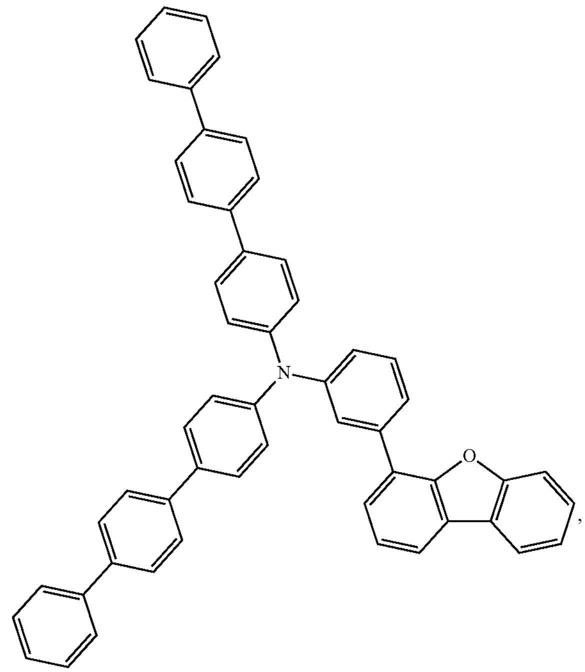
,
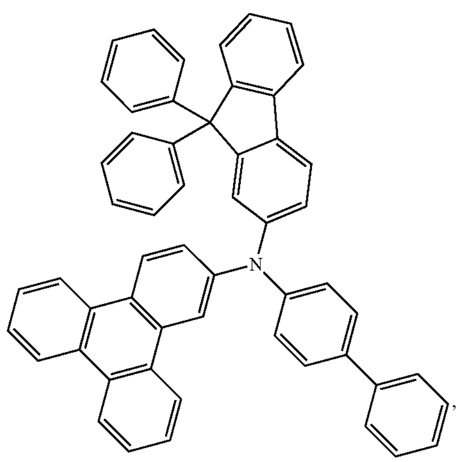
,
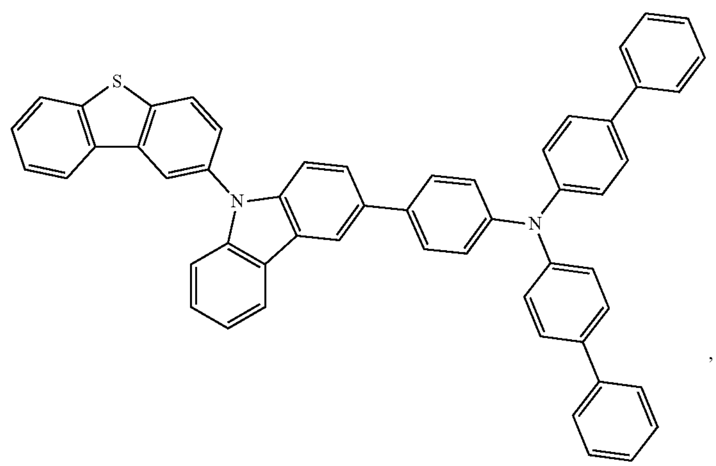
,
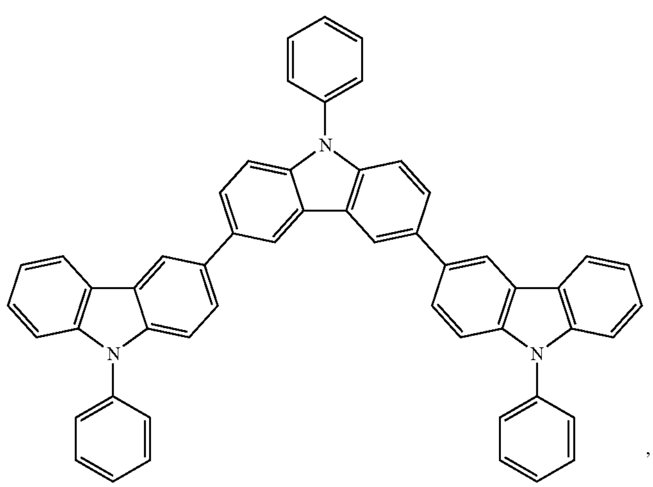
,
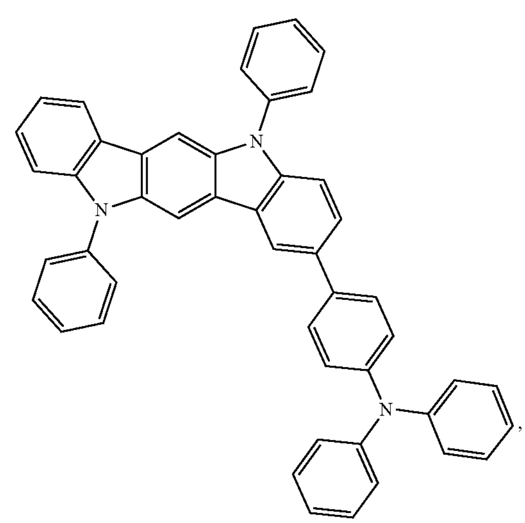
, -continued
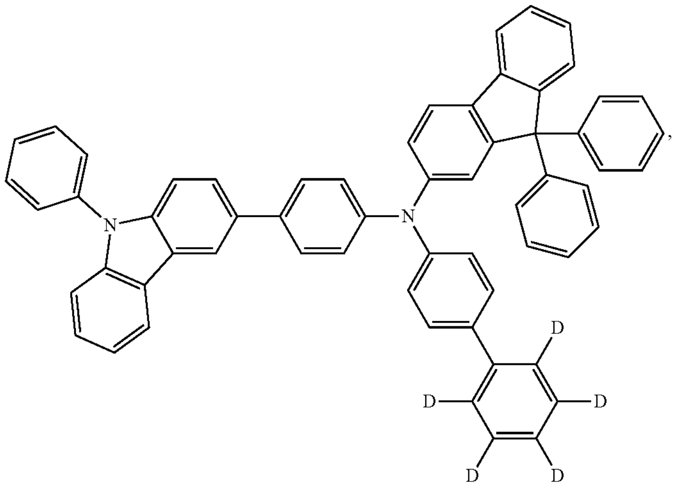
,
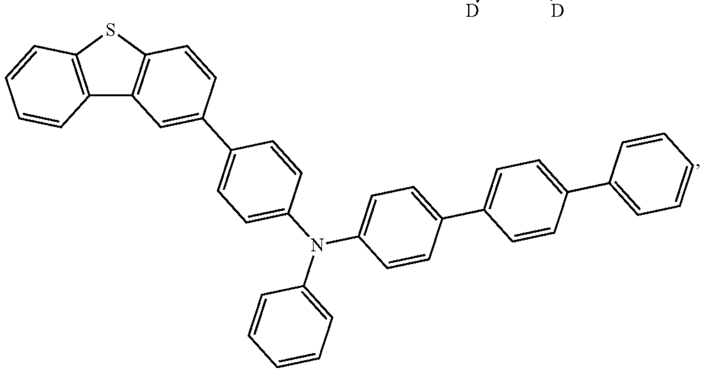
,
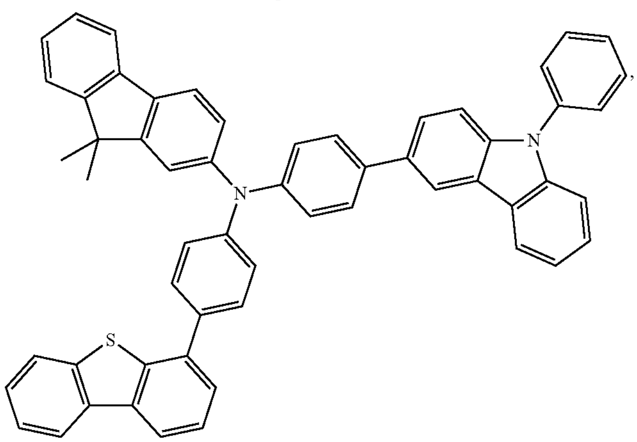
,
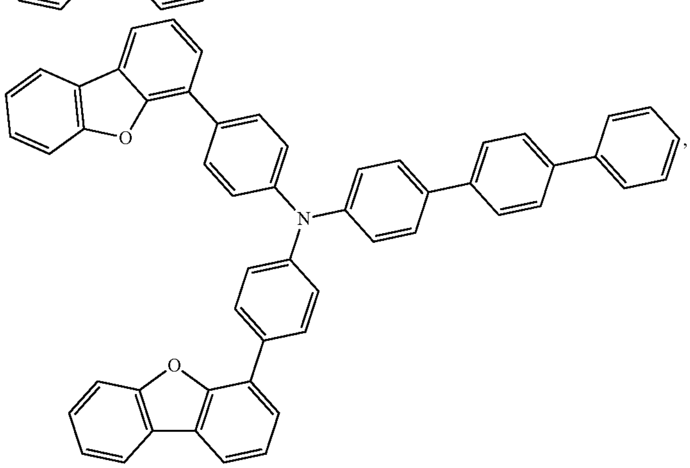
, -continued
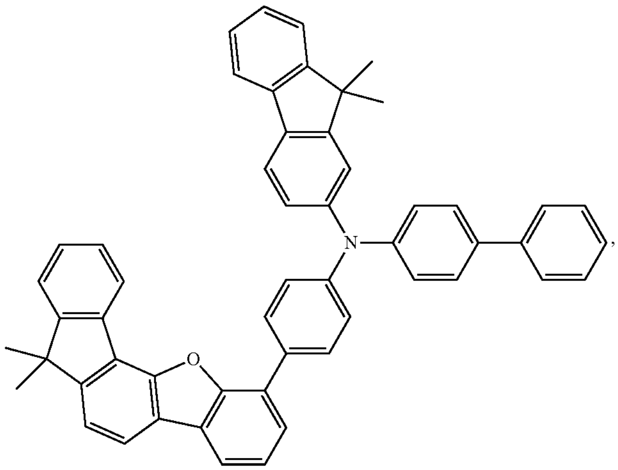
,
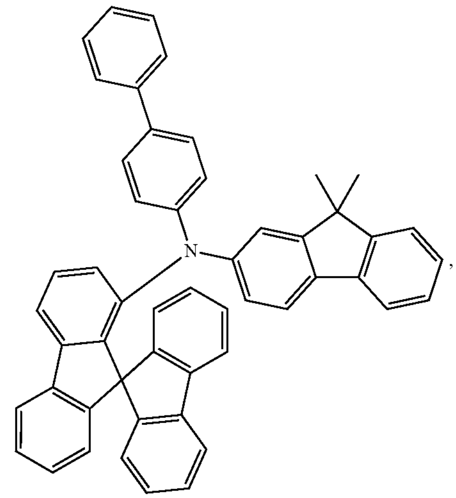
,
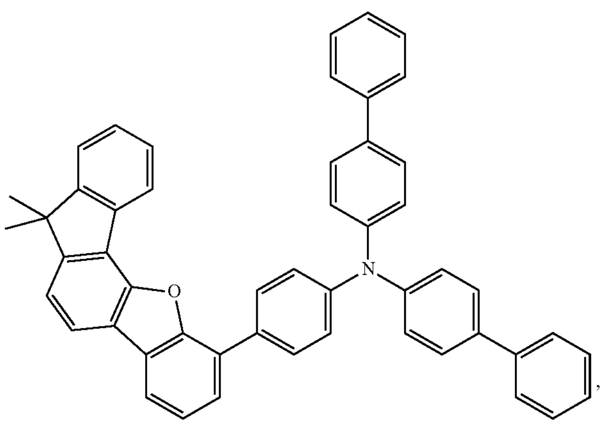
,
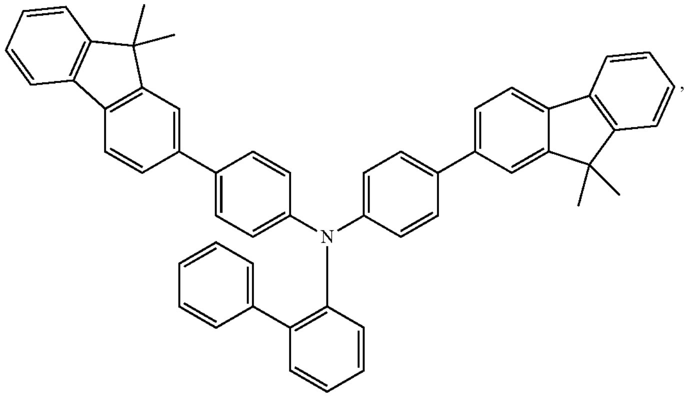
,
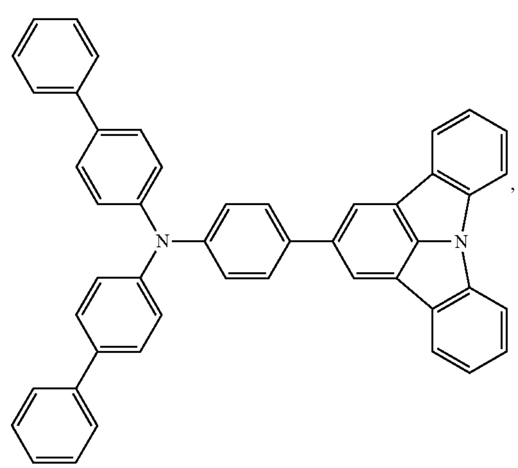
, -continued
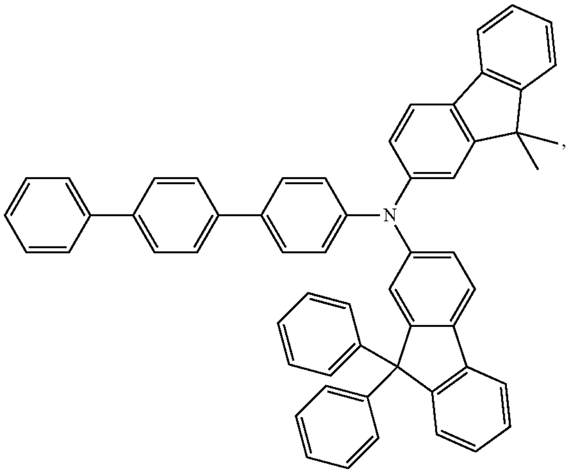
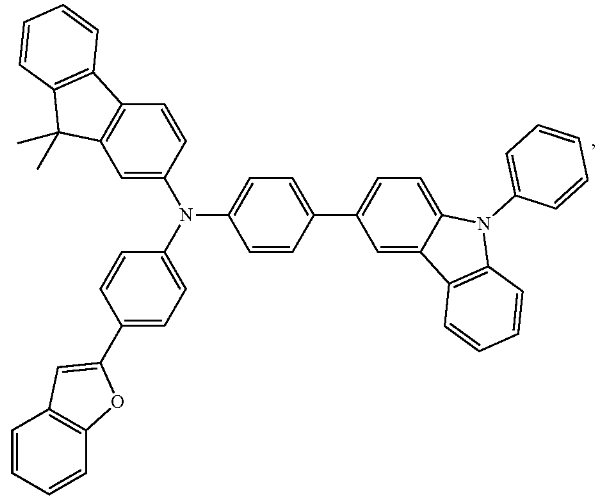
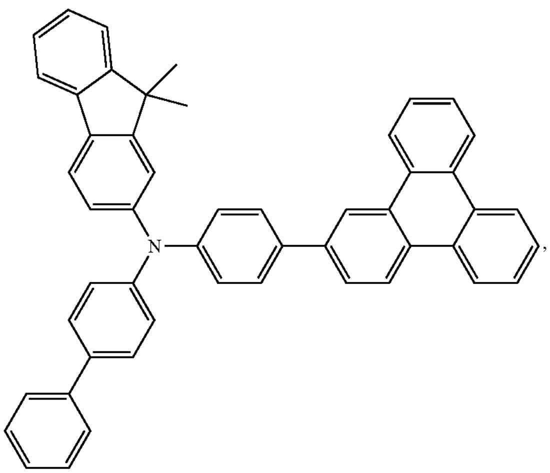
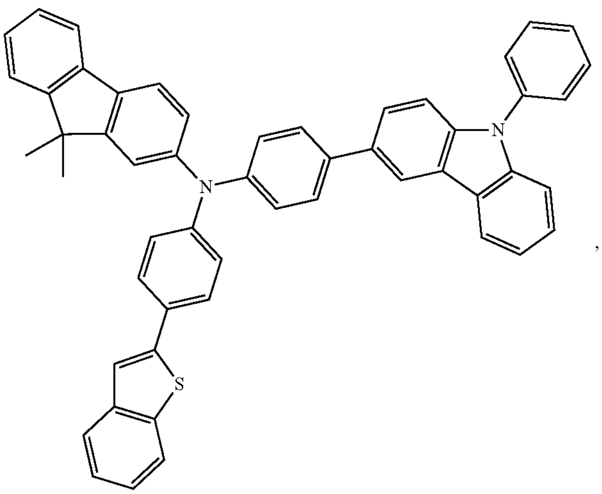
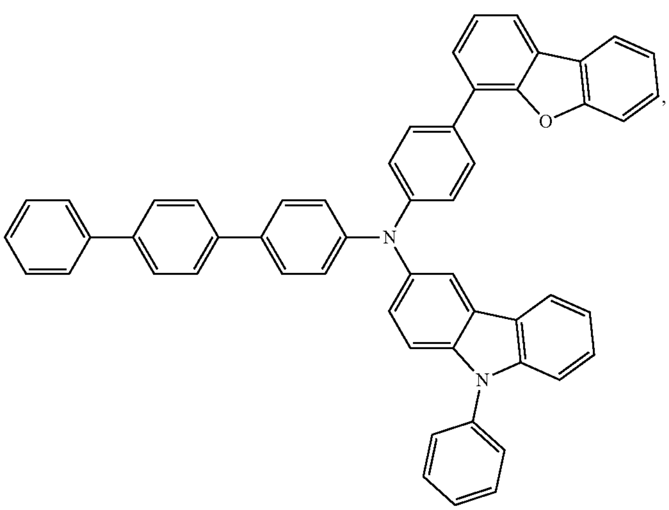

-continued
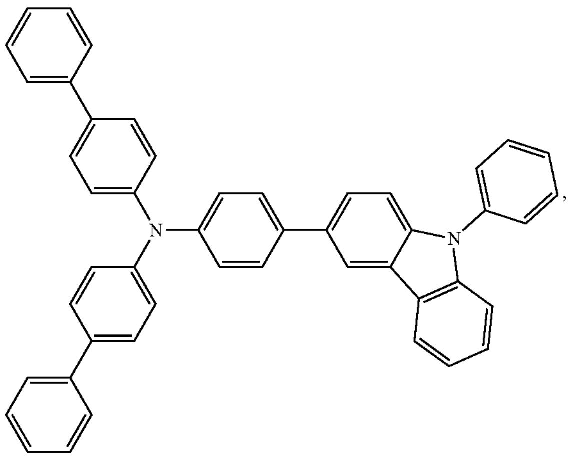
,
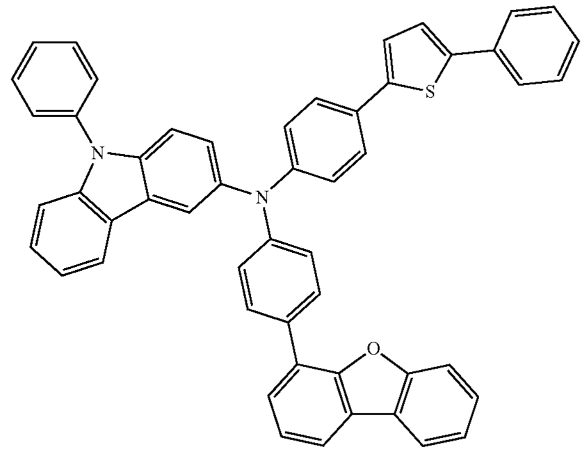
,
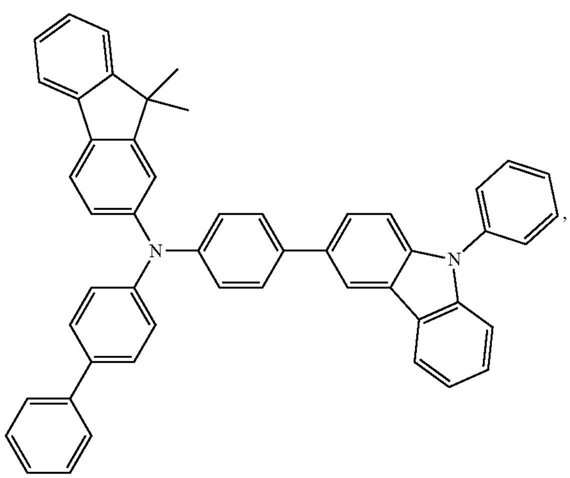
,
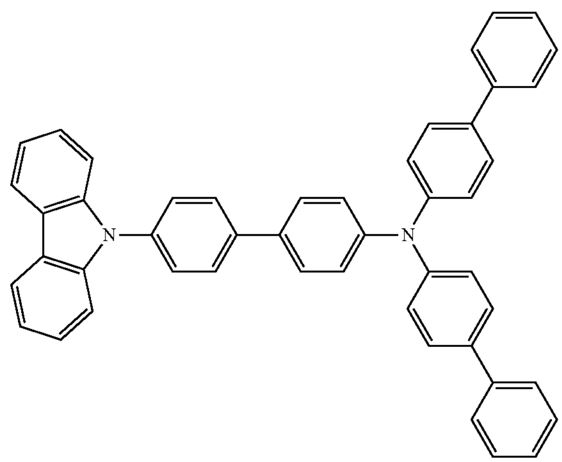
,
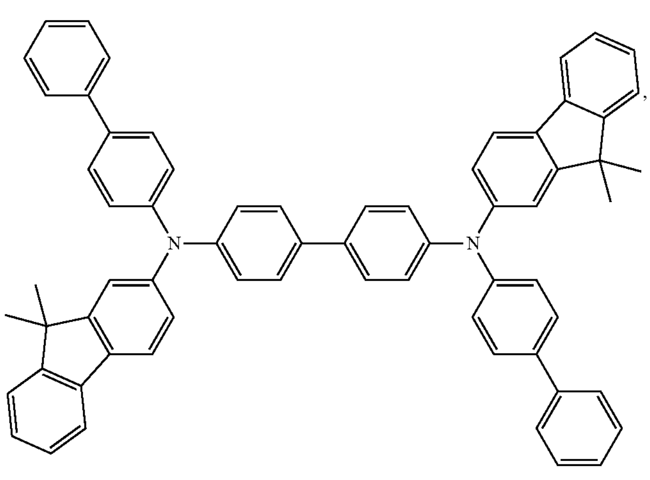
, -continued
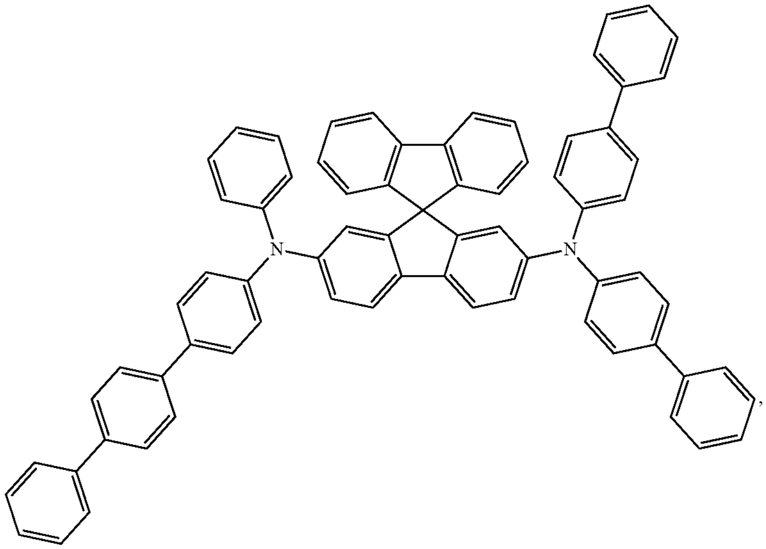
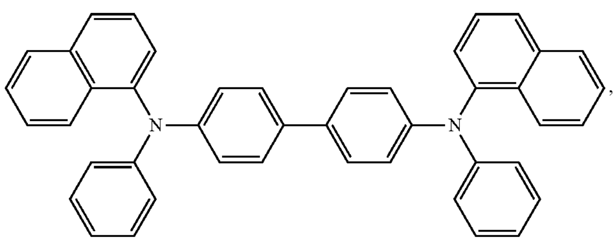
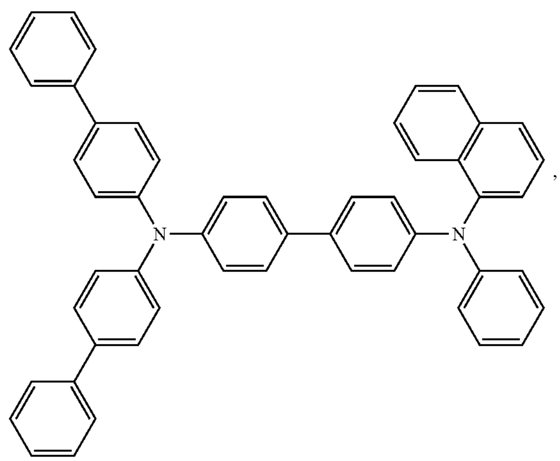
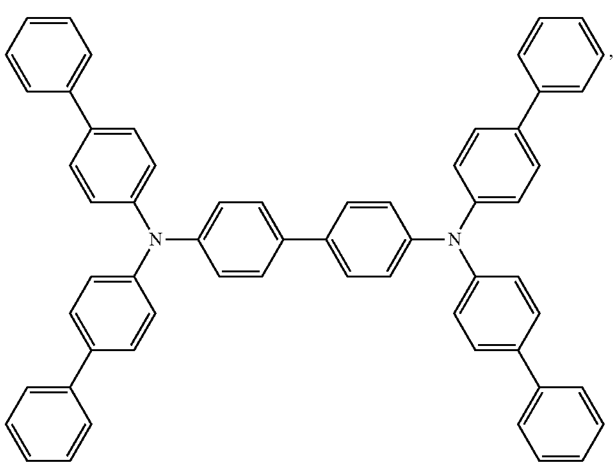

-continued
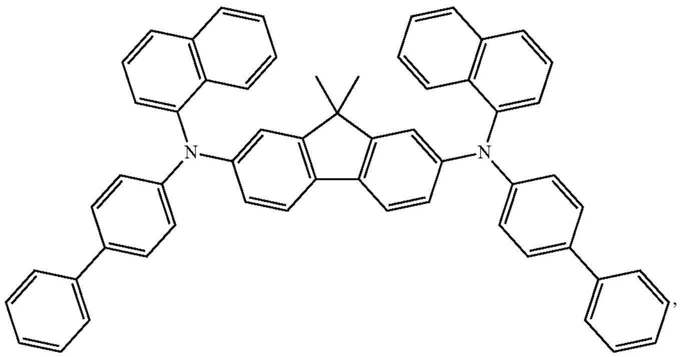,
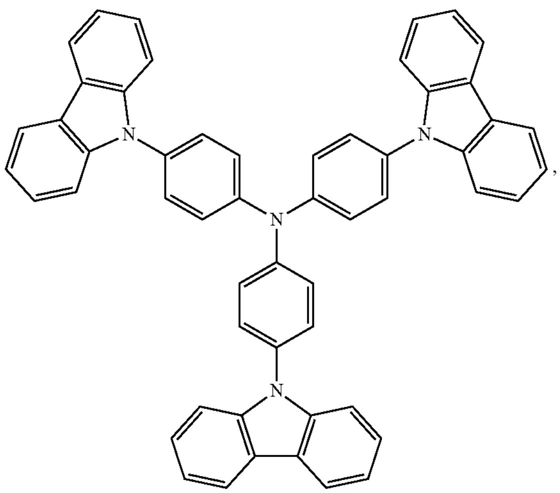,
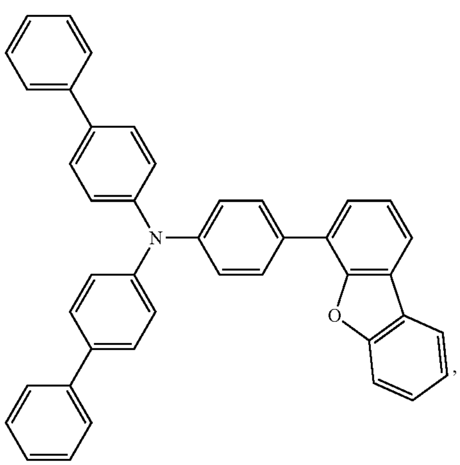,
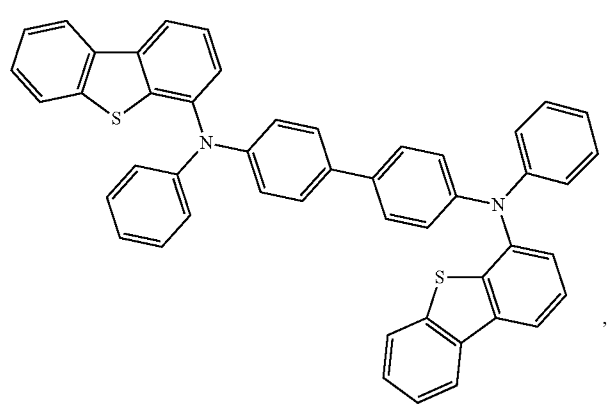,

-continued

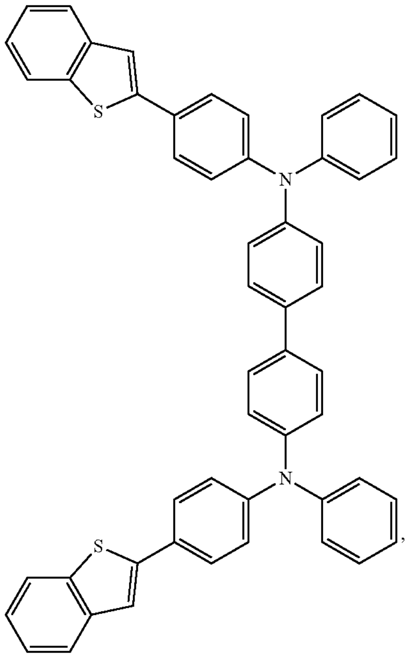

, and

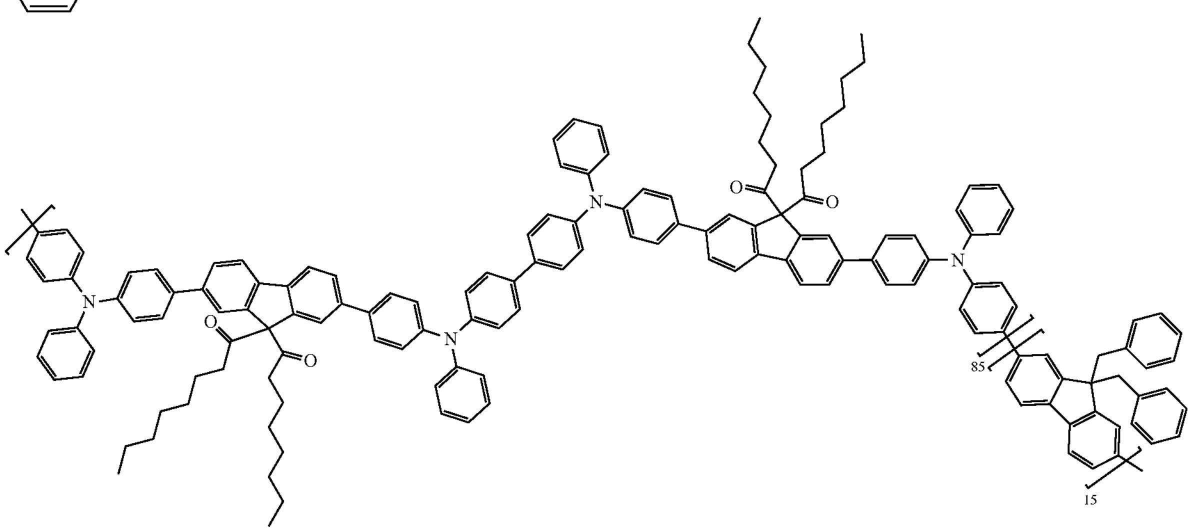

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

$$\left[\left(\begin{array}{c}Y^{103}\\ Y^{104}\end{array}\right)\right]_{k'}\text{Met}-(L^{101})_{k''}$$

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

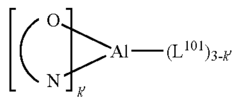

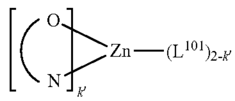

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

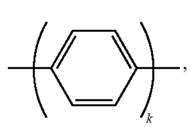

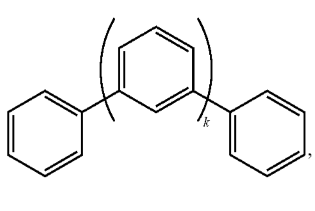

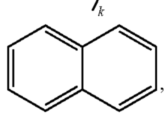

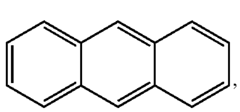

-continued

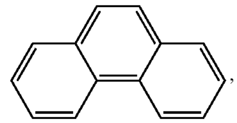

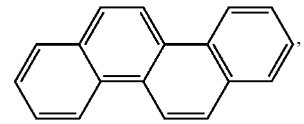

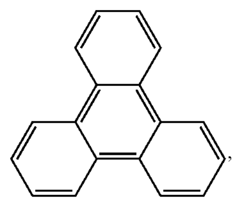

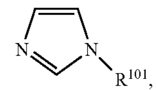

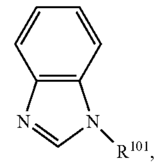

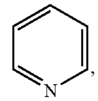

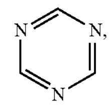

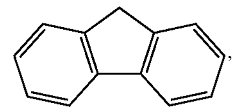

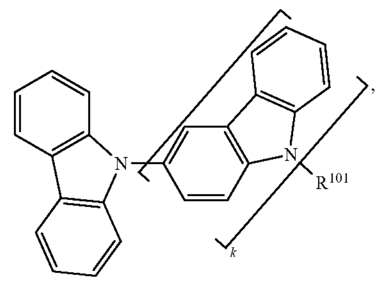

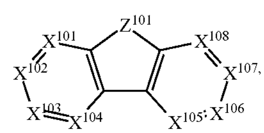

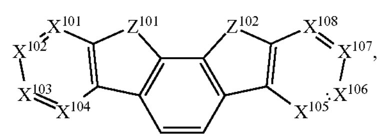

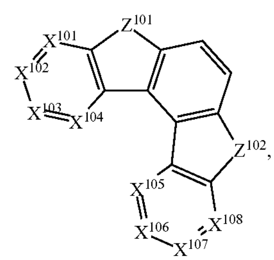

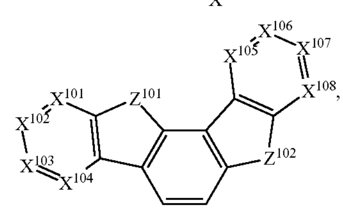

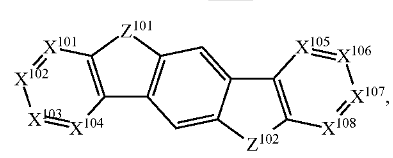

and

-continued

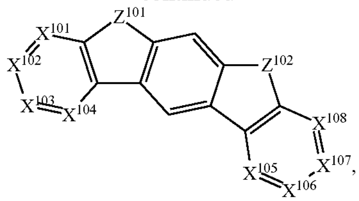

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

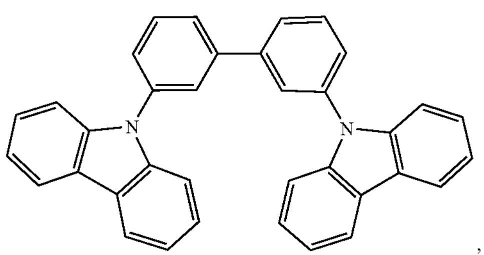

,

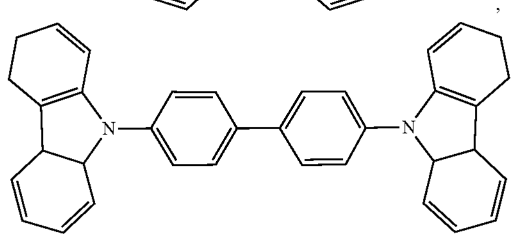

,

-continued

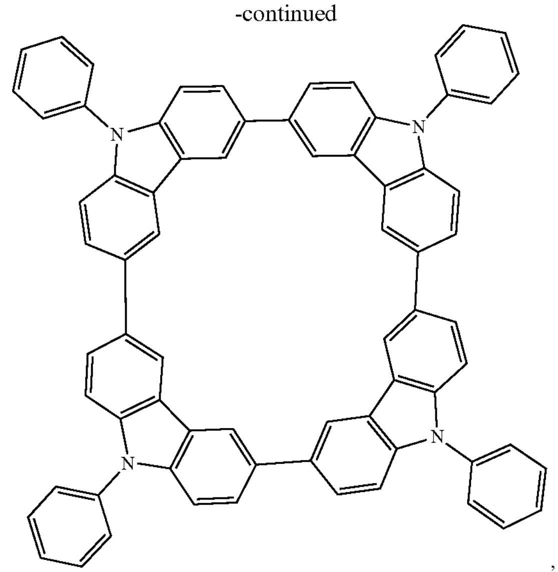

,

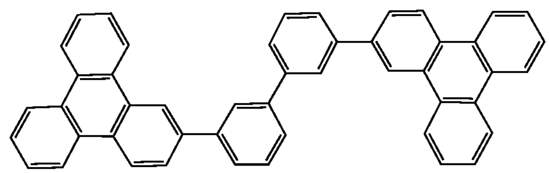

,

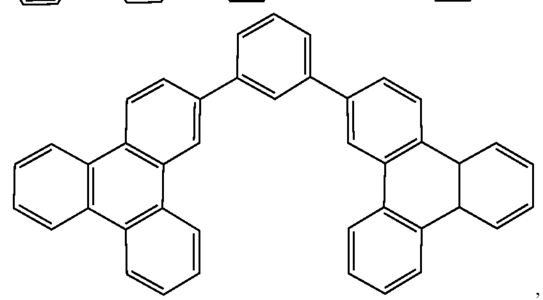

,

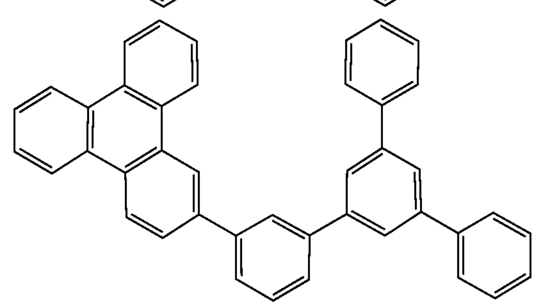

,

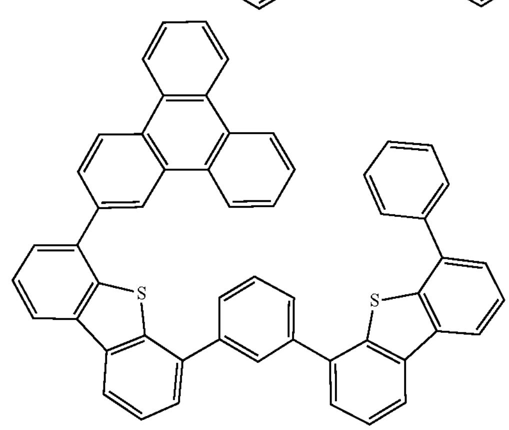

,

-continued
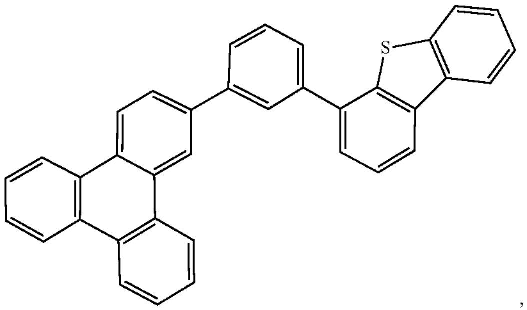
,
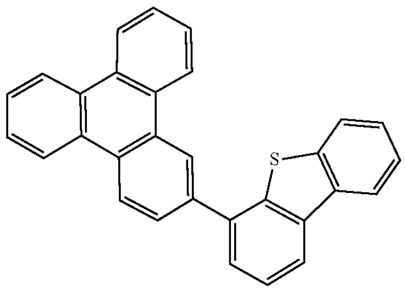
,
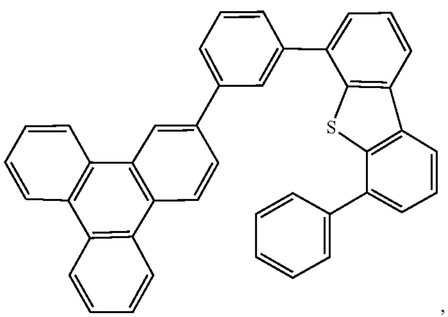
,
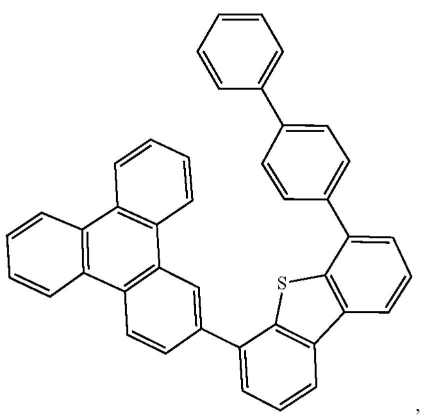
,
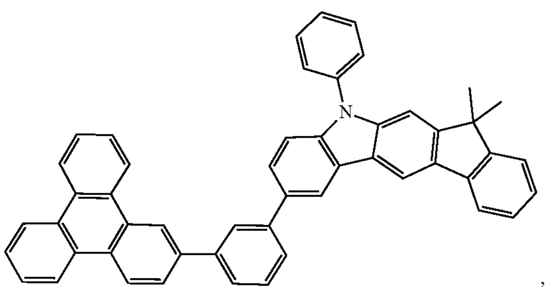
,
-continued
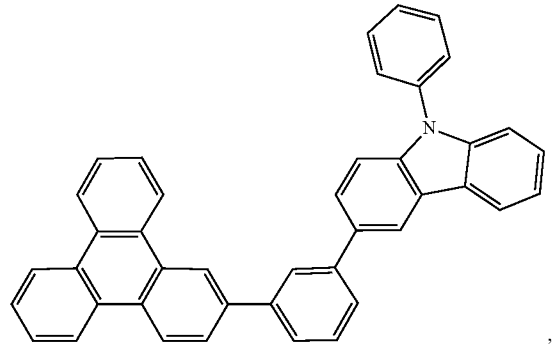
,
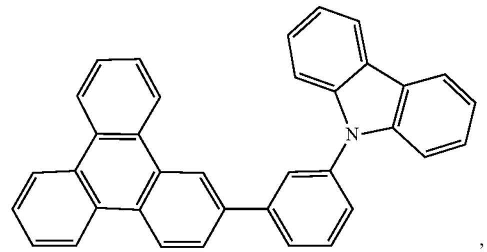
,
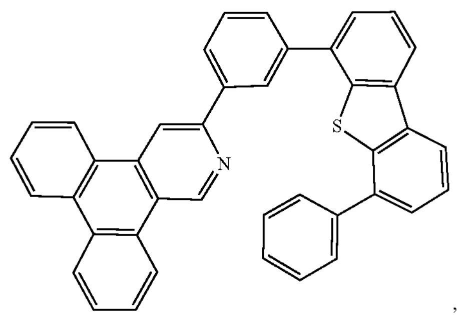
,
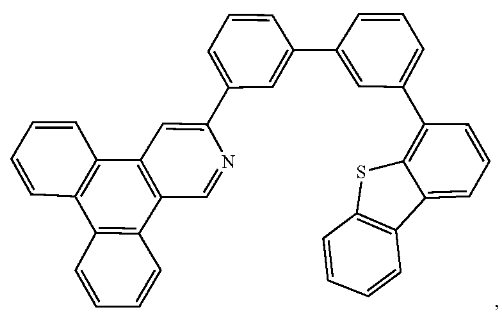
,
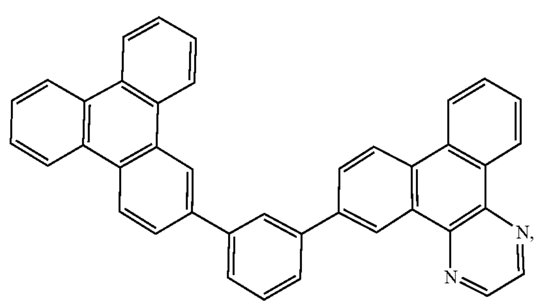

-continued
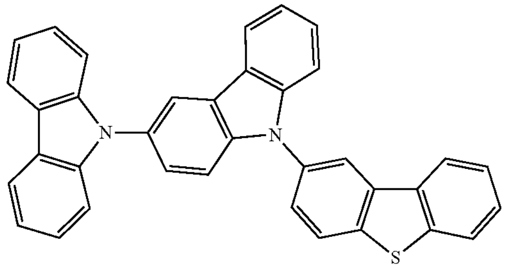
,
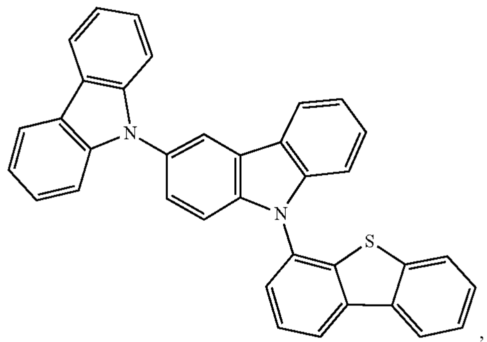
,
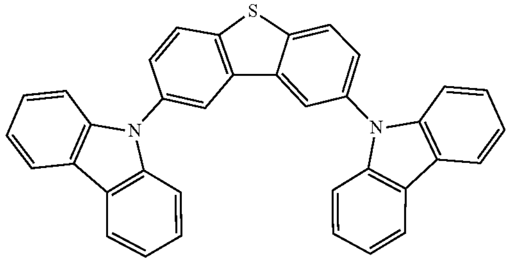
,
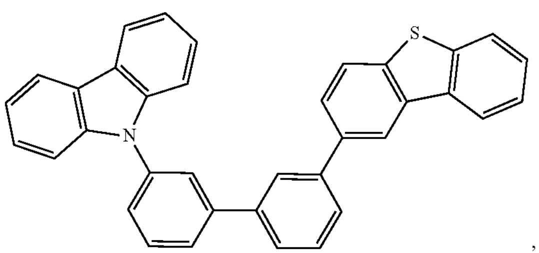
,
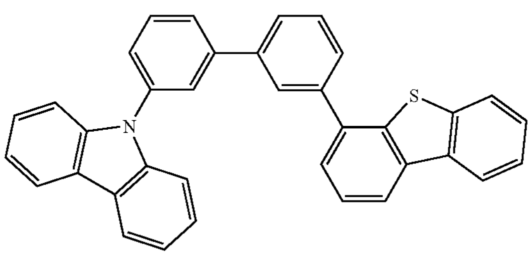
,
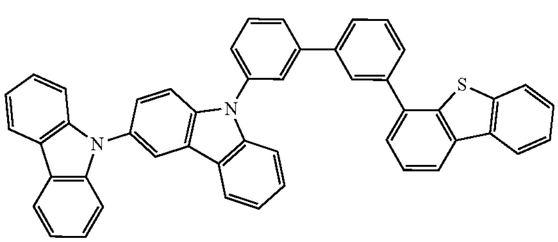
,
-continued
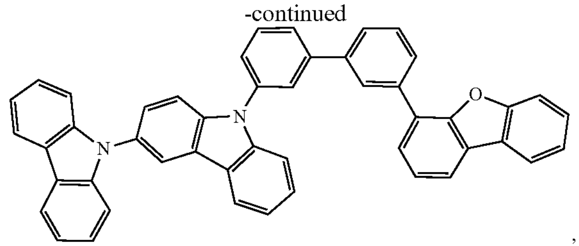
,
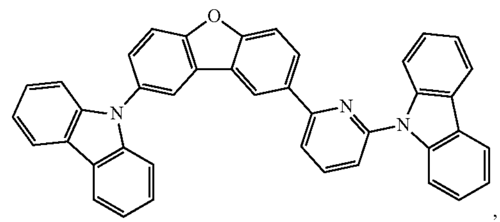
,
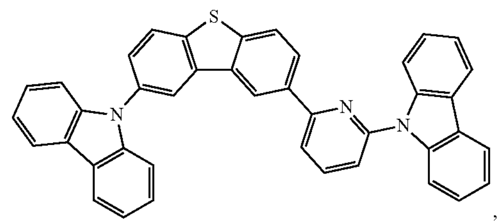
,
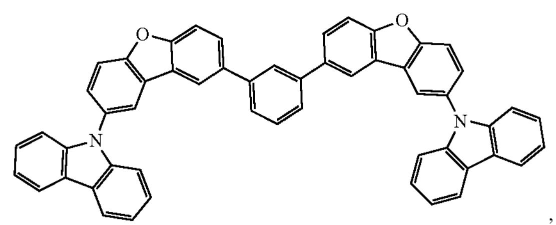
,
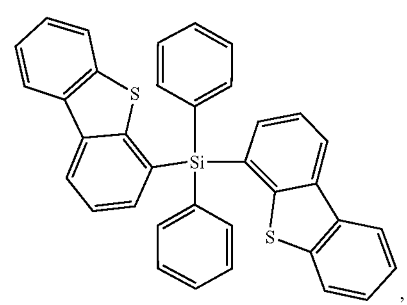
,
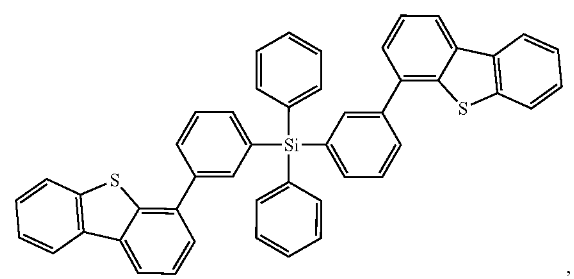
, -continued
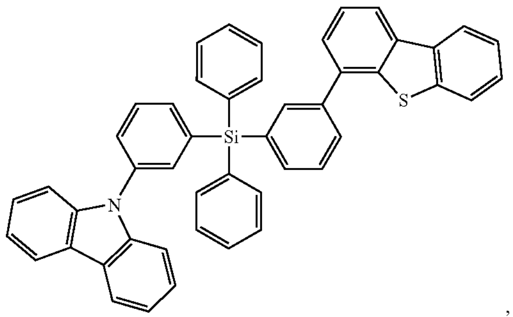
,
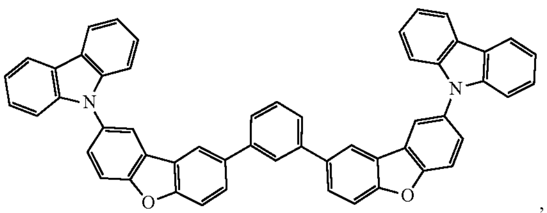
,
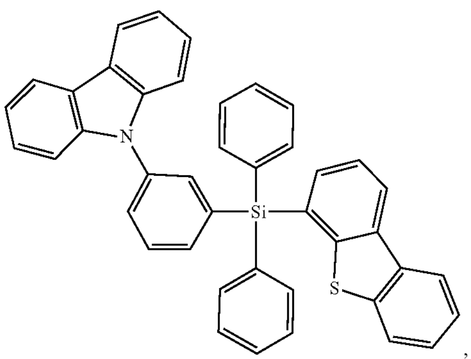
,
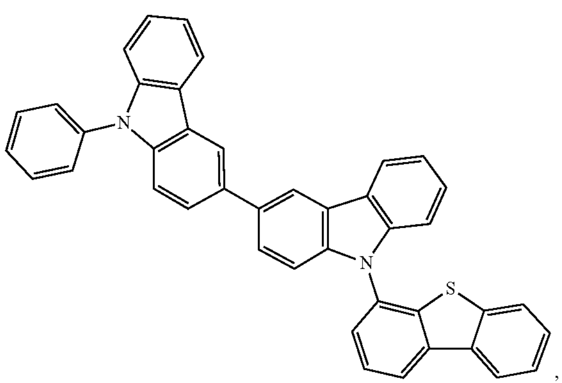
,
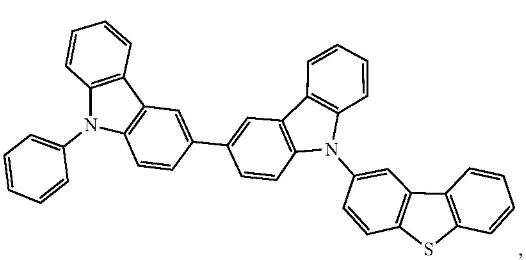
,
-continued
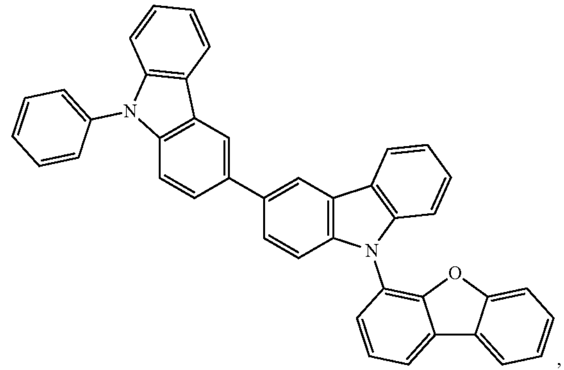
,
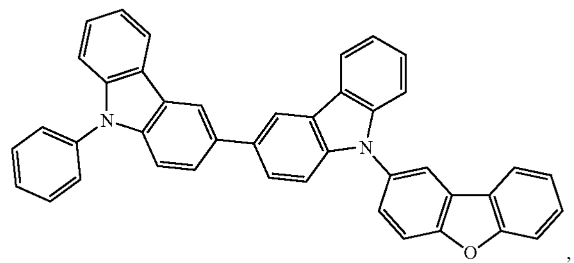
,
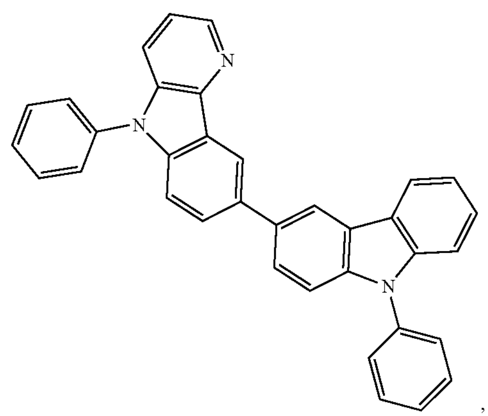
,
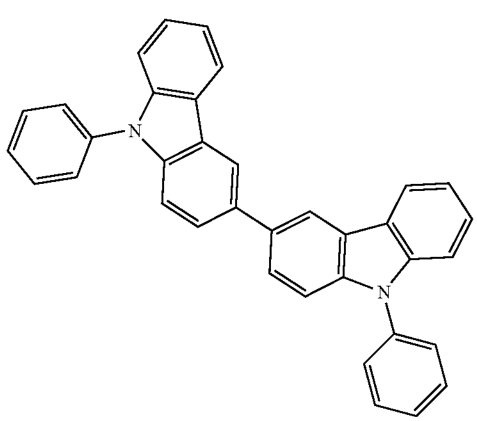
, -continued
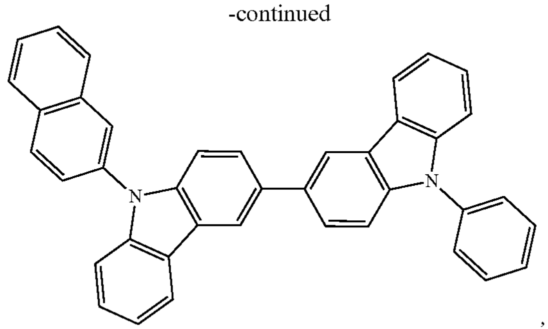
,
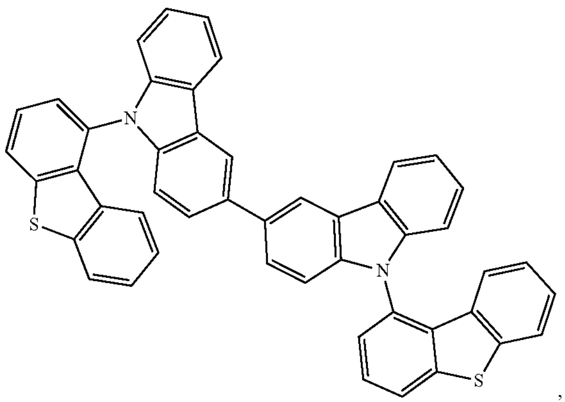
,
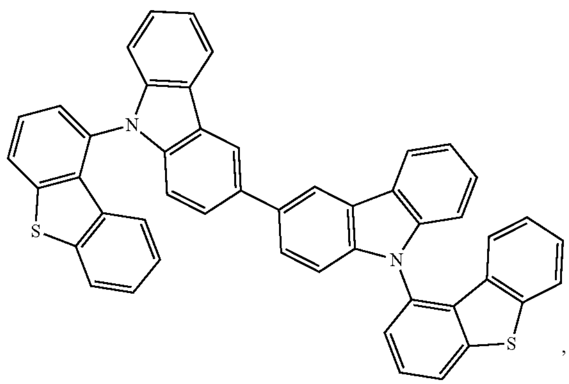
,
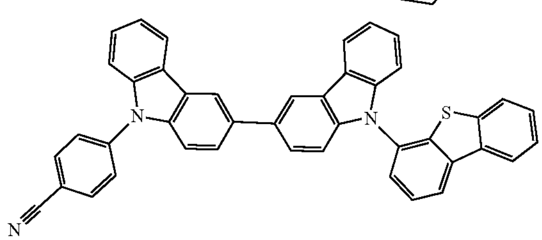
,
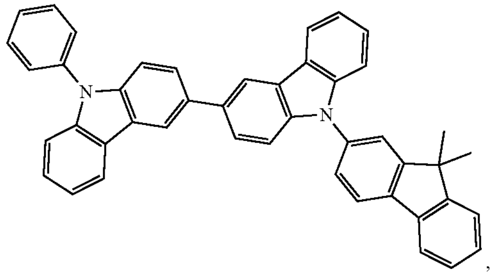
,
-continued
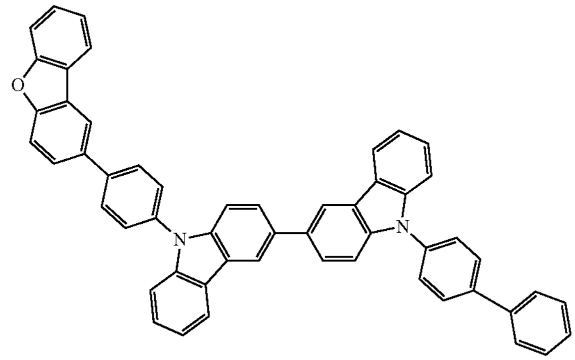
,
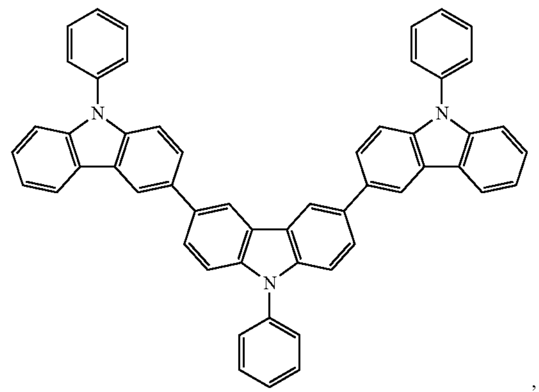
,
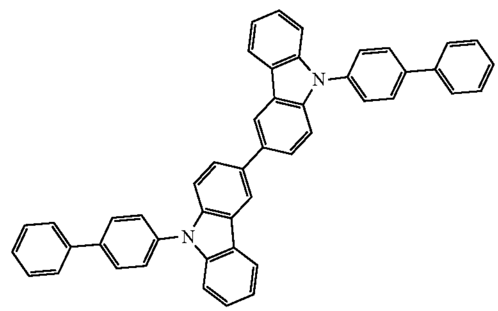
,
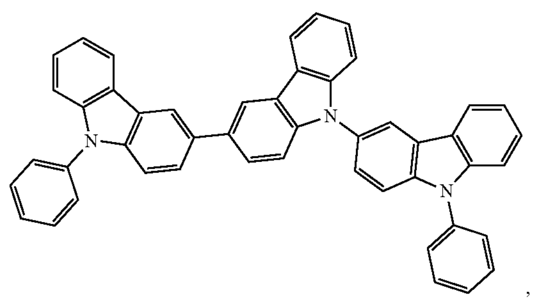
,
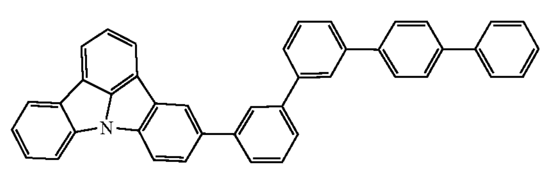
, -continued
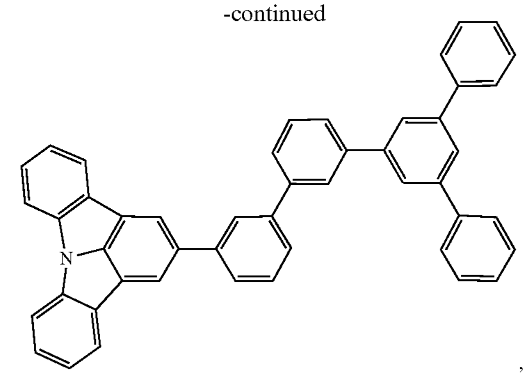
,
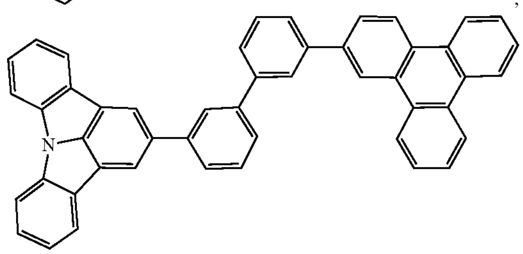
,
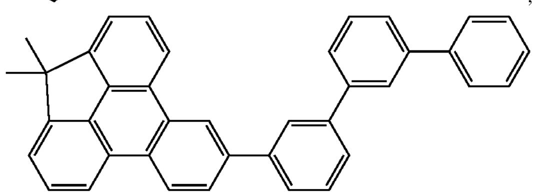
,
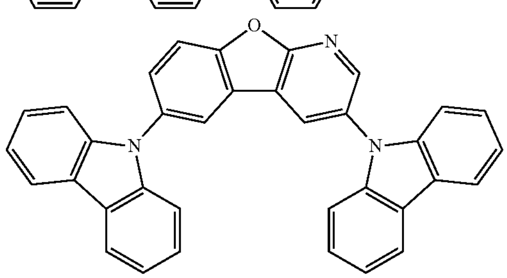
,
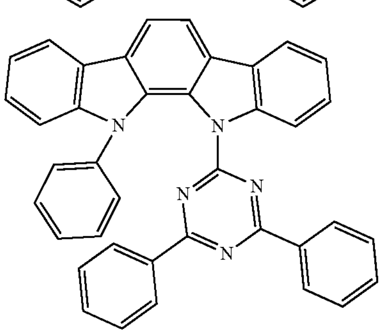
,
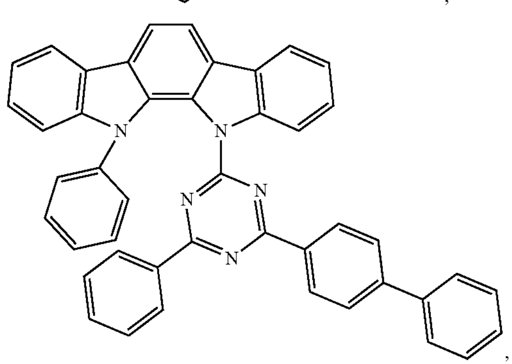
,
-continued
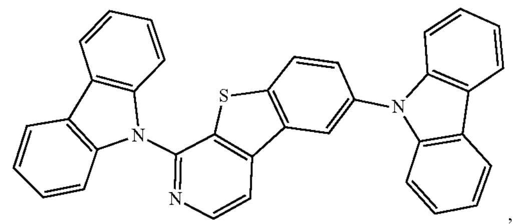
,
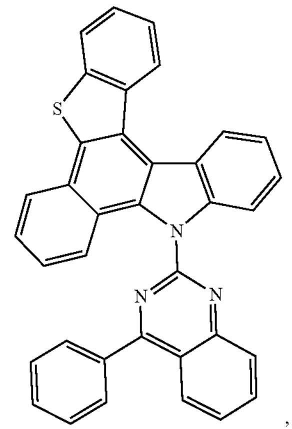
,
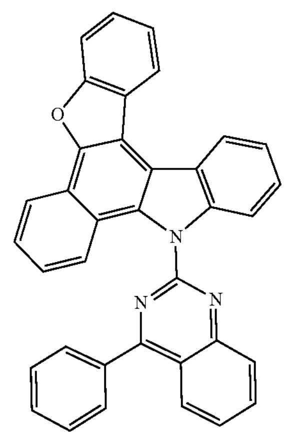
,
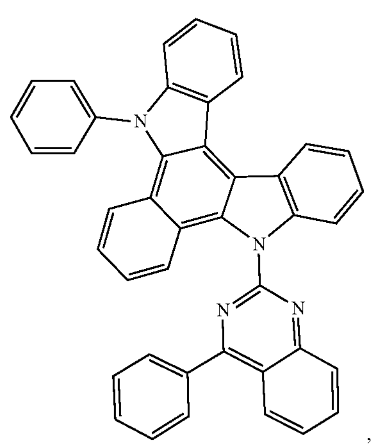
, -continued
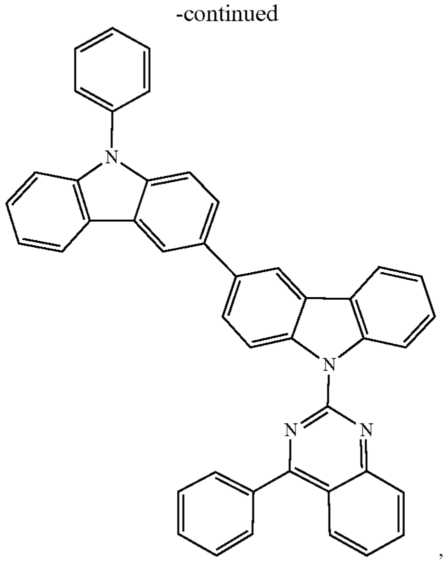
,
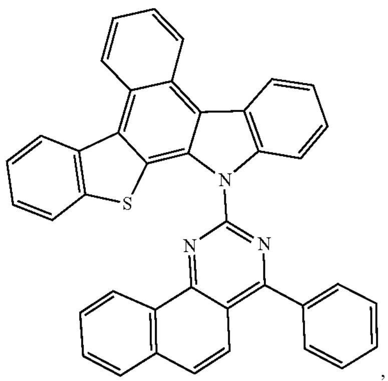
,
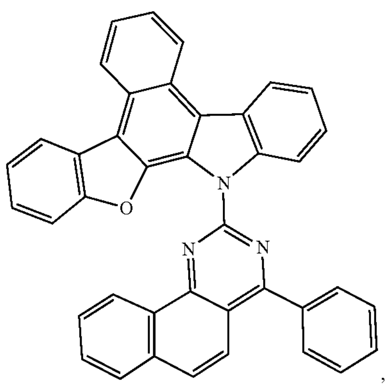
,
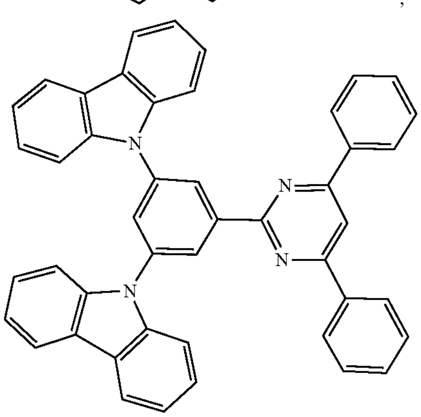
,
-continued
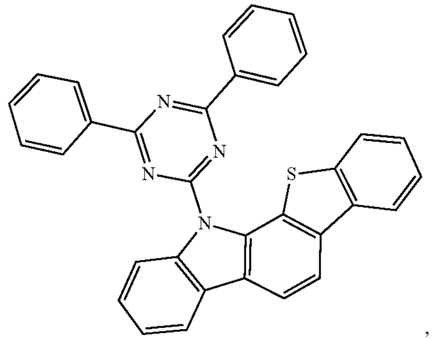
,
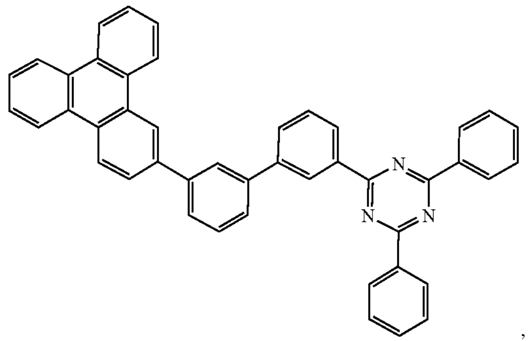
,
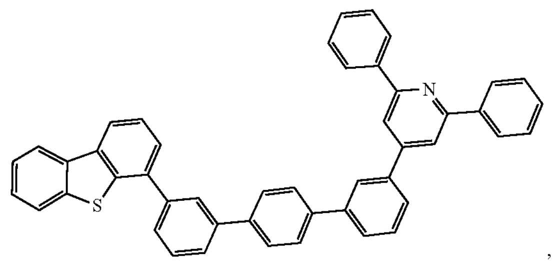
,
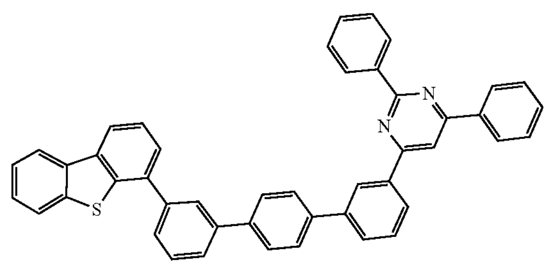
,
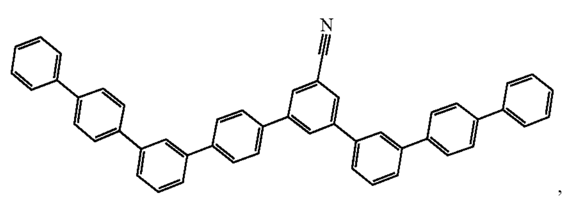
,
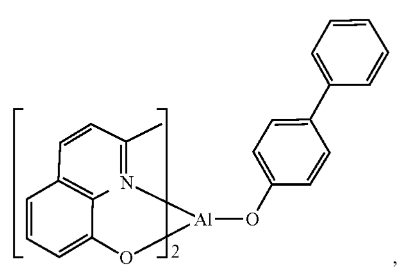
, -continued

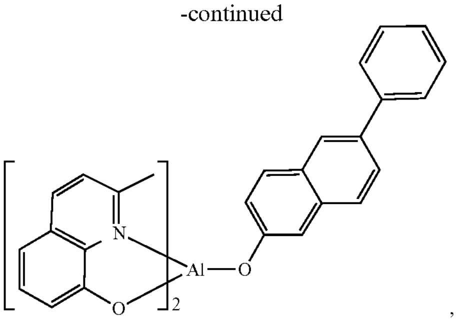

,

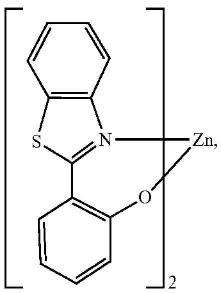

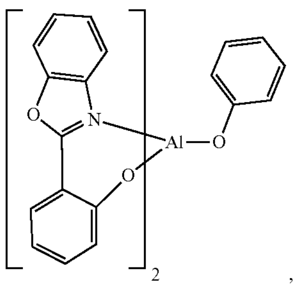

,

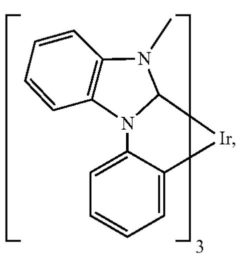

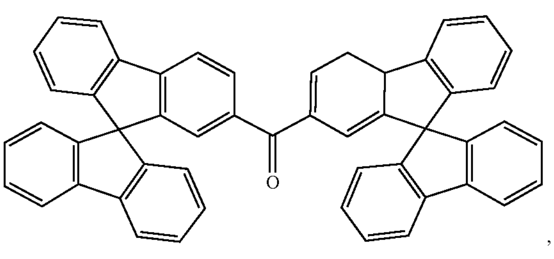

,

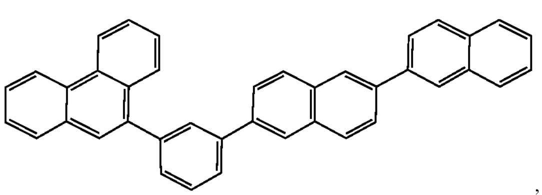

,

-continued

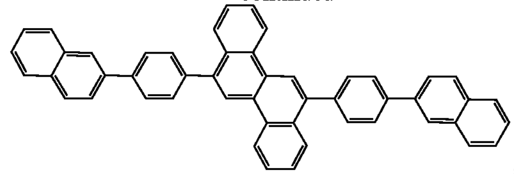

, and

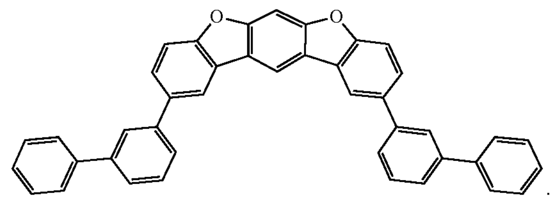

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. Nos. 06/699,599, 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
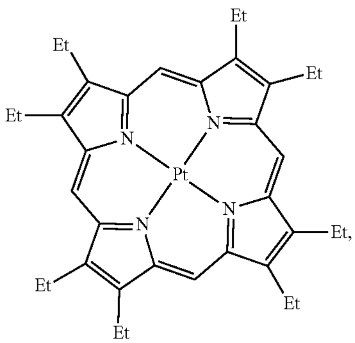
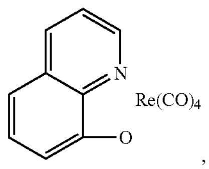
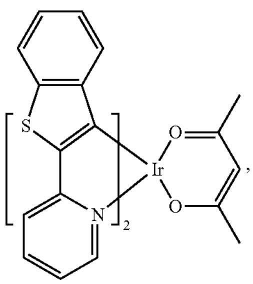
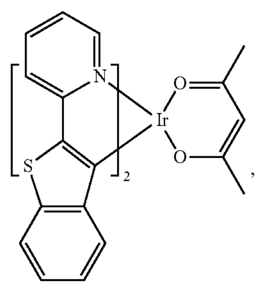
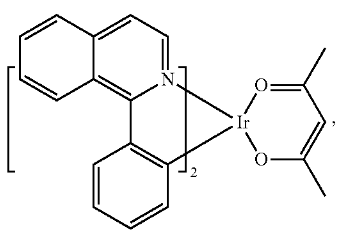
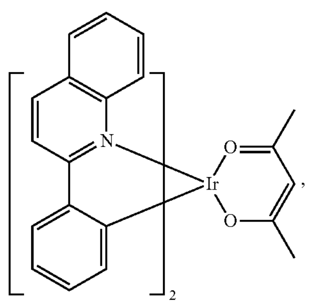
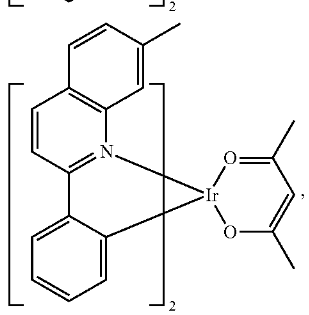
-continued
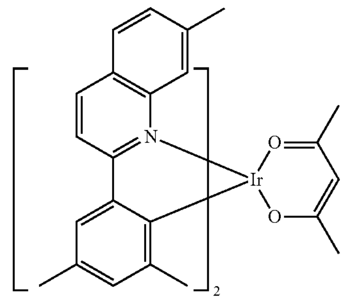
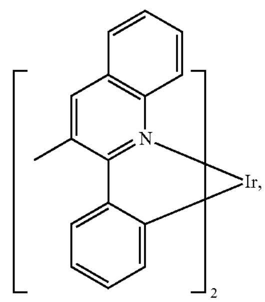
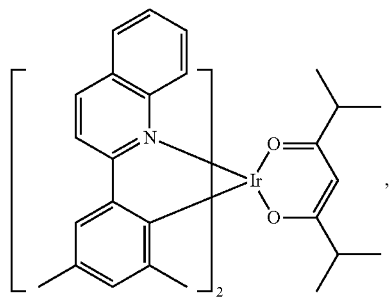
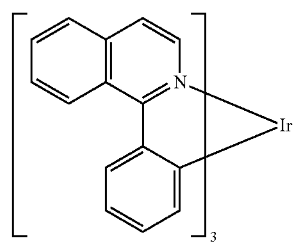
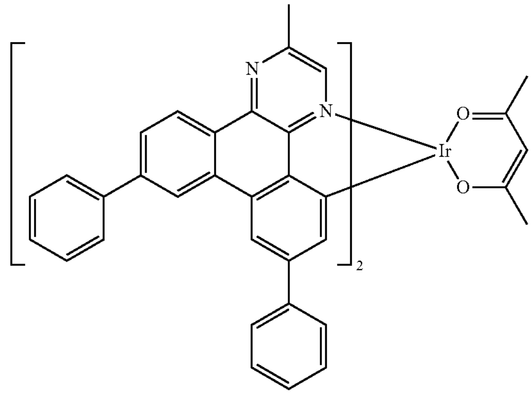

-continued
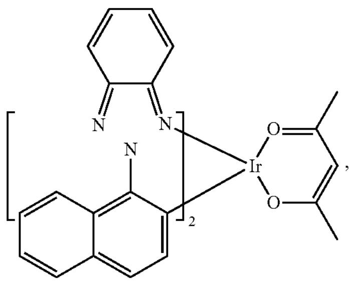
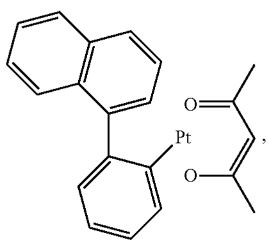
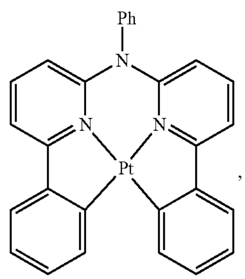
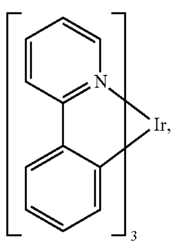
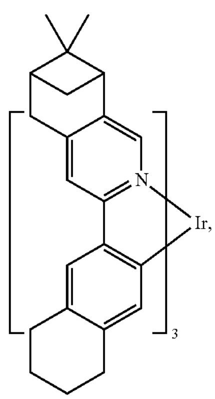
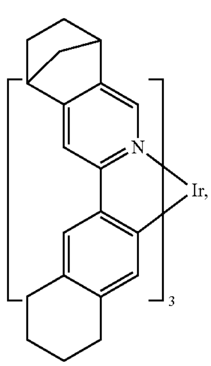
-continued
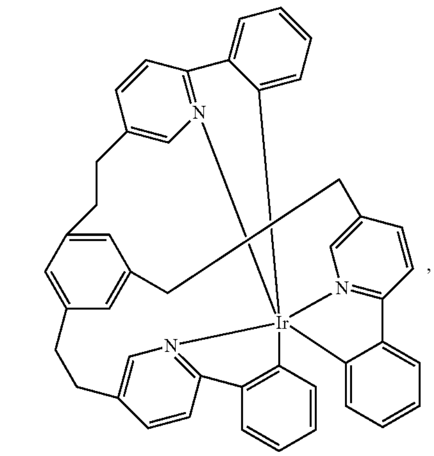
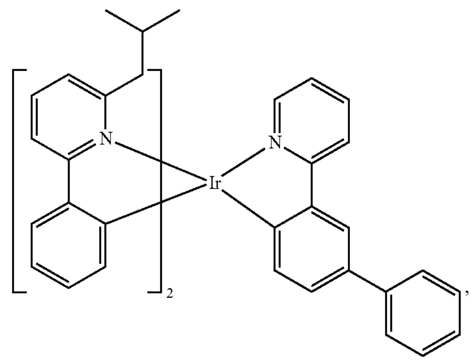
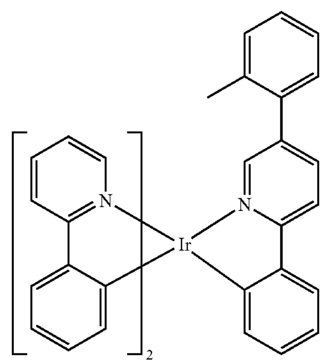
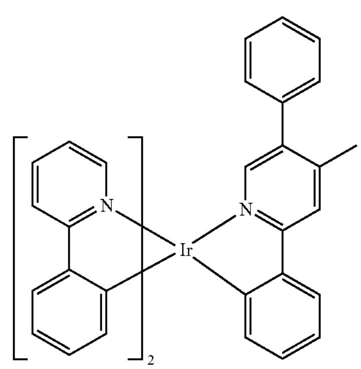

-continued
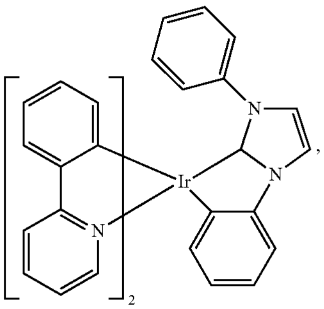
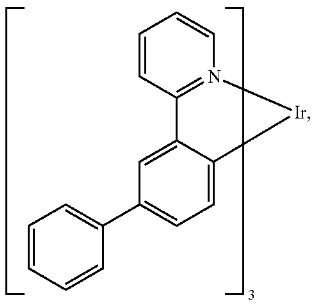
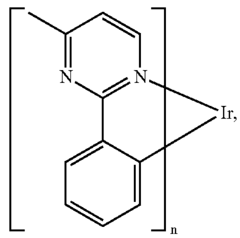
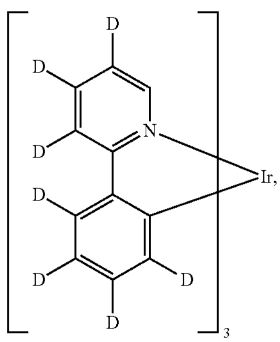
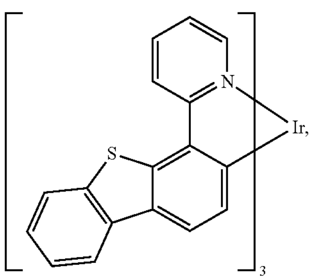
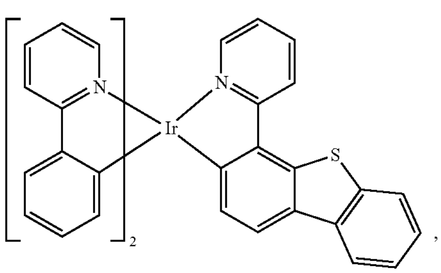
-continued
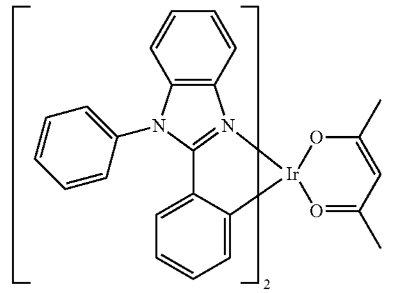
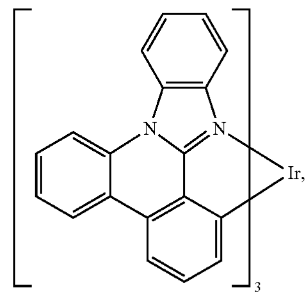
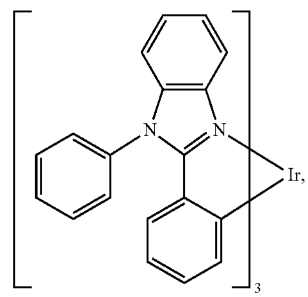
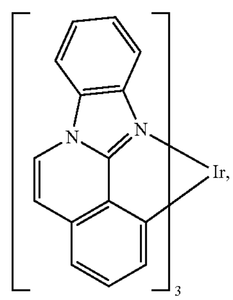
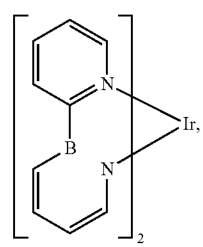
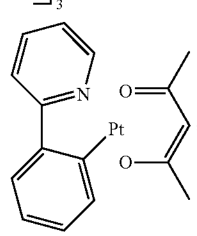
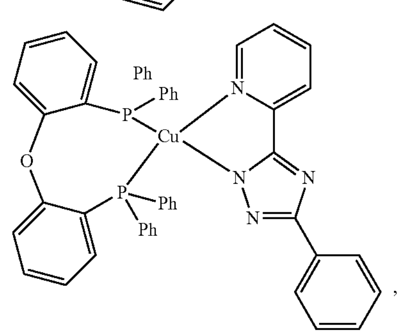

-continued
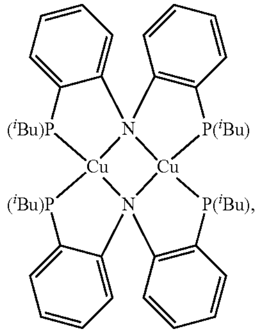
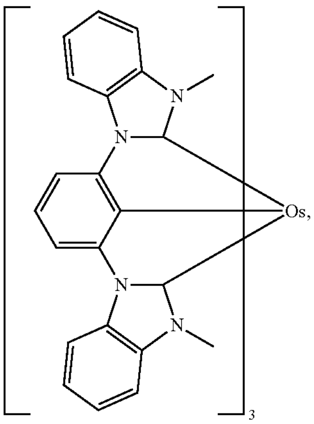
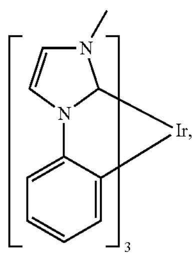
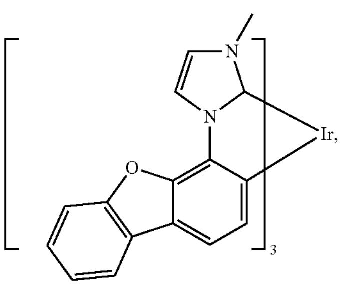
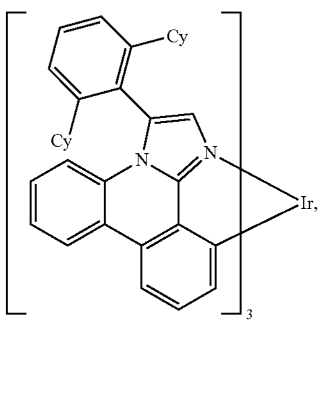
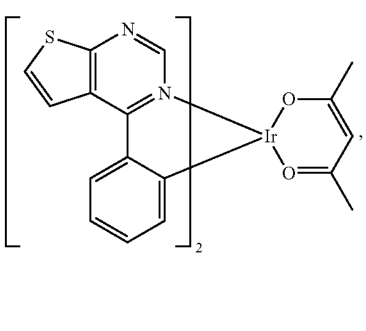
-continued
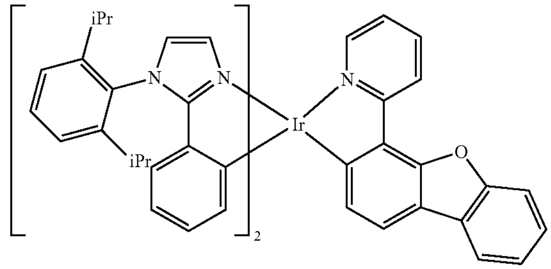
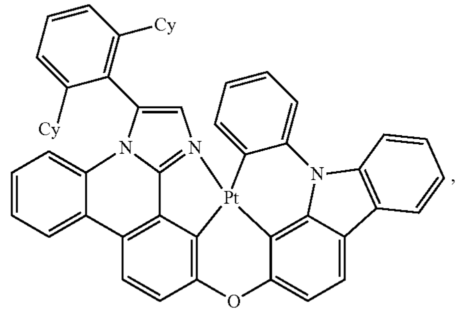
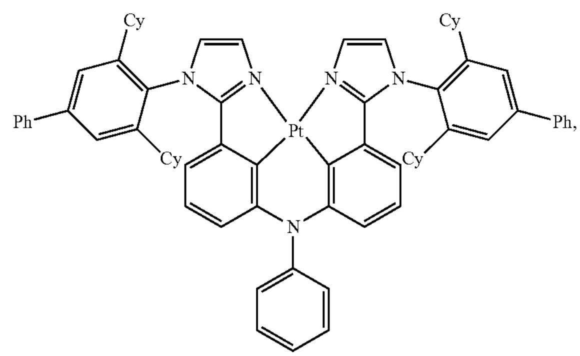
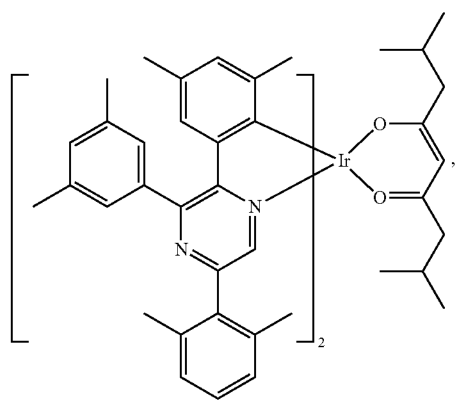
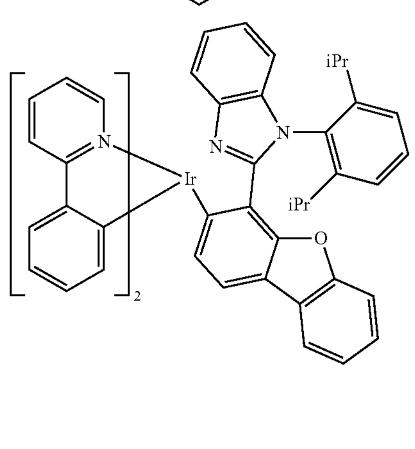

-continued
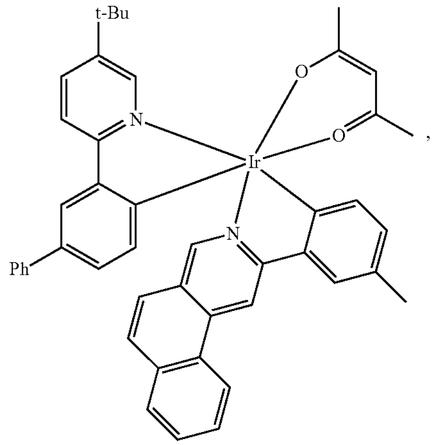
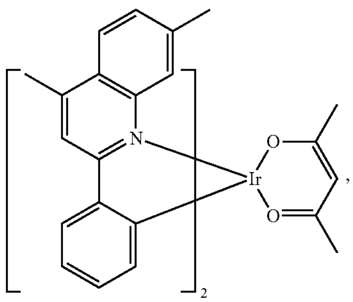
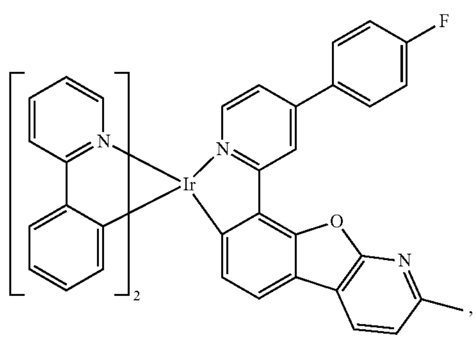
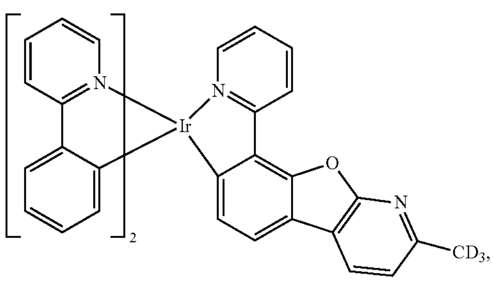
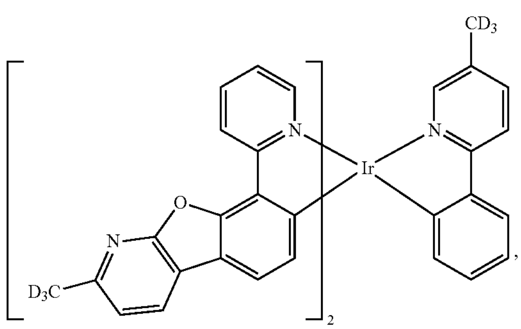
-continued
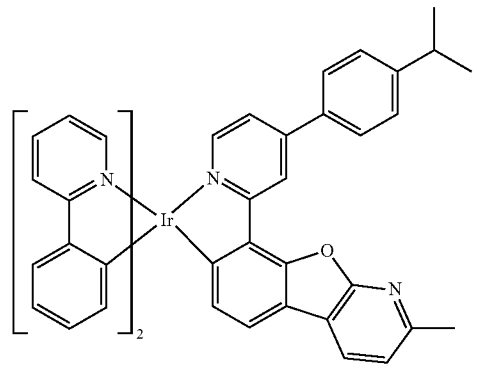
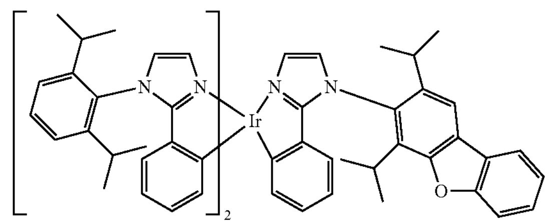
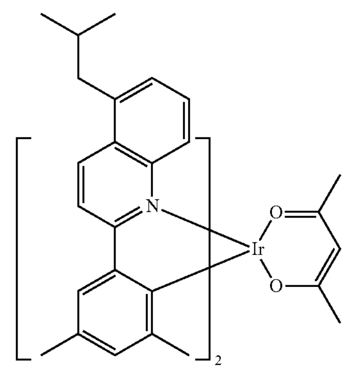
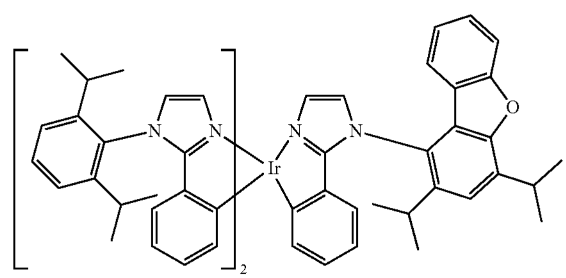
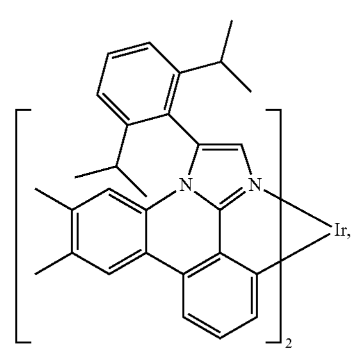

-continued
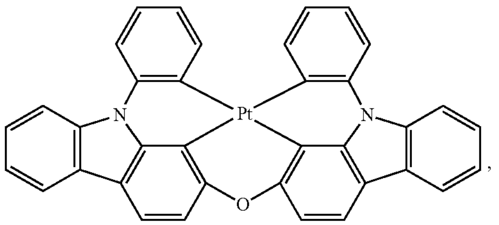
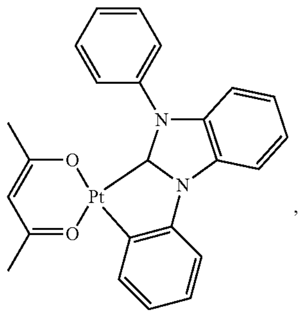
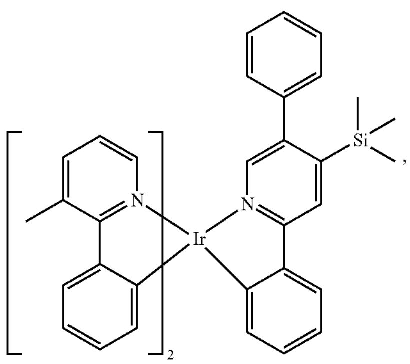
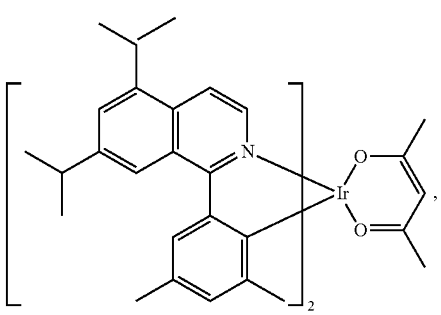
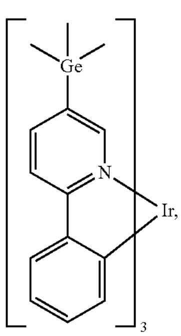
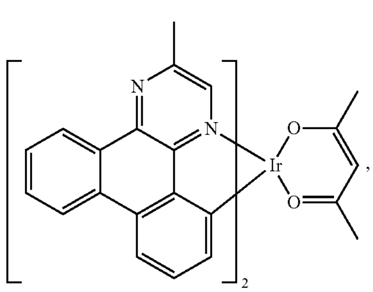
-continued
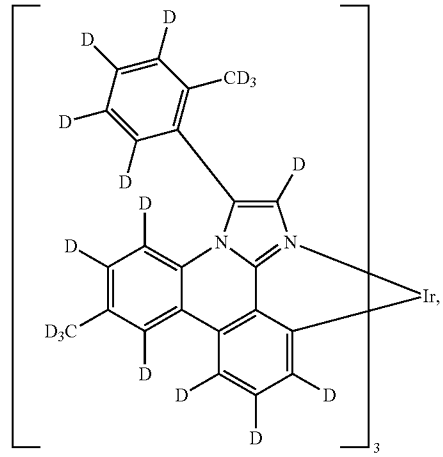
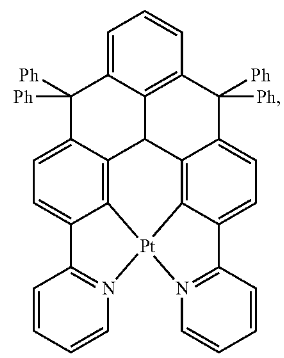
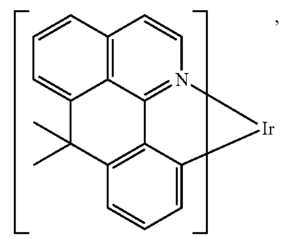
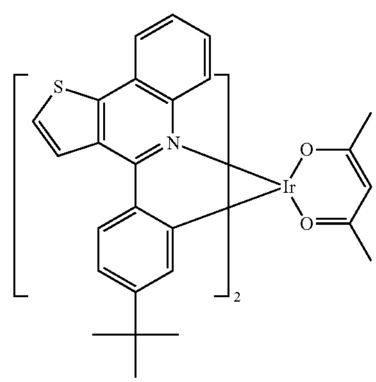
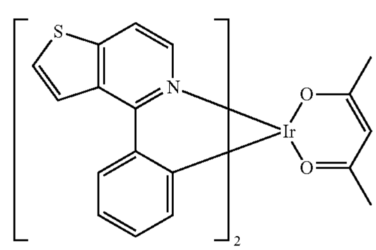

-continued
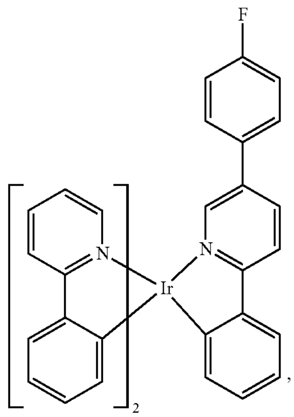
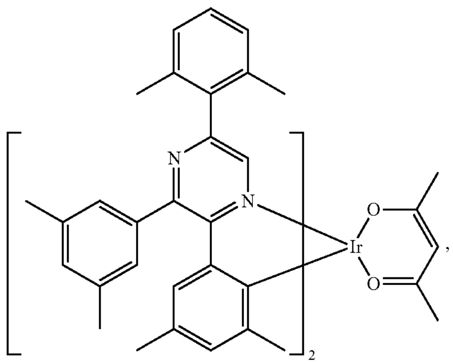
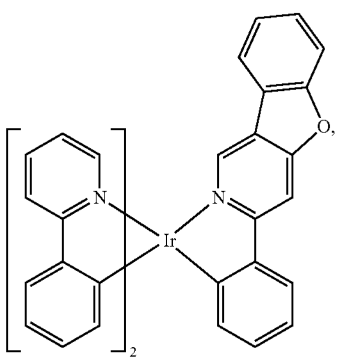
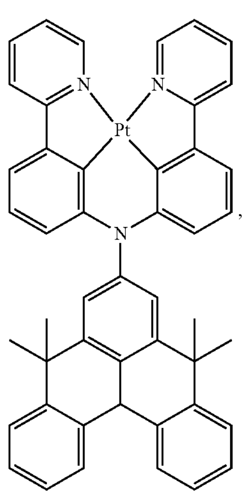
-continued
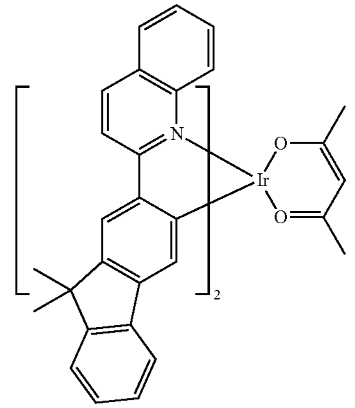
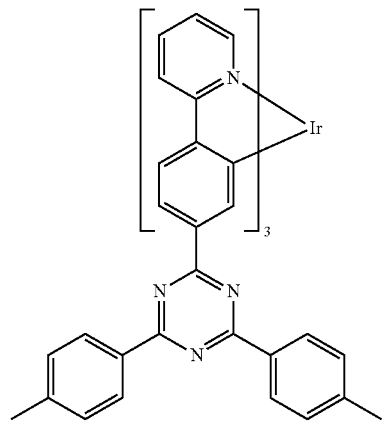
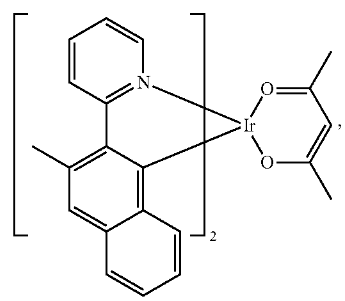
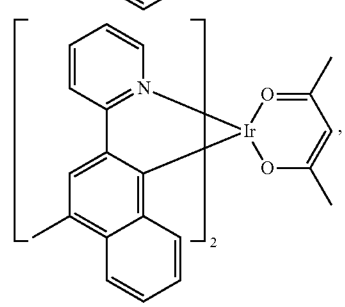
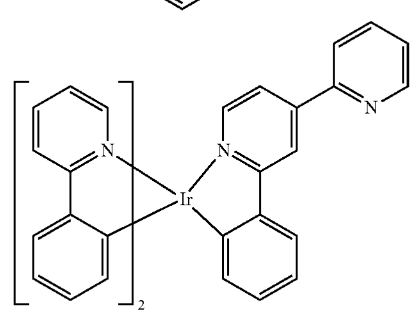

-continued
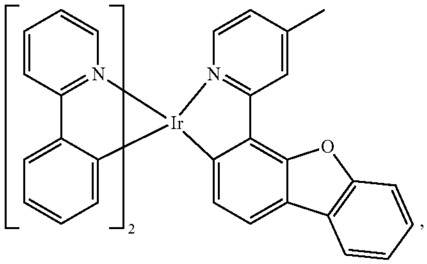
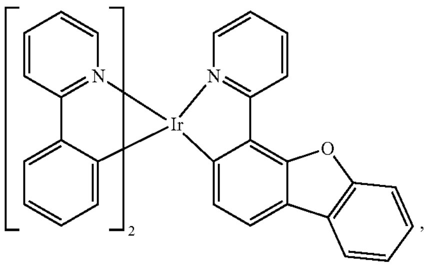
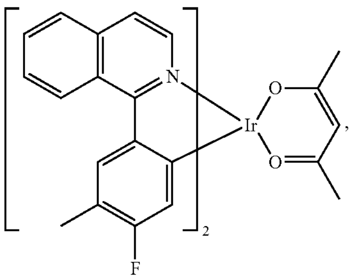
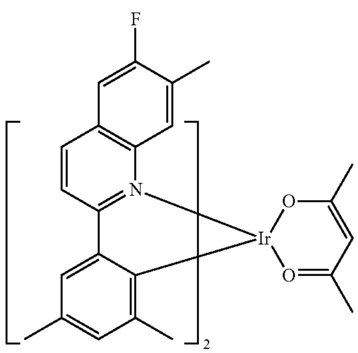
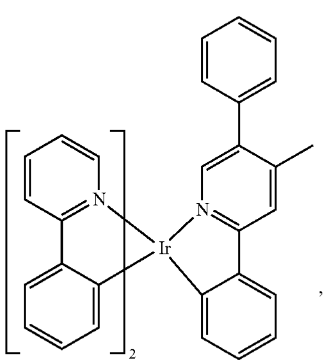
-continued
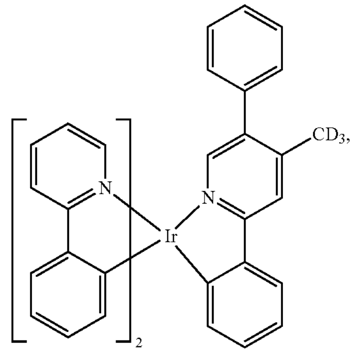
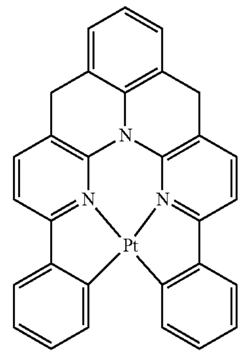
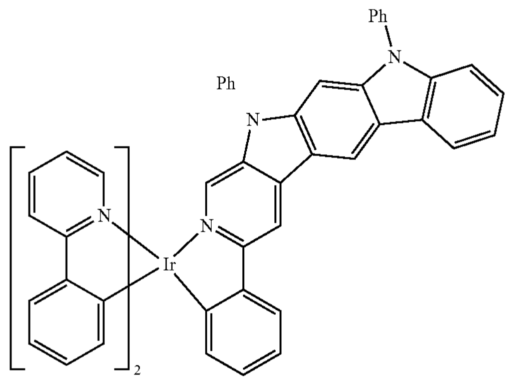
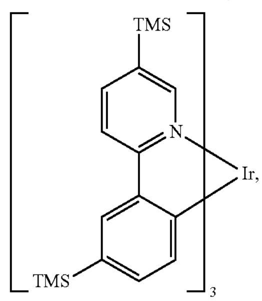
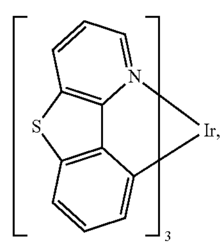
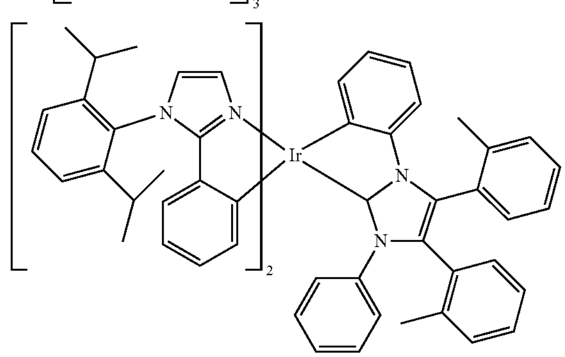

-continued
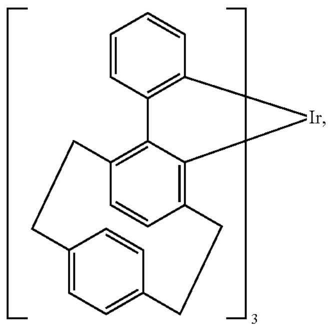
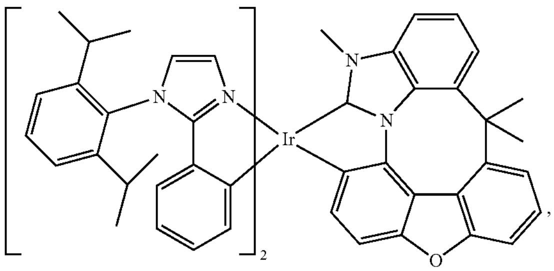
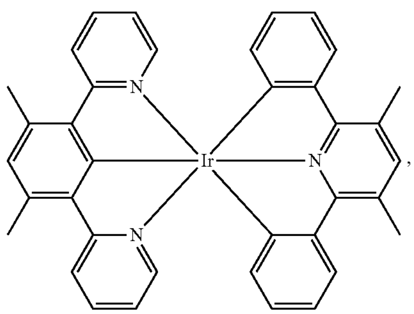
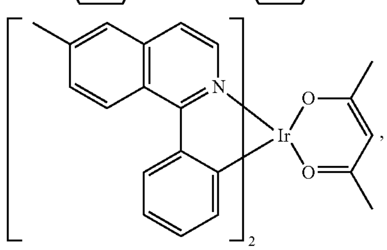
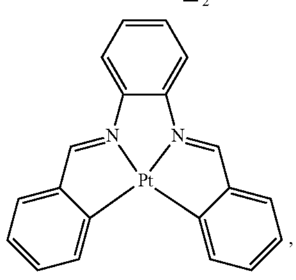
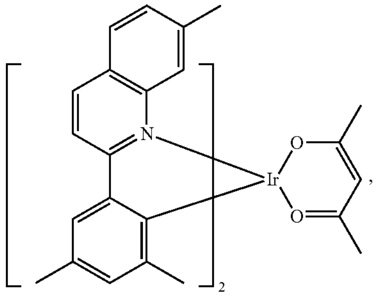
-continued
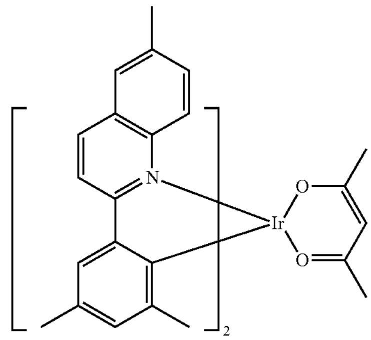
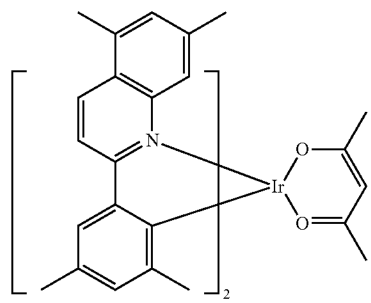
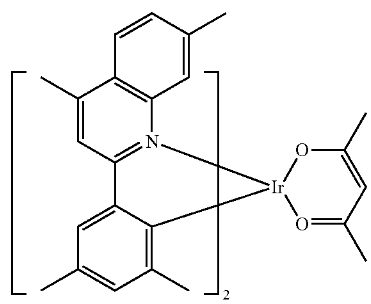
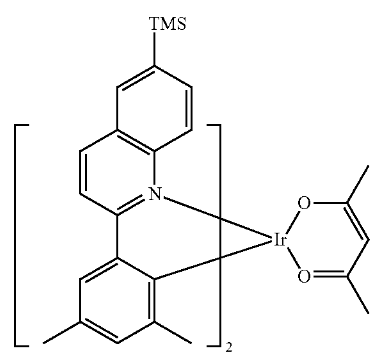
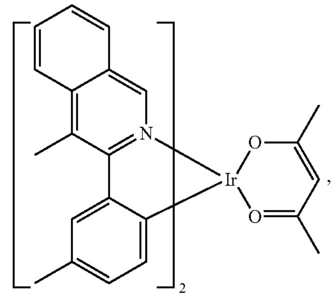

-continued
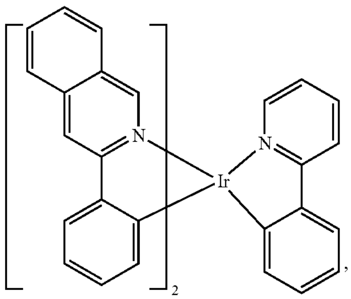
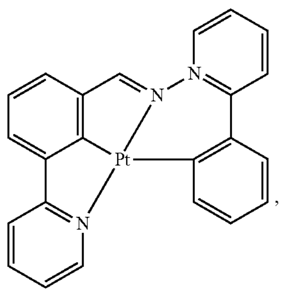
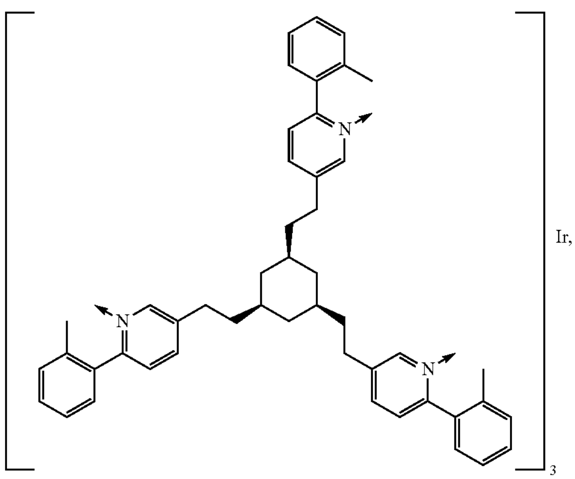
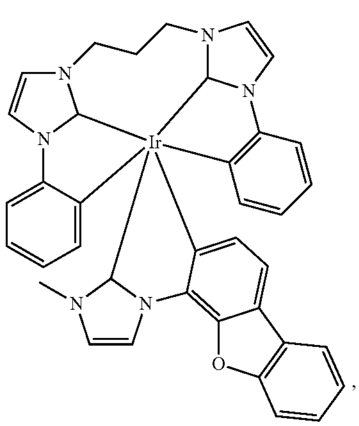
-continued
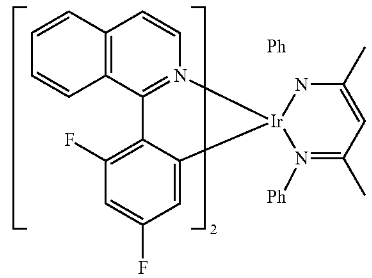
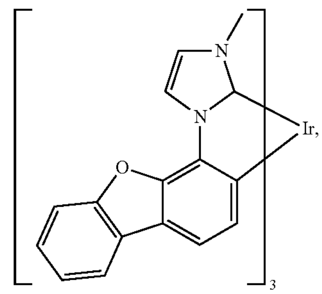
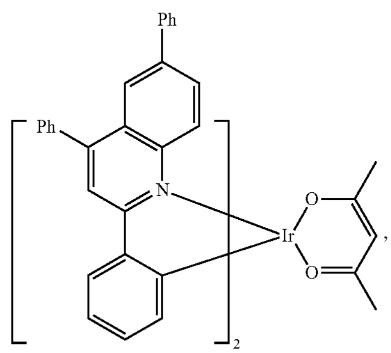
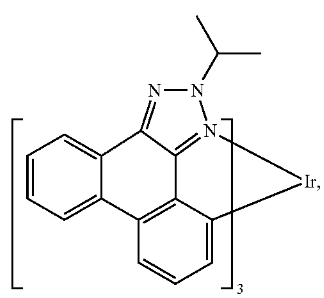
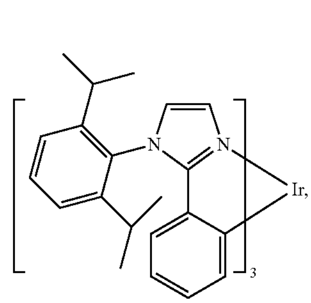
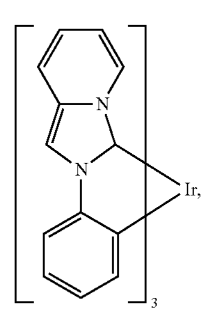

-continued

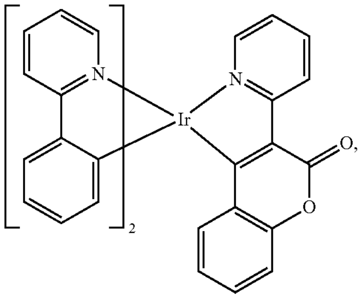

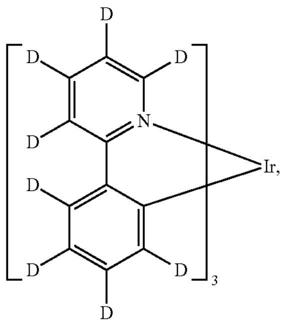

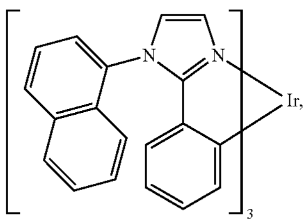

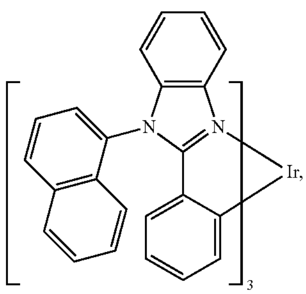

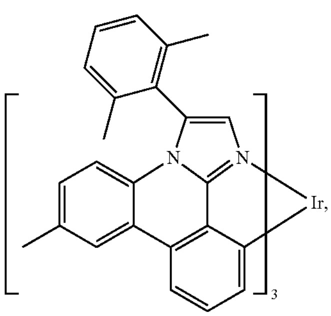

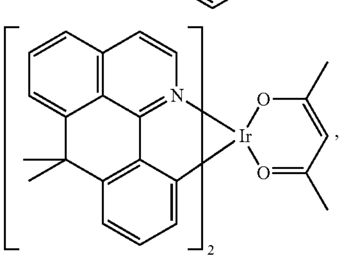

-continued

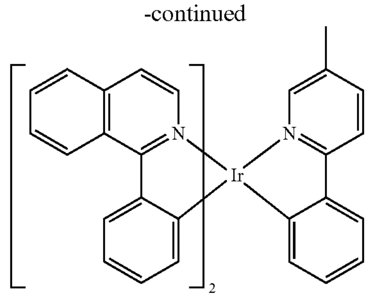

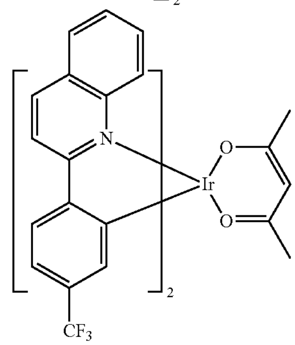

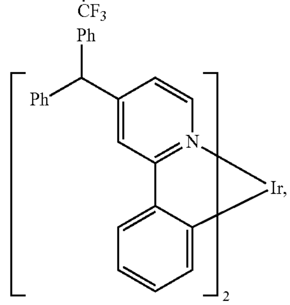

and

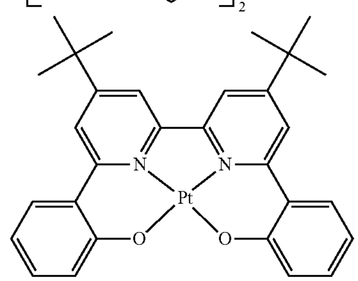

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

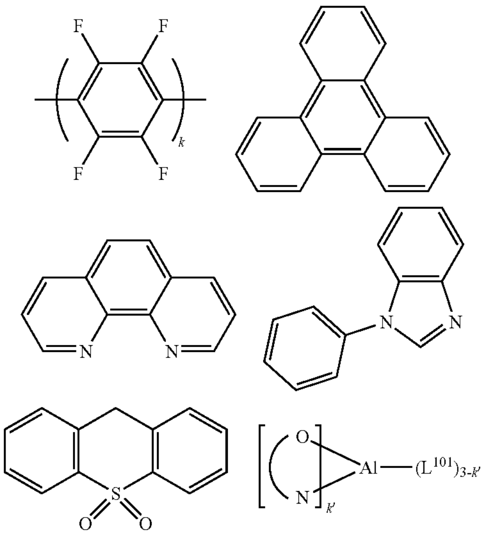

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

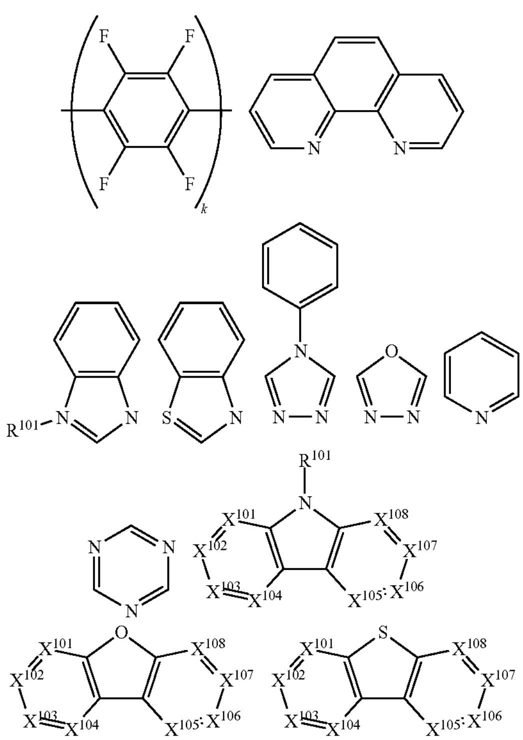

-continued

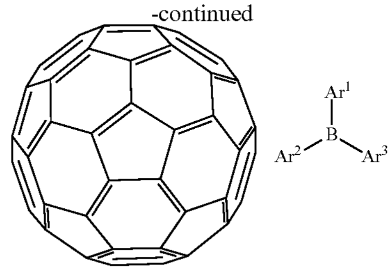

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

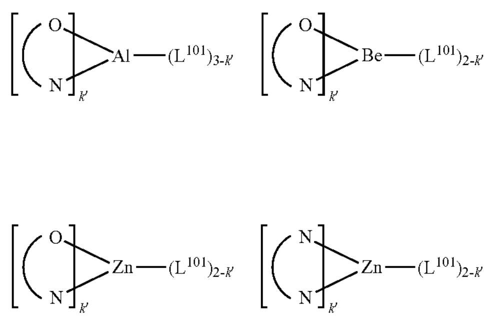

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535, -continued
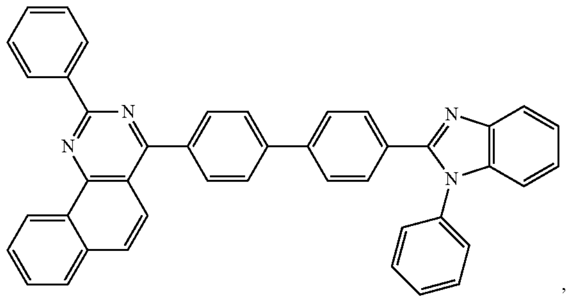
,
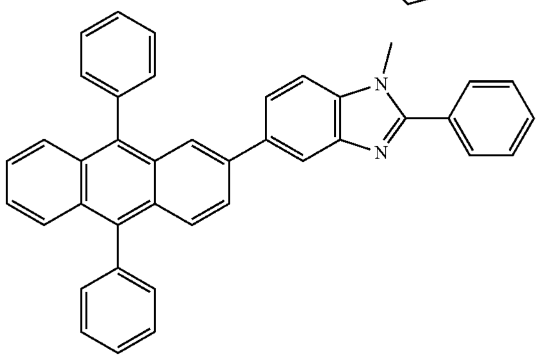
,
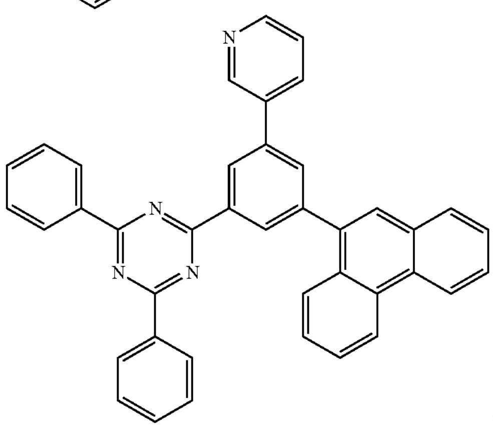
,
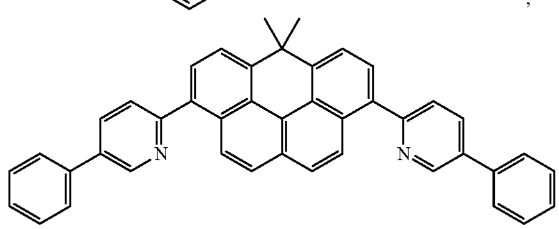
,
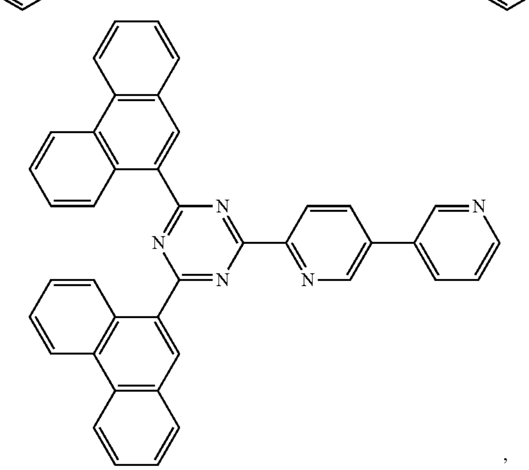
,
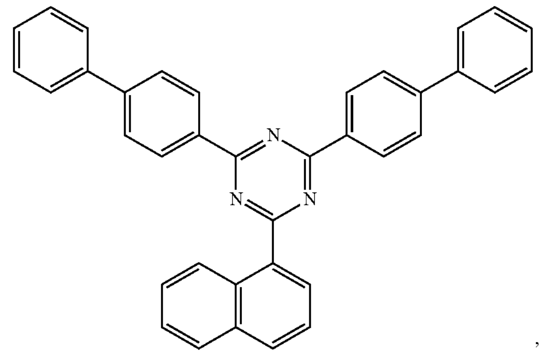
,
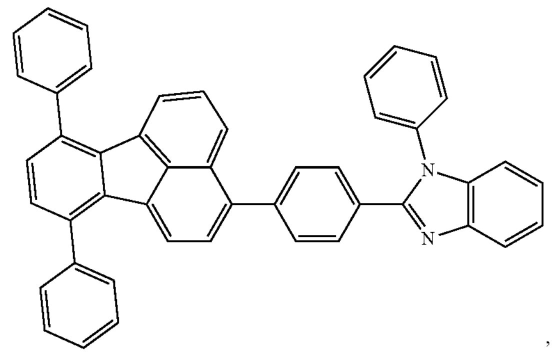
,
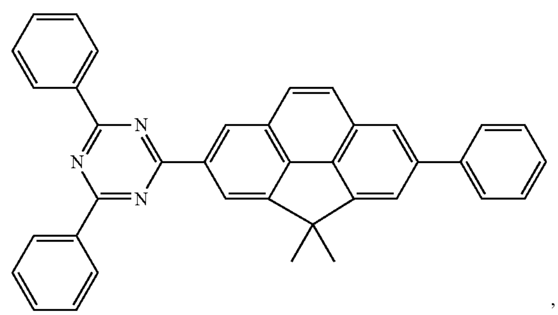
,
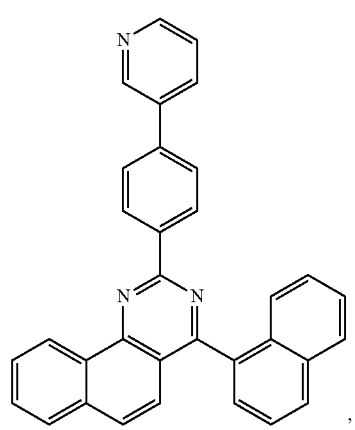
, -continued
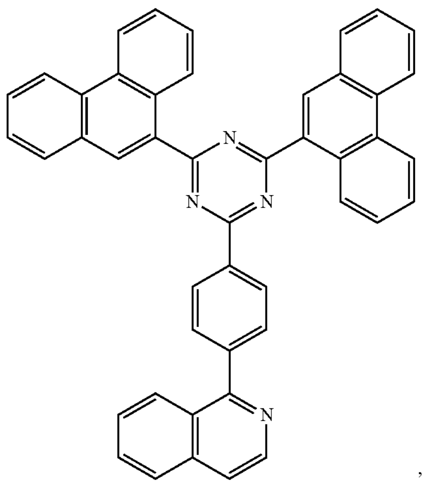
,
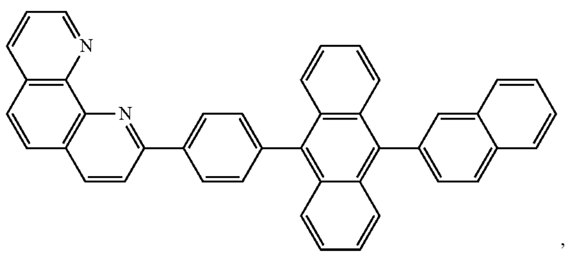
,
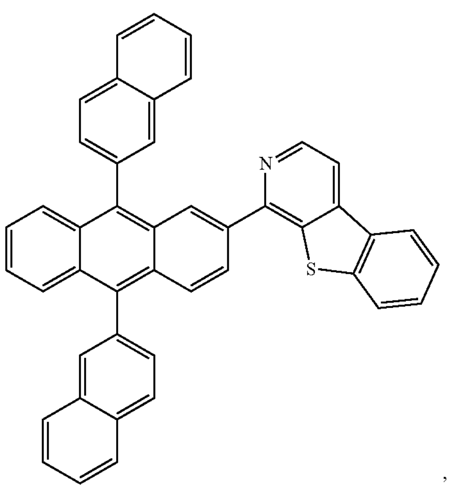
,
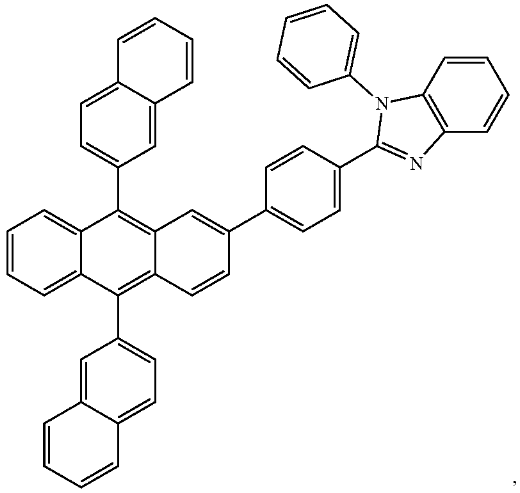
,
-continued
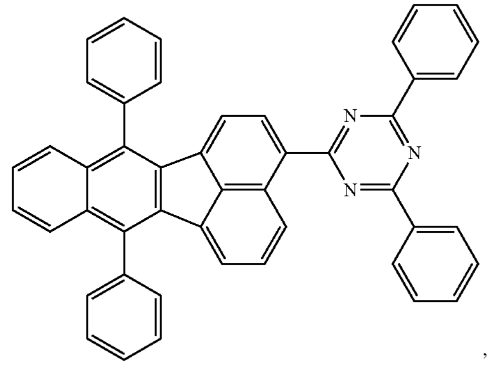
,
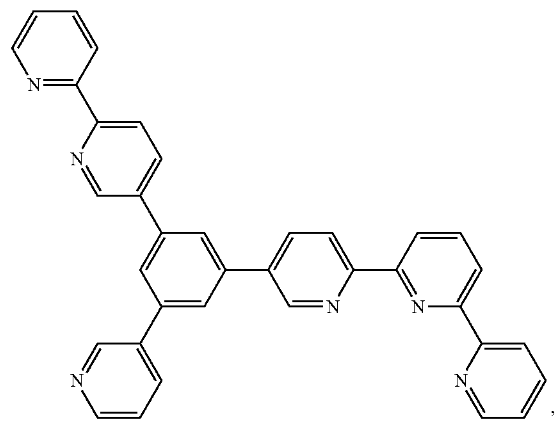
,
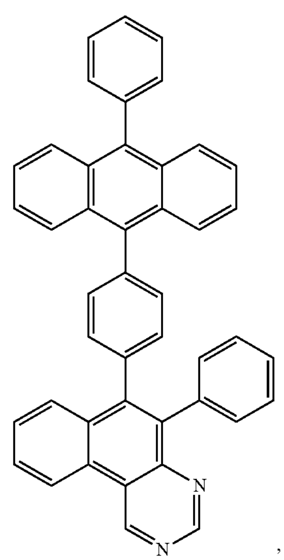
, -continued
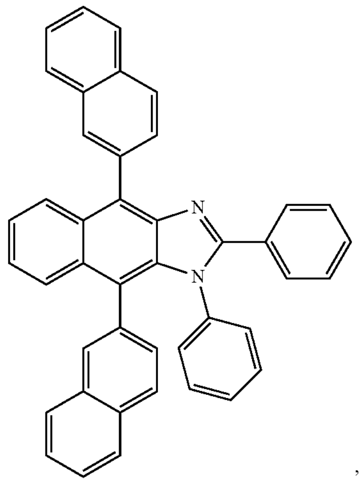
,
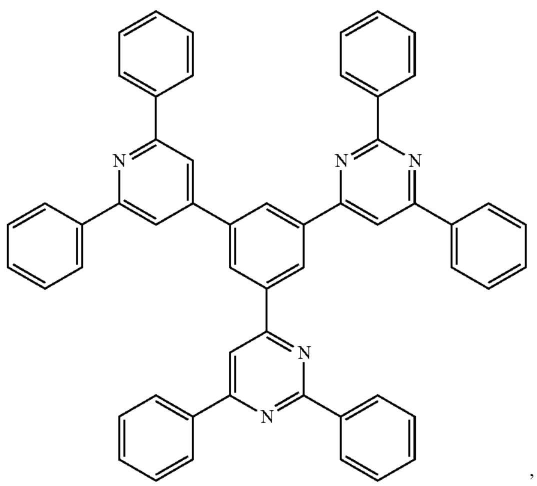
,
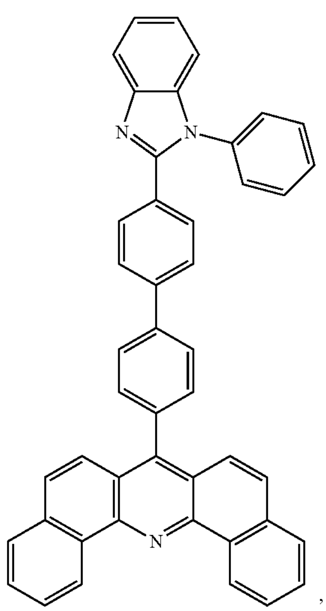
,
-continued
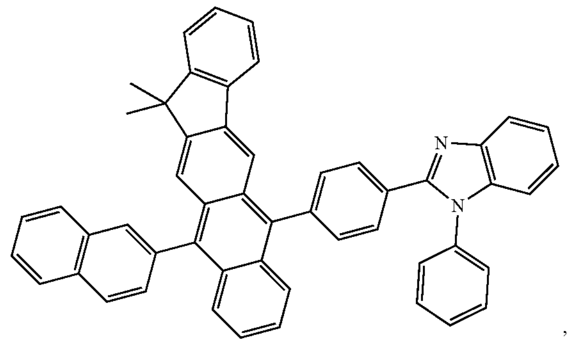
,
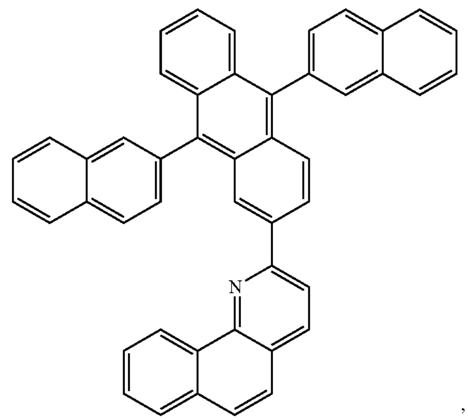
,
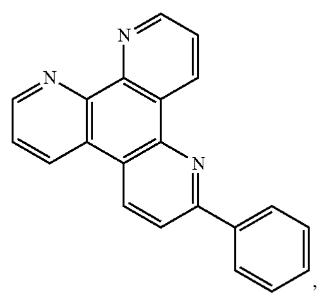
,
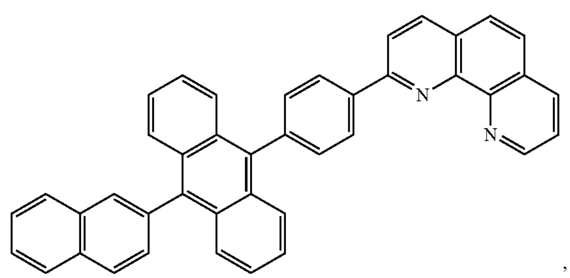
,
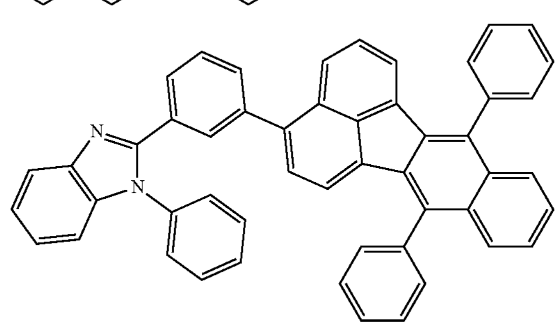
, -continued
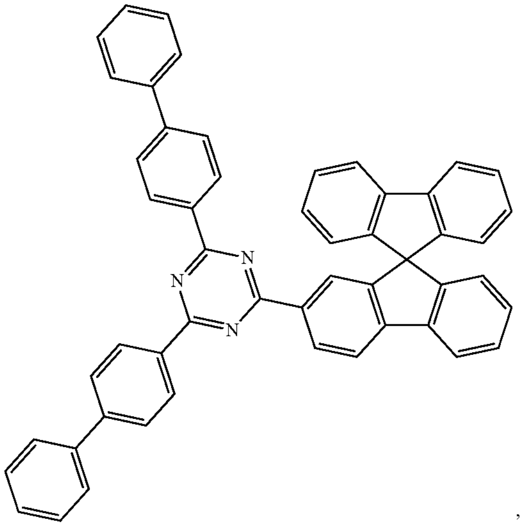
,
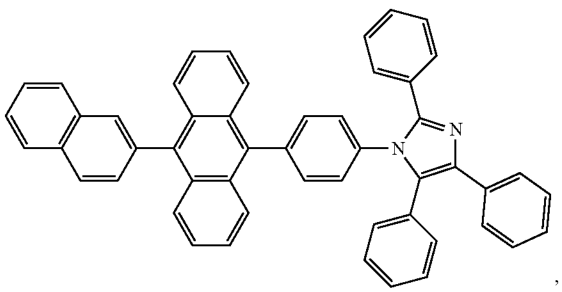
,
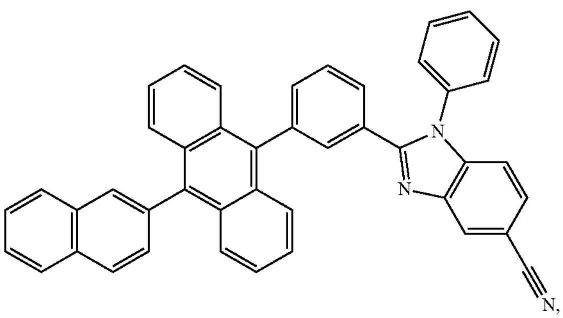
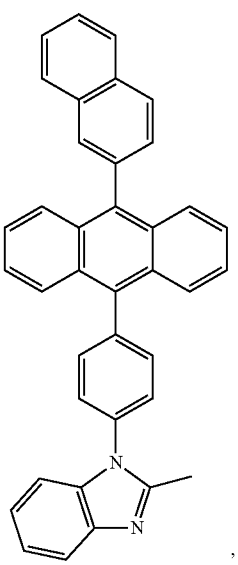
,
-continued
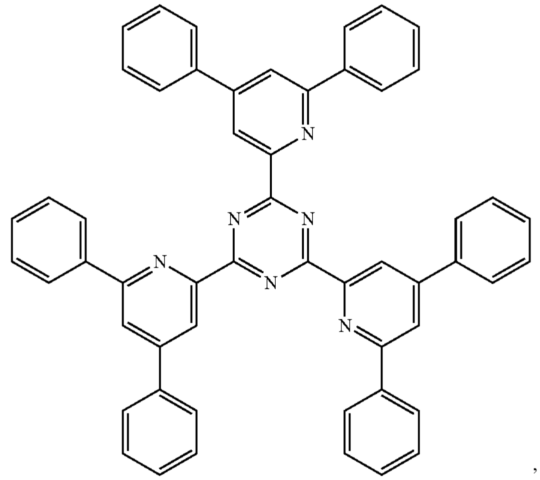
,
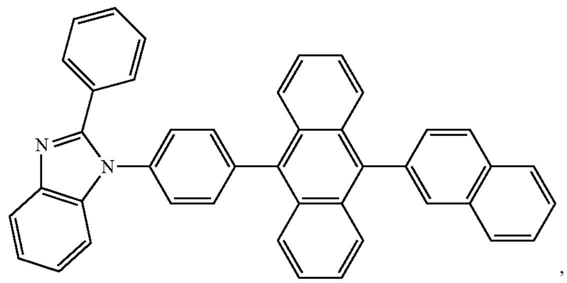
,
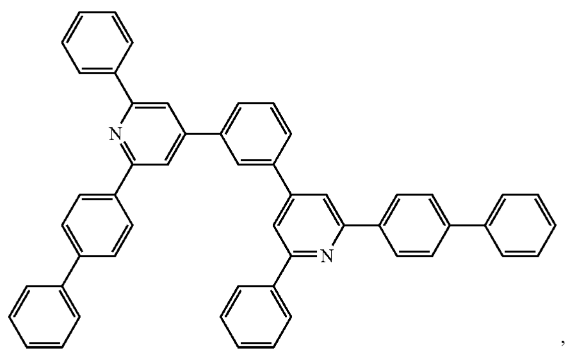
,
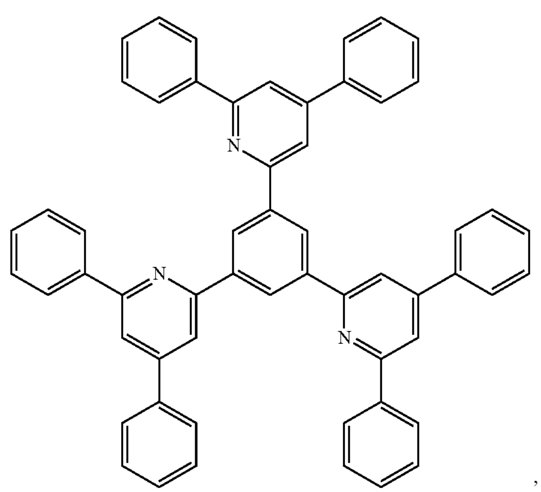
, -continued

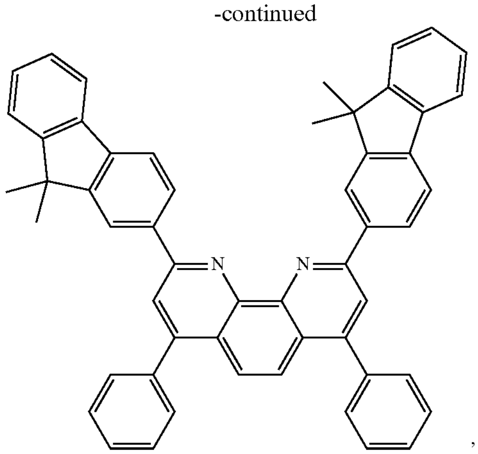

, and

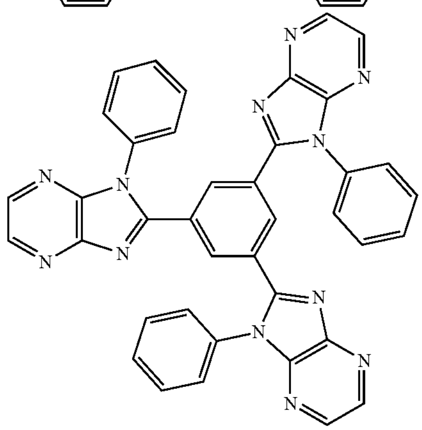

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Examples of the inventive compounds (Compound 254629586 and Compound 254678878) can be synthesized by the procedure shown in the following schemes.

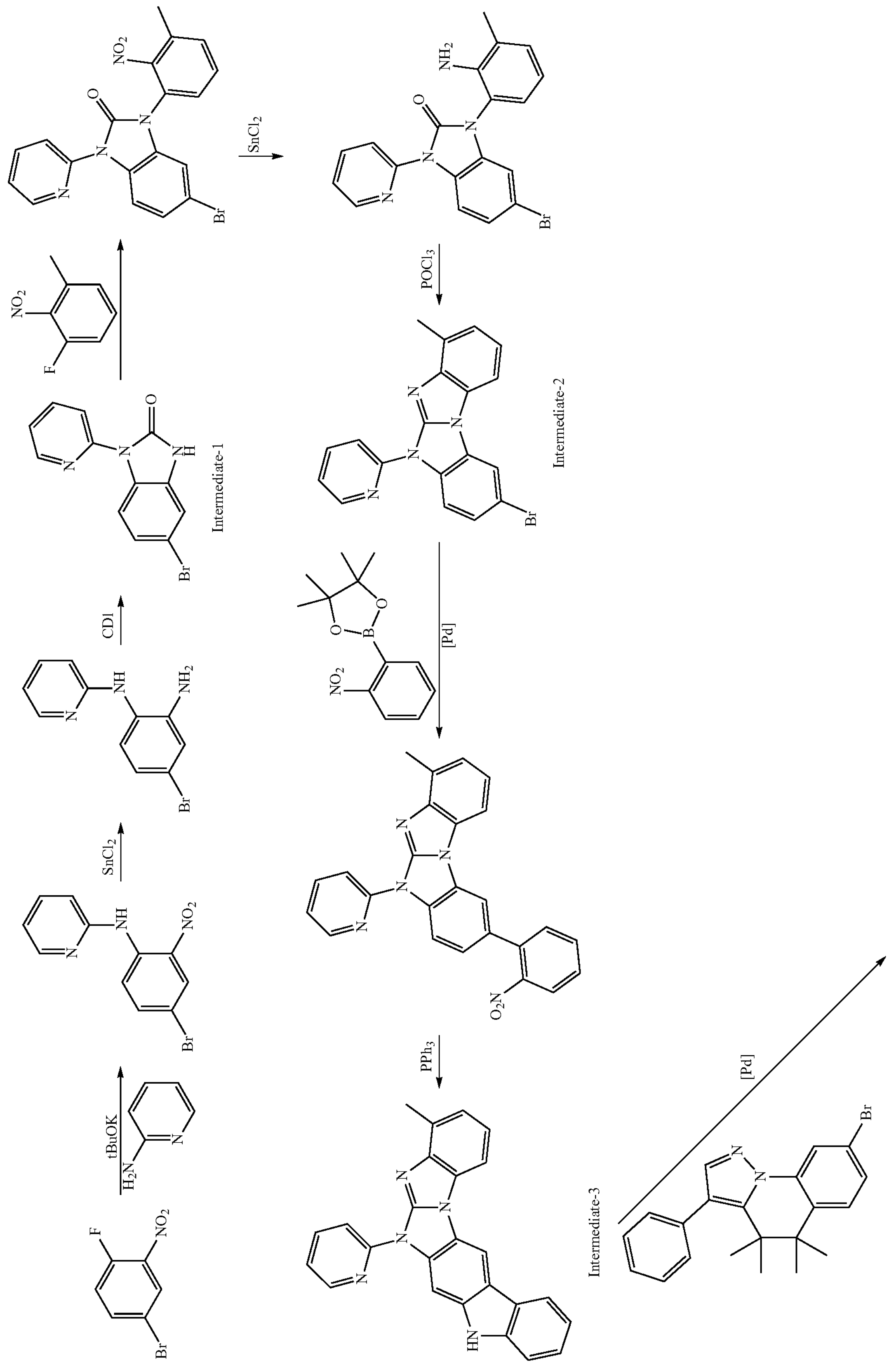
tBuOK
$H_2N$
$SnCl_2$
CDI
Intermediate-1
$SnCl_2$
$POCl_3$
Intermediate-2
[Pd]
$PPh_3$
Intermediate-3
[Pd]

-continued
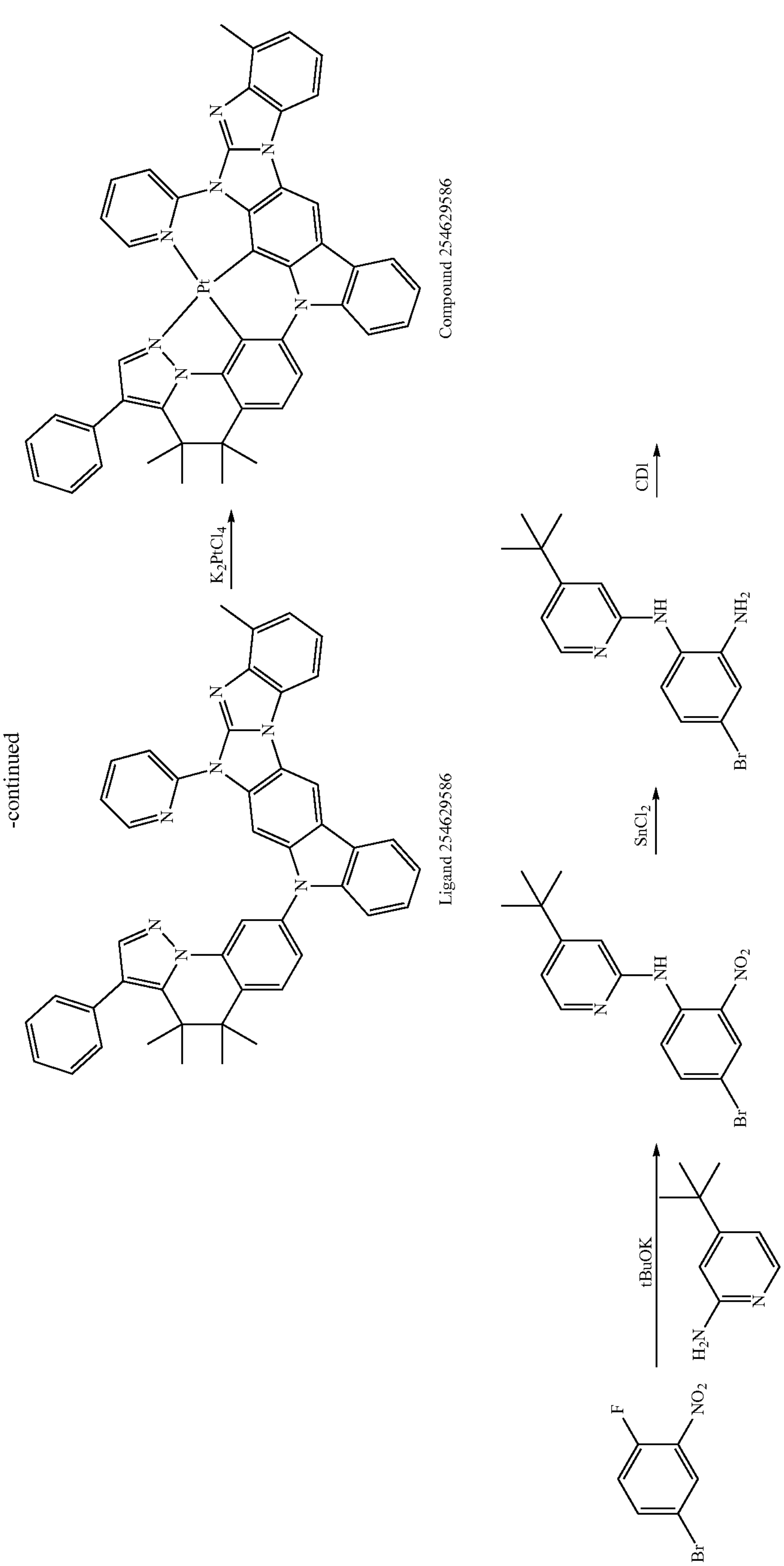

-continued
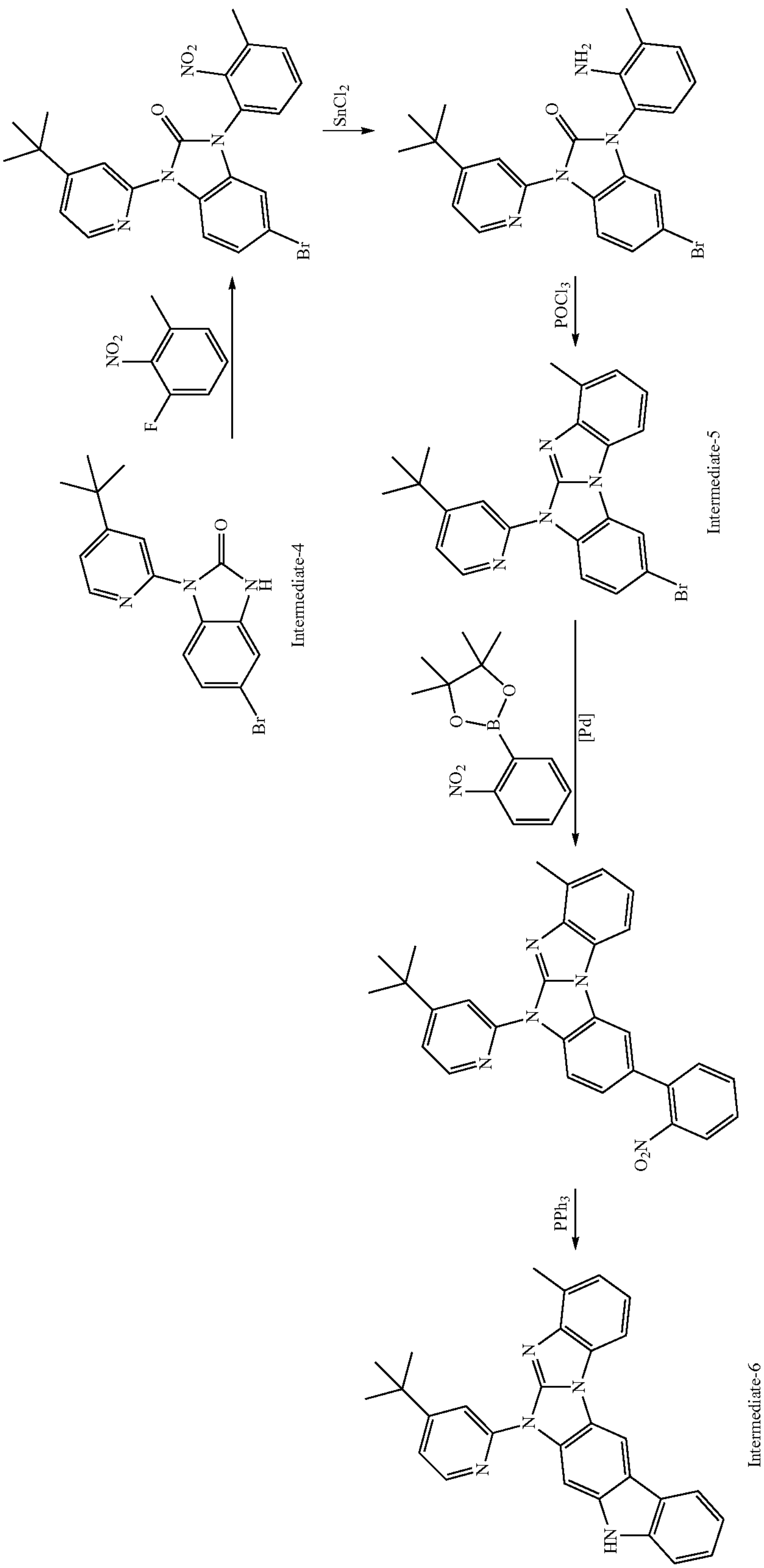

-continued
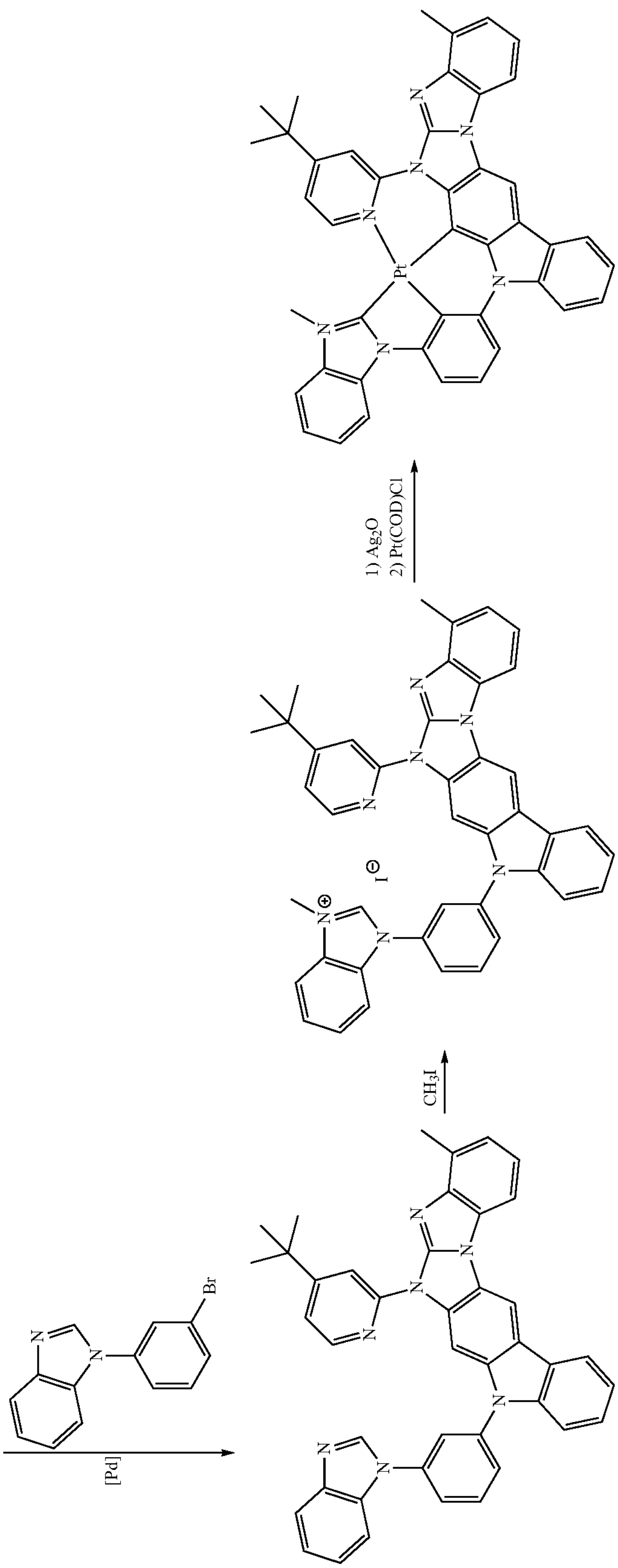
Ligand 254678878
Compound 254678878

Compound 254629586 and Compound 254678878 may be synthesized by the same synthetic strategy. Intermediate-1 and Intermediate-4 may be prepared by $S_NAr$ reaction between starting material and 2-aminopyridine in the presence of base followed by reduction of the nitro group by $SnCl_2$ and a previously reported procedure (*Bioorg. Med. Chem. Lett.* 2008, 18, 6067-6070) to form dihydrobenzimidazole-2-one ring. Intermediate-2 and Intermediate-5 may be prepared by repeating the $S_NAr$ reaction and reduction of nitro group followed by a reported procedure to close down the ring (PCT Int. Appl., 2013068376). Ligand 22016 and Ligand 28348 may be prepared by Pd-mediated C—N coupling between Intermediate-3 and bromophenylpyrazole derivative (U.S. Pat. Appl. Publ., 20160276603) and Intermediate-6 and bromophenylbenzimidazole (*Angew. Chem. Int. Ed.* 2012, 51, 8012), followed by Cadogen cyclization in the presence of $PPh_3$, respectively. Compound 22016 and Compound 28348 may then be synthesized by typical platination procedures (*Adv. Mater.* 2016, 29, 1605002; *Adv. Mater.* 2014, 26, 7116).

Synthesis of Compound 271817738

Synthesis of 5-(4-(tert-butyl)pyridin-2-yl)-3-(3-chlorophenoxy)-7-methyl-5H-benzo[d]benzo[4,5]imidazo[1,2-a]imidazole: A mixture of 3-bromo-5-(4-(tert-butyl)pyridin-2-yl)-7-methyl-5H-benzo[d]benzo[4,5]imidazo[1,2-a]imidazole (2.78 g, 6.42 mmol), copper(I) iodide (0.244 g, 1.283 mmol), picolinic acid (0.316 g, 2.57 mmol), and potassium phosphate (2.72 g, 12.83 mmol) was vacuumed and back-filled with nitrogen. 3-chlorophenol (0.711 ml, 6.74 mmol) and dimethyl sulfoxide (DMSO) (35 ml) was added to the reaction mixture and heated at 130° C. for 48 hours. The mixture was cooled down and water was added. The resulting solid was collected by filtration and washed with $NH_4OH$(aq) and dissolved in dichloromethane (DCM). The product was coated on Celite and chromatographed on silica (DCM/EA=30/1) (67% yield).

Synthesis of 3-([1,1':3',1"-terphenyl]-2'-yl-2,2",3,3",4,4",5,5",6,6"-d10)-1-(3-((5-(4-(tert-butyl)pyridin-2-yl)-7-methyl-5H-benzo[d]benzo[4,5]imidazo[1,2-a]imidazol-3-yl)oxy)phenyl)-1H-benzo[d]imidazol-3-ium chloride: N1-([1,1':3',1"-terphenyl]-2'-yl-2,2",3,3",4,4",5,5",6,6"-d10)-N2-(3-((5-(4-(tert-butyl)pyridin-2-yl)-7-methyl-5H-benzo[d]benzo[4,5]imidazo[1,2-a]imidazol-3-yl)oxy)phenyl)benzene-1,2-diamine (0.98 g, 1.239 mmol) was dissolved in triethoxymethane (8.24 ml, 49.6 mmol) and hydrogen chloride (0.122 ml, 1.487 mmol) was added. The reaction mixture was heated at 80° C. for 18 hours, then cooled down and removed most solvent and the solid was washed with hexane and filtered and dried in the vacuum oven (80% yield).

Synthesis of Compound 271817738: A mixture of 3-([1,1':3',1"-terphenyl]-2'-yl-2,2",3,3",4,4",5,5",6,6"-d10)-1-(3-((5-(4-(tert-butyl)pyridin-2-yl)-7-methyl-5H-benzo[d]benzo[4,5]imidazo[1,2-a]imidazol-3-yl)oxy)phenyl)-1H-benzo[d]imidazol-3-ium chloride (830 mg, 0.991 mmol) and silver oxide (115 mg, 0.496 mmol) was stirred in 1,2-dichloroethane (12 ml) at R.T. for 18 hours. After removing 1,2-dichloroethane, $Pt(COD)Cl_2$ (371 mg, 0.991 mmol) was added and the reaction mixture was vacuumed and back-filled with nitrogen. 1,2-dichlorobenzene (12 ml) was added and heated at 205° C. for 60 hours. The solvent was then removed and coated on Celite and chromatographed on silica (DCM/Hep=5/2). The product was triturated in MeOH and dried in the vacuum oven (29% yield).

TABLE 1

| Compound | Structure | Dihedral angle (indicated by *) | Calculated $T_1$ (nm) |
|---|---|---|---|
| 254629586 ($L_{X212192}$, $L_{Y26}$, $L_{Z13}$) | 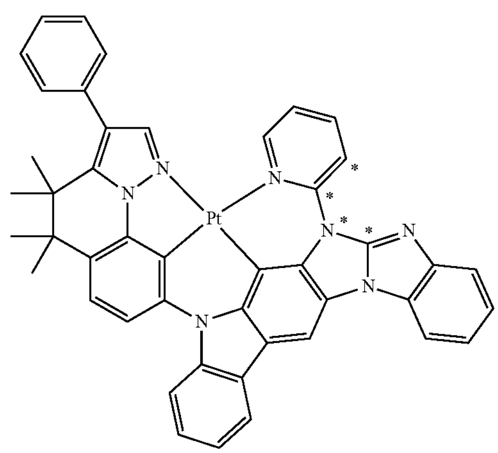 | 2.28° | 446 |

TABLE 1-continued
| Compound | Structure | Dihedral angle (indicated by *) | Calculated $T_1$ (nm) |
|---|---|---|---|
| 254678878 ($L_{X212233}$, $L_{Y28}$, $L_{Z16}$) | 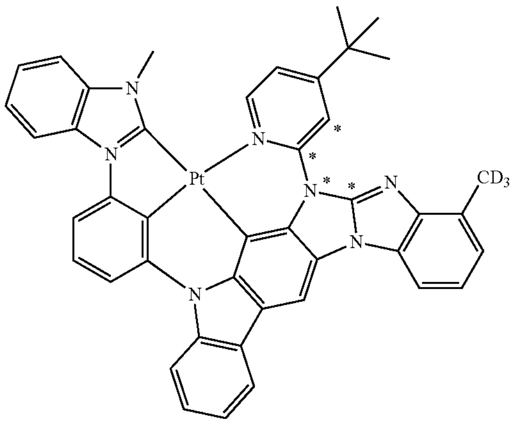 | 4.83° | 449 |
| 254630336 ($L_{X212192}$, $L_{Y26}$, $L_{Z38}$) | 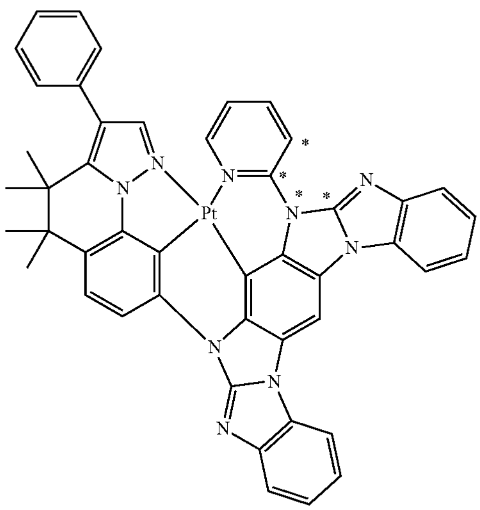 | 0.41° | 434 |
| 254679568 ($L_{X212233}$, $L_{Y28}$, $L_{Z39}$) | 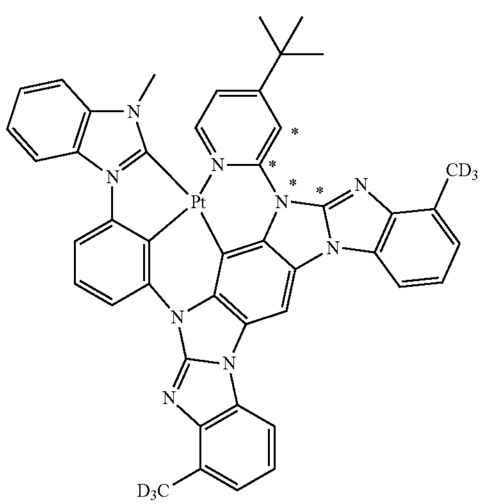 | 2.79° | 442 |

TABLE 1-continued

| Compound | Structure | Dihedral angle (indicated by *) | Calculated $T_1$ (nm) |
|---|---|---|---|
| 271817738 ($L_{X79253}$, $L_{Y28}$, $L_{Z42}$) | 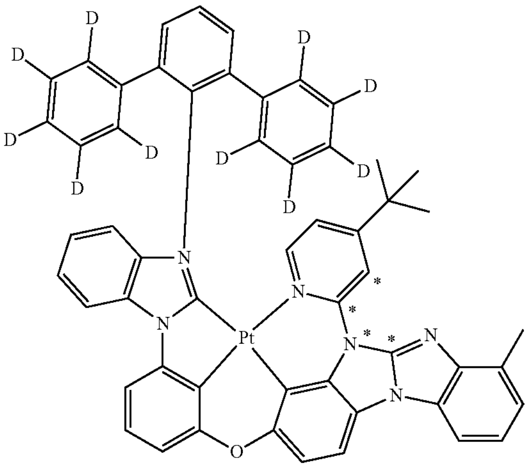 | 4.17° | 433 (exp: 444) |
| Comparative Example 1 | 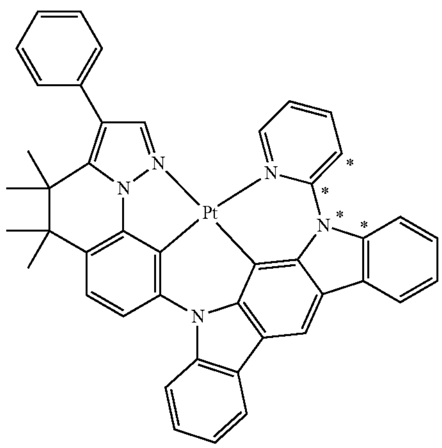 | 13.67° | 474 |
| Comparative Example 2 | 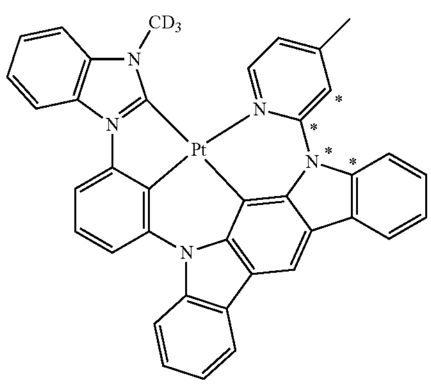 | 15.66° | 481 |

Table 1 shows the calculated dihedral angle and $T_1$ for inventive Compounds 254629586, 254678878, 254630336, 254679568, and 271817738, as well as Comparative Example 1 and 2. Geometry optimization calculations were performed within the Gaussian 09 software package using the B3LYP hybrid functional and CEP-31G basis set which includes effective core potentials. Excited state energies were computed with TDDFT at the optimized ground state geometries. Excitation calculations include a simulated tetrahydrofuran solvent using a self-consistent reaction field. The calculated $T_1$'s of all inventive compounds are much bluer as compared to those of comparative examples, indicating their excellent potential for blue emitting material in PhOLED application. The dihedral angle between the pyridine ring and benzimidazole or carbazole (as indicated by * in Table 1) are much smaller for all invented compounds. The small dihedral angles represent less distortion of their square planar geometries, which is always desired to achieve better chemical stability, hence OLEDs incorporating such compounds will exhibit better device lifetime.

The calculations obtained with the above-identified DFT functional set and basis set are theoretical. Computational composite protocols, such as the Gaussian 09 with B3LYP and CEP-31G protocol used herein, rely on the assumption that electronic effects are additive and, therefore, larger basis sets can be used to extrapolate to the complete basis set (CBS) limit. However, when the goal of a study is to understand variations in HOMO, LUMO, S1, T1, bond dissociation energies, etc. over a series of structurally-related compounds, the additive effects are expected to be similar. Accordingly, while absolute errors from using the B3LYP may be significant compared to other computational methods, the relative differences between the HOMO, LUMO, S1, T1, and bond dissociation energy values calculated with B3LYP protocol are expected to reproduce experiment quite well. See, e.g., Hong et al., *Chem. Mater.* 2016, 28, 5791-98, 5792-93 and Supplemental Information (discussing the reliability of DFT calculations in the context of OLED materials). Moreover, with respect to iridium or platinum complexes that are useful in the OLED art, the data obtained from DFT calculations correlates very well to actual experimental data. See Tavasli et al., *J. Mater. Chem.* 2012, 22, 6419-29, 6422 (Table 3) (showing DFT calculations closely correlating with actual data for a variety of emissive complexes); Morello, G. R., *J. Mol. Model.* 2017, 23:174 (studying of a variety of DFT functional sets and basis sets and concluding the combination of B3LYP and CEP-31G is particularly accurate for emissive complexes).

OLED device fabrication: OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with ultra violet (UV) ozone for 5 minutes. The devices in Tables 1 were fabricated in high vacuum ($<10^{-6}$ Torr) by thermal evaporation. The anode electrode was 750 Å of ITO. The device example had organic layers consisting of, sequentially, from the ITO surface, 100 Å thick Compound A (HIL), 250 Å layer of Compound B (HTL), 50 Å of Compound C (EBL), 300 Å of Compound D doped with 10% of Emitter (EML), 50 Å of Compound E (BL), 300 Å of Compound G doped with 35% of Compound F (ETL), 10 Å of Compound G (EIL) followed by 1,000 Å of Al (Cathode). All devices were encapsulated with a glass lid sealed with an epoxy resin in a nitrogen glove box (<1 ppm of $H_2O$ and $O_2$) immediately after fabrication with a moisture getter incorporated inside the package. The doping percentages are in volume percent.

The structures of the compounds used in the experimental devices are shown below:

Compound A

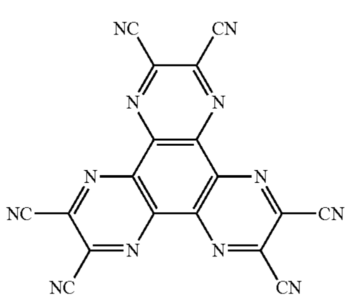

-continued

Compound B

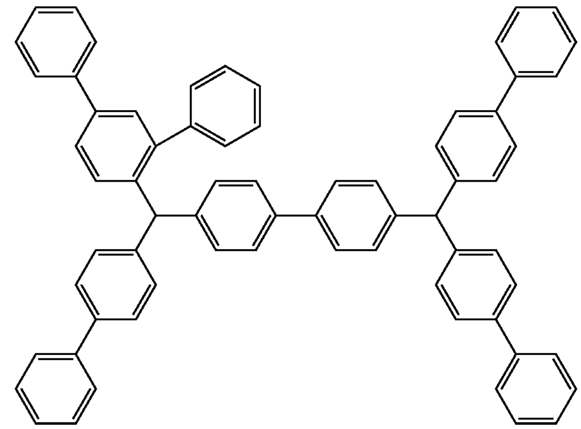

Compound C

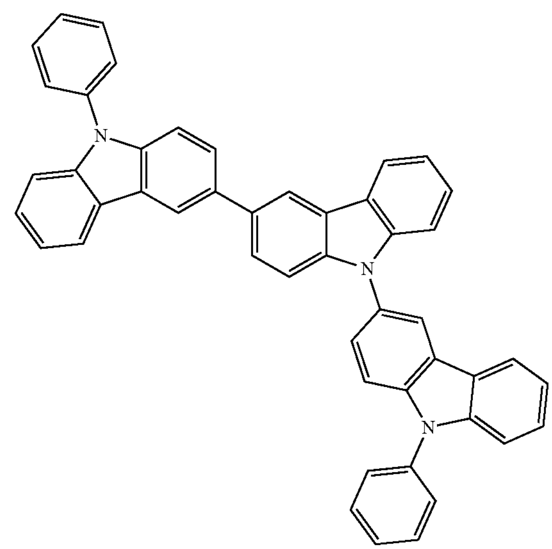

Compound D

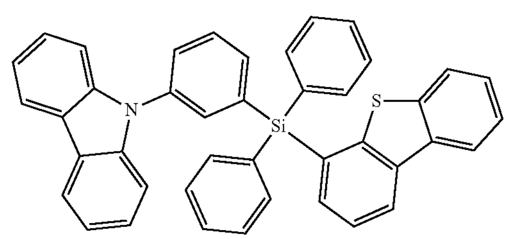

-continued

Compound E

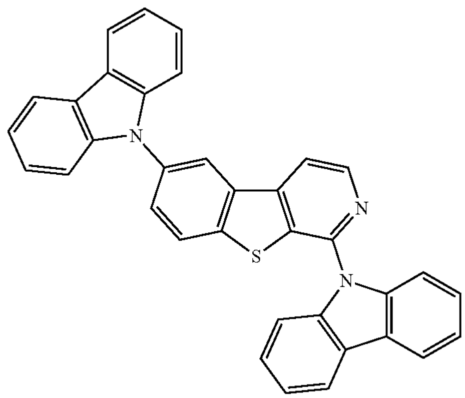

Compound F

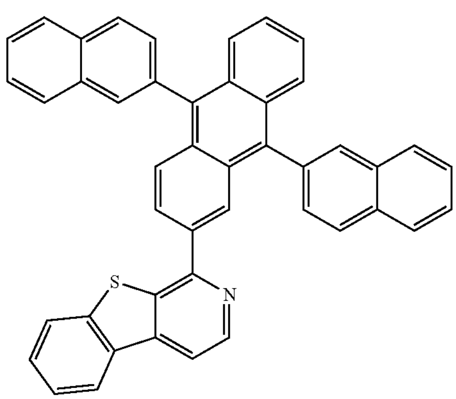

Compound G

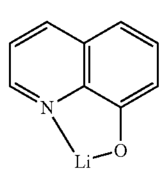

TABLE 2

| Device Data | | | | | | | | | |
|---|---|---|---|---|---|---|---|---|---|
| | | | | | at 1,000 nit | | | | |
| | 1931 CIE | | λ max | FWHM | Voltage | LE | EQE | PE |
| Device | x | y | [nm] | [nm] | [V] | [cd/A] | [%] | [lm/W] |
| Compound 271817738 | 0.138 | 0.161 | 459 | 46 | 4.2 | 16.9 | 13.4 | 12.8 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound selected from the group consisting of:

Formula I

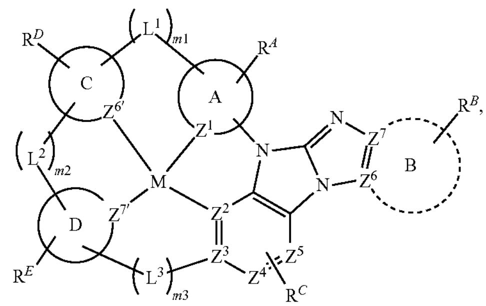

Formula II

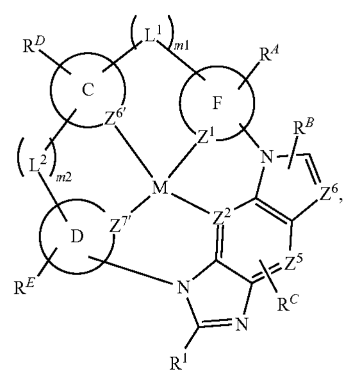

and

-continued

Formula III

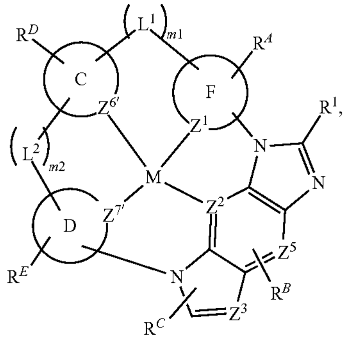

wherein,

A, B, C, D, and F are each independently a 5-membered or 6-membered aromatic ring;

ring B may or may not be present;

M is selected from the group consisting of Pt, Pd, Cu, and Au;

$Z^1$, $Z^2$, $Z^3$, $Z^4$, $Z^5$, $Z^6$, $Z^{6'}$, $Z^7$ and $Z^{7'}$ are each independently selected from the group consisting of C and N;

wherein one of $Z^{6'}$ and $Z^{7'}$ is a neutral carbene carbon, and the other one of $Z^{6'}$ and $Z^{7'}$ is an anionic carbon;

m1, m2 and m3 are each independently an integer of 0 or 1; when m2 is 0, each m1 and m3 is 1: when m2 is 1, each m1 and m3 can be 0 or 1;

when m1 is 0, $L^1$ is not present; when m2 is 0, $L^2$ is not present; when m3 is 0, $L^3$ is not present;

$L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof;

each $R^A$, $R^B$, $R^C$, $R^D$, and $R^E$ represents mono- to maximum possible number of substitutions, or no substitution;

each $R^A$, $R^B$, $R^C$, $R^D$, $R^E$, R and R' is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof, $R^1$ is selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof, and any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

2. The compound of claim 1, wherein M is Pt.

3. The compound of claim 1, wherein one of $Z^6$ and $Z^7$ is nitrogen, and the other one of $Z^6$ and $Z^7$ is carbon.

4. The compound of claim 1, wherein rings A, B, C, D, and F are each independently selected from the group consisting of phenyl, pyridine, pyrimidine, triazine, pyrazole, triazole, imidazole, and imidazole derived carbene.

5. The compound of claim 1, wherein $L^3$ and $Z^4$ are fused to form a 5-membered or 6-membered carbocyclic or heterocyclic ring.

6. The compound of claim 1, wherein $L^3$ is present and is selected from the group consisting of O, S, and CRR'.

7. The compound of claim 1, wherein the compound is Formula I and ring A is pyridine with N coordinating to M.

8. The compound of claim 1, wherein the compound is selected from the group consisting of:

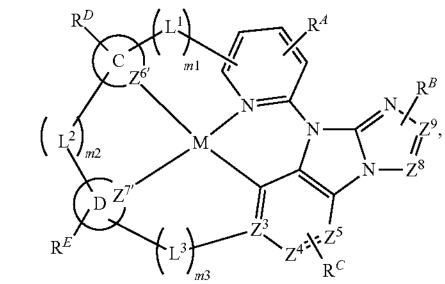

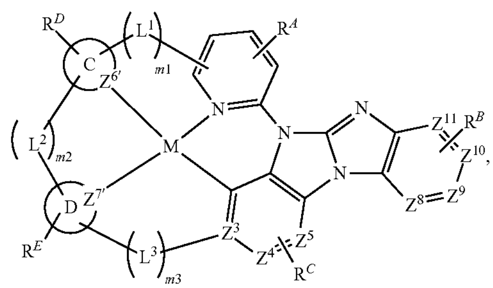

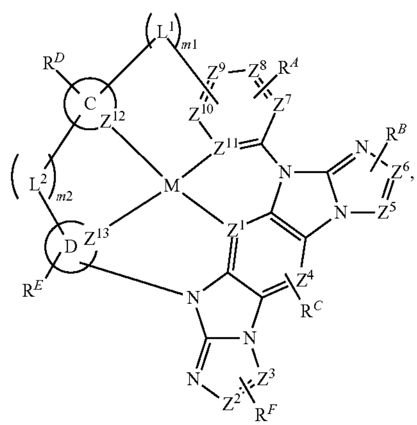

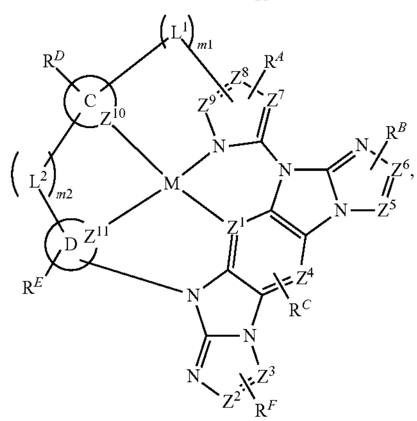

-continued

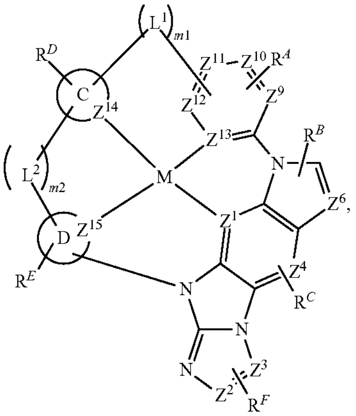

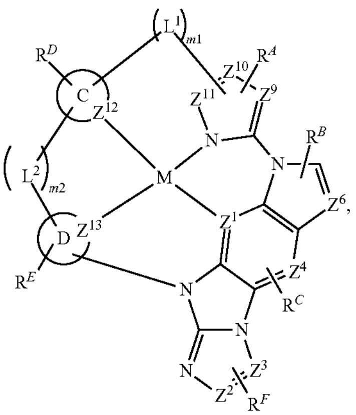

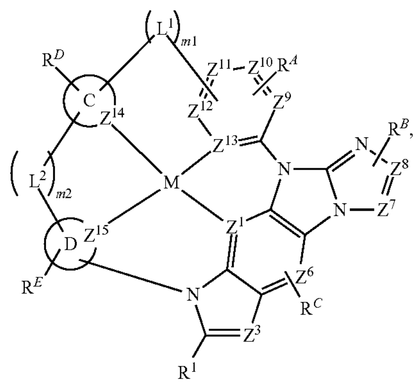

and

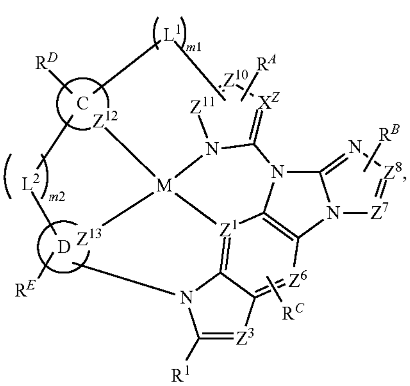

wherein, $Z^1$, $Z^2$, $Z^3$, $Z^4$, $Z^5$, $Z^6$, $Z^{6'}$, $Z^7$, $Z^{7'}$, $Z^8$, $Z^9$, $Z^{10}$, $Z^{11}$, $Z^{12}$, and $Z^{13}$ are each independently C or N;

wherein in rings C and D:

one of $Z^{6'}$ and $Z^{7'}$ is a neutral carbene carbon, and the other one of $Z^{6'}$ and $Z^{7'}$ is an anionic carbon;

one of $Z^{10}$ and $Z^{11}$ is a neutral carbene carbon, and the other one of $Z^{10}$ and $Z^{11}$ is an anionic carbon;

one of $Z^{12}$ and $Z^{13}$ is a neutral carbene carbon, and the other one of $Z^{12}$ and $Z^{13}$ is an anionic carbon;

one of $Z^{14}$ and $Z^{15}$ is a neutral carbene carbon, and the other one of $Z^{14}$ and $Z^{15}$ is an anionic carbon;

$R^F$ represents mono- to maximum possible number of substitutions, or no substitution; and each $R^F$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof, and any two substituents can be joined or fused into a ring.

9. The compound of claim 8, wherein the compound has the structure:

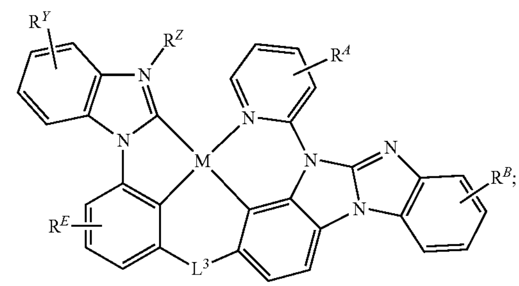

wherein $R^Y$ represents mono- to tetra-substitutions, or no substitution;

wherein any two substituents can be joined or fused into a ring;

wherein $R^Y$ is a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof, and wherein $R^Z$ is selected from the group consisting of alkyl, cycloalkyl, heteroalkyl, heterocycloalkyl, arylalkyl, silyl, aryl, heteroaryl, boryl, partially or fully deturated variants thereof, partially or fully fluorinated variants thereof, and combinations thereof.

10. The compound of claim 1, wherein at least one of $R^A$, $R^B$, $R^C$, $R^D$, $R^E$, $R^F$, R and R' comprises a chemical group containing at least three 6-membered aromatic rings that are not fused next to each other.

11. The compound of claim 9, wherein at least one of $R^Y$ and $R^Z$ comprises a chemical group containing at least three 6-membered aromatic rings that are not fused next to each other.

12. The compound of claim 1, wherein the compound is the compound x having the formula $(L_{Xi})Pt(L_{Yj})(L_{Zk})$;

wherein, $L_{Xi}$ is a bidentate ligand;

$L_{Yj}$ is a monodentate ligand;

$L_{Zk}$ is a monodentate ligand;

$L_{Xi}$ is linked to $L_{Zk}$ by a linking group $L^3$;

$L_{Zk}$ is linked to $L_{Yj}$ by a direct bond;

x=30(k−1)+j+1200(i−1), i is an integer from 1 to 212190, 212216 to 212219, 212231 to 212234, j is an integer from 1 to 30, and k is an integer from 1 to 40; when k=41, 42, or 43, x=25(k−41)+j+75(i−1)+254709600, i is an integer from 1 to 212190, 212216 to 212219, 212231 to 212234, j is an integer from 1 to 25;

$L_{Xi}$ is selected from the group consisting of $L_{X1}$ to $L_{X212190}$, $L_{X212216}$ to $L_{X212219}$, and $L_{X212231}$ to $L_{X212234}$ whose structures are defined as follows:

| $L_{Xi}$ | Structure of $L_{Xi}$ | $Ar^1$, $R^1$ | $i$ |
|---|---|---|---|
| wherein $L_{X1}$ to $L_{X9900}$ have the structure | 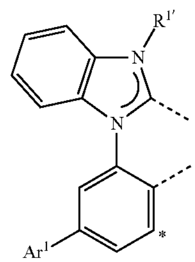 | wherein $Ar^1$ = A*m* and $R^{1'}$ = R*n*, wherein *m* is an integer from 1 to 30 and *n* is an integer from 1 to 330, and | $y = 330(m - 1) + n$ |
| wherein $L_{X9901}$-$L_{X19800}$ have the structure | 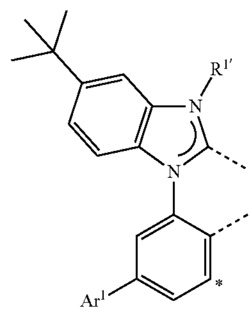 | wherein $Ar^1$ = A*m* and $R^{1'}$ = R*n*, wherein *m* is an integer from 1 to 30 and *n* is an integer from 1 to 330, and | $y = 330(m - 1) + n + 9900$ |
| wherein $L_{X19801}$-$L_{X29700}$ have the structure | 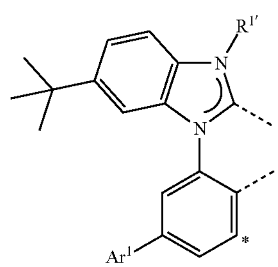 | wherein $Ar^1$ = A*m* and $R^{1'}$ = R*n*, wherein *m* is an integer from 1 to 30 and *n* is an integer from 1 to 330, and | $y = 330(m - 1) + n + 19800$ |
| wherein $L_{X29701}$-$L_{X39600}$ have the structure | 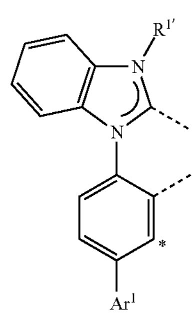 | wherein $Ar^1$ = A*m* and $R^{1'}$ = R*n*, wherein *m* is an integer from 1 to 30 and *n* is an integer from 1 to 330, and | $y = 330(m - 1) + n + 29700$ |

-continued

| $L_{Xi}$ | Structure of $L_{Xi}$ | $Ar^1$, $R^1$ | *i* |
|---|---|---|---|
| wherein $L_{X39601}$-$L_{X49500}$ have the structure | 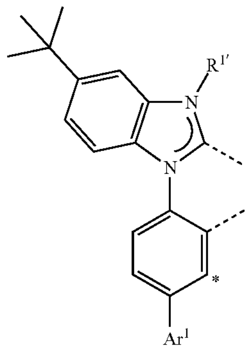 | wherein $Ar^1$ = A*m* and $R^{1'}$ = R*n*, wherein *m* is an integer from 1 to 30 and *n* is an integer from 1 to 330, and | $y = 330(m - 1) + n + 39600$ |
| wherein $L_{X49501}$-$L_{X59400}$ have the structure | 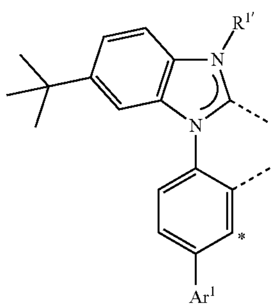 | wherein $Ar^1$ = A*m* and $R^{1'}$ = R*n*, wherein *m* is an integer from 1 to 30 and *n* is an integer from 1 to 330, and | $y = 330(m - 1) + n + 49500$ |
| wherein $L_{X59401}$-$L_{X69300}$ have the structure | 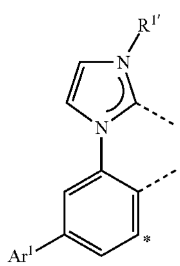 | wherein $Ar^1$ = A*m* and $R^{1'}$ = R*n*, wherein *m* is an integer from 1 to 30 and *n* is an integer from 1 to 330, and | $y = 330(m - 1) + n + 59400$ |
| wherein $L_{X69301}$-$L_{X79200}$ have the structure | 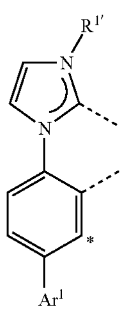 | wherein $Ar^1$ = A*m* and $R^{1'}$ = R*n*, wherein *m* is an integer from 1 to 30 and *n* is an integer from 1 to 330, and | $y = 330(m - 1) + n + 69300$ |
| wherein $L_{X79201}$ to $L_{X79530}$ have the structure | 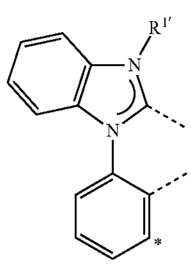 | wherein $R^{1'}$ = R*n*, wherein *n* is an integer from 1 to 330, and | $y = n + 79200$ |

-continued

| $L_{Xi}$ | Structure of $L_{Xi}$ | $Ar^1$, $R^1$ | $i$ |
|---|---|---|---|
| wherein $L_{X79531}$-$L_{X79860}$ have the structure | 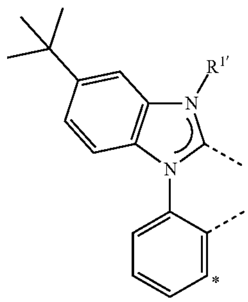 | wherein $R^{1'} = Rn$, wherein $n$ is an integer from 1 to 330, and | $y = n + 79530$ |
| wherein $L_{X79861}$-$L_{X80190}$ have the structure | 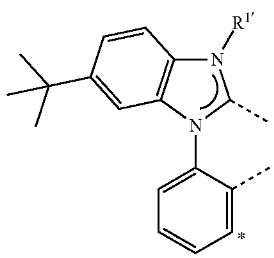 | wherein $R^{1'} = Rn$, wherein $n$ is an integer from 1 to 330, and | $y = n + 79860$ |
| wherein $L_{X80191}$-$L_{X80520}$ have the structure | 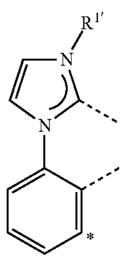 | wherein $R^{1'} = Rn$, wherein $n$ is an integer from 1 to 330, and | $y = n + 80190$ |
| wherein $L_{X80521}$ to $L_{X90420}$ have the structure | 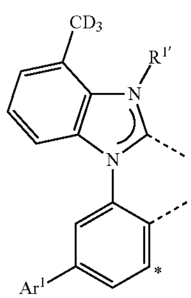 | wherein $Ar^1 = Am$ and $R^{1'} = Rn$, wherein $m$ is an integer from 1 to 30 and $n$ is an integer from 1 to 330, and | $y = 330(m - 1) + n + 80520$ |
| wherein $L_{X90421}$ to $L_{X100320}$ have the structure | 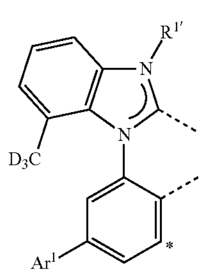 | wherein $Ar^1 = Am$ and $R^{1'} = Rn$, wherein $m$ is an integer from 1 to 30 and $n$ is an integer from 1 to 330, and | $y = 330(m - 1) + n + 90420$ |

-continued

| $L_{Xi}$ | Structure of $L_{Xi}$ | $Ar^1$, $R^1$ | i |
|---|---|---|---|
| wherein $L_{X100321}$ to $L_{X110220}$ | 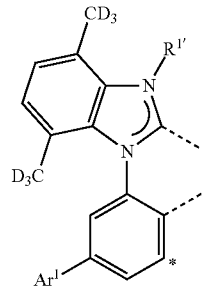 | wherein $Ar^1$ = Am and $R^{1'}$ = Rn, wherein m is an integer from 1 to 30 and n is an have the structure integer from 1 to 330, and | y = 330(m − 1) + n + 100320 |
| wherein $L_{X110221}$ to $L_{X120120}$ have the structure | 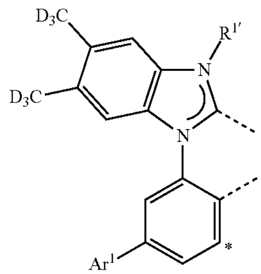 | wherein $Ar^1$ = Am and $R^{1'}$ = Rn, wherein m is an integer from 1 to 30 is an integer integer from 1 to 330, and | y = 330(m − 1) + n + 110220 |
| wherein $L_{X120121}$ to $L_{X130020}$ have the structure | 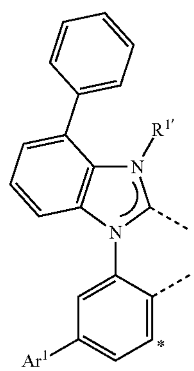 | wherein $Ar^1$ = Am and $R^{1'}$ = Rn, wherein m is an integer from 1 to 30 and n is an integer from 1 to 330, and | y = 330(m − 1) + n + 120120 |
| wherein $L_{X130021}$ to $L_{X139920}$ have the structure | 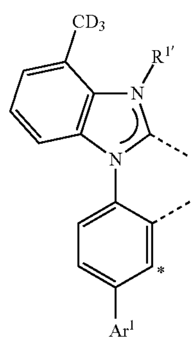 | wherein $Ar^1$ = Am and $R^{1'}$ = Rn, wherein m is an integer from 1 to 30 and n is an integer from 1 to 330, and | y = 330(m − 1) + n + 130020 |
| wherein $L_{X139921}$ to $L_{X149820}$ have the structure | 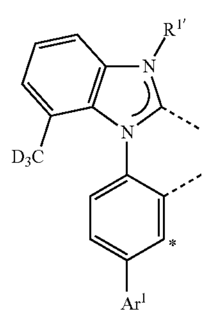 | wherein $Ar^1$ = Am and $R^{1'}$ = Rn, wherein m is an integer from 1 to 30 and n is an integer from 1 to 330, and | y = 330(m − 1) + n + 139920 |

-continued

| $L_{Xi}$ | Structure of $L_{Xi}$ | $Ar^1$, $R^1$ | *i* |
|---|---|---|---|
| wherein $L_{X149821}$ to $L_{X159720}$ have the structure | 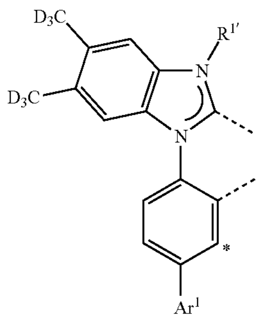 | wherein $Ar^1$ = A*m* and $R^{1'}$ = R*n*, wherein *m* is an integer from 1 to 30 and *n* is an integer from 1 to 330, and | $y = 330(m - 1) + n + 149820$ |
| wherein $L_{X159721}$ to $L_{X169620}$ have the structure | 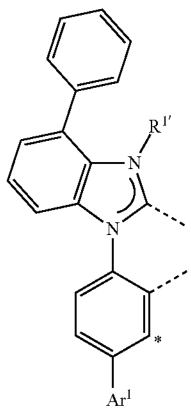 | wherein $Ar^1$ = A*m* and $R^{1'}$ = R*n*, wherein *m* is an integer from 1 to 30 and *n* is an integer from 1 to 330, and | $y = 330(m - 1) + n + 159720$ |
| wherein $L_{X169621}$ to $L_{X169950}$ have the structure | 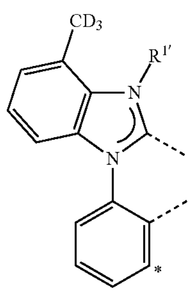 | wherein $R^{1'}$ = R*n*, wherein *n* is an integer from 1 to 330, and | $y = n + 169620$ |
| wherein $L_{X169951}$ to $L_{X170280}$ have the structure | 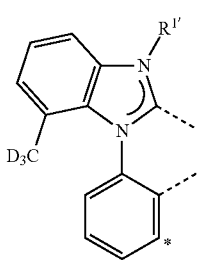 | wherein $R^{1'}$ = R*n*, wherein *n* is an integer from 1 to 330, and | $y = n + 169950$ |
| wherein $L_{X170281}$ to $L_{X170610}$ have the structure | 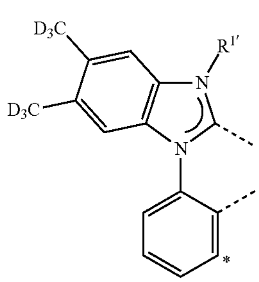 | wherein $R^{1'}$ = R*n*, wherein *n* is an integer from 1 to 330, and | $y = n + 170280$ |

-continued

| $L_{Xi}$ | Structure of $L_{Xi}$ | $Ar^1$, $R^1$ | *i* |
|---|---|---|---|
| wherein $L_{X170610}$ to $L_{X170940}$ have the structure | 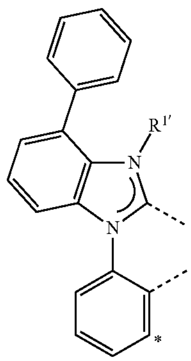 | wherein $R^{1'}$ = R*n*, wherein *n* is an integer from 1 to 330, and | $y = n + 170610$ |
| wherein $L_{X170941}$ to $L_{X171270}$ have the structure | 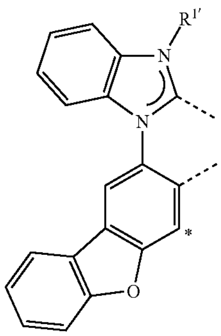 | wherein $R^{1'}$ = R*n*, wherein *n* is an integer from 1 to 330, and | $y = n + 170940$ |
| wherein $L_{X171271}$ to $L_{X171600}$ have the structure | 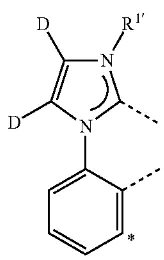 | wherein $R^{1'}$ = R*n*, wherein *n* is an integer from 1 to 330, and | $y = n + 171270$ |
| wherein $L_{X171601}$ to $L_{X181500}$ have the structure | 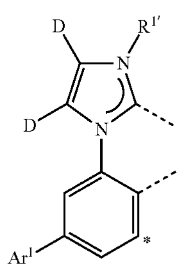 | wherein $Ar^1$ = A*m* and $R^{1'}$ = R*n*, wherein *m* is an integer from 1 to 30 and *n* is an integer from 1 to 330, and | $y = 330(m - 1) + n + 171600$ |
| wherein $L_{X181501}$ to $L_{X191400}$ have the structure | 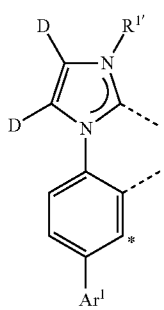 | wherein $Ar^1$ = A*m* and $R^{1'}$ = R*n*, wherein *m* is an integer from 1 to 30 and *n* is an integer from 1 to 330, and | $y = 330(m - 1) + n + 181500$ |

-continued

| $L_{Xi}$ | Structure of $L_{Xi}$ | $Ar^1$, $R^1$ | *i* |
|---|---|---|---|
| wherein $L_{X191401}$ to $L_{X191730}$ have the structure | 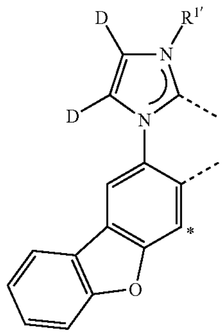 | wherein $R^{1'} = Rn$, wherein *n* is an integer from 1 to 330, and | $y = n + 191400$ |
| wherein $L_{X191731}$ to $L_{X192060}$ have the structure | 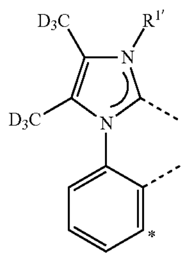 | wherein $R^{1'} = Rn$, wherein *n* is an integer from 1 to 330, and | $y = n + 191730$ |
| wherein $L_{X192061}$ to $L_{X201960}$ have the structure | 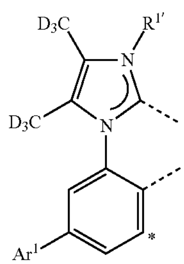 | wherein $Ar^1 = Am$ and $R^{1'} = Rn$, wherein *m* is an integer from 1 to 30 and *n* is an integer from 1 to 330, and | $y = 330(m - 1) + n + 192060$ |
| wherein $L_{X201961}$ to $L_{X211860}$ have the structure | 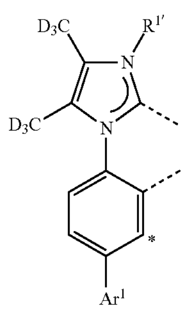 | wherein $Ar^1 = Am$ and $R^{1'} = Rn$, wherein *m* is an integer from 1 to 30 and *n* is an integer from 1 to 330, and | $y = 330(m - 1) + n + 201960$ |
| wherein $L_{X211861}$ to $L_{X212190}$ have the structure | 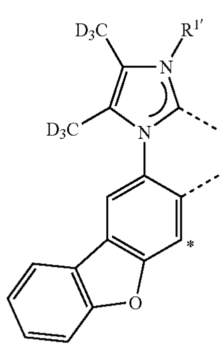 | wherein $R^{1'} = Rn$, wherein *n* is an integer from 1 to 330, and | $y = n + 211860$ |

$L_{X212216}$
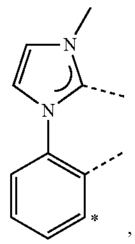
$L_{X212217}$
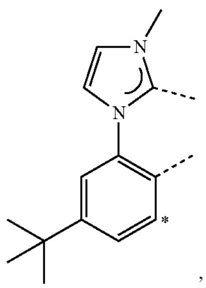
$L_{X212218}$
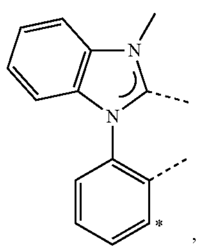
$L_{X212219}$
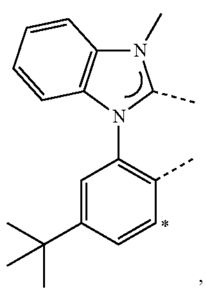
$L_{X212231}$
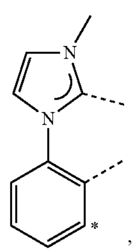
$L_{X212232}$
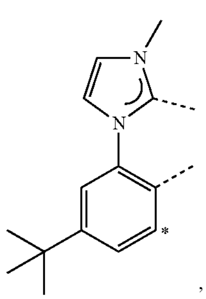
-continued
$L_{X212233}$
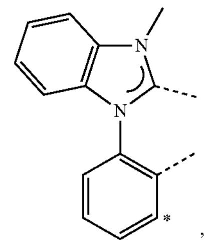
$L_{X212234}$
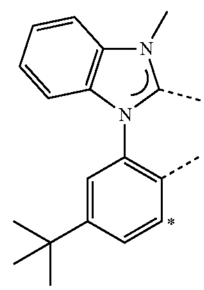
wherein A1 to A30 have the following structures:
A1
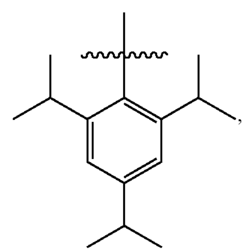
A2
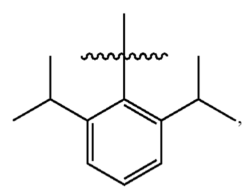
A3
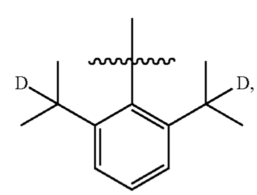
A4
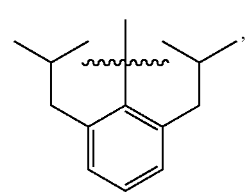

-continued
A5
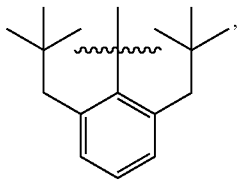
A6
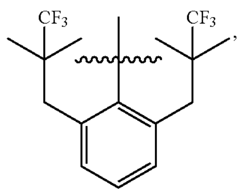
A7
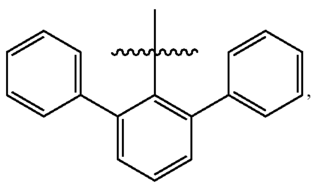
A8
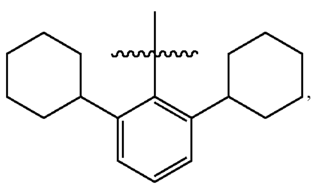
A9
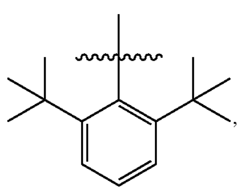
A10
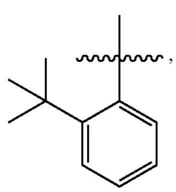
A11
Me,
A12
iPr,
A13
tBu,
A14
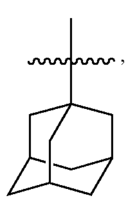
-continued
A15
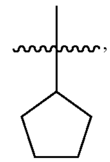
A16
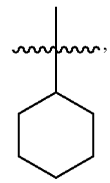
A17
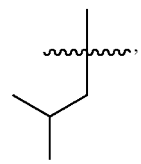
A18
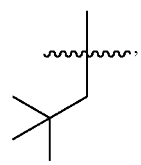
A19
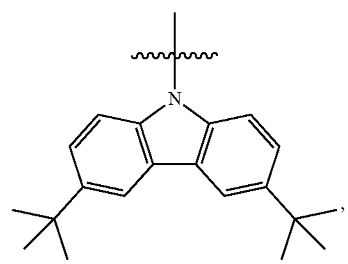
A20
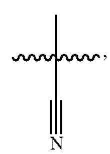
A21
$CD_3$,
A22
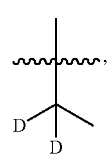
A23
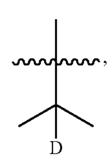

-continued
A24
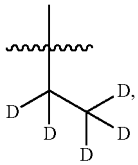
A25
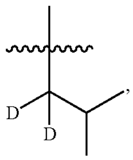
A26
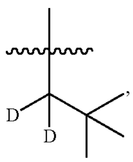
A27
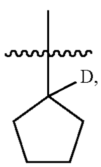
A28
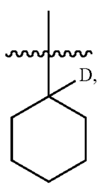
A29
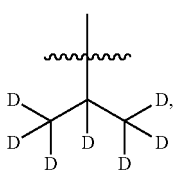
A30
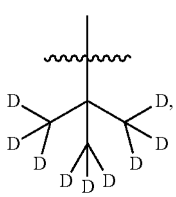
and R1 to R330 have the following structures:
Et, R1
iPr, R2
tBu, R3
-continued
R4
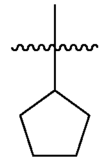
R5
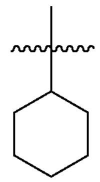
R6
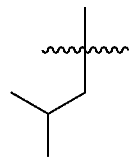
R7
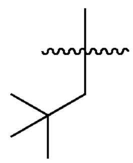
R8
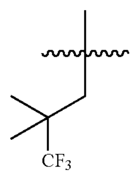
R9
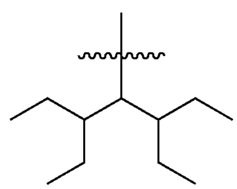
R10
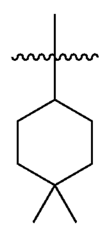
R11
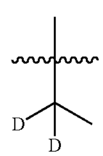
R12
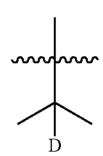

-continued
R13
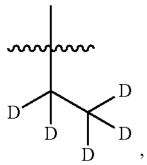
R14
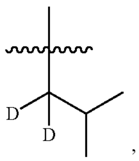
R15
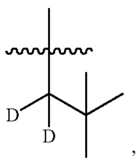
R16
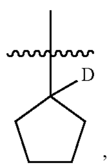
R17
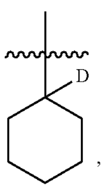
R18
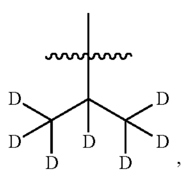
R19
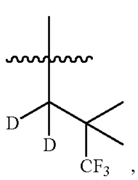
R20
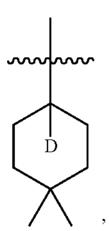
-continued
R21
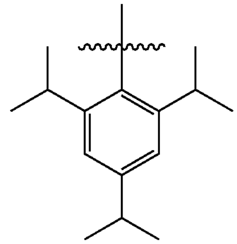
R22
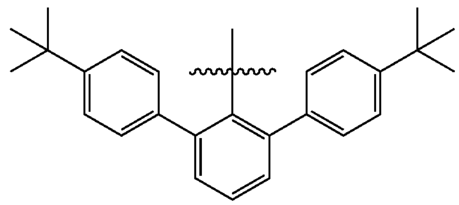
R23
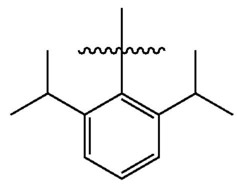
R24
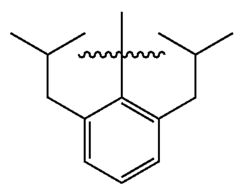
R25
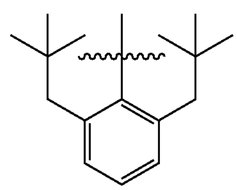
R26
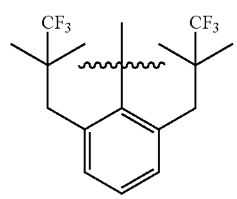
R27
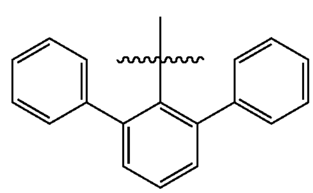
R28
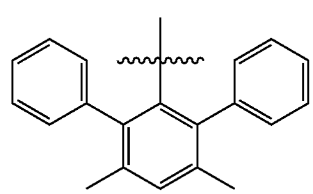

-continued
R29
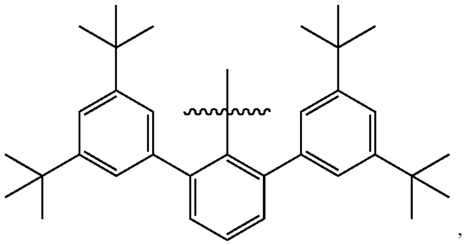
R30
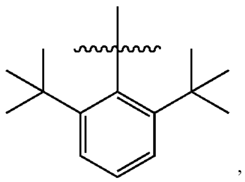
R31
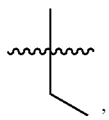
R32
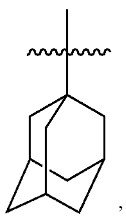
R33
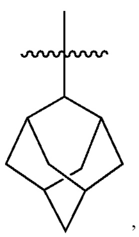
R34
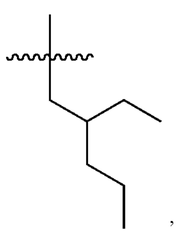
R35
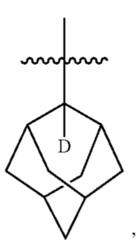
-continued
R36
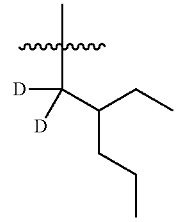
R37
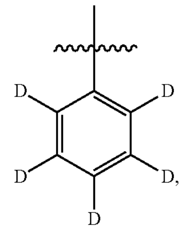
R38
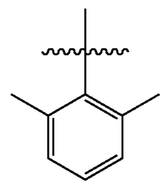
R39
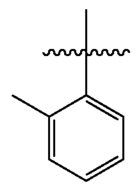
R40
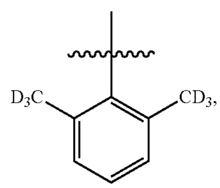
R41
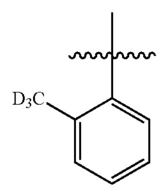
R42
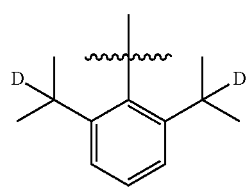
R43
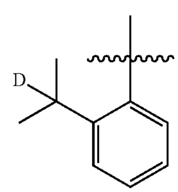

-continued
R44
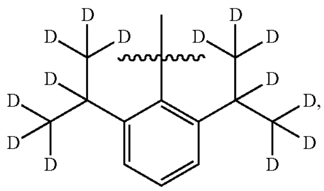
R45
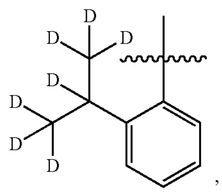
R46
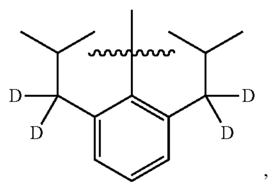
R47
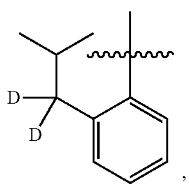
R48
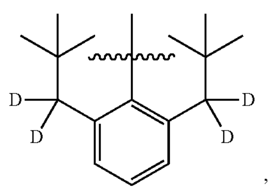
R49
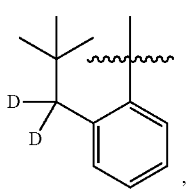
R50
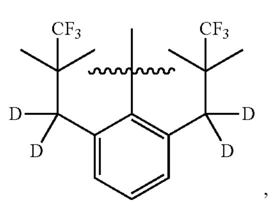
R51
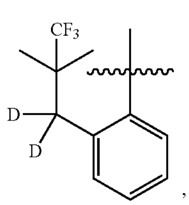
-continued
R52
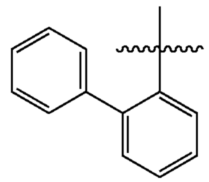
R53
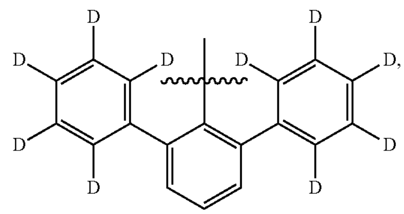
R54
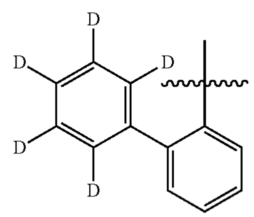
R55
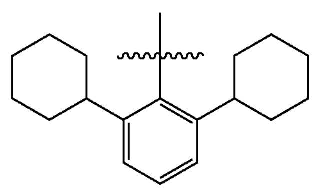
R56
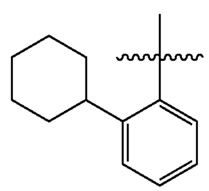
R57
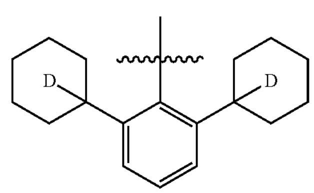
R58
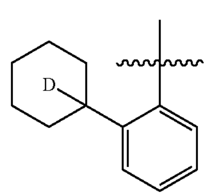
R59
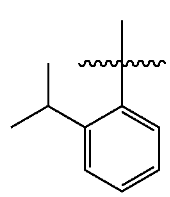

-continued
R60
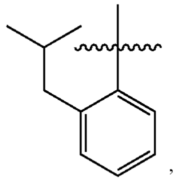
R61
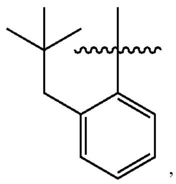
R62
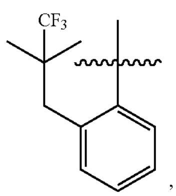
R63
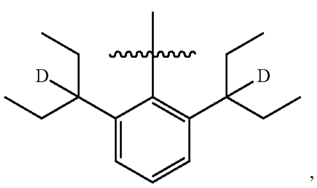
R64
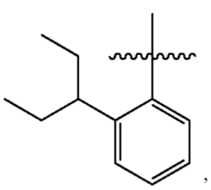
R65
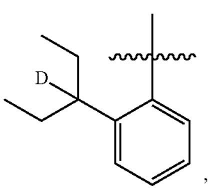
R66
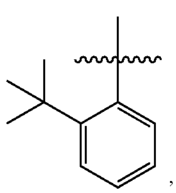
R67
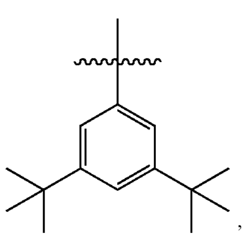
-continued
R68
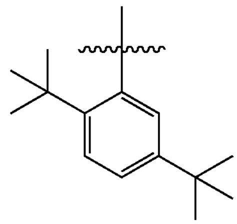
R69
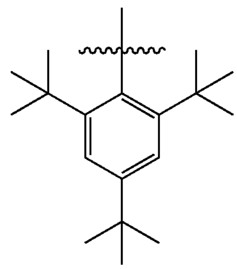
R70
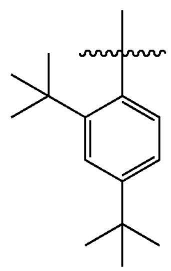
R71
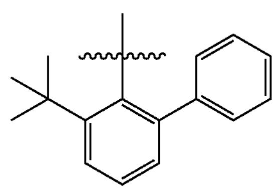
R72
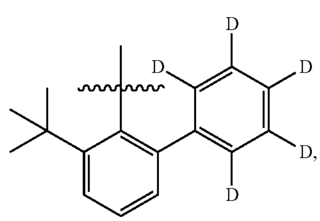
R73
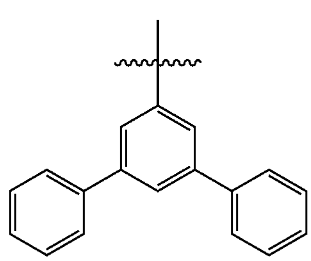

-continued
R74
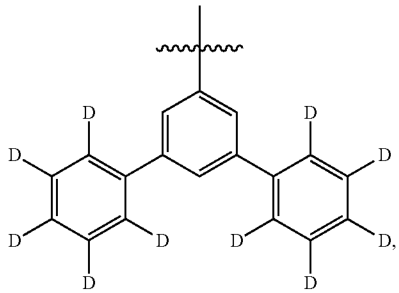
R75
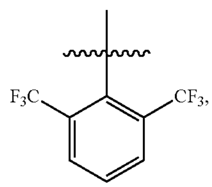
R76
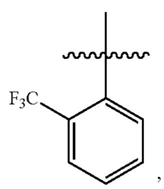
R77
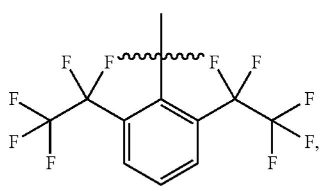
R78
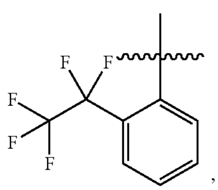
R79
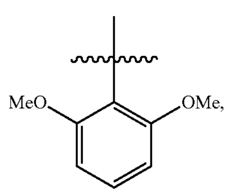
R80
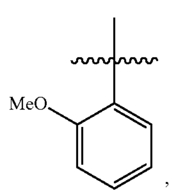
R81
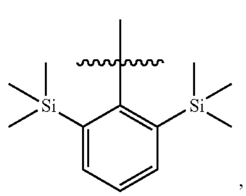
-continued
R82
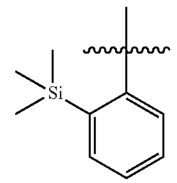
R83
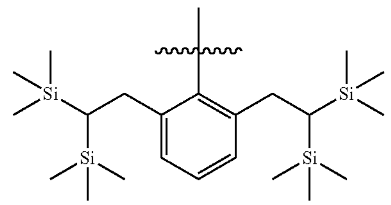
R84
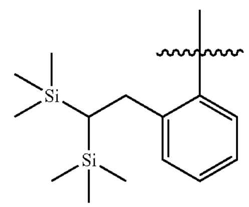
R85
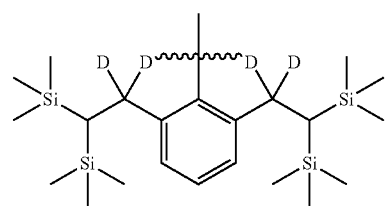
R86
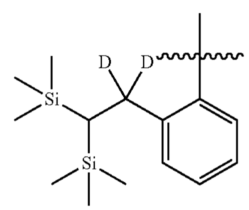
R87
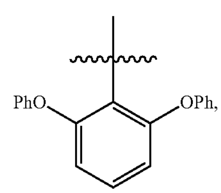
R88
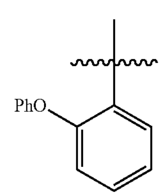
R89
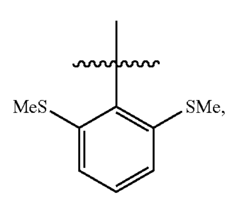

-continued
R90
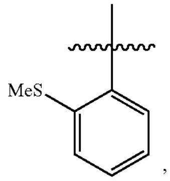
R91
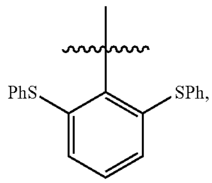
R92
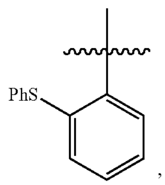
R93
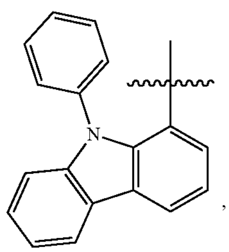
R94
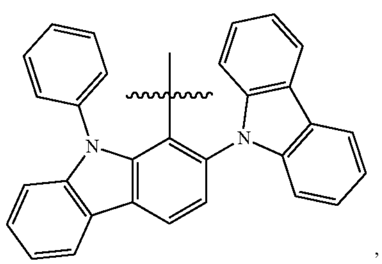
R95
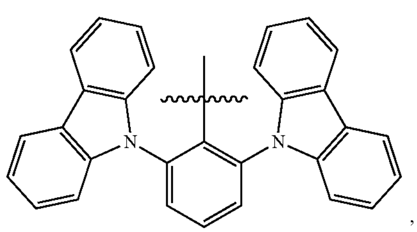
R96
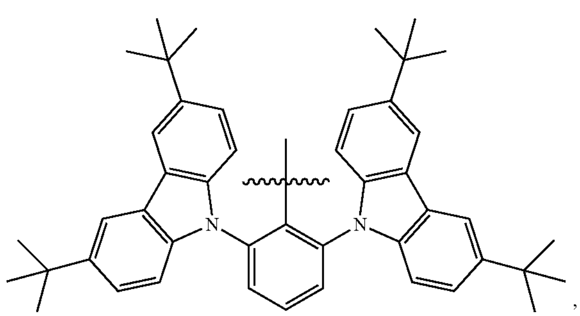
-continued
R97
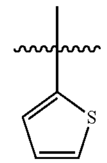
R98
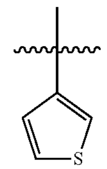
R99
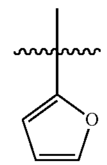
R100
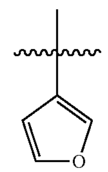
R101
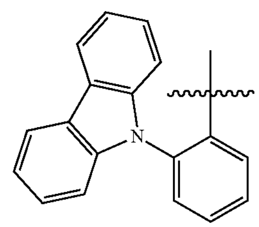
R102
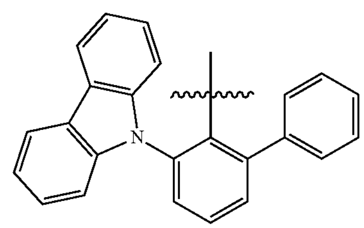
R103
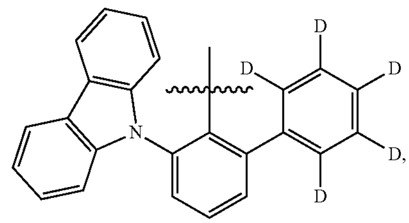
R104
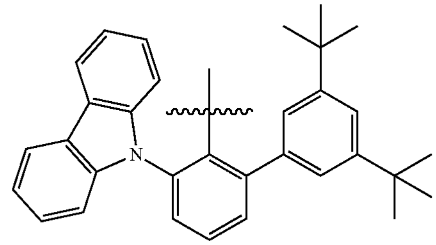

-continued
R105
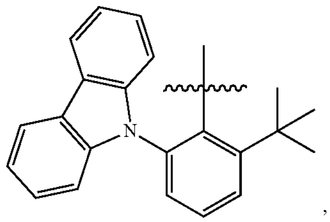
R106
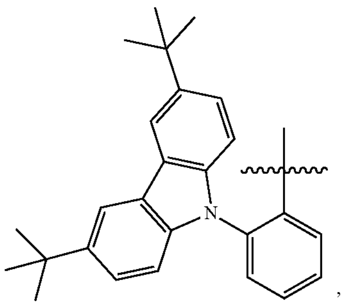
R107
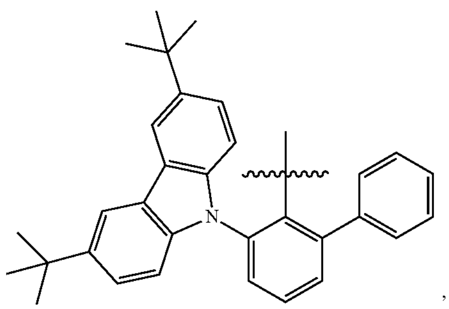
R108
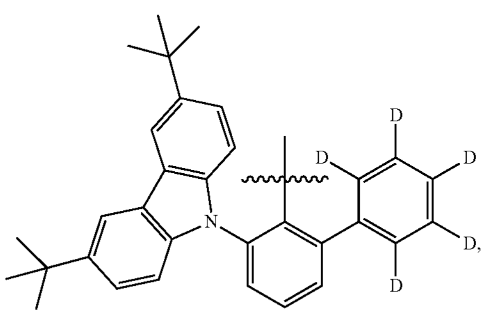
R109
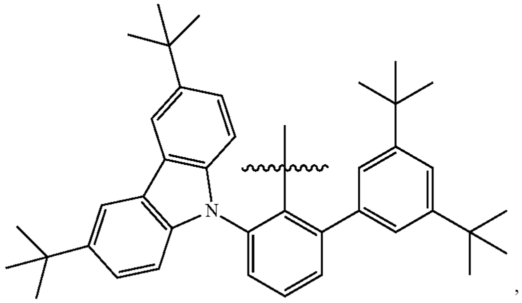
-continued
R110
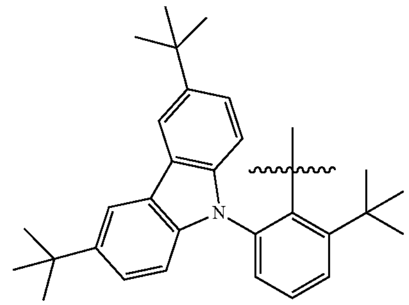
R111
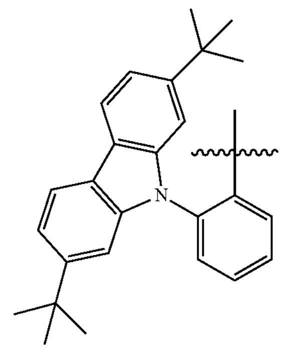
R112
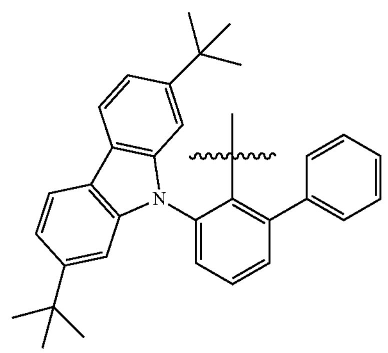
R113
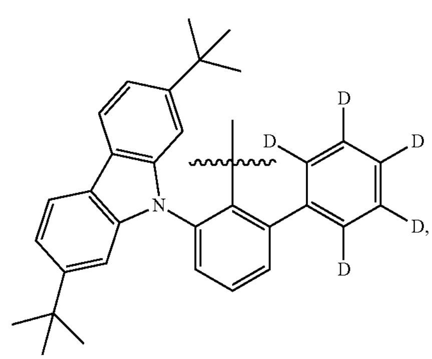

R114
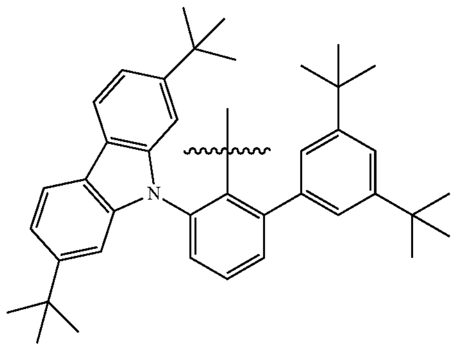
,
R115
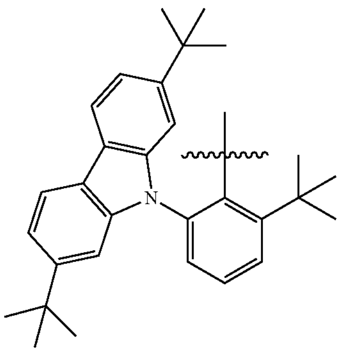
,
R116
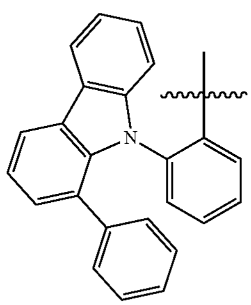
,
R117
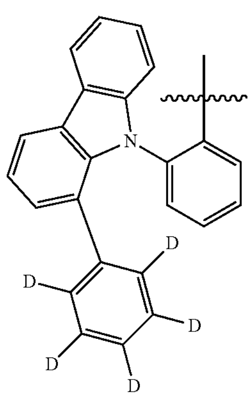
,
R118
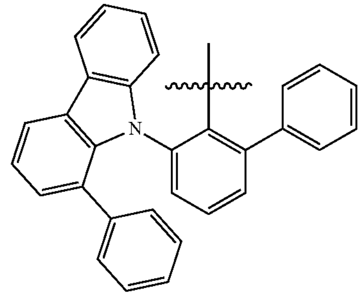
,
R119
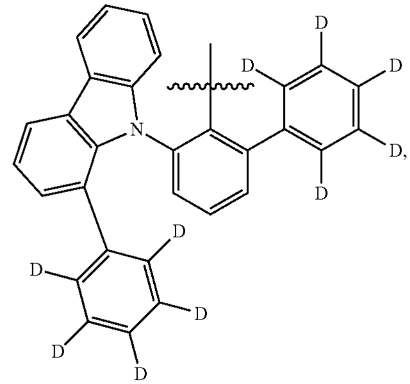
R120
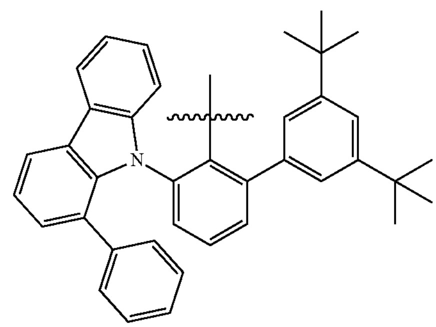
,
R121
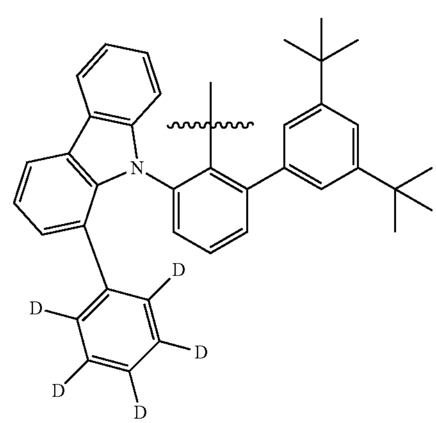
,

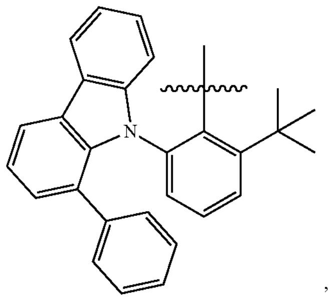
R122
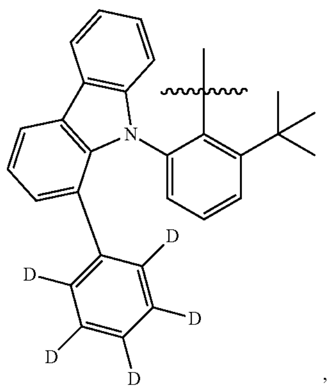
R123
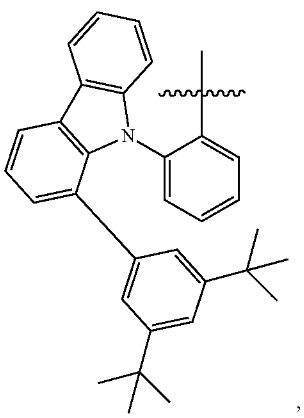
R124
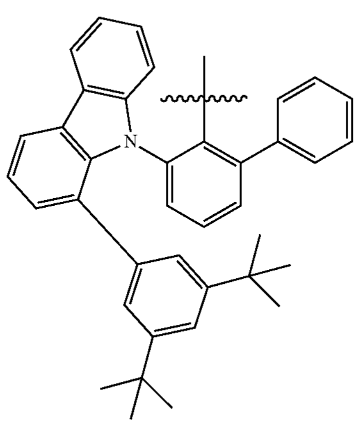
R125
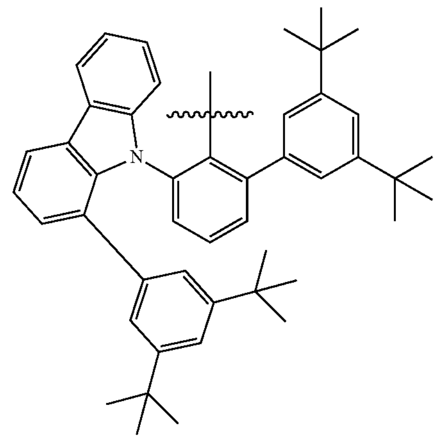
R126
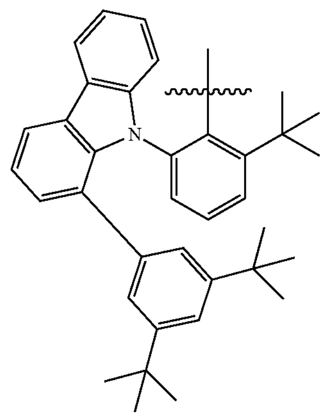
R127
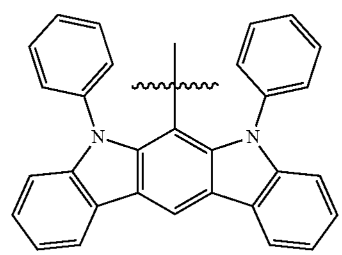
R128
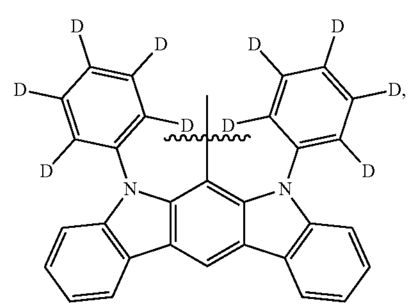
R129

-continued
R130
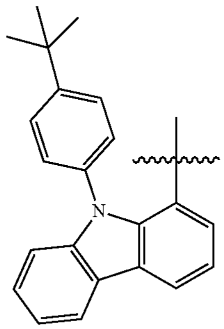
,
R131
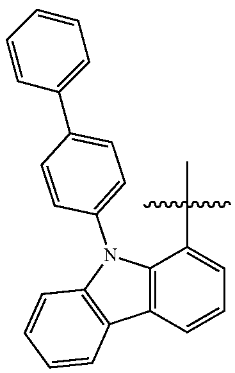
,
R132
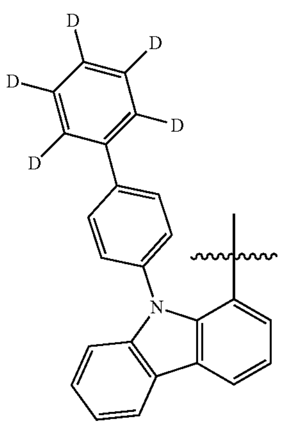
,
R133
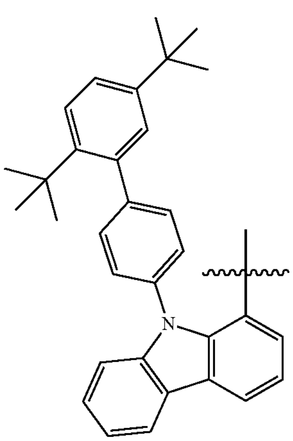
,
-continued
R134
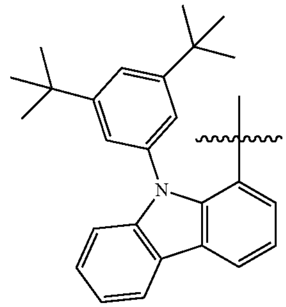
,
R135
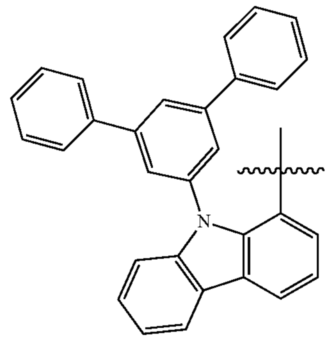
,
R136
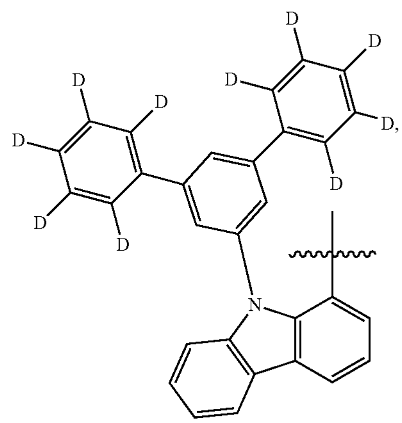
R137
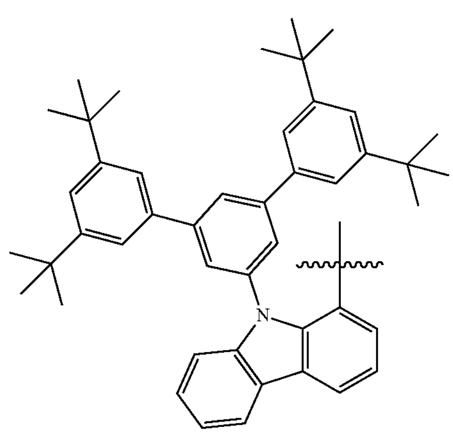
, R138
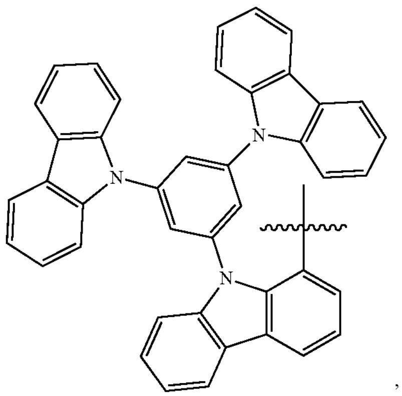
R139
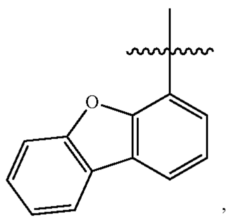
R140
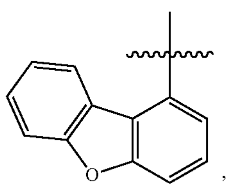
R141
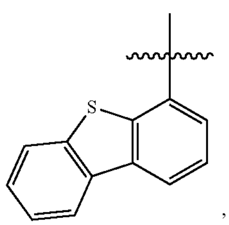
R142
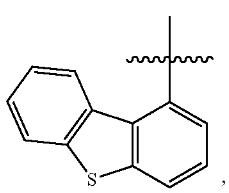
R143
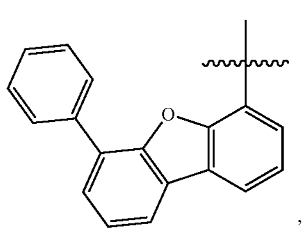
R144
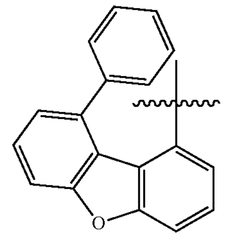
R145
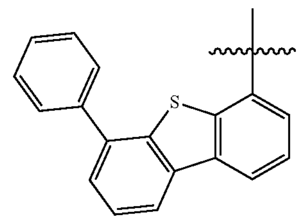
R146
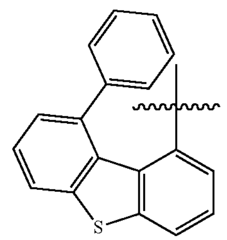
R147
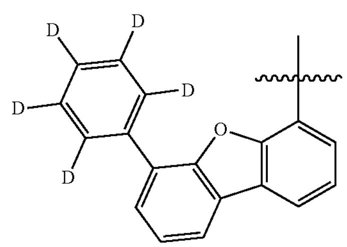
R148
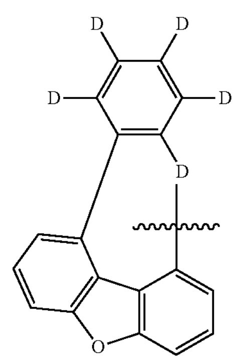
R149
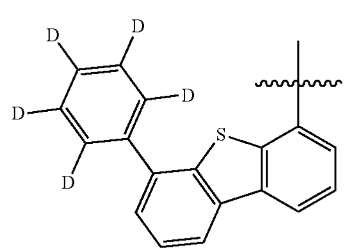

-continued
R150
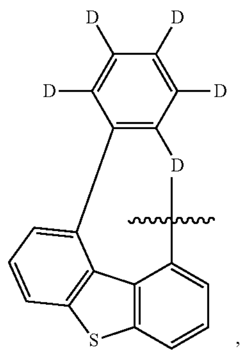
R151
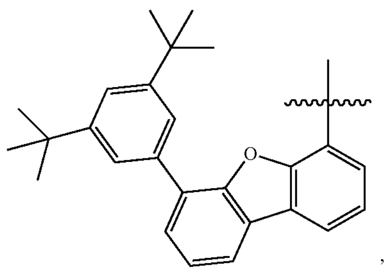
R152
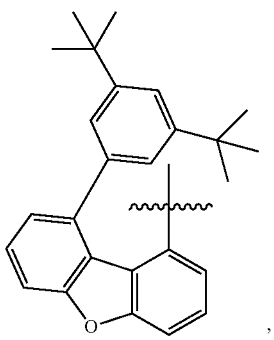
R153
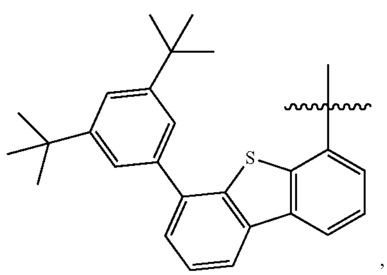
R154
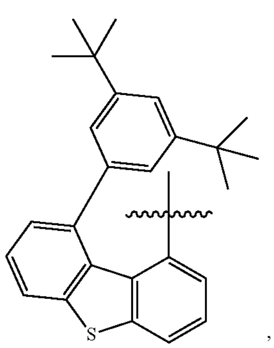
-continued
R155
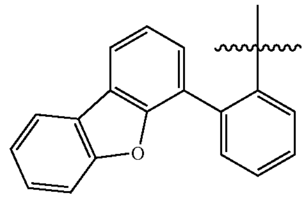
R156
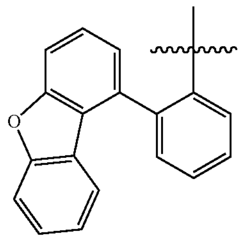
R157
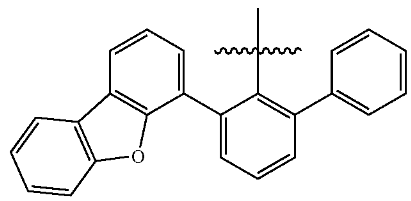
R158
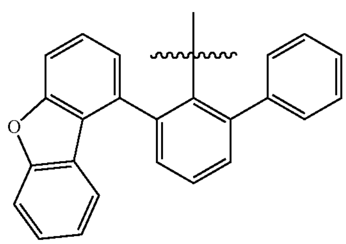
R159
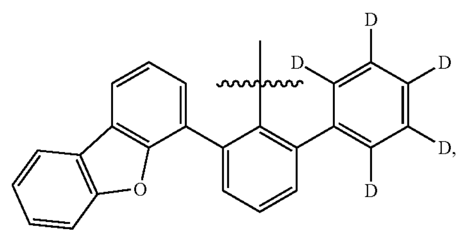
R160
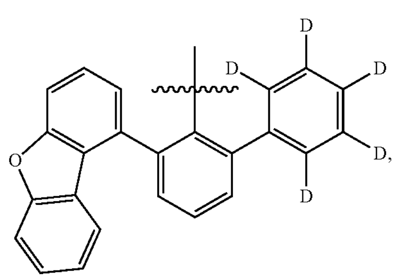

-continued
R161
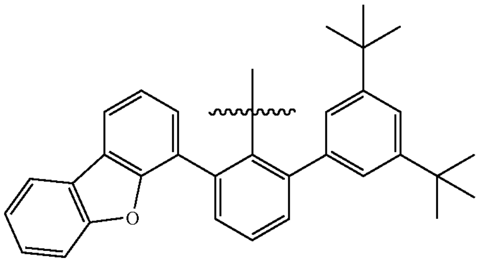
R162
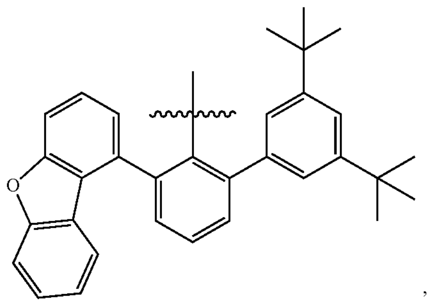
R163
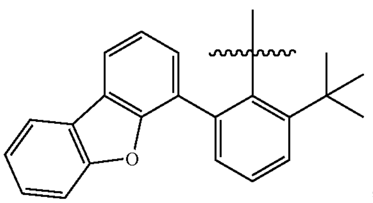
R164
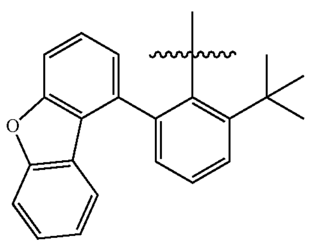
R165
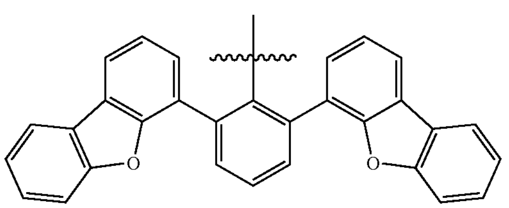
R166
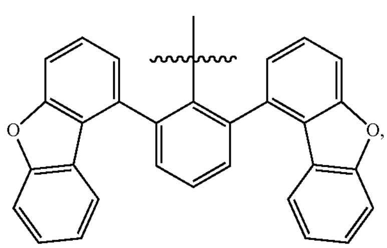
-continued
R167
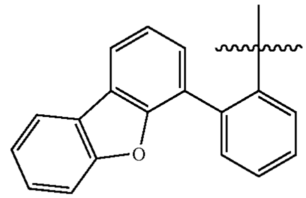
R168
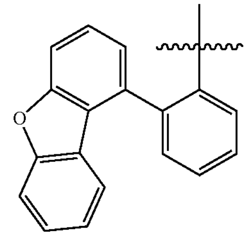
R169
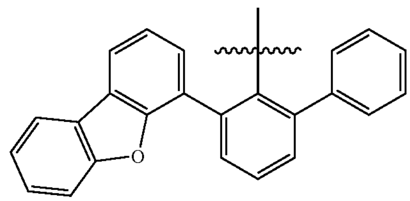
R170
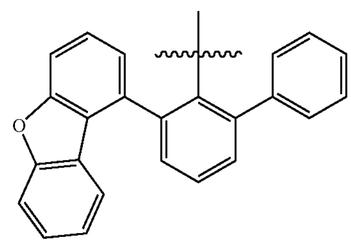
R171
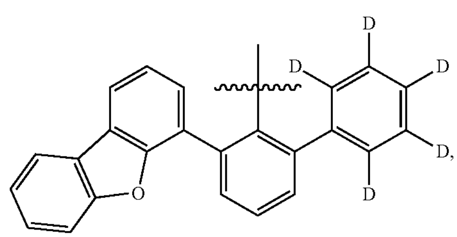
R172
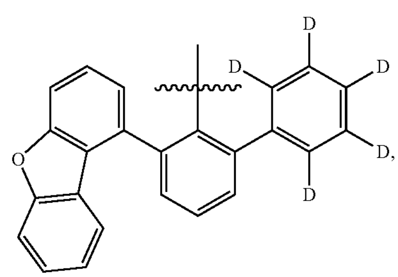

-continued
R173
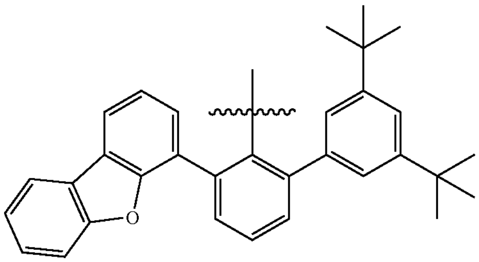
,
R174
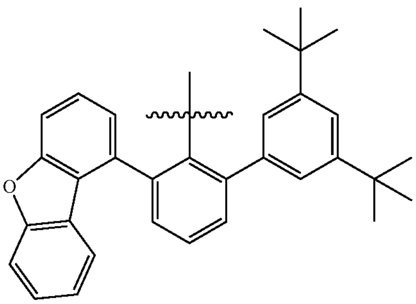
,
R175
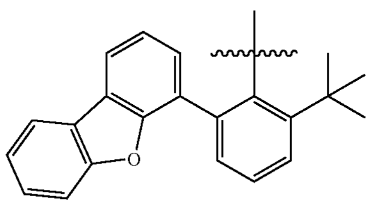
,
R176
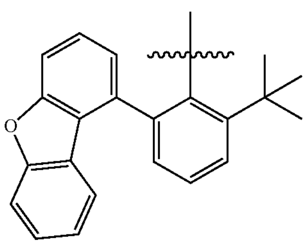
,
R177
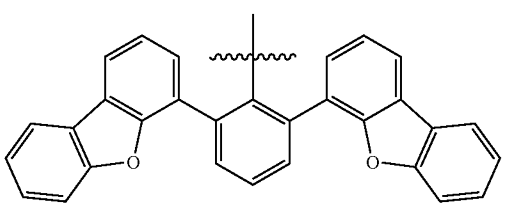
,
R178
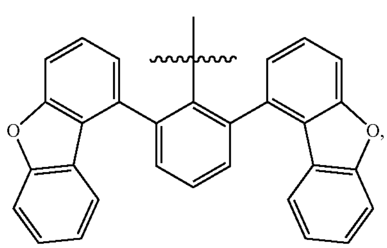
-continued
R179
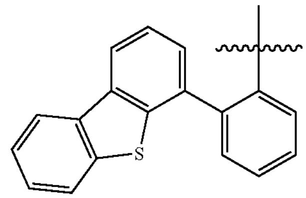
,
R180
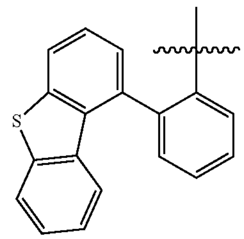
,
R181
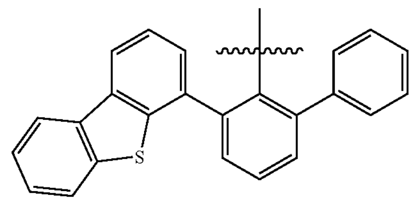
,
R182
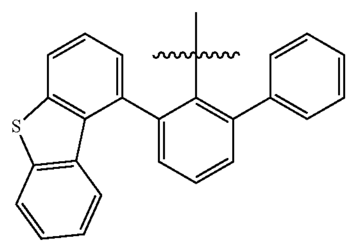
,
R183
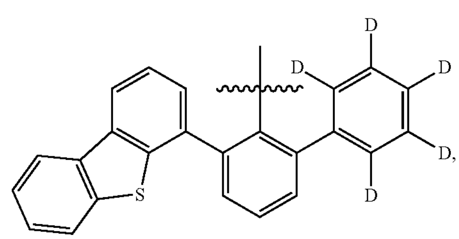
R184
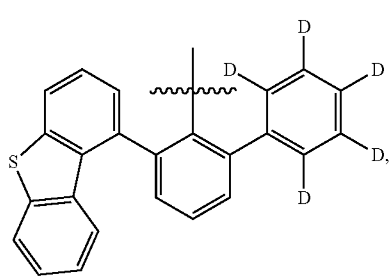

-continued
R185
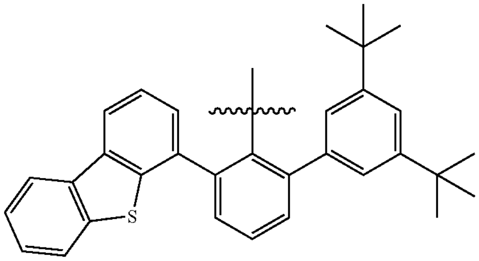
,
R186
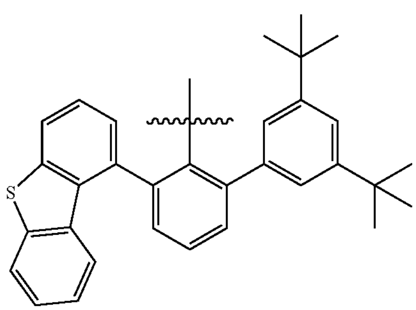
,
R187
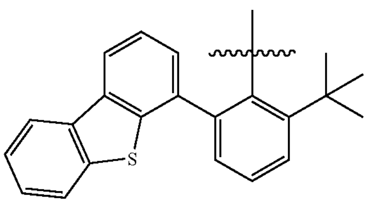
,
R188
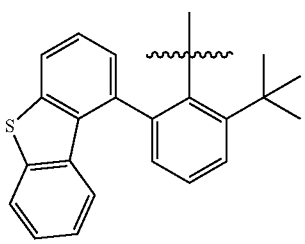
,
R189
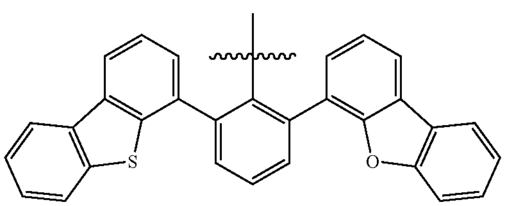
,
R190
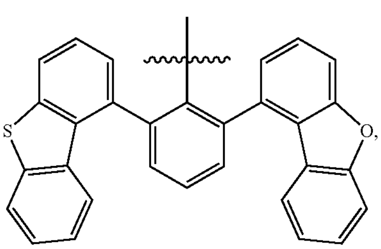
-continued
R191
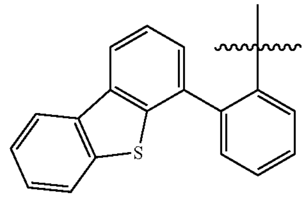
,
R192
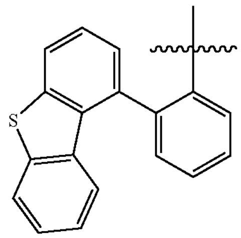
,
R193
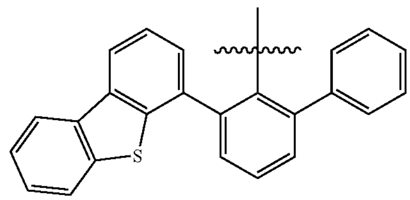
,
R194
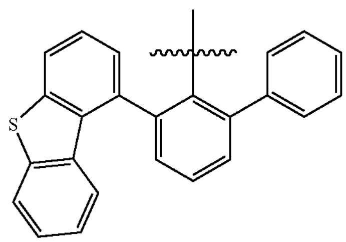
,
R195
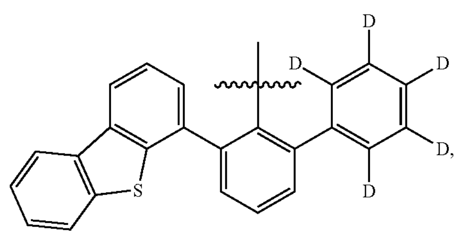
R196
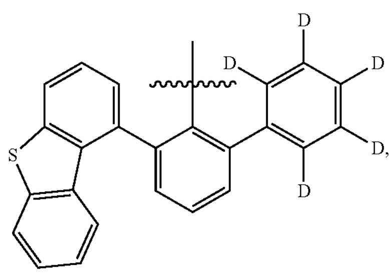

-continued
R197
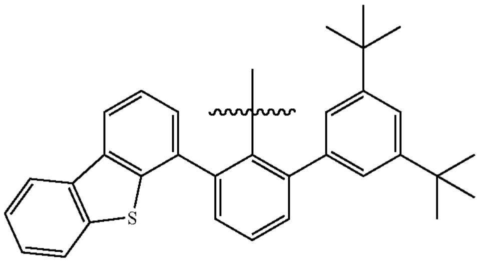
,
R198
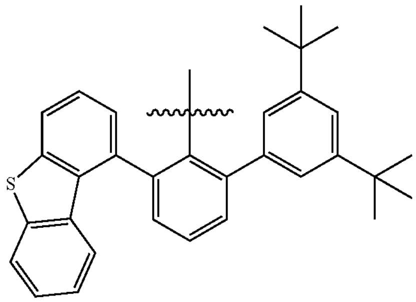
,
R199
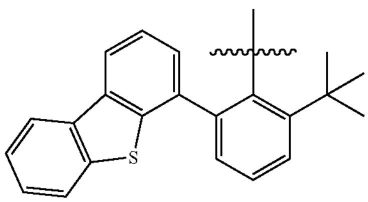
,
R200
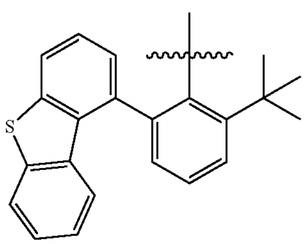
,
R201
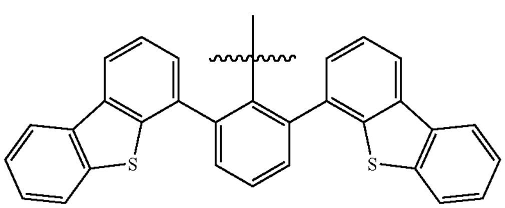
,
R202
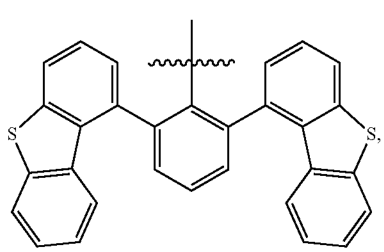
-continued
R203
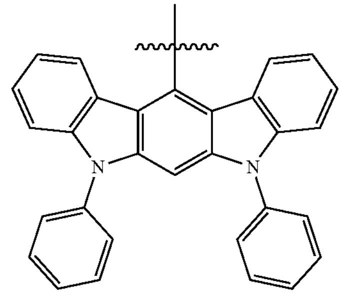
,
R204
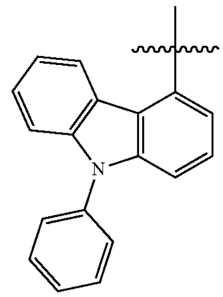
,
R205
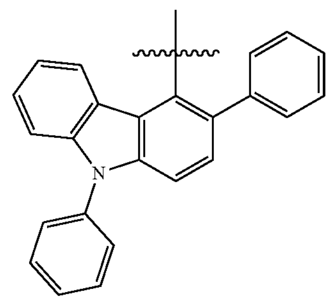
,
R206
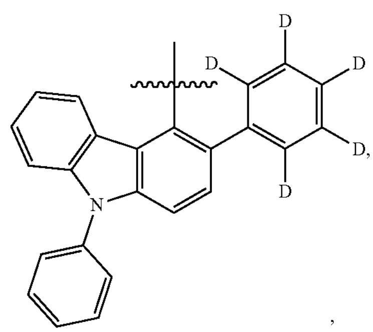
,
R207
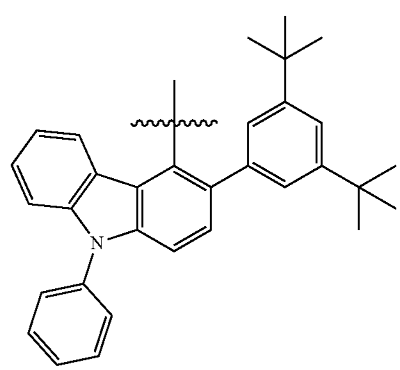
, -continued
R208
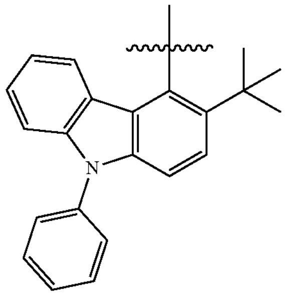
,
R209
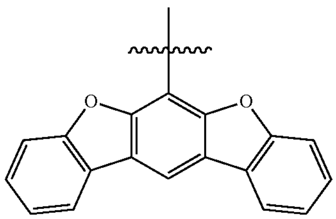
,
R210
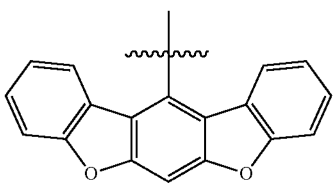
,
R211
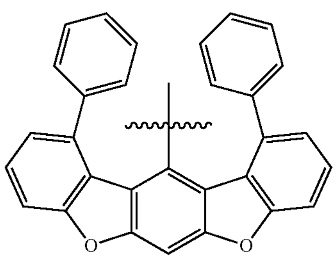
,
R212
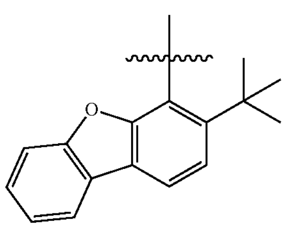
,
R213
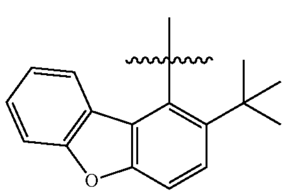
,
R214
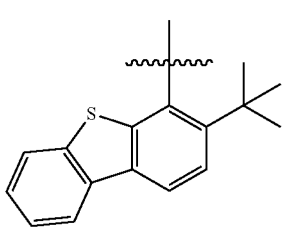
,
-continued
R215
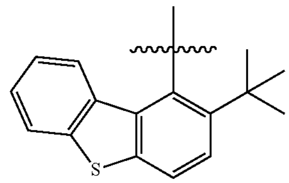
,
R216
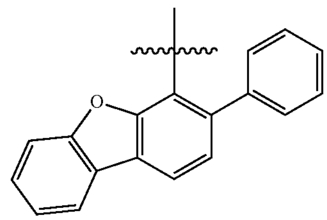
,
R217
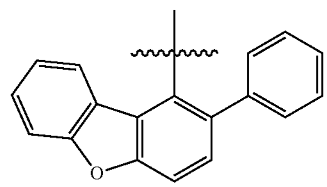
,
R218
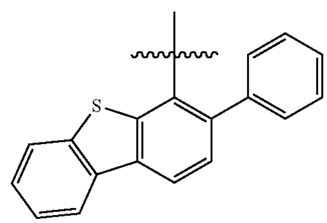
,
R219
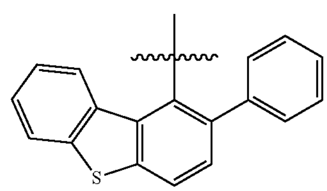
,
R220
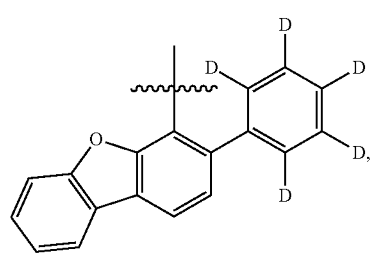
R221
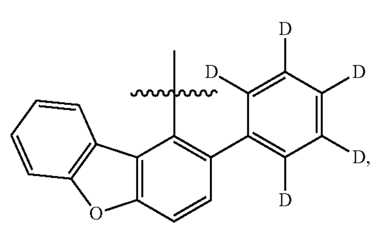

-continued
R222
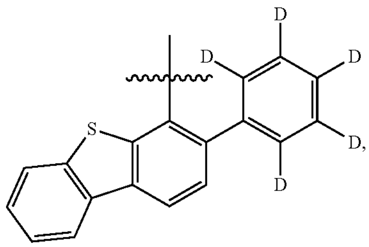
R223
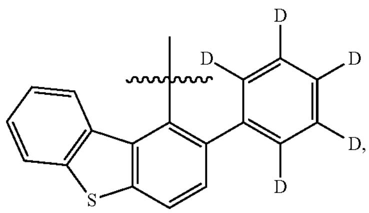
R224
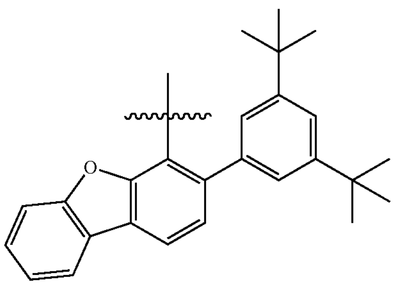
,
R225
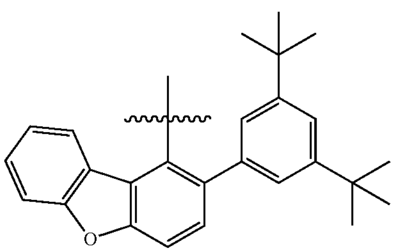
,
R226
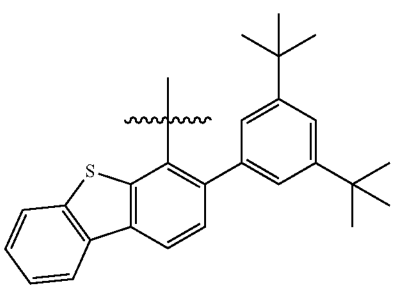
,
R227
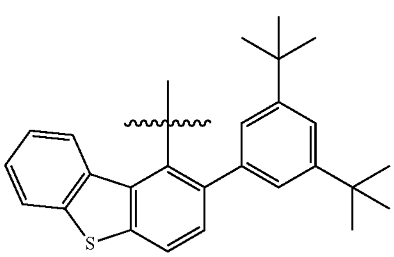
,
-continued
R228
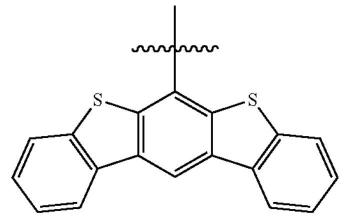
,
R229
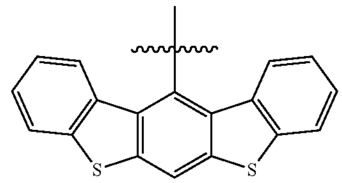
,
R230
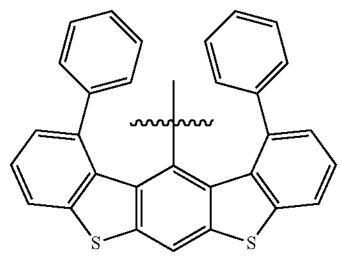
,
R231
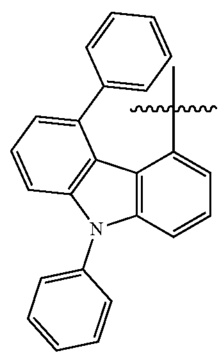
,
R232
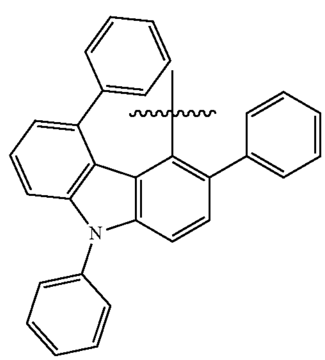
, -continued
R233
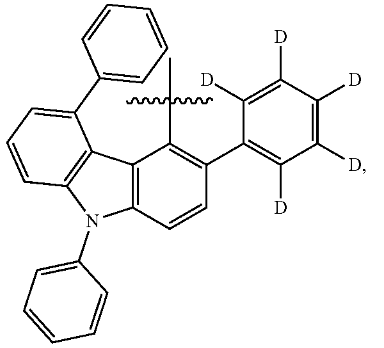
R234
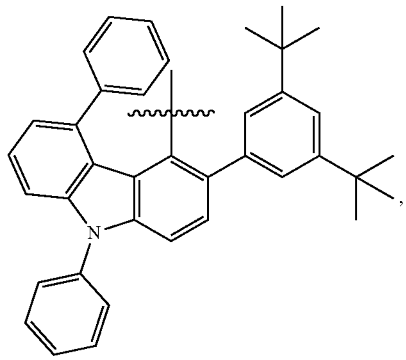
R235
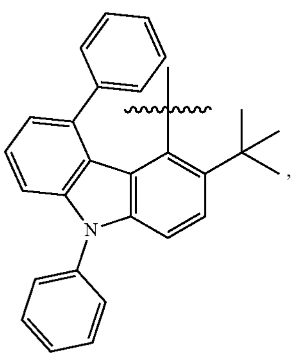
R236
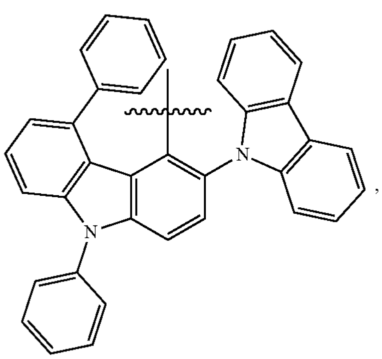
-continued
R237
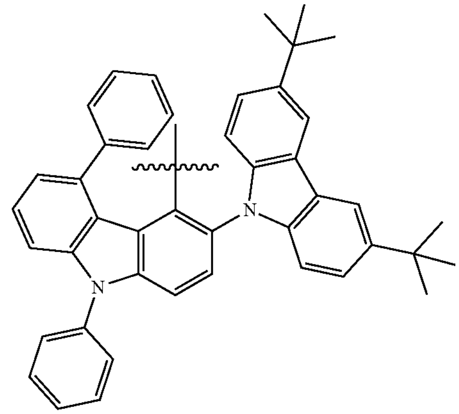
R238
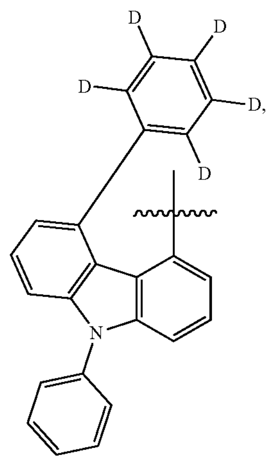
R239
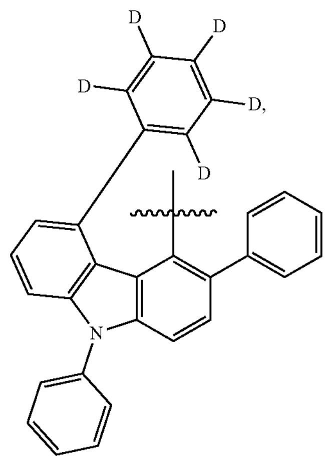

-continued
R240
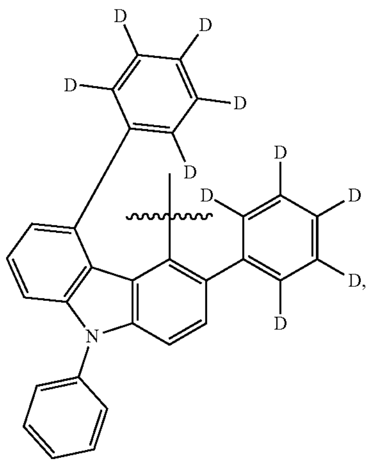
R241
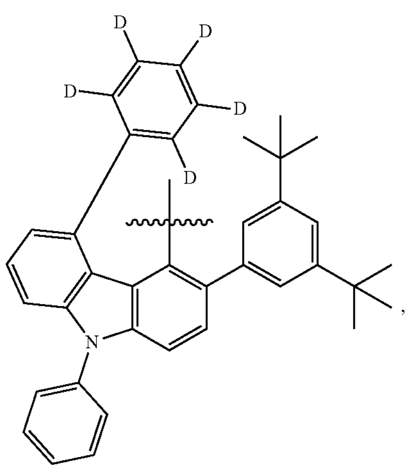
R242
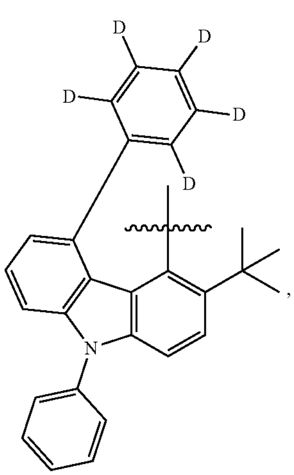
-continued
R243
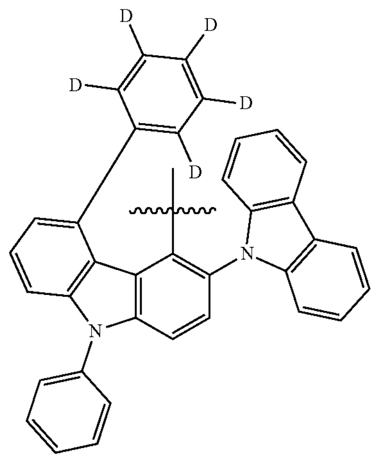
R244
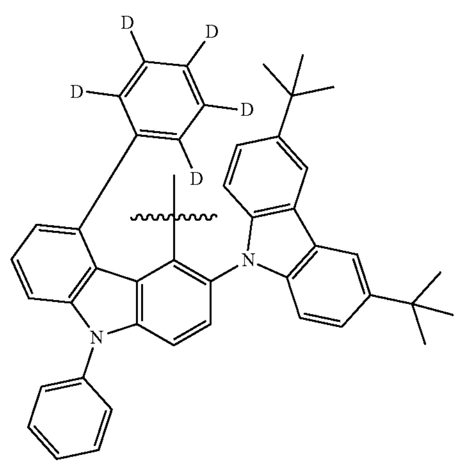
R245
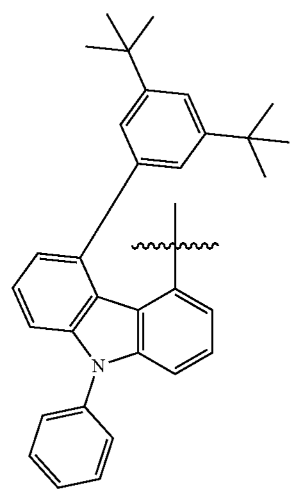

-continued
R246
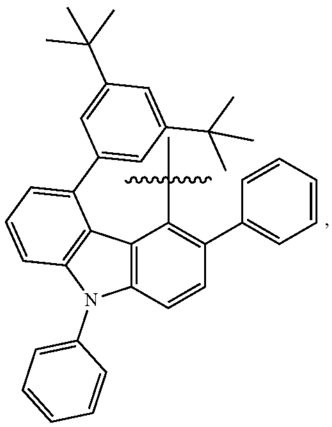
R247
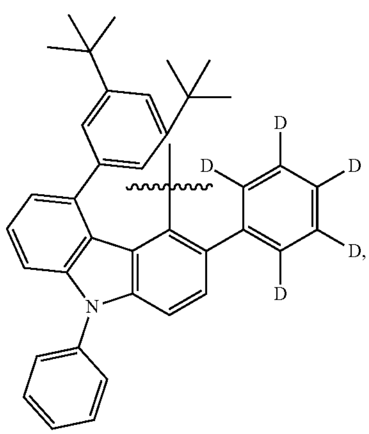
R248
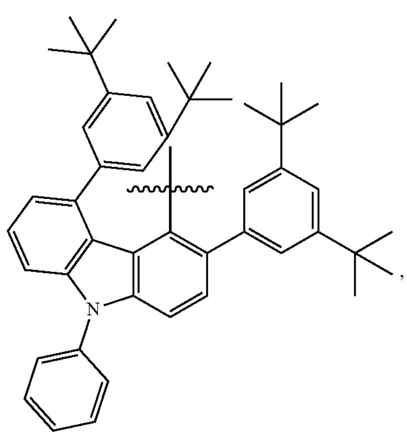
-continued
R249
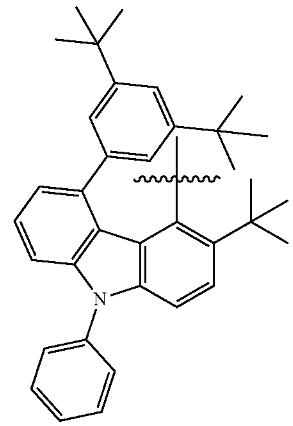
R250
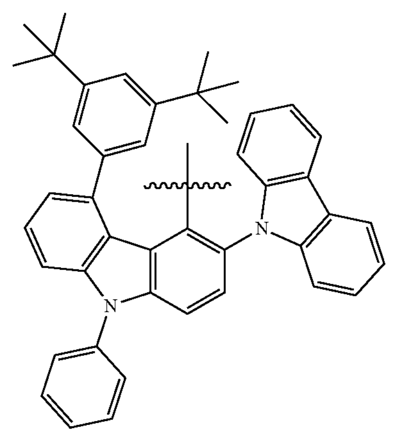
R251
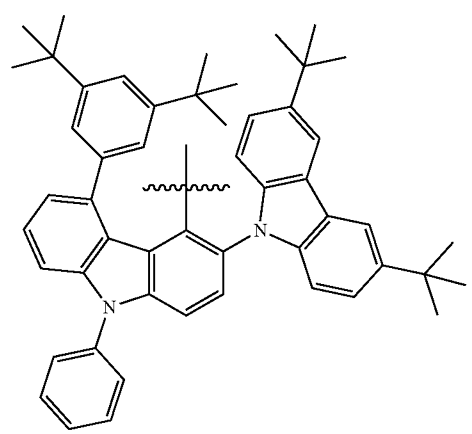

-continued
R252
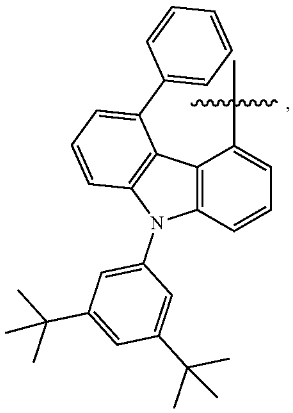
R253
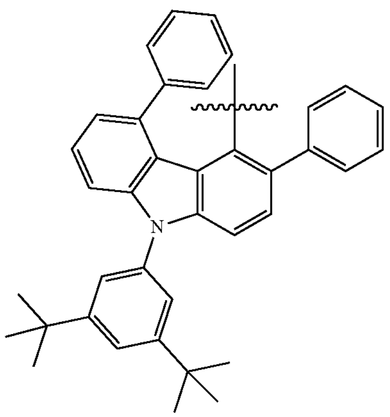
R254
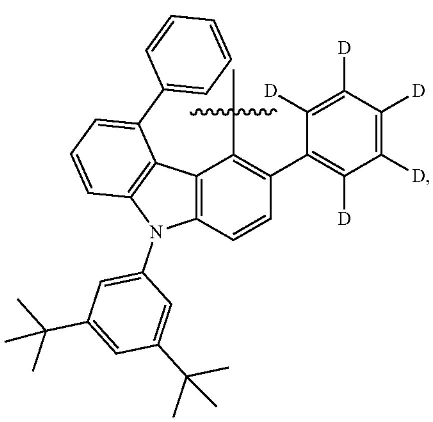
-continued
R255
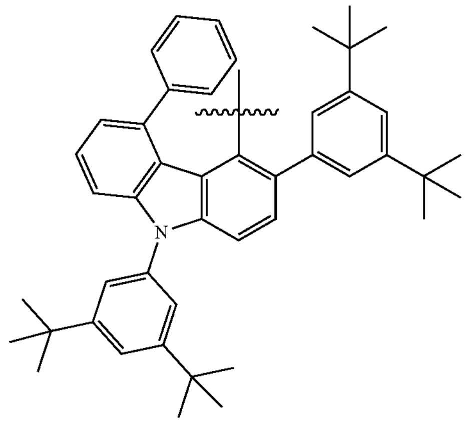
R256
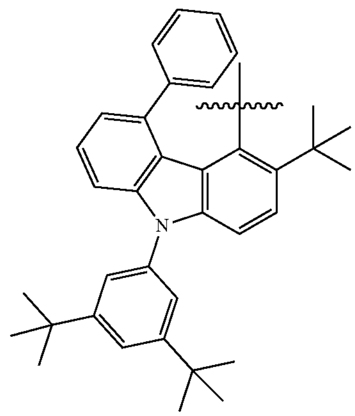
R257
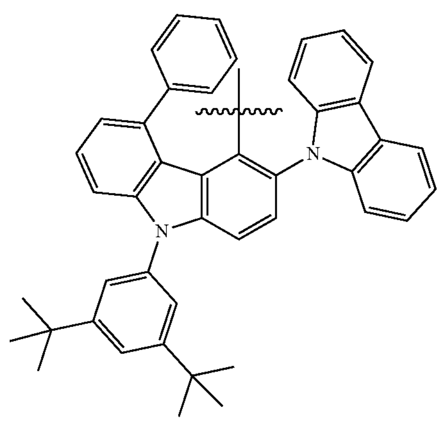

R258
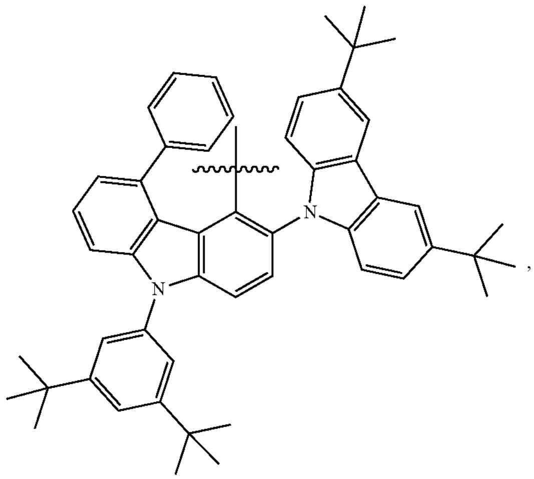
R259
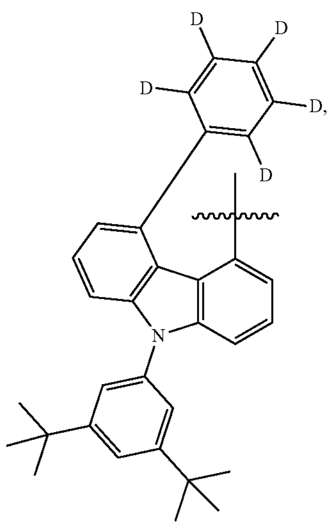
R260
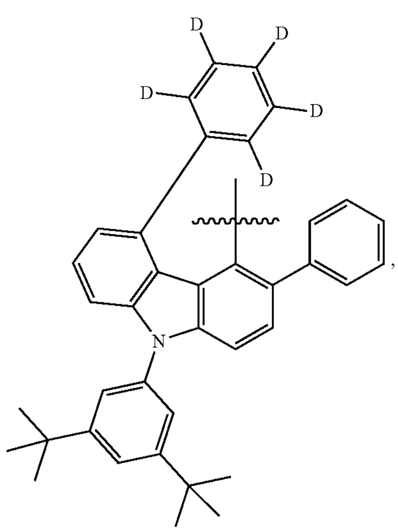
R261
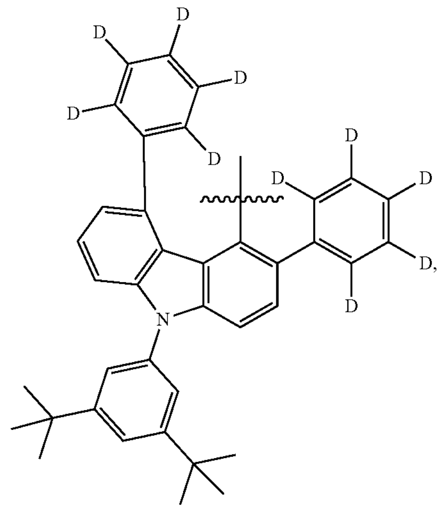
R262
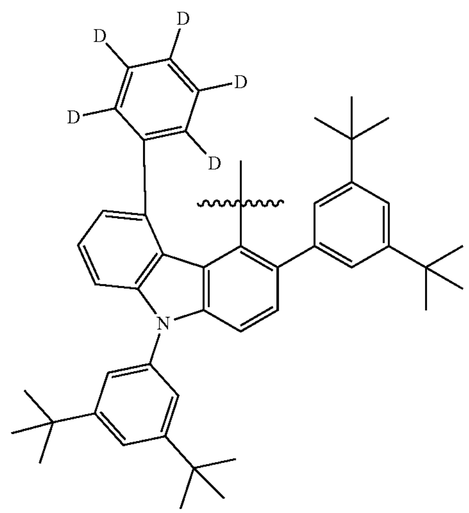
R263
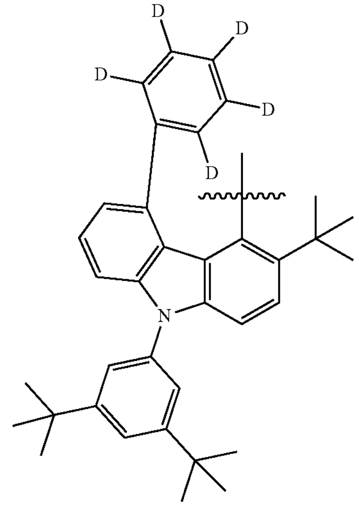

R264
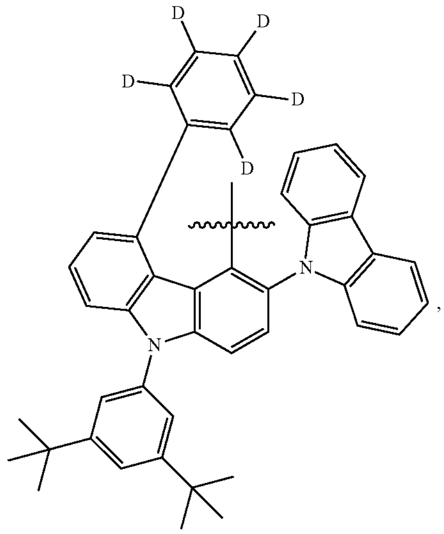
R265
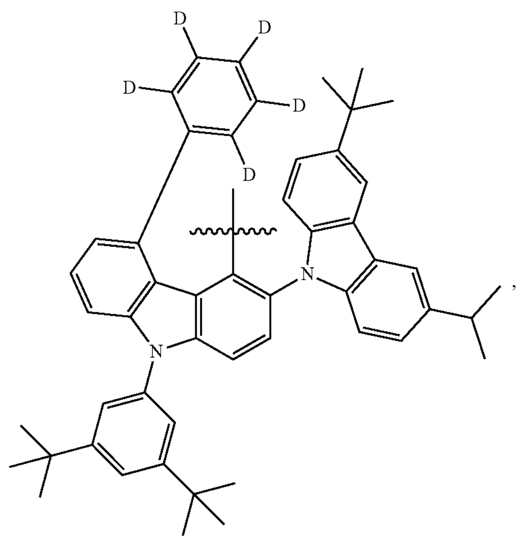
R266
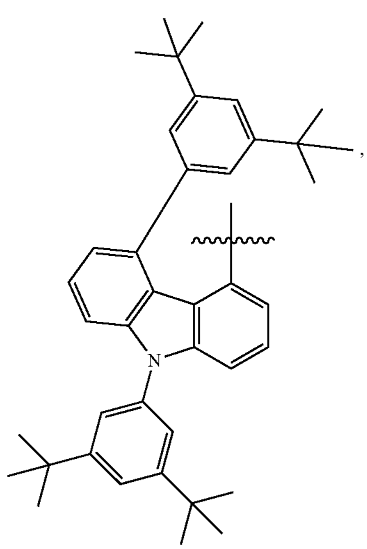
R267
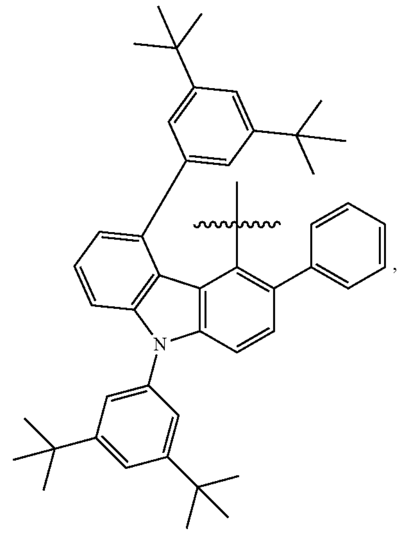
R268
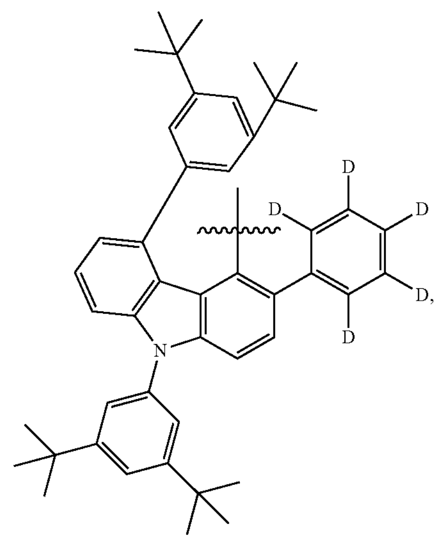
R269
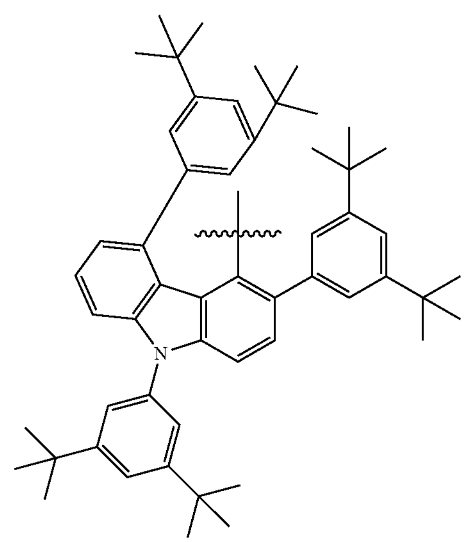

-continued
R270
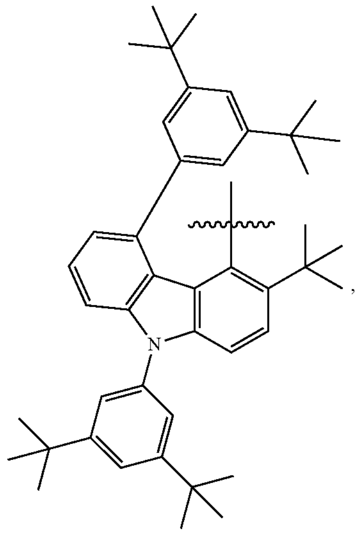
R271
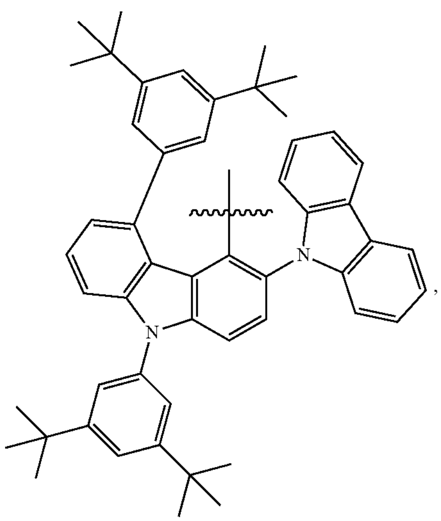
R272
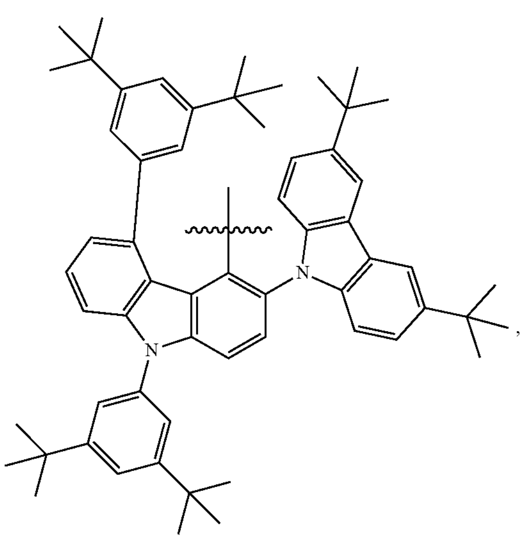
-continued
R273
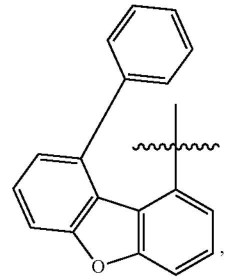
R274
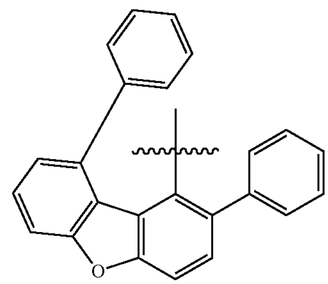
R275
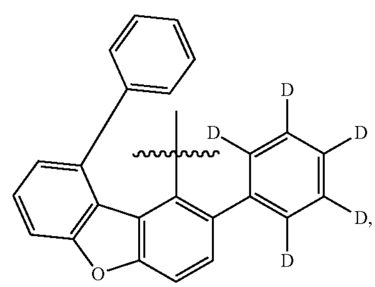
R276
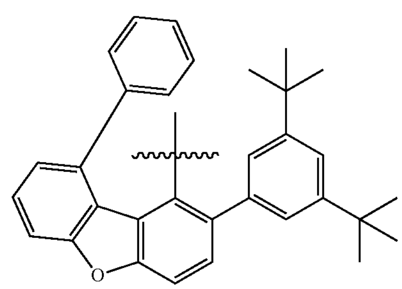
R277
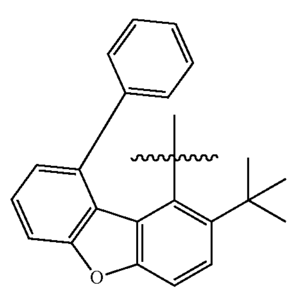

-continued
R278
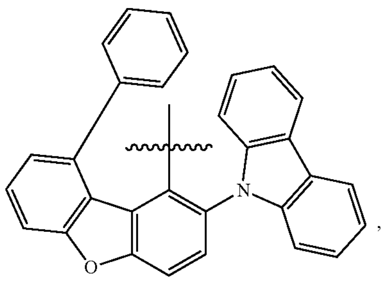
R279
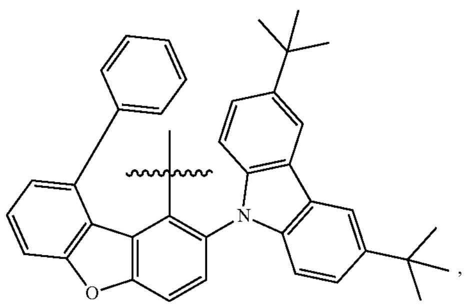
R280
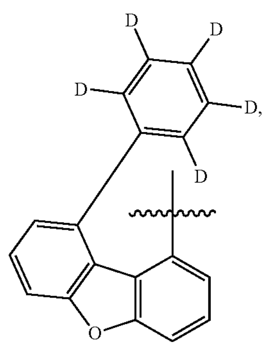
R281
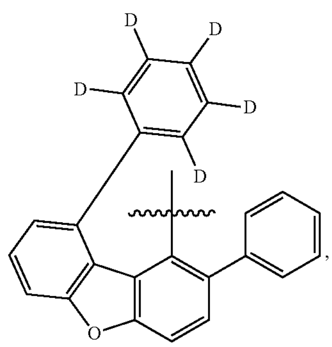
R282
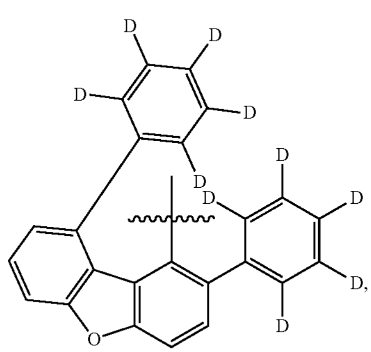
-continued
R283
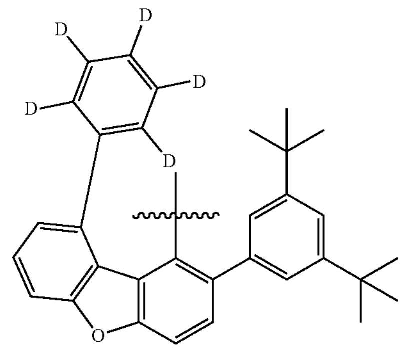
R284
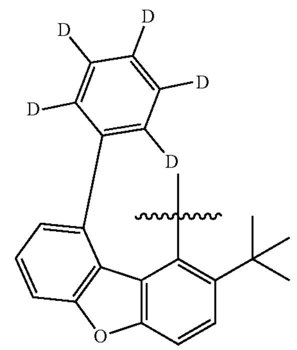
R285
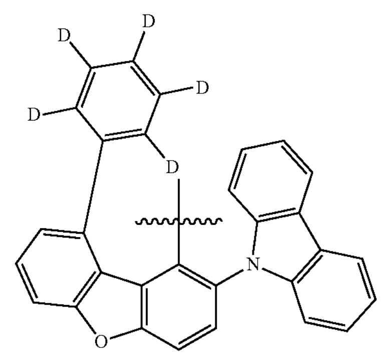
R286
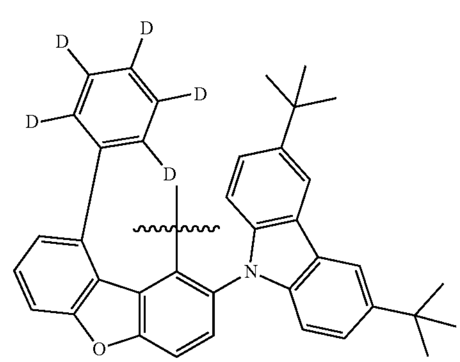

-continued
R287
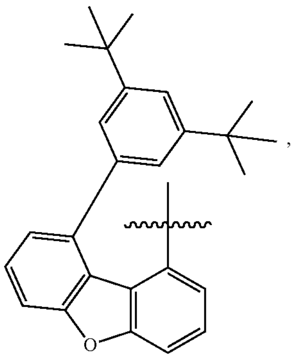
R288
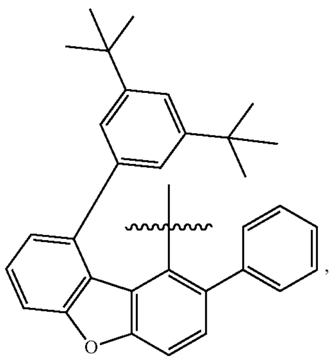
R289
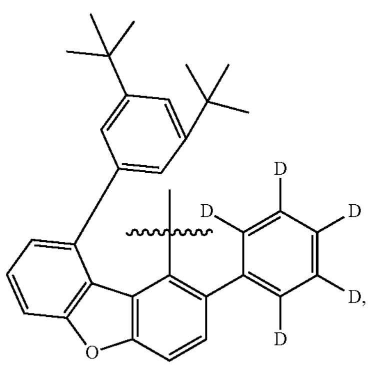
R290
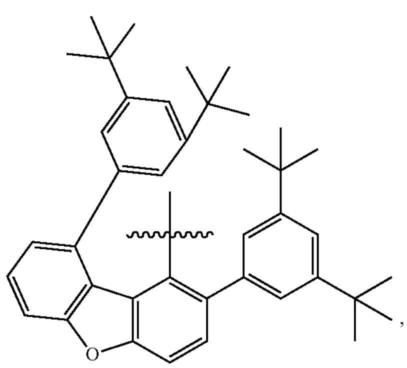
-continued
R291
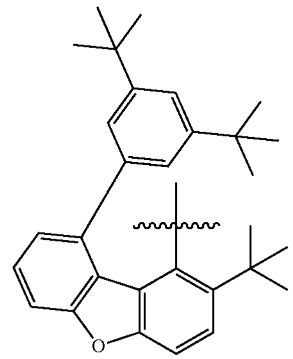
R292
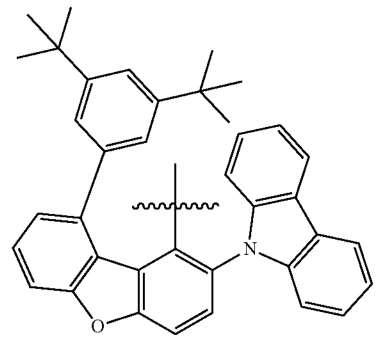
R293
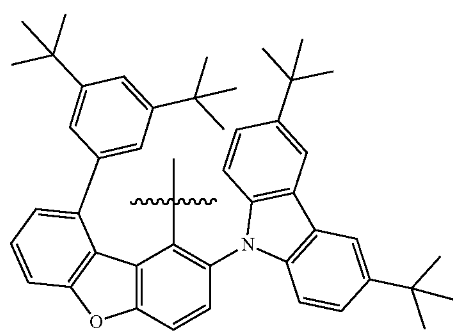
R294
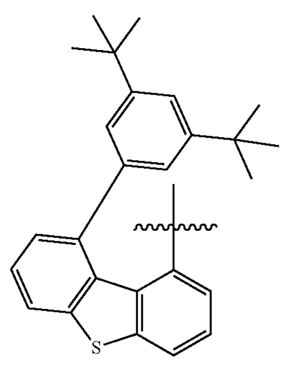

R295
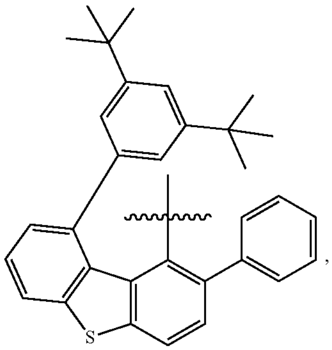
R296
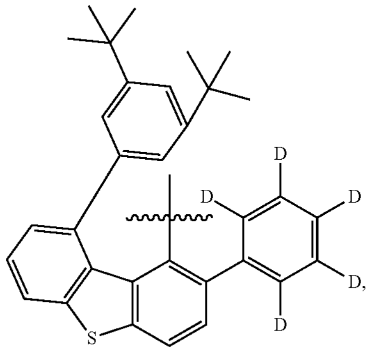
R297
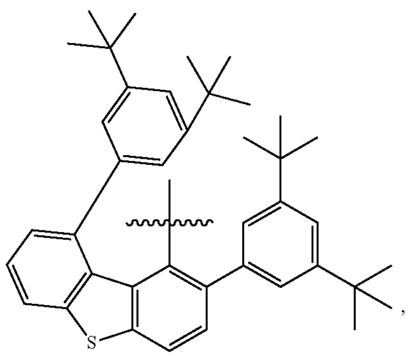
R298
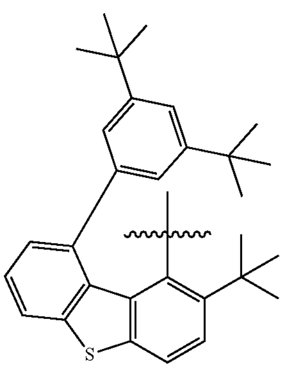
R299
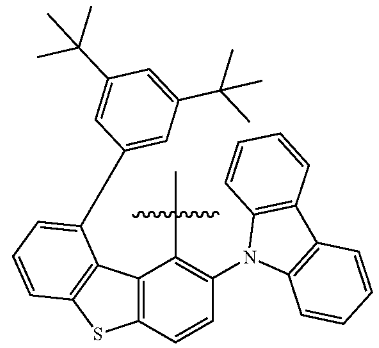
R300
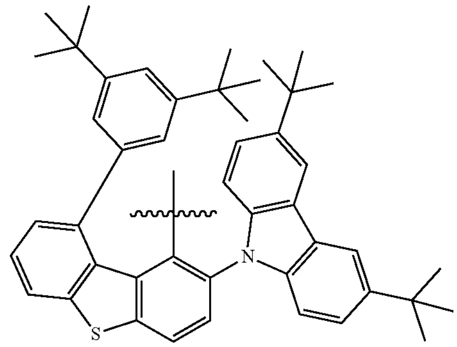
R301
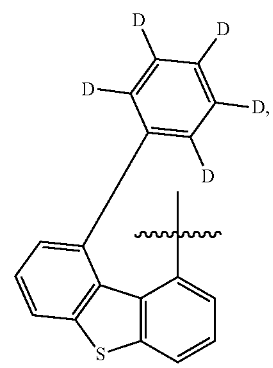
R302
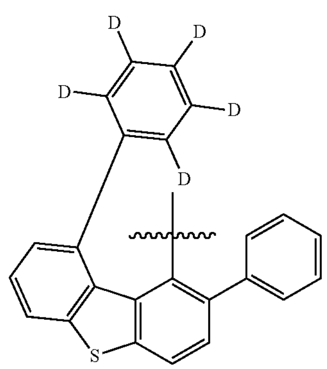

R303
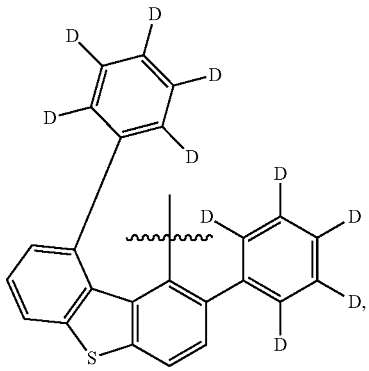
R304
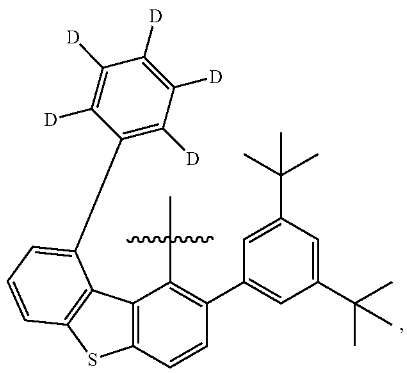
R305
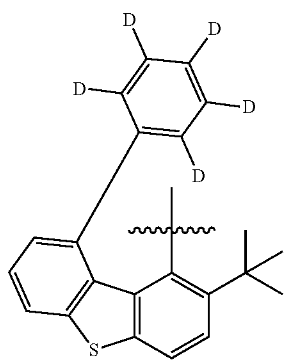
R306
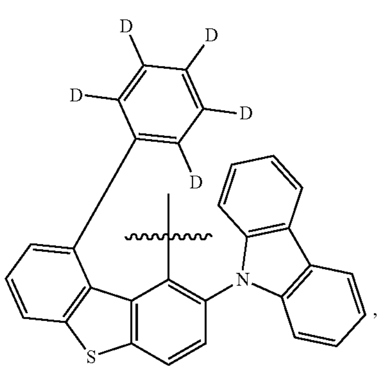
R307
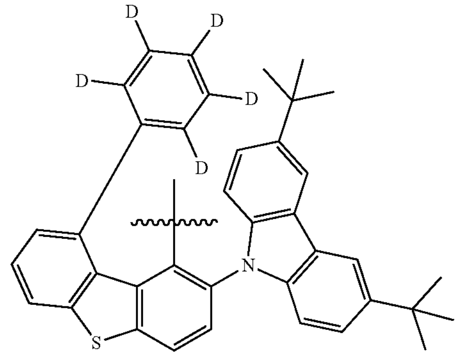
R308
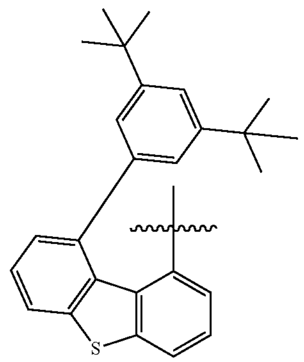
R309
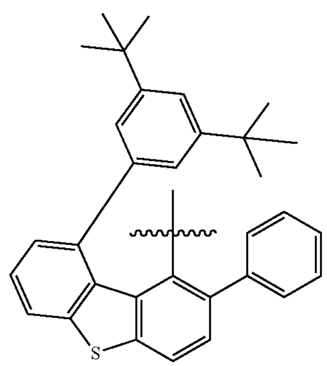
R310
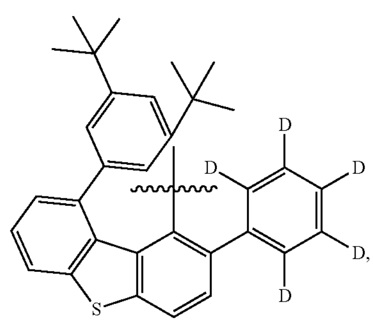

-continued
R311
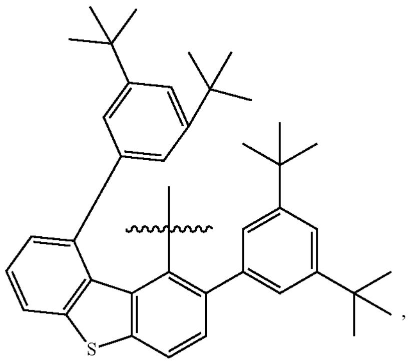
R312
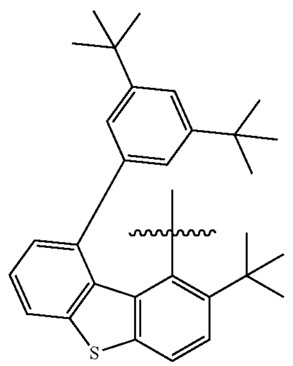
R313
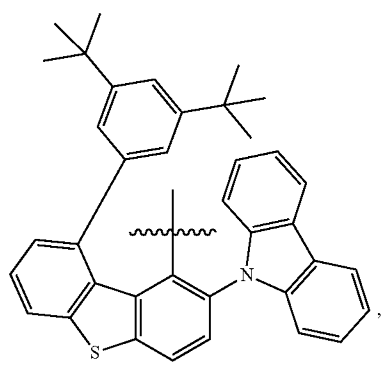
R314
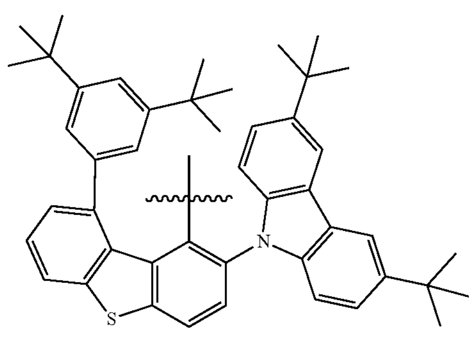
-continued
R315
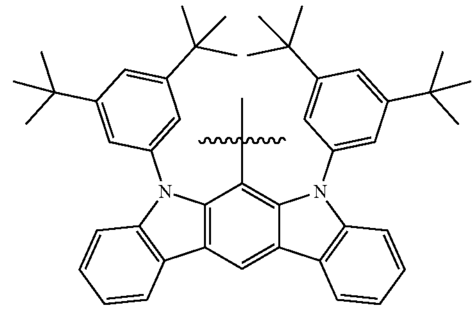
R316
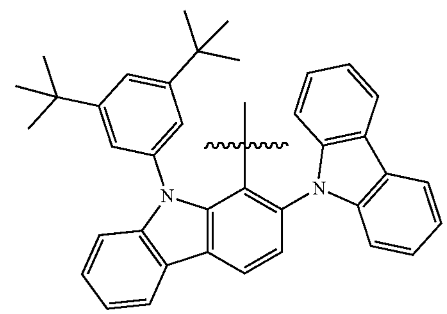
R317
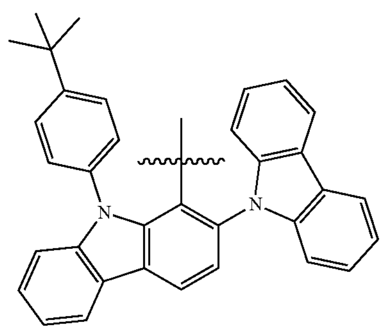
R318
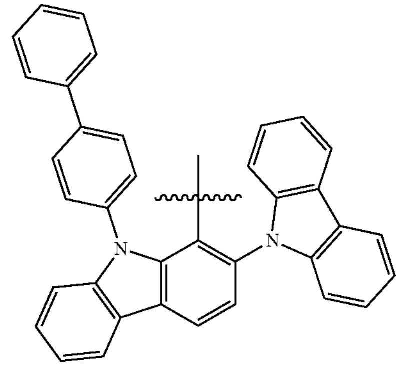

-continued
R319
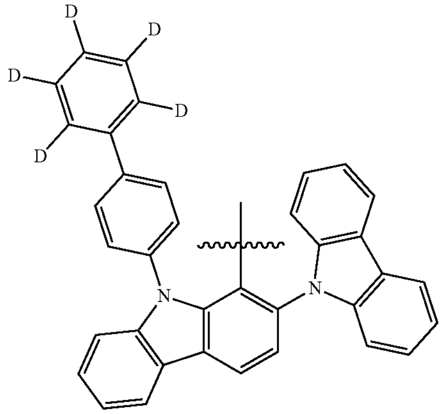
R320
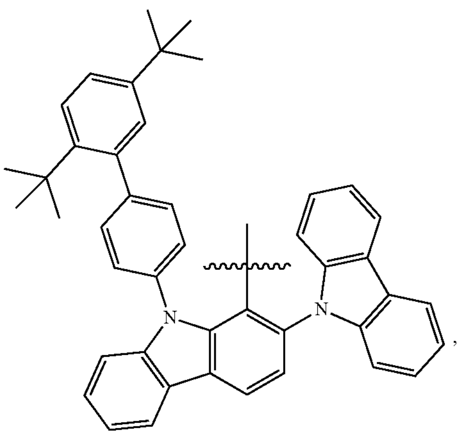
R321
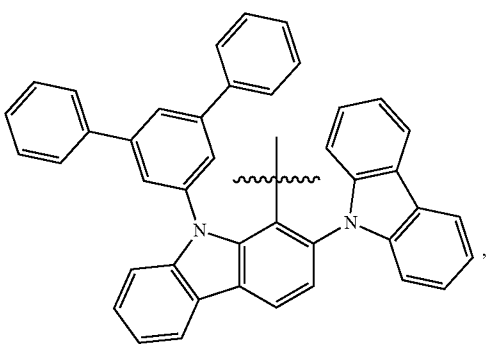
R322
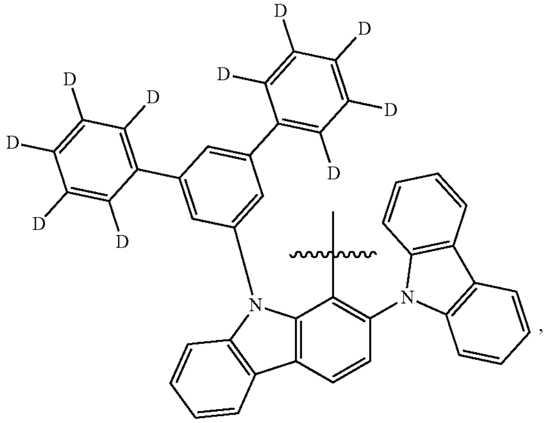
-continued
R323
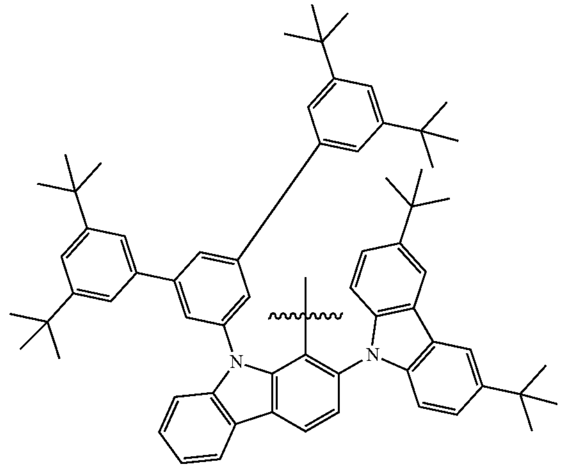
R324
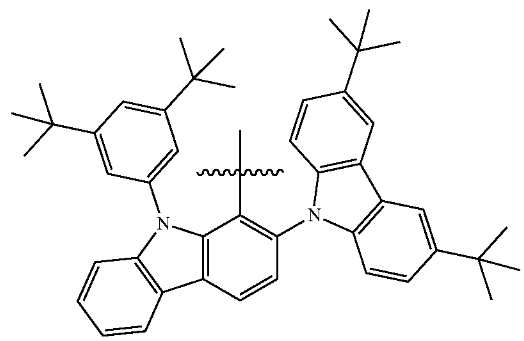
R325
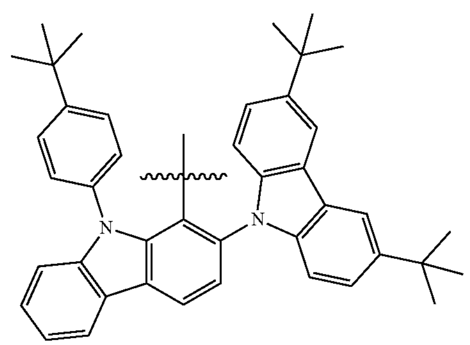
R326
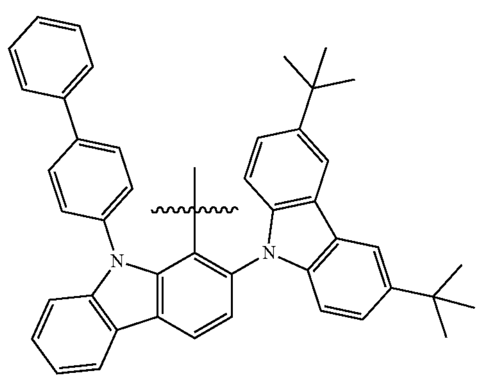

-continued
R327
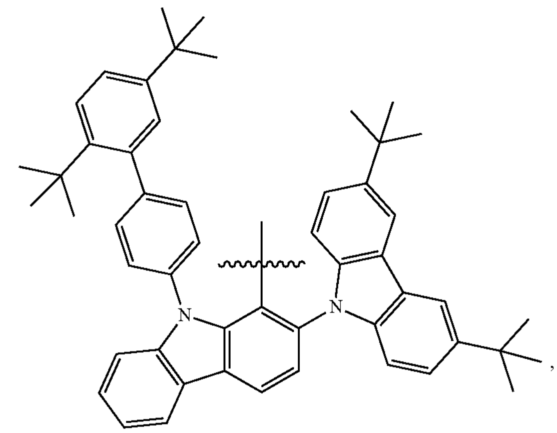
R328
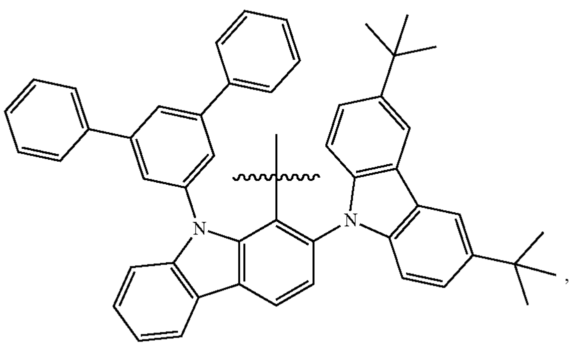
R329
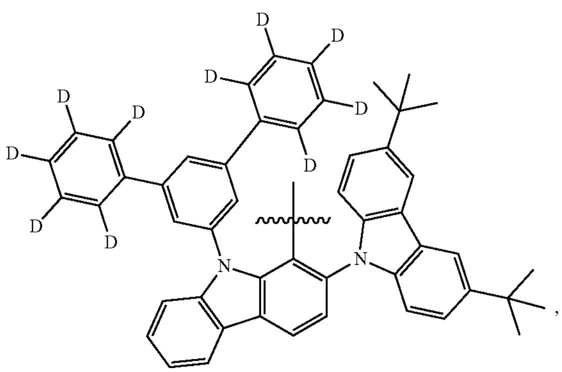
R330
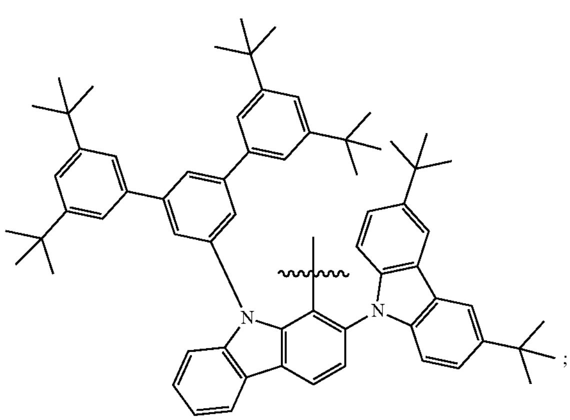
$L_{Yj}$ is selected from the group consisting of:
$L_{Y1}$
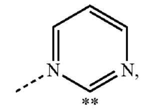
$L_{Y2}$
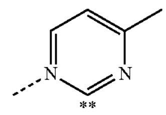
$L_{Y3}$
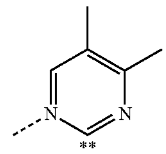
$L_{Y4}$
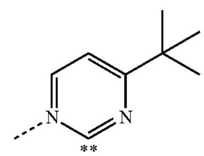
$L_{Y5}$
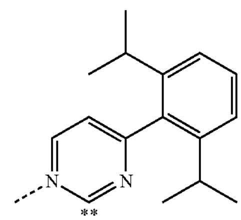
$L_{Y6}$
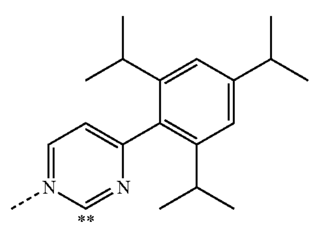
$L_{Y7}$
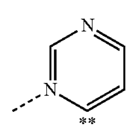
$L_{Y8}$
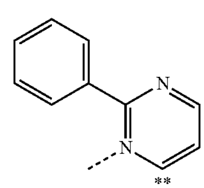

-continued
$L_{Y9}$
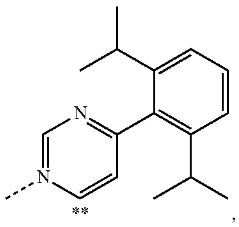
$L_{Y10}$
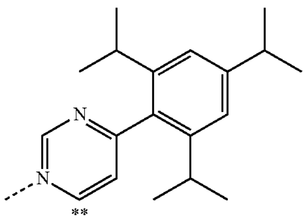
$L_{Y11}$
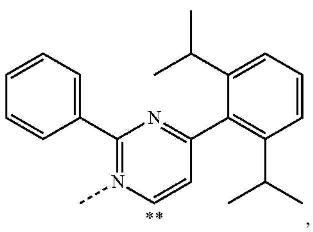
$L_{Y12}$
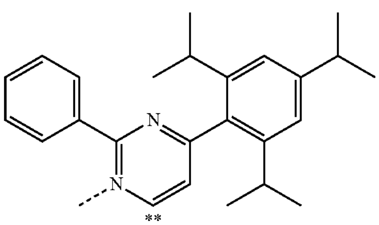
$L_{Y13}$
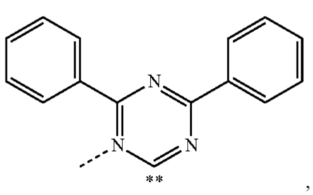
$L_{Y14}$
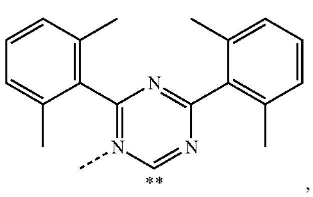
$L_{Y15}$
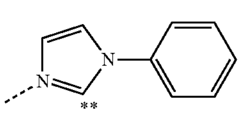
-continued
$L_{Y16}$
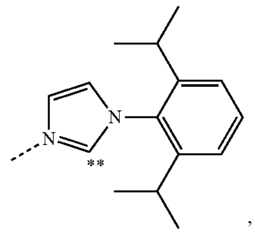
$L_{Y17}$
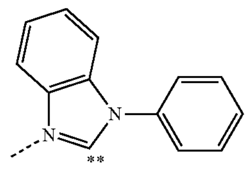
$L_{Y18}$
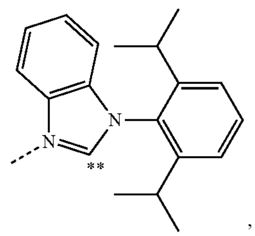
$L_{Y19}$
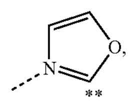
$L_{Y20}$
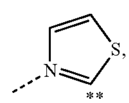
$L_{Y21}$
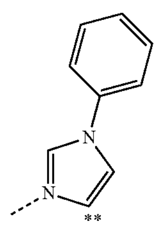
$L_{Y22}$
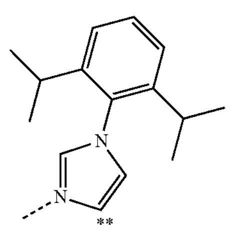
$L_{Y23}$
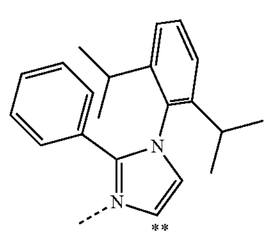

-continued
$L_{Y24}$
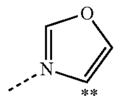
,
$L_{Y25}$
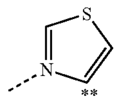
,
$L_{Y26}$
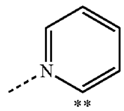
,
$L_{Y27}$
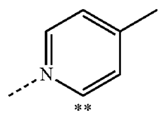
,
$L_{Y28}$
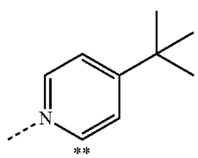
,
$L_{Y29}$
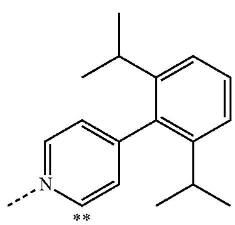
, and
$L_{Y30}$
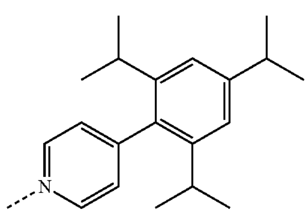
;
$L_{Zk}$ is selected from the group consisting of:
$L_{Z1}$
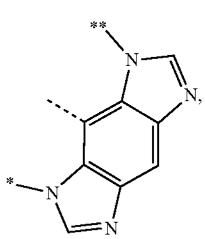
-continued
$L_{Z2}$
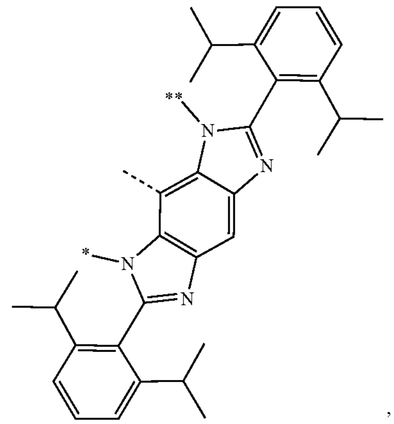
,
$L_{Z3}$
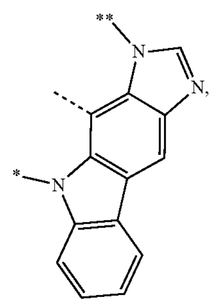
$L_{Z4}$
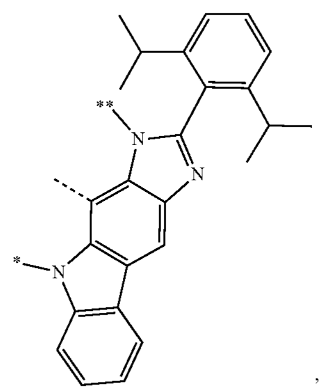
,
$L_{Z5}$
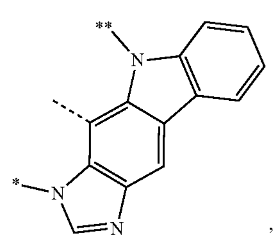
, -continued
$L_{Z6}$
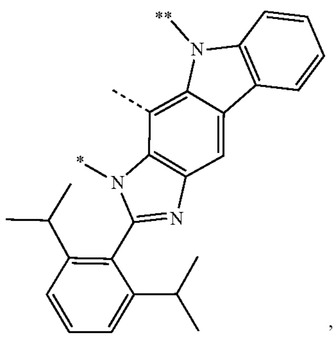
$L_{Z7}$
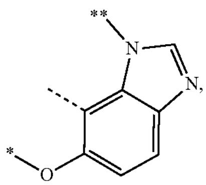
$L_{Z8}$
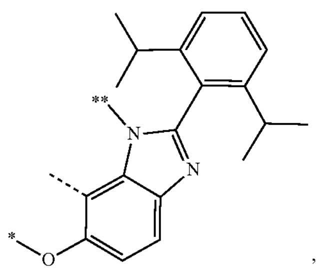
$L_{Z9}$
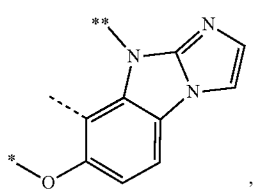
$L_{Z10}$
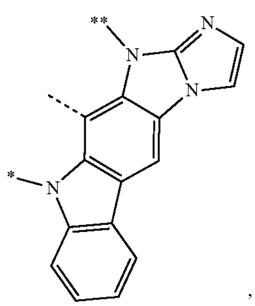
$L_{Z11}$
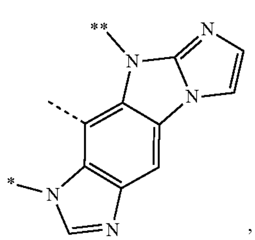
-continued
$L_{Z12}$
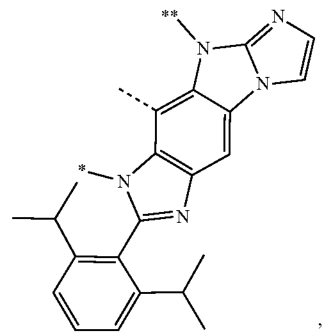
$L_{Z13}$
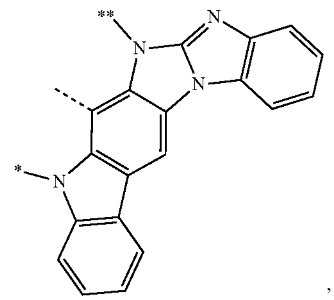
$L_{Z14}$
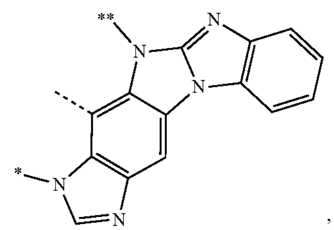
$L_{Z15}$
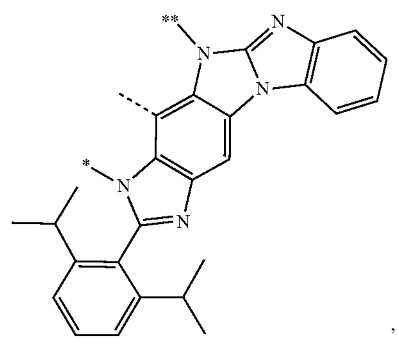
$L_{Z16}$
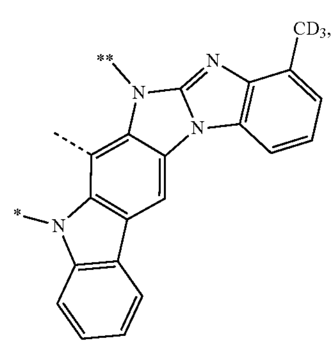

L$_{Z17}$
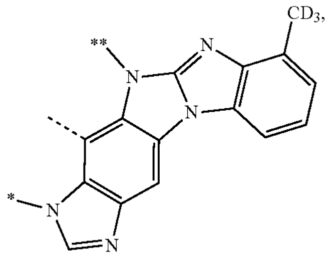
L$_{Z18}$
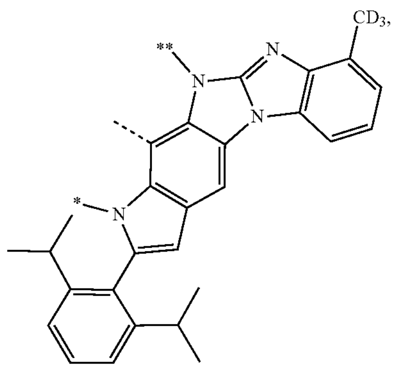
L$_{Z19}$
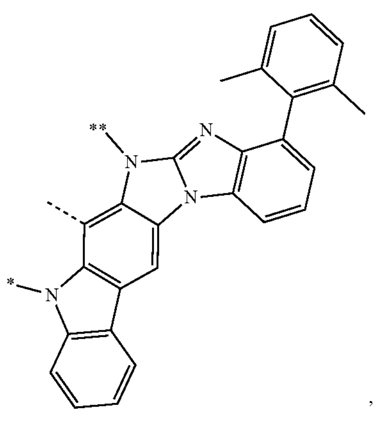
,
L$_{Z20}$
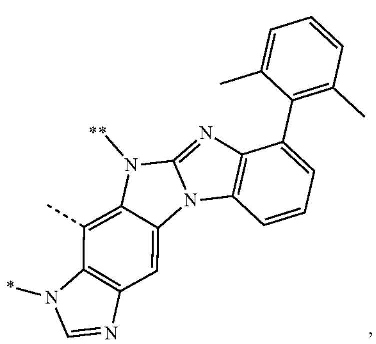
,
L$_{Z21}$
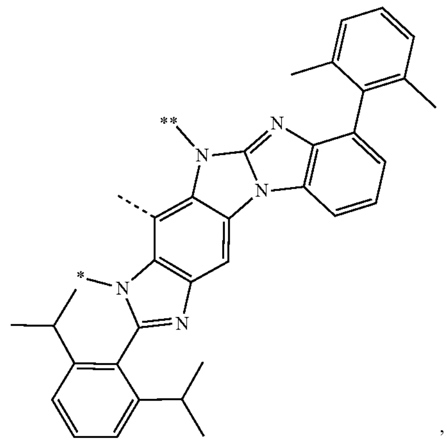
,
L$_{Z22}$
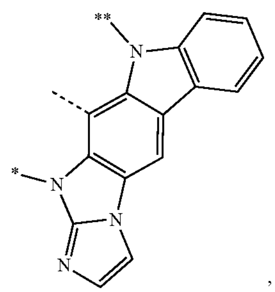
,
L$_{Z23}$
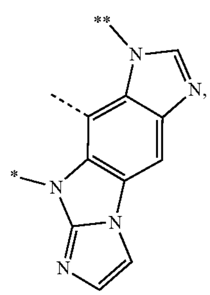
L$_{Z24}$
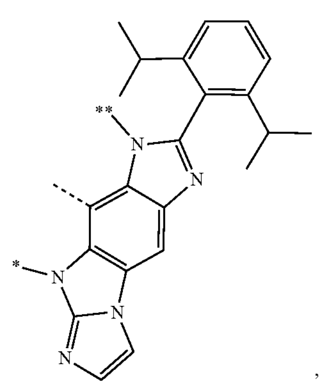
, -continued
$L_{Z25}$
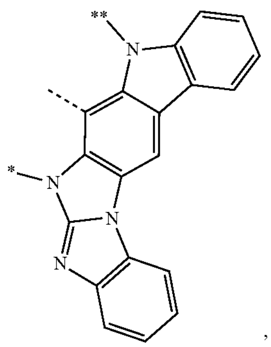
$L_{Z26}$
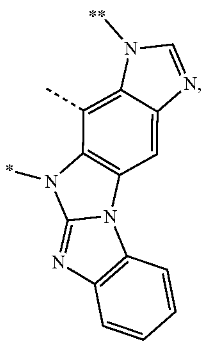
$L_{Z27}$
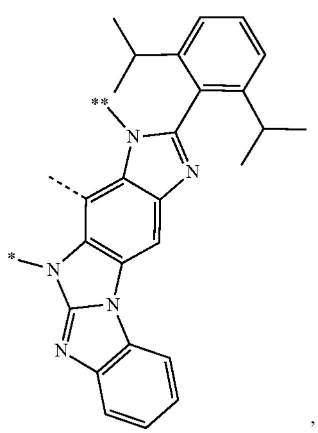
$L_{Z28}$
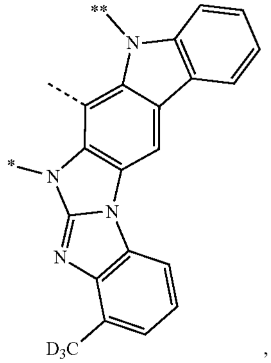
-continued
$L_{Z29}$
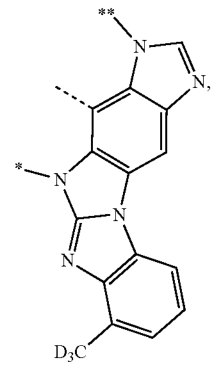
$L_{Z30}$
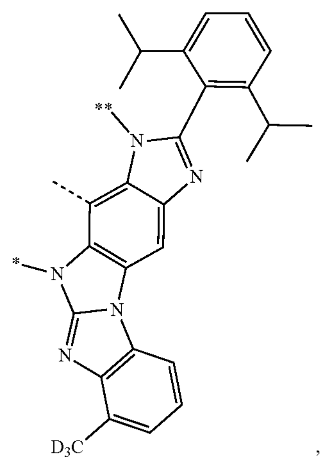
$L_{Z31}$
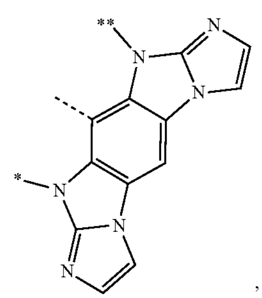
$L_{Z32}$
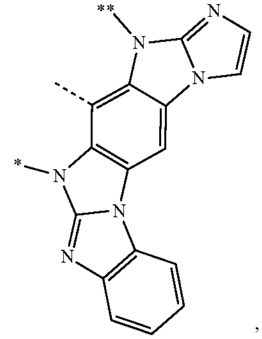

-continued
$L_{Z33}$
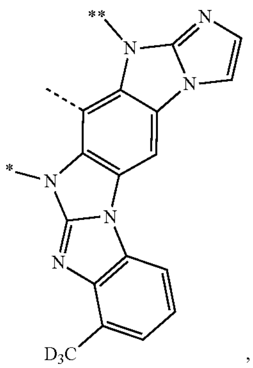
,
$L_{Z34}$
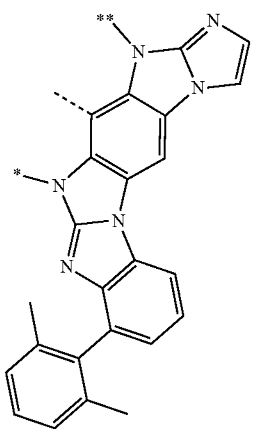
,
$L_{Z35}$
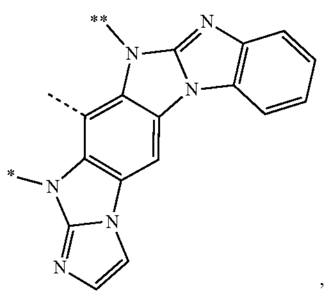
,
$L_{Z36}$
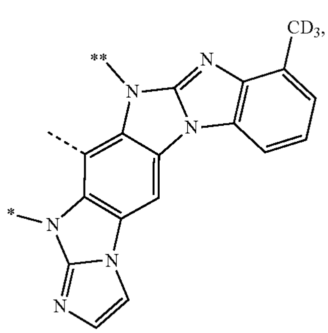
-continued
$L_{Z37}$
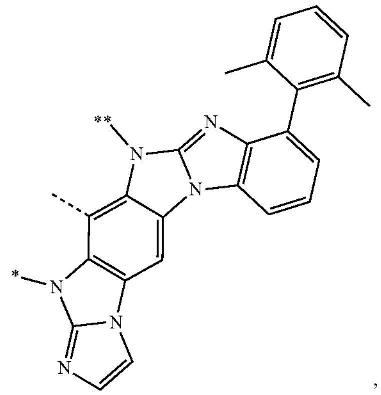
,
$L_{Z38}$
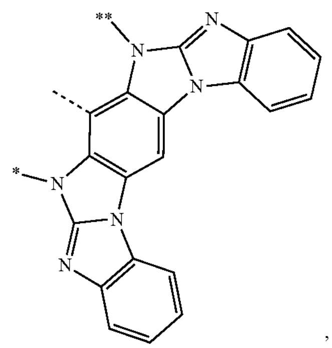
,
$L_{Z39}$
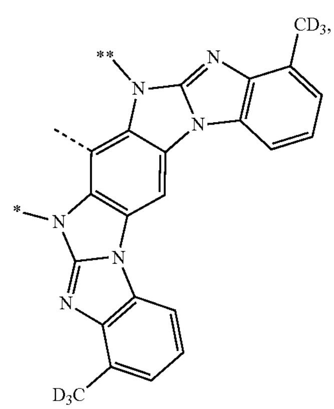
, and -continued
$L_{Z40}$
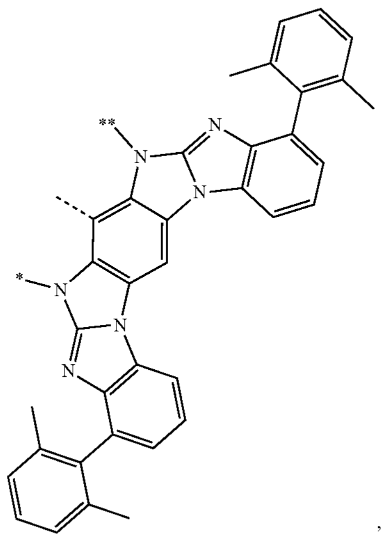
,
$L_{Z41}$
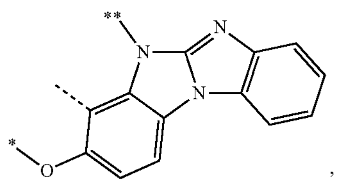
,
$L_{Z42}$
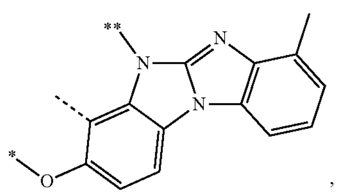
,
$L_{Z43}$
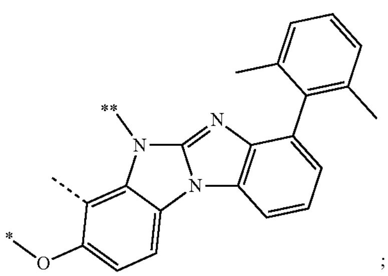
;
and the * of $L_{Zk}$ attaches to the * of $L_{Xi}$, and the  of $L_{Zk}$ attaches to the  of $L_{Yj}$.
13. The compound of claim 12, wherein x=5(k−41)+(j−25)+15(i−1)+270628950, i is an integer from 1 to 212190, 212216 to 212219, 212231 to 212234, j is an integer from 26 to 30, and k is an integer from 41 to 43.
14. The compound of claim 1, wherein the compound is selected from the group consisting of:
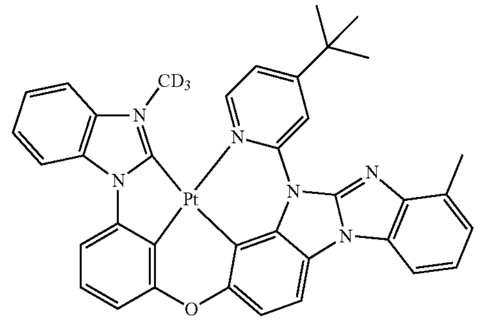
,
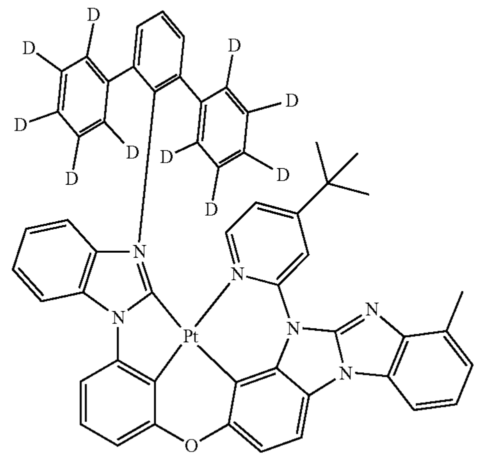
,
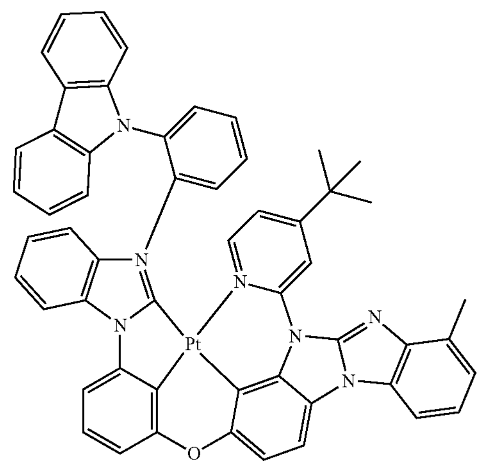
,
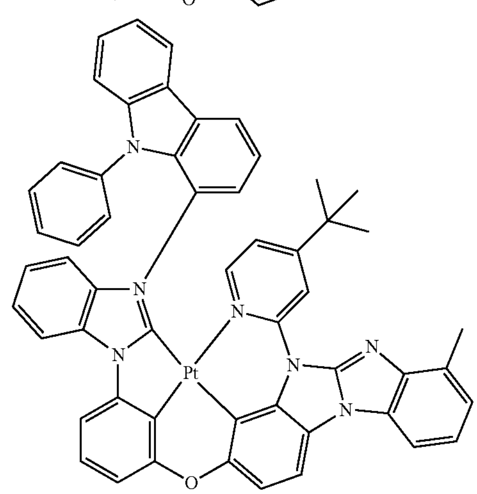
, -continued
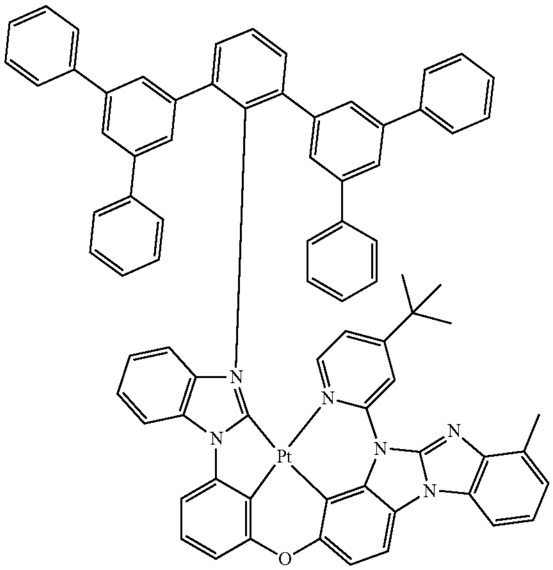
,
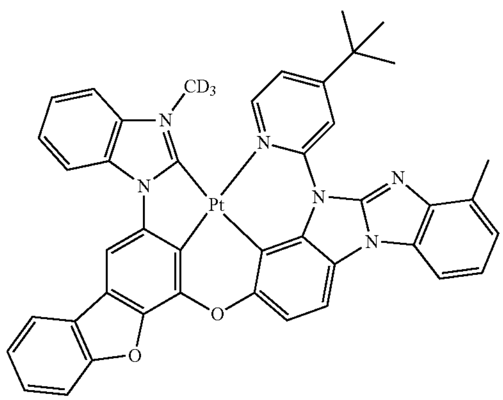
,
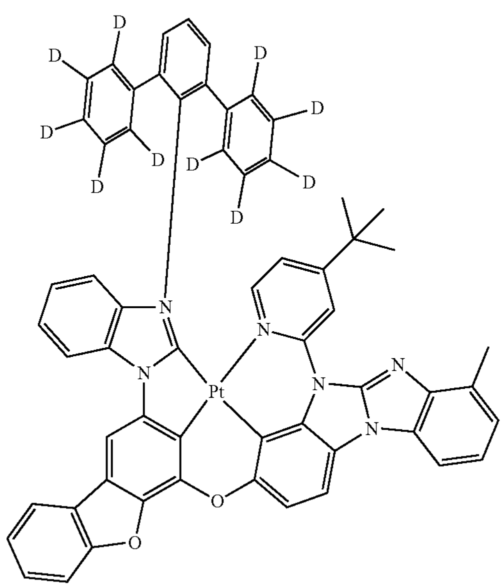
,
-continued
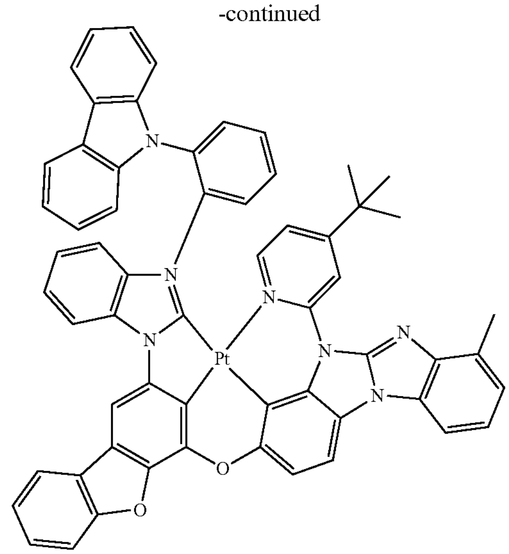
,
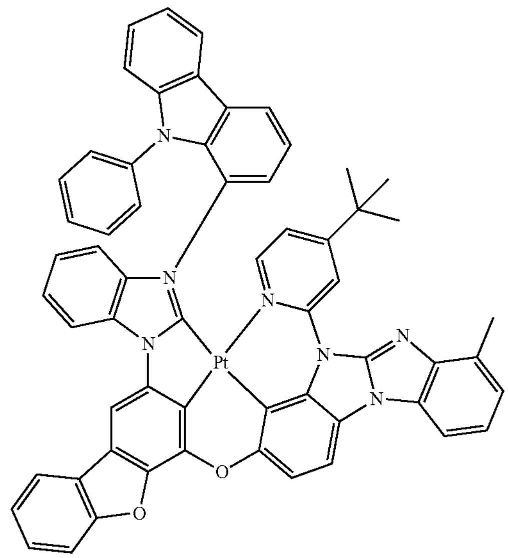
,
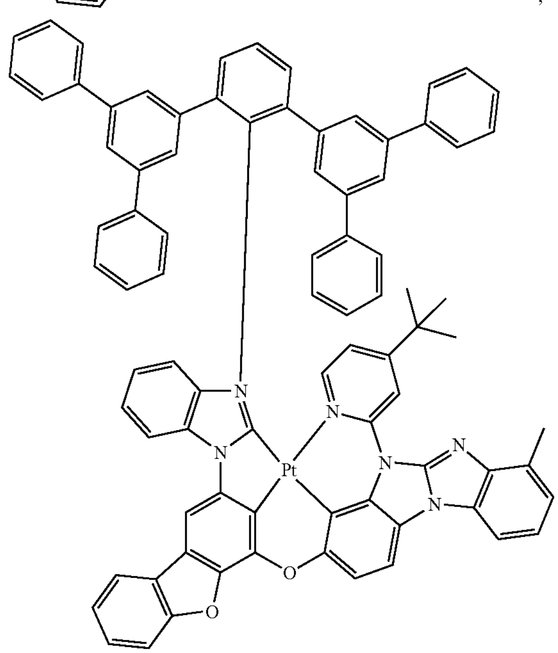
,

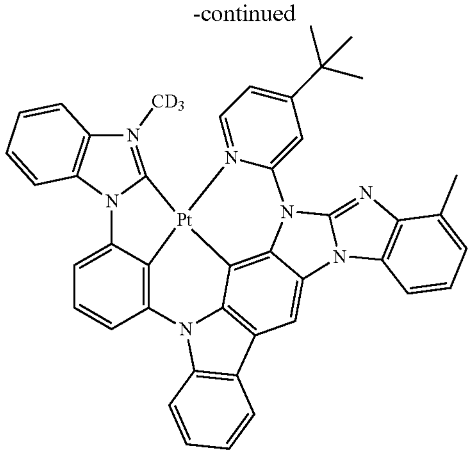
CD3
N
N
Pt
N
N
N
N
N
,
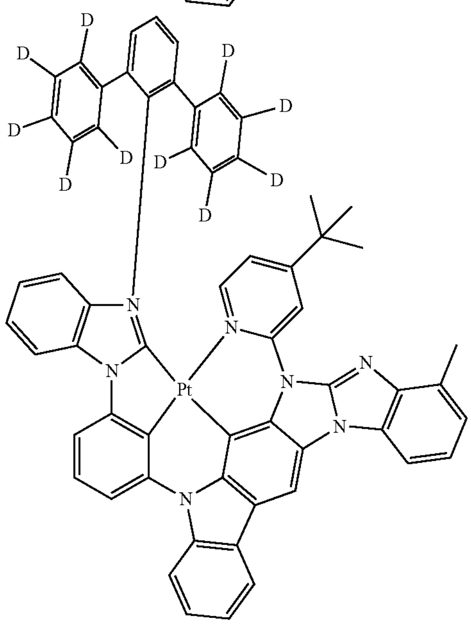
D
D
D
D
D
D
D
D
D
D
N
N
Pt
N
N
N
N
N
,
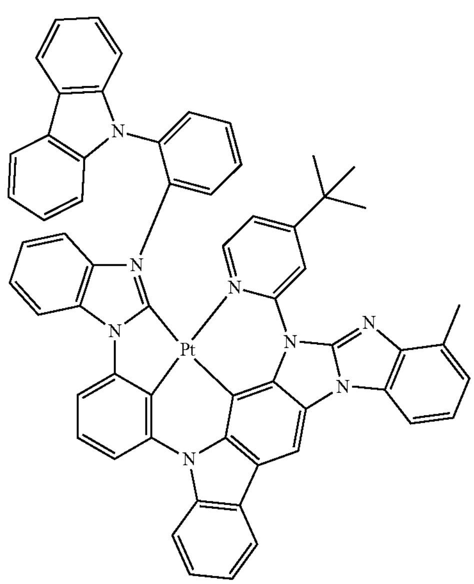
N
N
N
Pt
N
N
N
N
N
,
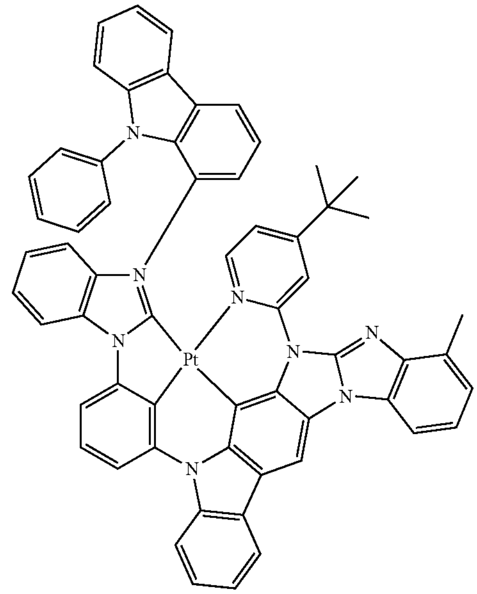
N
N
N
Pt
N
N
N
N
N
,
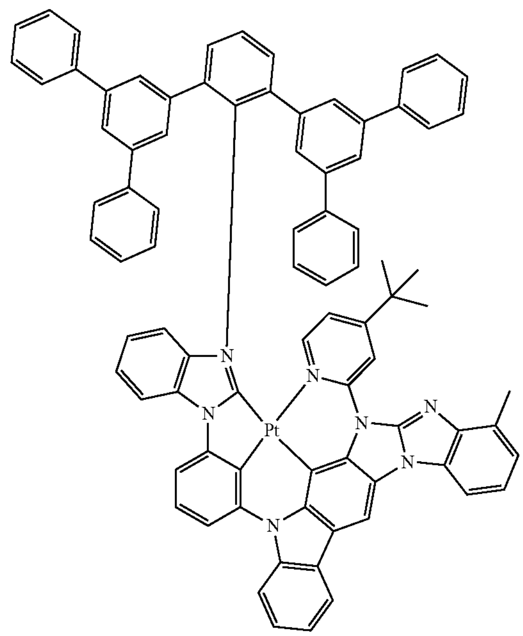
N
N
Pt
N
N
N
N
N
,
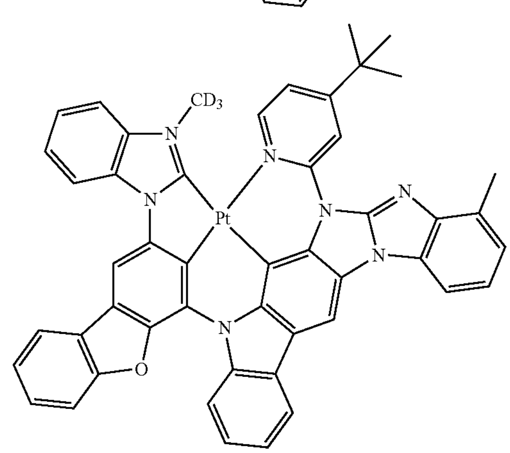
CD3
N
N
Pt
N
N
N
N
O
N
, -continued
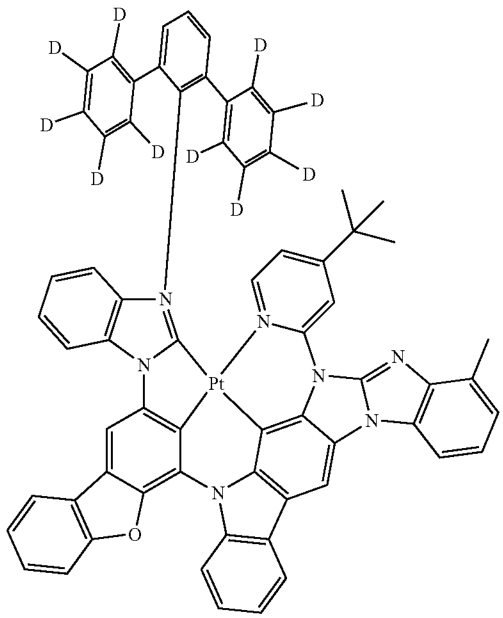
,
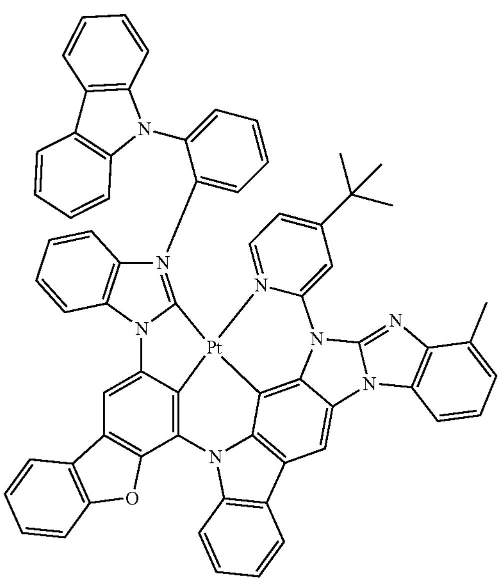
,
-continued
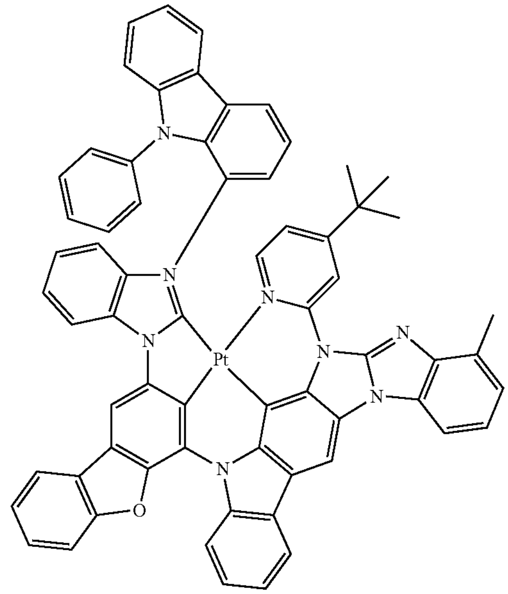
,
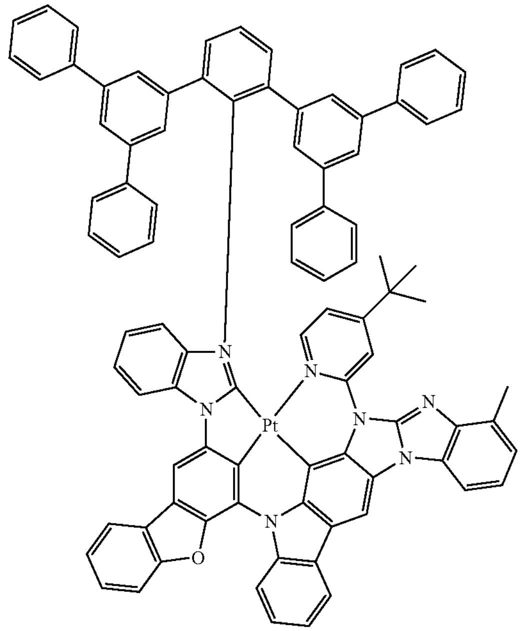
,
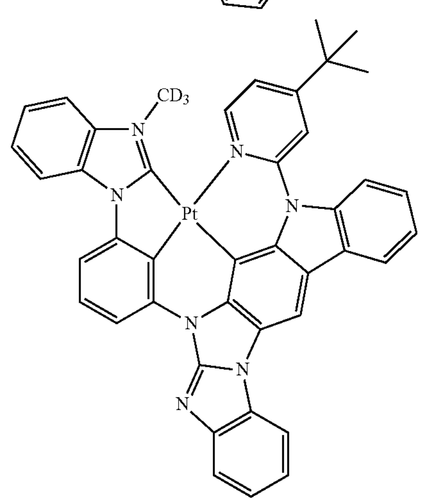
,

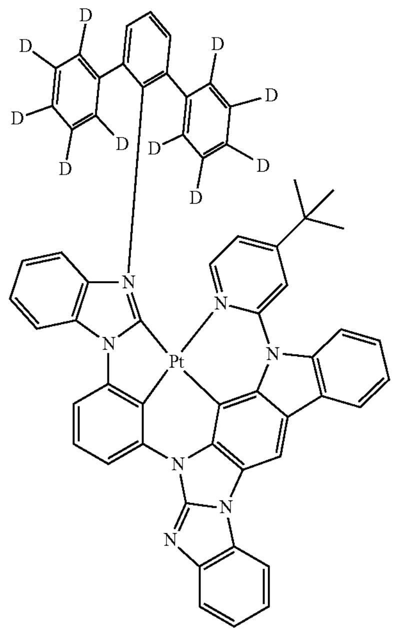
,
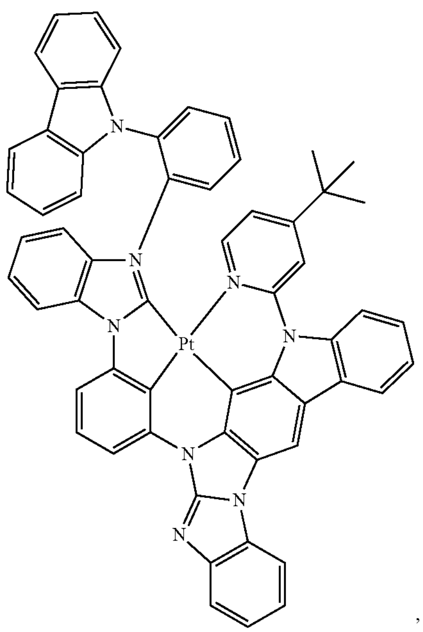
,
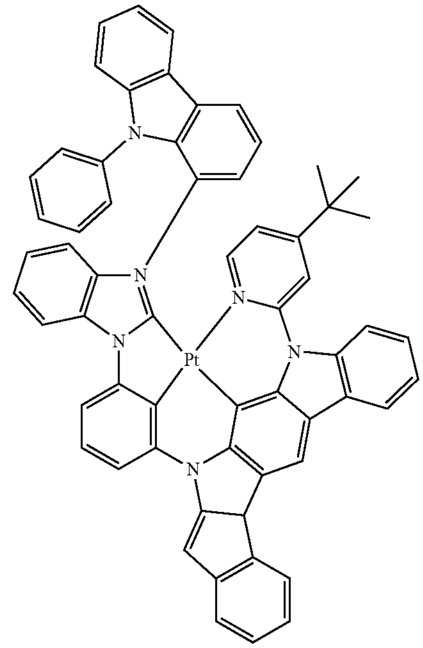
,
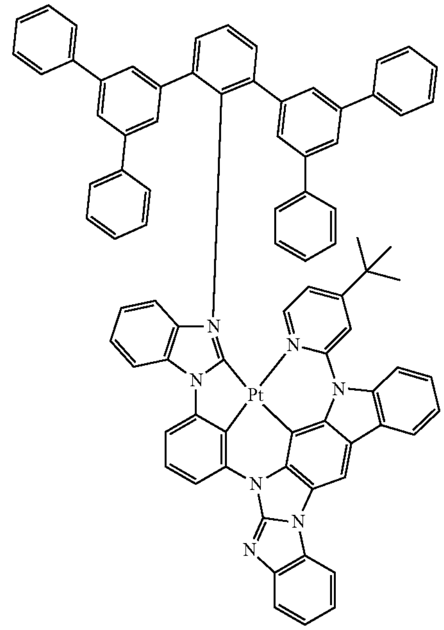
,

-continued
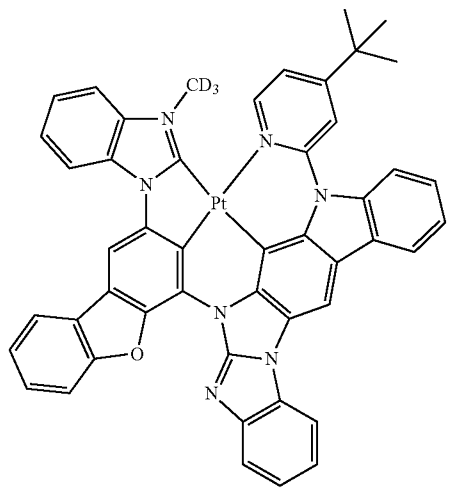
,
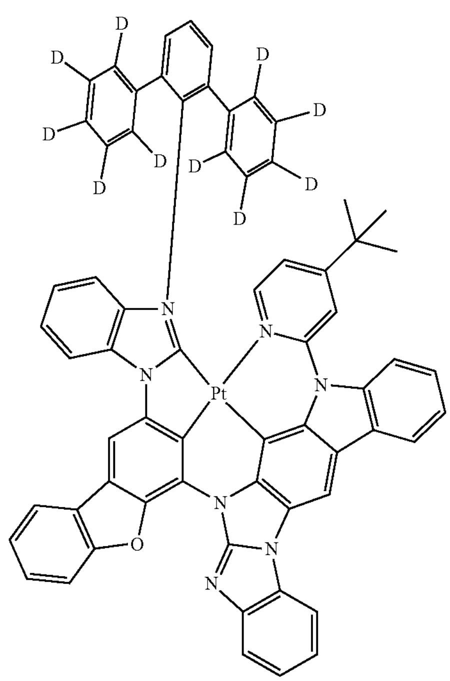
,
-continued
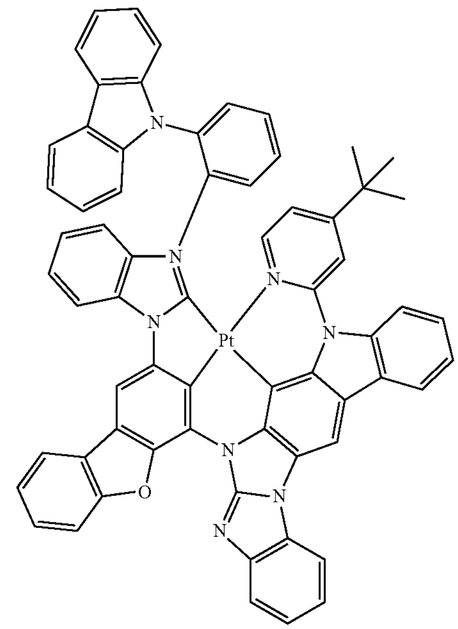
,
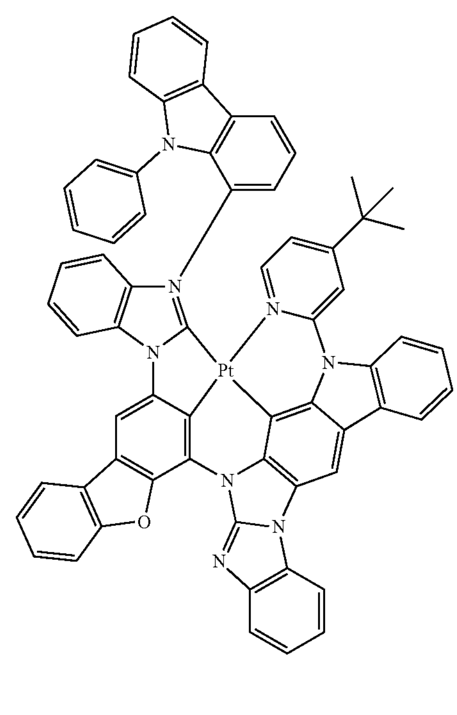
, -continued
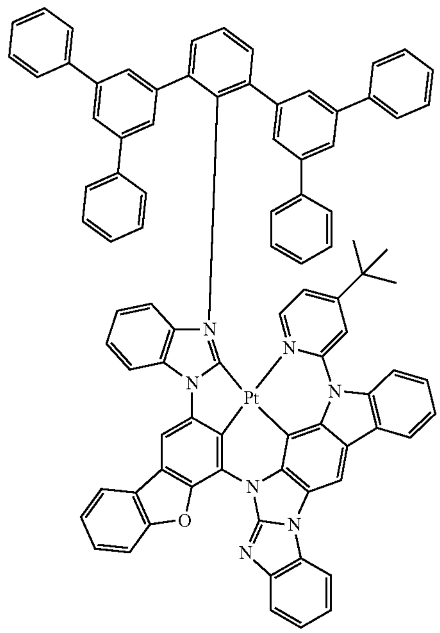
,
-continued
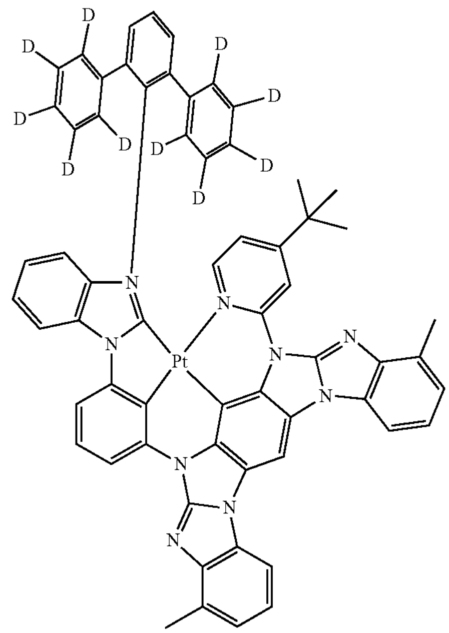
,
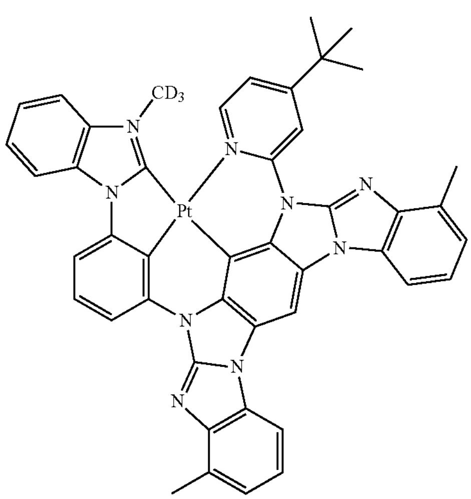
,
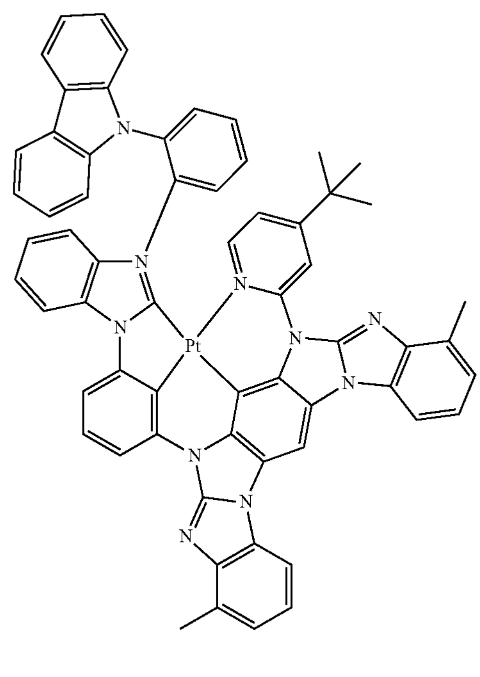
, -continued
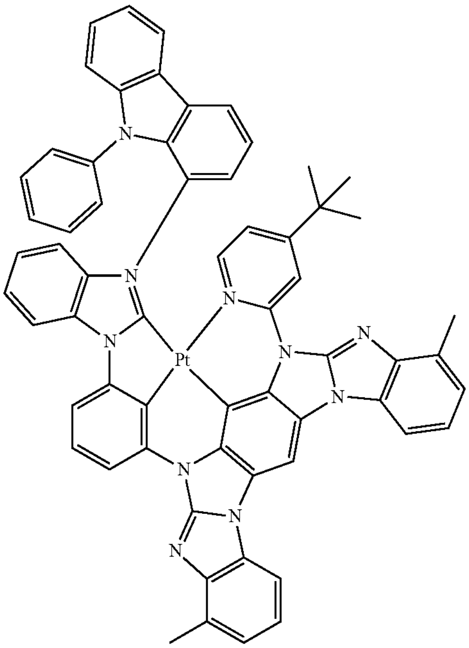
,
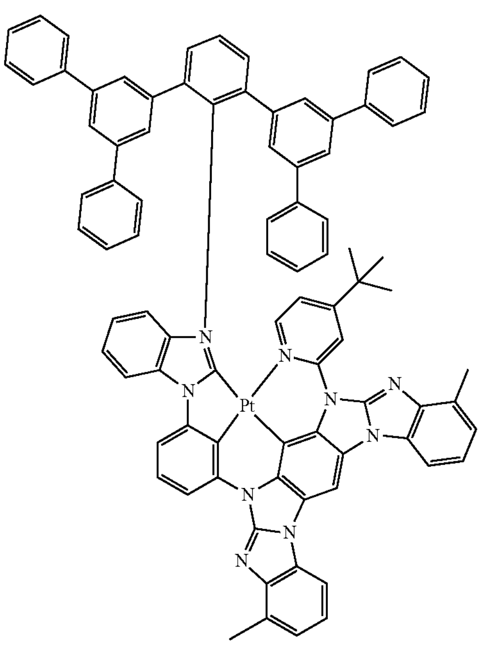
,
-continued
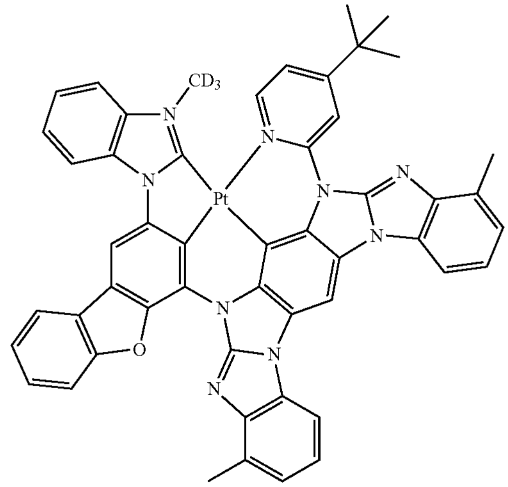
,
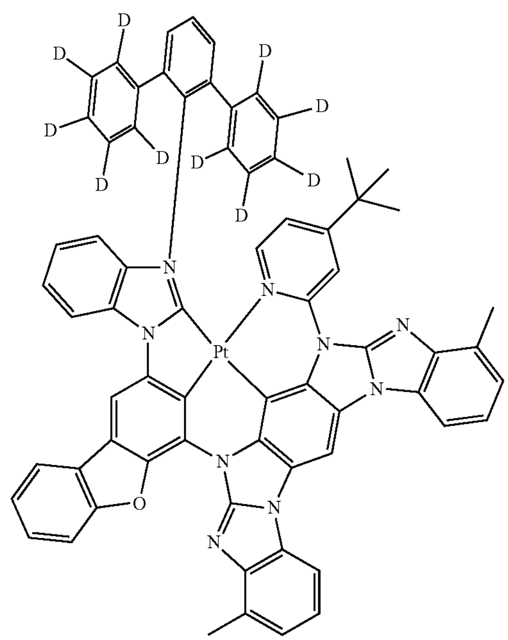
,

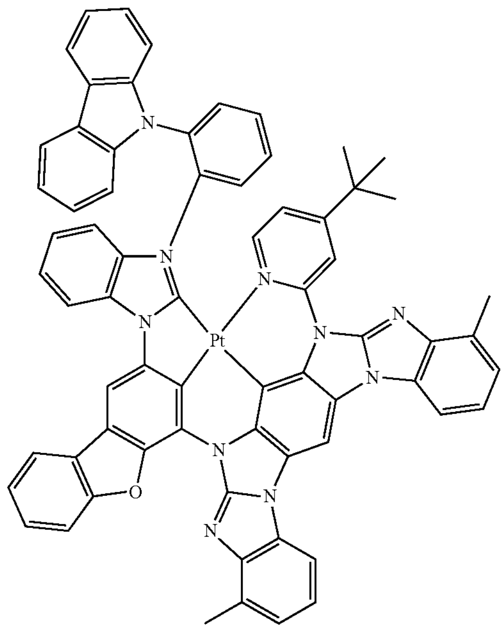
,
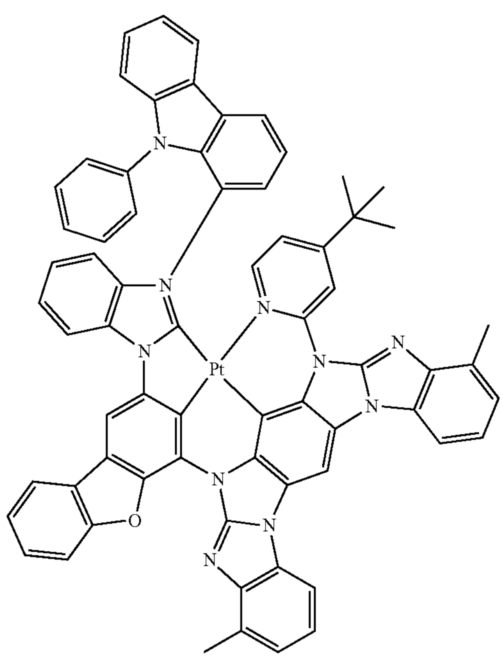
, and
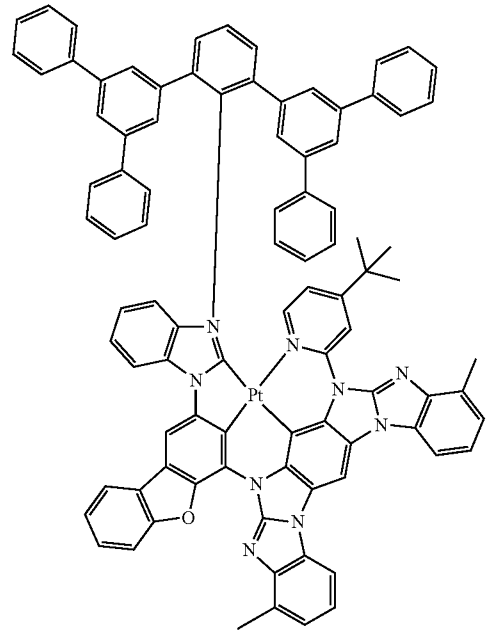
.
15. An organic light emitting device (OLED) comprising:
an anode;
a cathode; and
an organic layer, disposed between the anode and the cathode, comprising a compound selected from the group consisting of:
Formula I
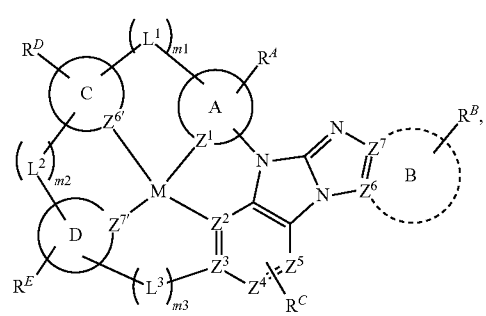
Formula II
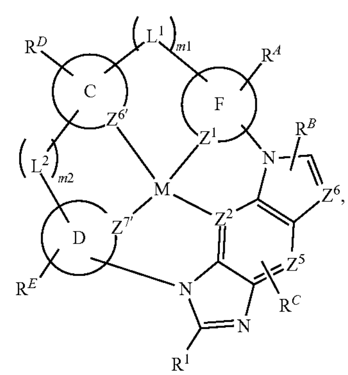
and -continued Formula III

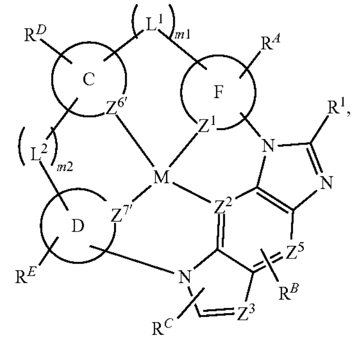

wherein,

A, B, C, D, and F are each independently a 5-membered or 6-membered aromatic ring;

ring B may or may not be present;

M is selected from the group consisting of Pt, Pd, Cu, and Au;

$Z^1$, $Z^2$, $Z^3$, $Z^4$, $Z^5$, $Z^6$, $Z^{6'}$, $Z^7$ and $Z^{7'}$ are each independently selected from the group consisting of C and N;

wherein one of $Z^{6'}$ and $Z^{7'}$ is a neutral carbene carbon, and the other one of $Z^{6'}$ and $Z^{7'}$ is an anionic carbon;

m1, m2 and m3 are each independently an integer of 0 or 1; when m2 is 0, each m1 and m3 is 1;

when m2 is 1, each m1 and m3 can be 0 or 1;

when m1 is 0, $L^1$ is not present; when m2 is 0, $L^2$ is not present; when m3 is 0, $L^3$ is not present;

$L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof;

each $R^A$, $R^B$, $R^C$, $R^D$, and $R^E$ represents mono- to maximum possible number of substitutions, or no substitution;

each $R^A$, $R^B$, $R^C$, $R^D$, $R^E$, R and R' is a hydrogen or a substituent independently selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof;

$R^1$ is selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

16. The OLED of claim 15, wherein the organic layer further comprises a host, wherein the host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

17. The OLED of claim 16, wherein the host is selected from the group consisting of:

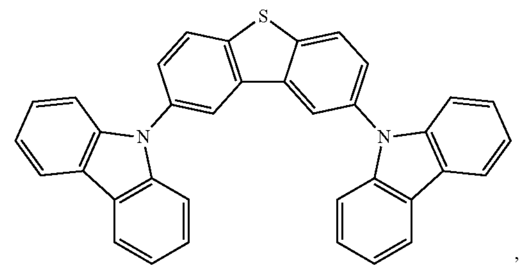
,

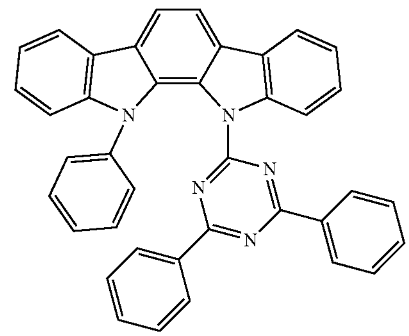
,

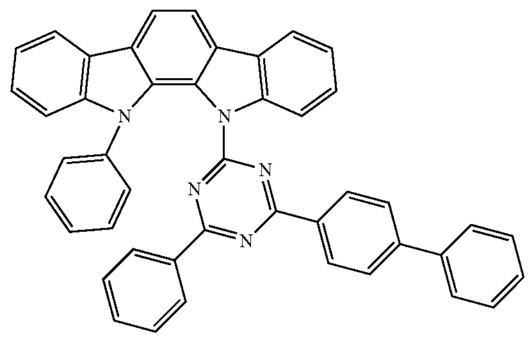
,

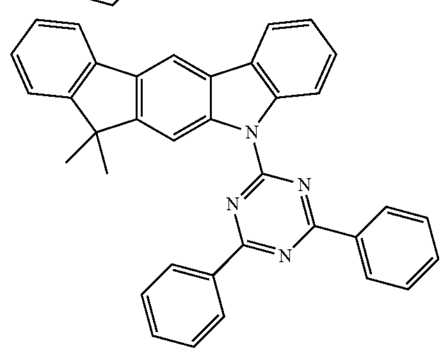
,

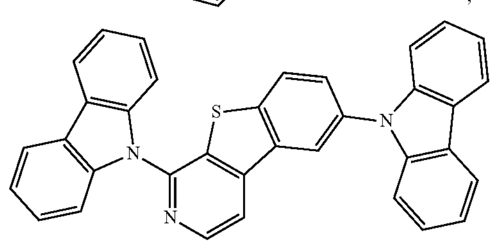
,

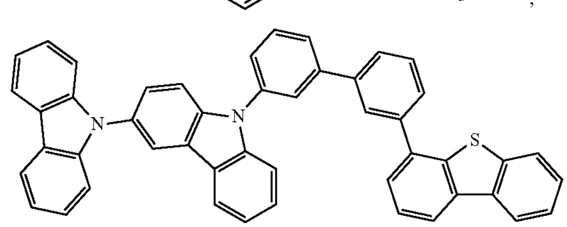
,

-continued
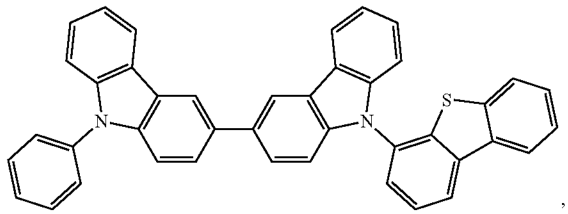
,
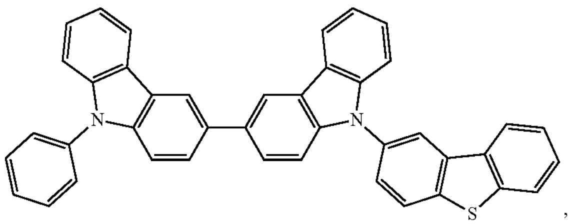
,
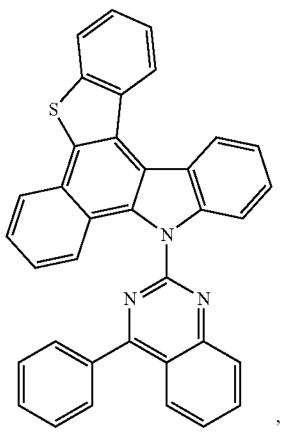
,
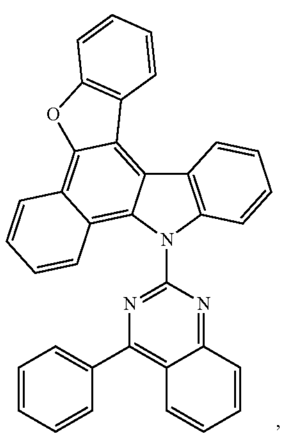
,
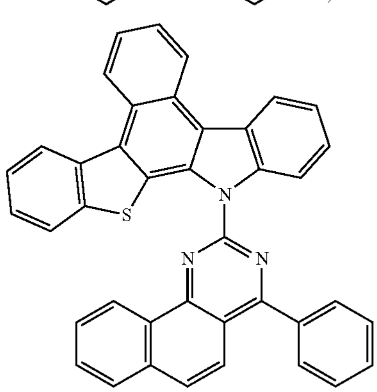
,
-continued
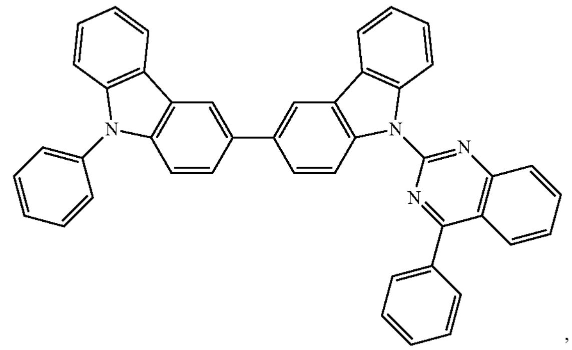
,
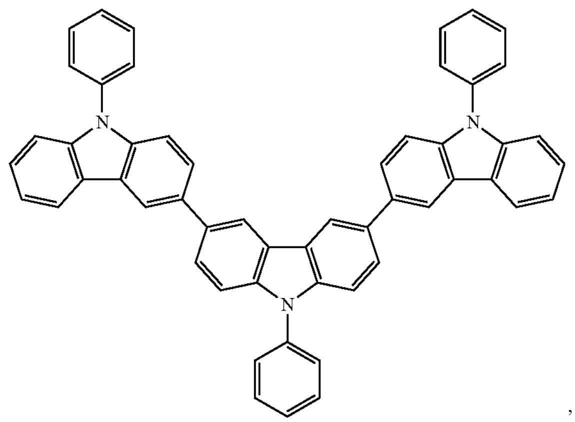
,
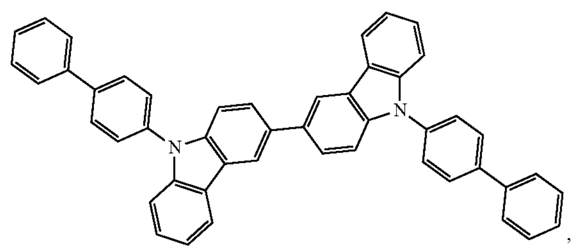
,
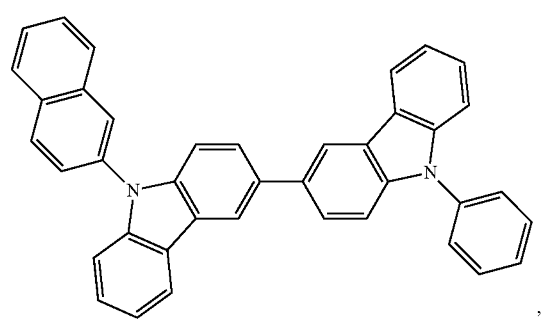
,
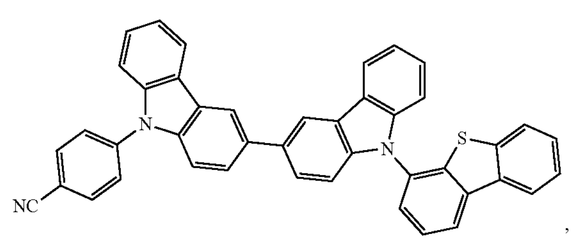
, -continued

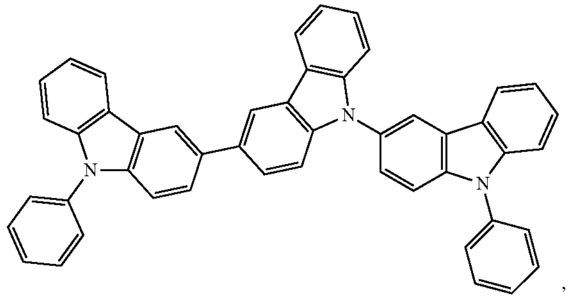

,

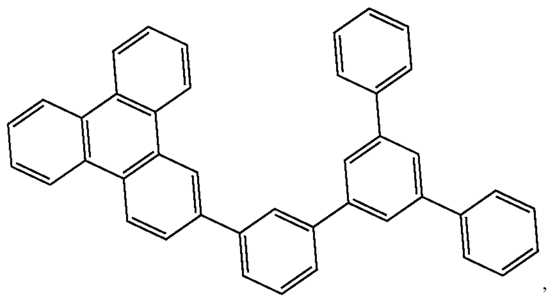

,

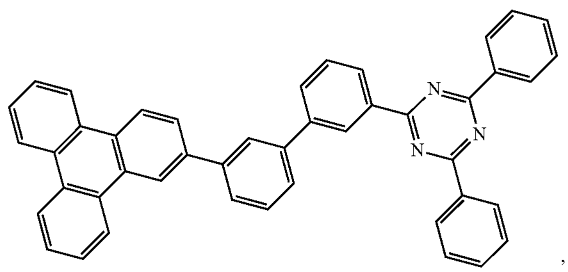

,

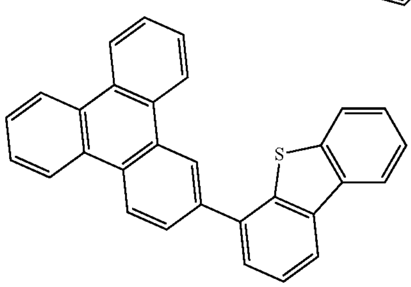

,

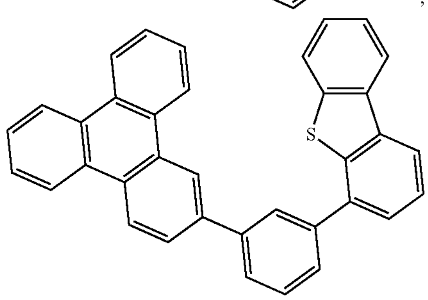

,

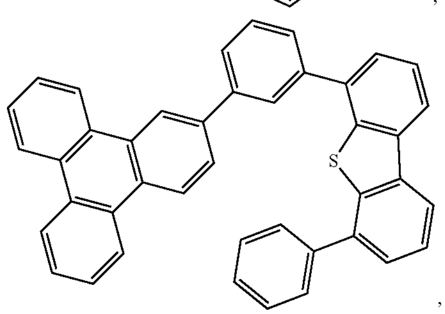

,

-continued

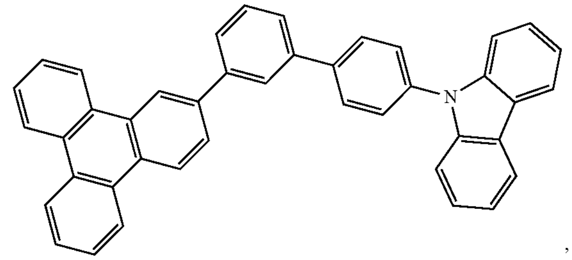

,

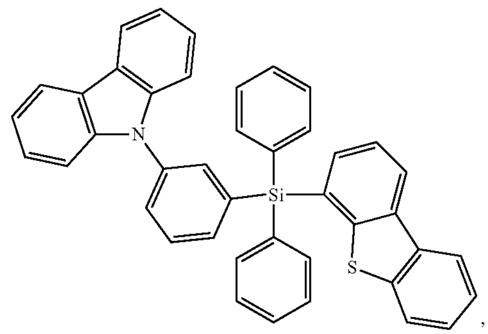

,

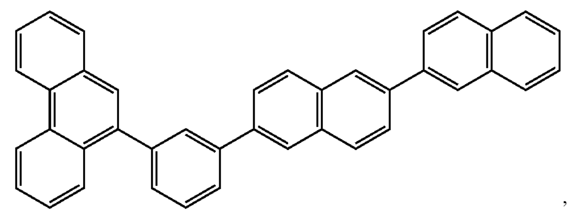

, and combinations thereof.

18. The OLED of claim 15, wherein the compound is a sensitizer; wherein the device further comprises an acceptor; and wherein the acceptor is selected from the group consisting of fluorescent emitter, delayed fluorescence emitter, and combination thereof.

19. A consumer product comprising an organic light-emitting device (OLED) comprising:

an anode;

a cathode; and an organic layer, disposed between the anode and the cathode, comprising a compound selected from the group consisting of:

Formula I

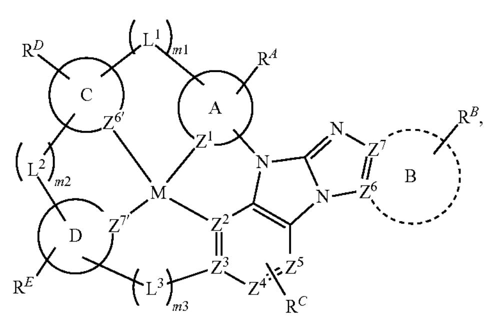

-continued

Formula II

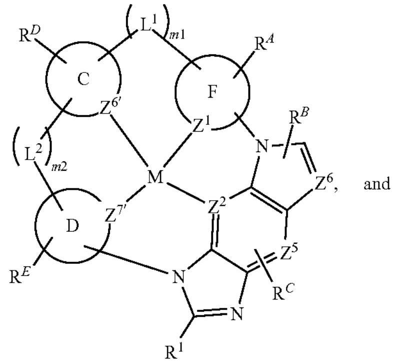

Formula III

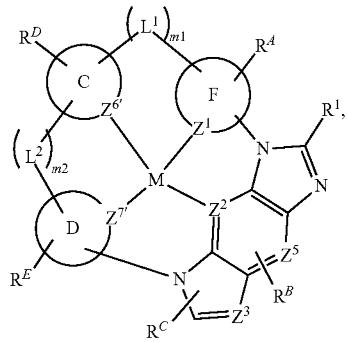

wherein,

A, B, C, D, and F are each independently a 5-membered or 6-membered aromatic ring;

ring B may or may not be present;

M is selected from the group consisting of Pt, Pd, Cu, and Au;

$Z^1$, $Z^2$, $Z^3$, $Z^4$, $Z^5$, $Z^6$, $Z^{6'}$, $Z^7$ and $Z^{7'}$ are each independently selected from the group consisting of C and N;

wherein one of $Z^{6'}$ and $Z^{7'}$ is a neutral carbene carbon, and the other one of $Z^{6'}$ and $Z^{7'}$ is an anionic carbon;

m1, m2 and m3 are each independently an integer of 0 or 1; when m2 is 0, each m1 and m3 is 1; when m2 is 1, each m1 and m3 can be 0 or 1;

when m1 is 0, $L^1$ is not present; when m2 is 0, $L^2$ is not present; when m3 is 0, $L^3$ is not present;

$L^1$, $L^2$, and $L^3$ each independently selected from the group consisting of a direct bond, BR, NR, PR, O, S, Se, C═O, S═O, $SO_2$, CRR', SiRR', GeRR', alkyl, cycloalkyl, and combinations thereof;

each $R^A$, $R^B$, $R^C$, $R^D$, and $R^E$ represents mono- to maximum possible number of substitutions, or no substitution;

each $R^A$, $R^B$, $R^C$, $R^D$, $R^E$, R and R' is a hydrogen or a substituent independently selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof;

$R^1$ is selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and any two substituents can be joined or fused into a ring, provided that, in Formula I, if ring C is a 5-membered aromatic ring, $L^2$ is present and is a direct bond, then at least one pair of $R^D$, one pair of $R^E$, or one $R^D$ and one $R^E$ are joined together to form a fused ring.

20. The compound of claim 1, wherein $Z^{6'}$ is a neutral carbene carbon, and $Z^{7'}$ is an anionic carbon.

* * * * *